US011705530B2

(12) United States Patent
Nakano et al.

(10) Patent No.: US 11,705,530 B2

(45) Date of Patent: Jul. 18, 2023

(54) IMAGING DEVICE, STACKED IMAGING DEVICE, AND SOLID-STATE IMAGING APPARATUS

(71) Applicant: SONY CORPORATION, Tokyo (JP)

(72) Inventors: Hiroshi Nakano, Tokyo (JP); Toshiki Moriwaki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 139 days.

(21) Appl. No.: 17/047,208

(22) PCT Filed: Apr. 10, 2019

(86) PCT No.: PCT/JP2019/015591

§ 371 (c)(1),
(2) Date: Oct. 13, 2020

(87) PCT Pub. No.: WO2019/203085

PCT Pub. Date: Oct. 24, 2019

(65) Prior Publication Data

US 2021/0167234 A1 Jun. 3, 2021

(30) Foreign Application Priority Data

Apr. 20, 2018 (JP) ................................ 2018-081250
Aug. 31, 2018 (JP) ................................ 2018-162973

(51) Int. Cl.
*H01L 31/0376* (2006.01)
*H01L 27/146* (2006.01)
(Continued)

(52) U.S. Cl.
CPC .... *H01L 31/0376* (2013.01); *H01L 27/14647* (2013.01); *H01L 31/032* (2013.01); *H01L 31/102* (2013.01)

(58) Field of Classification Search
CPC ........... H01L 31/0376; H01L 27/14647; H01L 31/032; H01L 31/102; H01L 27/14601;
(Continued)

(56) References Cited

U.S. PATENT DOCUMENTS 10,468,451 B2 * 11/2019 Togashi ............ H01L 27/14625
10,714,532 B2 * 7/2020 Togashi ............ H01L 27/14636
(Continued)

FOREIGN PATENT DOCUMENTS

JP 2016-063165 4/2016
JP 2016-219800 12/2016
(Continued)

OTHER PUBLICATIONS

International Search Report and Written Opinion prepared by the Japanese Patent Office dated Jun. 28, 2019, for International Application No. PCT/JP2019/015591.

*Primary Examiner* — Bitew A Dinke

(74) *Attorney, Agent, or Firm* — Sheridan Ross P.C.

(57) ABSTRACT

An imaging device includes a photoelectric conversion unit in which a first electrode, a photoelectric conversion layer, and a second electrode are stacked. A semiconductor material layer including an inorganic oxide semiconductor material having an amorphous structure at least in a portion is formed between the first electrode and the photoelectric conversion layer, and the formation energy of an inorganic oxide semiconductor material that has the same composition as the inorganic oxide semiconductor material having an amorphous structure and has a crystalline structure has a positive value.

14 Claims, 87 Drawing Sheets

(51) Int. Cl.
*H01L 31/032* (2006.01)
*H01L 31/102* (2006.01)

(58) Field of Classification Search
CPC . H01L 27/146; H01L 27/14643; H01L 27/30; H01L 31/10; H01L 51/42; H01L 27/307; H01L 21/02565; Y02E 10/549
See application file for complete search history.

(56) References Cited

U.S. PATENT DOCUMENTS

| | | | | |
|---|---|---|---|---|
| 11,276,726 | B2 * | 3/2022 | Moriwaki | H01L 27/14603 |
| 11,348,965 | B2 * | 5/2022 | Togashi | H01L 27/307 |
| 2009/0315136 | A1 * | 12/2009 | Hayashi | H01L 27/14692 257/440 |
| 2014/0306180 | A1 * | 10/2014 | Moriwaki | H01L 51/442 257/14 |
| 2015/0188065 | A1 * | 7/2015 | Takimoto | H01L 27/1462 257/40 |
| 2015/0311245 | A1 | 10/2015 | Yamazaki et al. | |
| 2016/0037098 | A1 * | 2/2016 | Lee | H01L 27/307 257/292 |
| 2016/0284862 | A1 * | 9/2016 | Yamazaki | H01L 29/66969 |
| 2016/0336363 | A1 | 11/2016 | Dairiki et al. | |
| 2017/0005126 | A1 | 1/2017 | Yamazaki et al. | |
| 2017/0062620 | A1 * | 3/2017 | Yamazaki | H01L 29/78696 |
| 2017/0257587 | A1 * | 9/2017 | Hatano | H01L 27/146 |
| 2017/0278784 | A1 * | 9/2017 | Moriwaki | H01L 21/3205 |
| 2018/0076252 | A1 * | 3/2018 | Togashi | H01L 51/442 |
| 2020/0295219 | A1 * | 9/2020 | Moriwaki | H01L 27/14647 |
| 2020/0303446 | A1 * | 9/2020 | Moriwaki | H04N 5/369 |
| 2021/0126040 | A1 * | 4/2021 | Moriwaki | H01L 27/146 |
| 2021/0167234 | A1 * | 6/2021 | Nakano | H01L 27/146 |
| 2021/0257401 | A1 * | 8/2021 | Moriwaki | H01L 27/14643 |
| 2021/0288099 | A1 * | 9/2021 | Moriwaki | H01L 27/14643 |
| 2021/0327961 | A1 * | 10/2021 | Moriwaki | H01L 27/307 |
| 2022/0037602 | A1 * | 2/2022 | Iino | H04N 5/374 |
| 2022/0208857 | A1 * | 6/2022 | Moriwaki | H01L 51/4213 |
| 2022/0231245 | A1 * | 7/2022 | Iino | H01L 27/14612 |
| 2022/0255027 | A1 * | 8/2022 | Moriwaki | H01L 51/4213 |

FOREIGN PATENT DOCUMENTS

| | | | | |
|---|---|---|---|---|
| JP | 2017-017324 | | 1/2017 | |
| JP | 2017157186 | A | 9/2017 | |
| TW | 201029188 | A | 8/2010 | |
| TW | 201036151 | A | 10/2010 | |
| WO | WO-2013027391 | A1 | 2/2013 | |
| WO | WO-2017061082 | A1 * | 4/2017 | H01L 21/76898 |

* cited by examiner

IMAGING DEVICE, STACKED IMAGING DEVICE, AND SOLID-STATE IMAGING APPARATUS

CROSS REFERENCE TO RELATED APPLICATIONS

This application is a national stage application under 35 U.S.C. 371 and claims the benefit of PCT Application No. PCT/JP2019/015591 having an international filing date of 10 Apr. 2019, which designated the United States, which PCT application claimed the benefit of Japanese Patent Application Nos. 2018-081250 filed 20 Apr. 2018 and 2018-162973 filed 31 Aug. 2018, the entire disclosures of each of which are incorporated herein by reference.

TECHNICAL FIELD

The present disclosure relates to an imaging device, a stacked imaging device, and a solid-state imaging apparatus.

BACKGROUND ART

In recent years, attention has been drawn to stacked imaging devices as imaging devices that constitute image sensors and the like. A stacked imaging device has a structure in which a photoelectric conversion layer (a light receiving layer) is interposed between two electrodes. The stacked imaging device then requires a structure for storing and transferring signal charges generated at the photoelectric conversion layer on the basis of photoelectric conversion. A conventional structure requires a mechanism for storing and transferring signal charges into a floating drain (FD) electrode, and needs to perform high-speed transfer so as not to cause a signal charge delay.

An imaging device (a photoelectric conversion element) for solving such a problem is disclosed in Japanese Patent Application Laid-Open No. 2016-63165, for example. This imaging device includes:

a storage electrode formed on a first insulating layer;

a second insulating layer formed on the storage electrode;

a semiconductor layer formed to cover the storage electrode and the second insulating layer;

a collection electrode that is formed in contact with the semiconductor layer, and is separated from the storage electrode;

a photoelectric conversion layer formed on the semiconductor layer; and an upper electrode formed on the photoelectric conversion layer.

An imaging device using an organic semiconductor material for its photoelectric conversion layer can photoelectrically convert a specific color (wavelength band). In a case where such imaging devices are used in a solid-state imaging apparatus, because of such characteristics, it then becomes possible to obtain a structure (a stacked imaging device) in which subpixels are stacked, which is not possible in a conventional solid-state imaging apparatus in which an on-chip color filter layer (OCCF) and an imaging device constitute a subpixel, and subpixels are two-dimensionally arranged (see Japanese Patent Application Laid-Open No. 2011-138927, for example). Furthermore, there is an advantage that any false color does not appear, as demosaicing is not required. In the description below, an imaging device that is disposed on or above a semiconductor substrate and includes a photoelectric conversion unit may be referred to as a "first-type imaging device" for convenience, the photoelectric conversion units forming a first-type imaging device may be referred to as "first-type photoelectric conversion units" for convenience, the imaging devices disposed in the semiconductor substrate may be referred to as "second-type imaging devices" for convenience, and the photoelectric conversion units forming a second-type imaging device may be referred to as "second-type photoelectric conversion units" for convenience.

FIG. 78 shows an example configuration of a conventional stacked imaging device (a stacked solid-state imaging apparatus). In the example shown in FIG. 78, a third photoelectric conversion unit 343A and a second photoelectric conversion unit 341A that are the second-type photoelectric conversion units forming a third imaging device 343 and a second imaging device 341 that are second-type imaging devices are stacked and formed in a semiconductor substrate 370. Further, a first photoelectric conversion unit 310A that is a first-type photoelectric conversion unit is disposed above the semiconductor substrate 370 (specifically, above the second imaging device 341). Here, the first photoelectric conversion unit 310A includes a first electrode 321, a photoelectric conversion layer 323 formed with an organic material, and a second electrode 322, and forms a first imaging device that is a first-type imaging device. The second photoelectric conversion unit 341A and the third photoelectric conversion unit 343A photoelectrically convert blue light and red light, respectively, for example, depending on a difference in absorption coefficient. Meanwhile, the first photoelectric conversion unit 310A photoelectrically converts green light, for example.

After temporarily stored in the second photoelectric conversion unit 341A and the third photoelectric conversion unit 343A, the electric charges generated through the photoelectric conversion in the second photoelectric conversion unit 341A and the third photoelectric conversion unit 343A are transferred to a second floating diffusion layer $FD_2$ and a third floating diffusion layer $FD_3$ by a vertical transistor (shown as a gate portion 345) and a transfer transistor (shown as a gate portion 346), respectively, and are further output to an external readout circuit (not shown). These transistors and the floating diffusion layers $FD_2$ and $FD_3$ are also formed in the semiconductor substrate 370.

The electric charges generated through the photoelectric conversion in the first photoelectric conversion unit 310A are stored in a first floating diffusion layer $FD_1$ formed in the semiconductor substrate 370, via a contact hole portion 361 and a wiring layer 362. The first photoelectric conversion unit 310A is also connected to a gate portion 352 of an amplification transistor that converts a charge amount into a voltage, via the contact hole portion 361 and the wiring layer 362. Further, the first floating diffusion layer $FD_1$ forms part of a reset transistor (shown as a gate portion 351). Reference numeral 371 indicates a device separation region, reference numeral 372 indicates an oxide film formed on the surface of the semiconductor substrate 370, reference numerals 376 and 381 indicate interlayer insulating layers, reference numeral 383 indicates an insulating layer, and reference numeral 314 indicates an on-chip microlens.

CITATION LIST

Patent Document

Patent Document 1: Japanese Patent Application Laid-Open No. 2016-63165

Patent Document 2: Japanese Patent Application Laid-Open No. 2011-138927

SUMMARY OF THE INVENTION

Problems to be Solved by the Invention

However, in the imaging device disclosed in Japanese Patent Application Laid-Open No. 2016-63165, there is a problem of semiconductor layer alteration that occurs when heat is applied to the semiconductor layer by annealing or the like in the manufacturing process after the semiconductor layer is formed to cover the storage electrode and the second insulating layer, or due to changes in the imaging device over time.

Therefore, an object of the present disclosure is to provide an imaging device, a stacked imaging device, and a solid-state imaging apparatus that have stable characteristics even in the manufacturing process during which heat is applied, and with changes over time.

Solutions to Problems

An imaging device according to a first embodiment of the present disclosure for achieving the above object includes a photoelectric conversion unit in which a first electrode, a photoelectric conversion layer, and a second electrode are stacked.

A semiconductor material layer including an inorganic oxide semiconductor material having an amorphous structure at least in a portion is formed between the first electrode and the photoelectric conversion layer, and the formation energy of an inorganic oxide semiconductor material that has the same composition as the inorganic oxide semiconductor material having an amorphous structure and has a crystalline structure has a positive value.

An imaging device according to a second embodiment of the present disclosure for achieving the above object includes a photoelectric conversion unit in which a first electrode, a photoelectric conversion layer, and a second electrode are stacked.

A semiconductor material layer including an inorganic oxide semiconductor material having an amorphous structure at least in a portion is formed between the first electrode and the photoelectric conversion layer, the composition of the inorganic oxide semiconductor material having an amorphous structure is formed with N kinds of metallic atoms $M_n$ (n=2, 3, . . . , N) and oxygen atoms, and the reaction energy at the time when an inorganic oxide semiconductor material having a crystalline structure is generated on the basis of a reaction of N kinds of metallic oxides (single-metal oxides) formed with the metallic atoms $M_n$ and oxygen atoms has a positive value.

A stacked imaging device of the present disclosure for achieving the above object includes at least one imaging device of the present disclosure described above.

A solid-state imaging apparatus according to the first embodiment of the present disclosure for achieving the above object includes a plurality of imaging devices of the present disclosure described above. Alternatively, a solid-state imaging apparatus according to the second embodiment of the present disclosure for achieving the above object includes a plurality of stacked imaging devices of the present disclosure described above.

MODE FOR CARRYING OUT THE INVENTION

Figure 1:
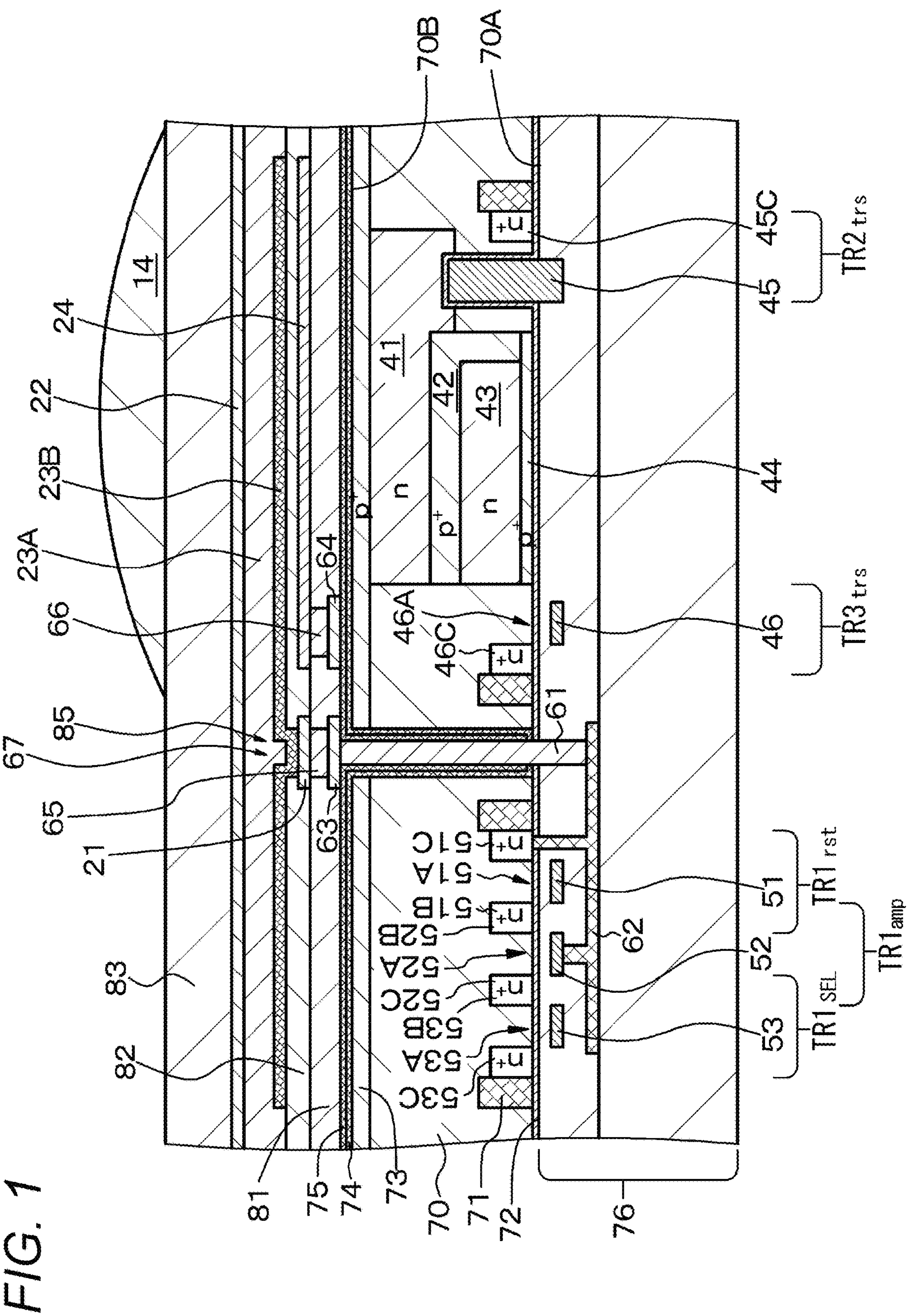
FIG. 1 is a schematic partial cross-sectional view of an imaging device of Example 1.

The following is a description of the present disclosure based on embodiments, with reference to the drawings. However, the present disclosure is not limited to the embodiments, and the various numerical values and materials mentioned in the embodiments are merely examples. Note that explanation will be made in the following order.

1. General description of imaging devices according to first and second embodiments of the present disclosure, stacked imaging devices of the present disclosure, and solid-state imaging apparatuses according to the first and second embodiments of the present disclosure 2. Example 1 (imaging devices according to the first and second embodiments of the present disclosure, a stacked imaging device of the present disclosure, and a solid-state imaging apparatus according to the second embodiment of the present disclosure)

3. Example 2 (a modification of Example 1)

4. Example 3 (modifications of Examples 1 and 2, and a solid-state imaging apparatus according to the first embodiment of the present disclosure)

5. Example 4 (modifications of Examples 1 to 3, and an imaging device including a transfer control electrode)

6. Example 5 (modifications of Examples 1 to 4, and an imaging device including a charge emission electrode)

7. Example 6 (modifications of Examples 1 to 5, and an imaging device including a plurality of charge storage electrode segments)

8. Example 7 (imaging devices of first and sixth configurations)

9. Example 8 (imaging devices of second and sixth configurations of the present disclosure)

10. Example 9 (an imaging device of the third configuration)

11. Example 10 (an imaging device of the fourth configuration)

12. Example 11 (an imaging device of the fifth configuration)

13. Example 12 (an imaging device of the sixth configuration)

14. Example 13 (solid-state imaging apparatuses of the first and second configurations)

15. Example 14 (a modification of Example 13)

16. Other aspects

<General Description of Imaging Devices According to First and Second Embodiments of the Present Disclosure, Stacked Imaging Devices of the Present Disclosure, and Solid-State Imaging Apparatuses According to the First and Second Embodiments of the Present Disclosure>

In an imaging device according to a first embodiment of the present disclosure, an imaging device according to the first embodiment of the present disclosure forming a stacked imaging device of the present disclosure, and an imaging device according to the first embodiment of the present disclosure forming a solid-state imaging apparatus according to the first or second embodiment of the present disclosure (these imaging devices will be hereinafter collectively referred to as "imaging devices or the like according to the first embodiment of the present disclosure" in some cases), formation energy is defined as the reaction energy at a time when an inorganic oxide semiconductor material having a crystalline structure is generated on the basis of a plurality of starting materials for generating an inorganic oxide semiconductor material having a crystalline structure.

In the above mode of an imaging device or the like according to the first embodiment of the present disclosure, each of the starting materials may include metallic atoms that constitute an inorganic oxide semiconductor material. Electrons or holes (positive charges) can be used as signal charges generated in an imaging device. However, in a case where electrons are used, the metallic element forming an inorganic oxide semiconductor material may have a closed-shell d orbital. Furthermore, in these cases, each of the starting materials may be formed with an oxide (a metallic oxide) formed with metallic atoms constituting an inorganic oxide semiconductor material and oxygen atoms. Further, in an imaging device according to the second embodiment of the present disclosure, an imaging device according to the second embodiment of the present disclosure forming a stacked imaging device of the present disclosure, and an imaging device according to the second embodiment of the present disclosure forming a solid-state imaging apparatus according to the first or second embodiment of the present disclosure (these imaging devices will be hereinafter collectively referred to as "imaging devices or the like according to the second embodiment of the present disclosure" in some cases), metallic atoms may have a closed-shell d orbital.

In a metallic oxide, a metallic ion having a closed-shell d orbital has a spatially-large unoccupied s orbital, because of the electrostatic shielding effect of the closed-shell d orbital. Therefore, in the metallic oxide, the conduction band minimum (CBM), which serves as an electron path, is combined with the spatially-large unoccupied s orbital, resulting in a highly delocalized orbital. A highly delocalized orbital has a high carrier mobility, and accordingly, is suitable for an inorganic oxide semiconductor material forming a semiconductor material layer.

Furthermore, in the cases with these configurations in imaging devices or the like according to the first and second embodiments of the present disclosure, specific metallic atoms having a closed-shell d orbital may be metallic atoms selected from the group consisting of copper (Cu), silver (Ag), gold (Au), zinc (Zn), gallium (Ga), germanium (Ge), indium (In), tin (Sn), thallium (Tl), cadmium (Cd), mercury (Hg), and lead (Pb), or preferably, may be metallic atoms selected from the group consisting of copper (Cu), silver (Ag), gold (Au), zinc (Zn), gallium (Ga), germanium (Ge), indium (In), tin (Sn), and thallium (Tl), or more preferably, do not include indium (In), or even more preferably, may be metallic atoms selected from the group consisting of copper (Cu), silver (Ag), zinc (Zn), gallium (Ga), germanium (Ge), and tin (Sn). Here, more preferably, examples of combinations of metallic atoms include (In, Ga), (In, Zn), (In, Sn), (Ga, Sn), (Ga, Zn), (Zn, Sn), (Cu, Zn), (Cu, Ga), (Cu, Sn), (Ag, Zn), (Ag, Ga), and (Ag, Sn). Alternatively, the semiconductor material layer may be formed with $Ga_{x1}Sn_{y1}O$, and $$0.28 \leq [y1/(x1+y1)] \leq 0.38$$

may be satisfied. The composition of the semiconductor material layer can be determined on the basis of ICP emission spectroscopy (high-frequency inductively coupled plasma emission spectroscopy, ICP-AES) or X-ray photoelectron spectroscopy (XPS), for example. Note that, in the film formation process for the semiconductor material layer in some cases, other impurities such as hydrogen and other metals or metal compounds may be mixed in. However, if the amount of such impurities is small (3% or less by mole fraction, for example), the impurities may be allowed to be mixed in.

When the formation energy of an inorganic oxide semiconductor material was calculated, the density functional theory (DFT) of the plane wave basis of Vienna Ab initio Simulation Package (VASP) was used (see https://www.vasp.at/). As the density functional, PBE (Perdew-Burke-Ernzerhof) was used (see J. P. Perdew, K. Burke, and M. Ernzerhof, Phys. Rev. Lett. 77, 3865, (1996)), and inner shell electrons were approximated by the Projector Augmented Wave (PAW) technique (see P. E. Bloechl, Phys. Rev. B, 50, 17953, (1994)). Regarding metallic elements, in addition to s orbital and p orbital electrons, 4d-orbital In, 3d-orbital Ga, and 3d-orbital Zn were also exposed as valence electrons. Specifically, the functionals "In_d", "Ga_d", "Zn", "Sn", and "0" accompanying VASP 5.4 were used. The cutoff energy of the plane wave basis was 400 eV. Regarding k points, according to the k-point number setting method compliant with USPEX (Universal Structure Predictor: Evolutionary Xtallography), k points were set so that the resolution became 0.06 (unit: 2η/Å) in a reciprocal lattice space. However, to determine the formation energy, it is not always necessary to use computer simulation, but whether the formation energy is positive or negative can be determined by differential scanning calorimetry (DSC), for example.

To calculate the formation energy of an inorganic oxide semiconductor material that has the same composition as an inorganic oxide semiconductor material having an amorphous structure in a semiconductor material layer, and has a crystalline structure, information about the crystalline structure is necessary. If this information is not available, it is possible to obtain crystals by mixing and sintering single-metal oxide crystals so that the same composition is obtained. The resultant crystalline structure may be identified by single-crystal or powder X-ray analysis, for example. Further, a composition substantially equal to the composition of the semiconductor material layer may be used in a crystalline structure search using software such as USPEX (see A. R. Oganov and C. W. Glass, The Journal of Chemical Physics, 124, 244704, (2006); A. O. Lyakhov, A. R. Oganov, H. T. Stokes, and Q. Zhu, Comp. Phys. Comm., 184, 1172, (2013); and A. R. Oganov, A. O. Lyakhov, and M. Valle, Accounts of Chemical Research, 44, 227, (2011)). USPEX is linked with VASP to search for a stable crystalline structure so that the total energy to be calculated by VASP will be low. The calculation conditions used in this case are the same as the calculation conditions for VASP described above. As for the USPEX structure search conditions, the population size (populationSize) is 20, and the number of generations (numGenerations) is 40. Calculation is performed under such conditions, and the most stable structure is adopted as the structure of the composition. Further, in a case where the composition is unknown, it is possible to know the composition of the semiconductor material layer by energy dispersive X-ray microanalyzer (EDX) or the like. Whether or not the semiconductor material layer including an inorganic oxide semiconductor material is amorphous can be determined on the basis of X-ray diffraction analysis.

Imaging devices of the present disclosure may be CCD devices, CMOS image sensors, contact image sensors (CIS), or signal-amplifying image sensors of a charge modulation device (CMD) type. A solid-state imaging apparatus according to the first or second embodiment of the present disclosure, or a solid-state imaging apparatus of first or second configuration described later can form a digital still camera, a digital video camera, a camcorder, a surveillance camera, a camera to be mounted in a vehicle, a smartphone camera, a game user interface camera, a biometric authentication camera, or the like, for example.

Example 1

Figure 2:
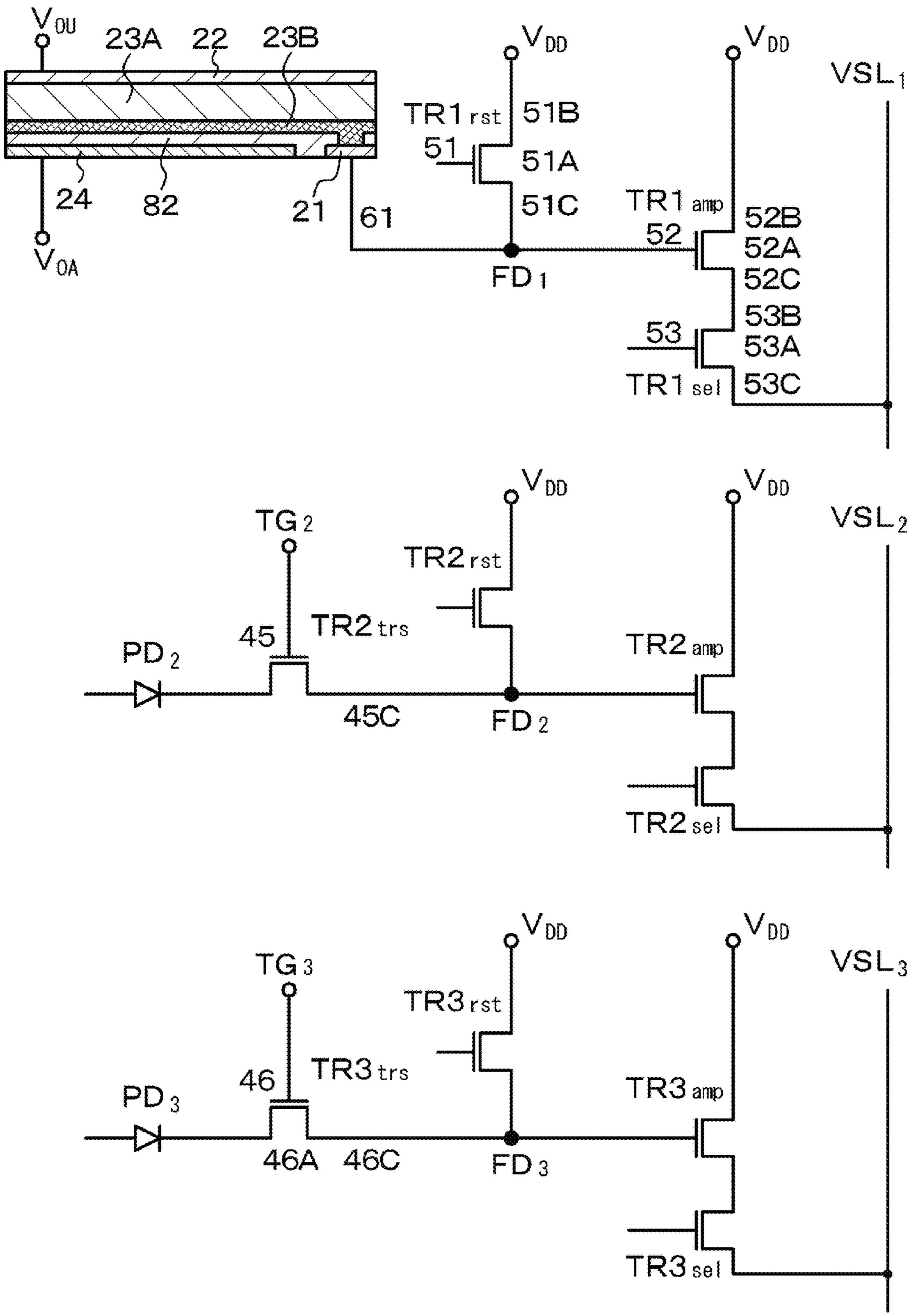
FIG. 2 is an equivalent circuit diagram of an imaging device of Example 1.
Figure 3:
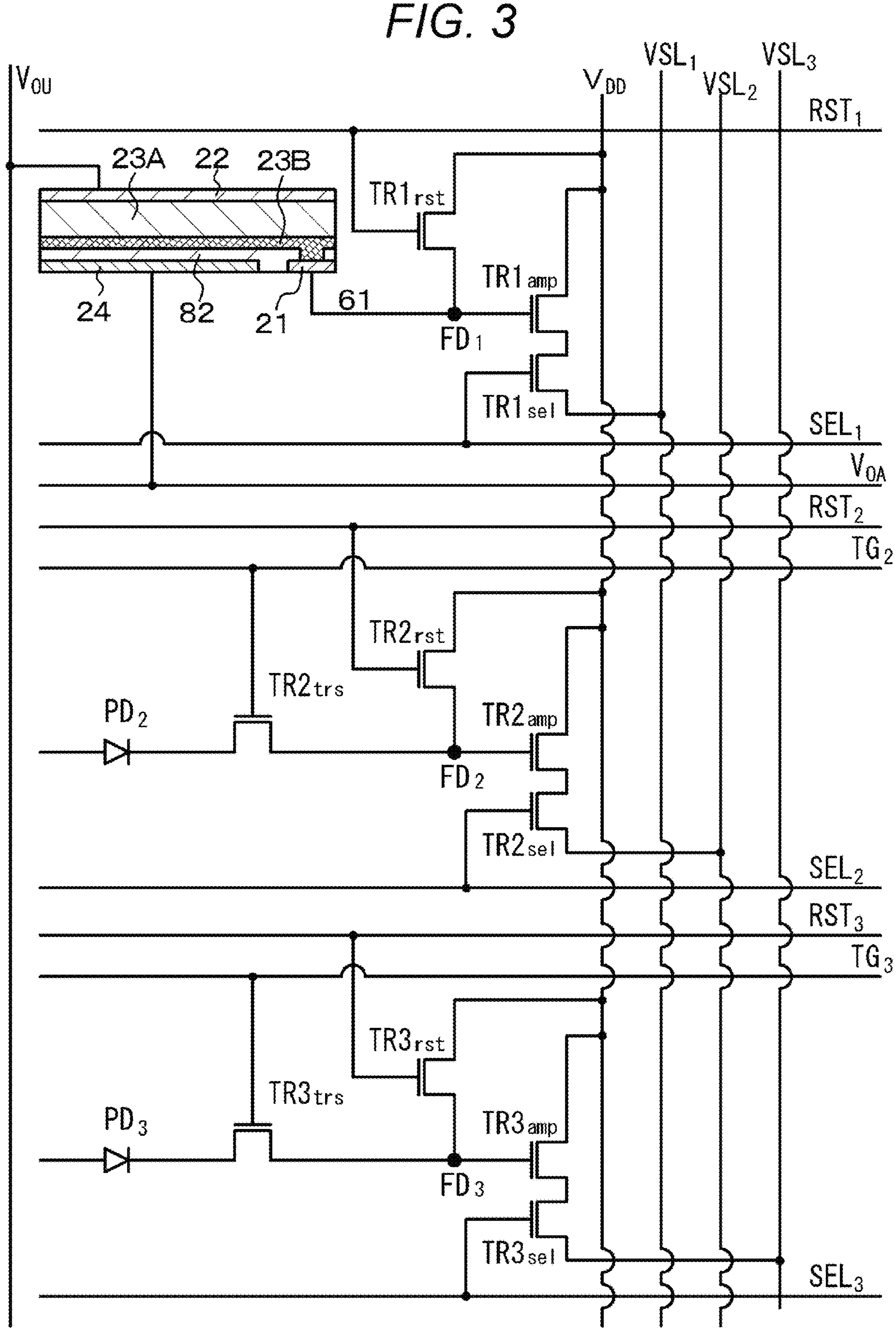
FIG. 3 is an equivalent circuit diagram of an imaging device of Example 1.
Figure 4:
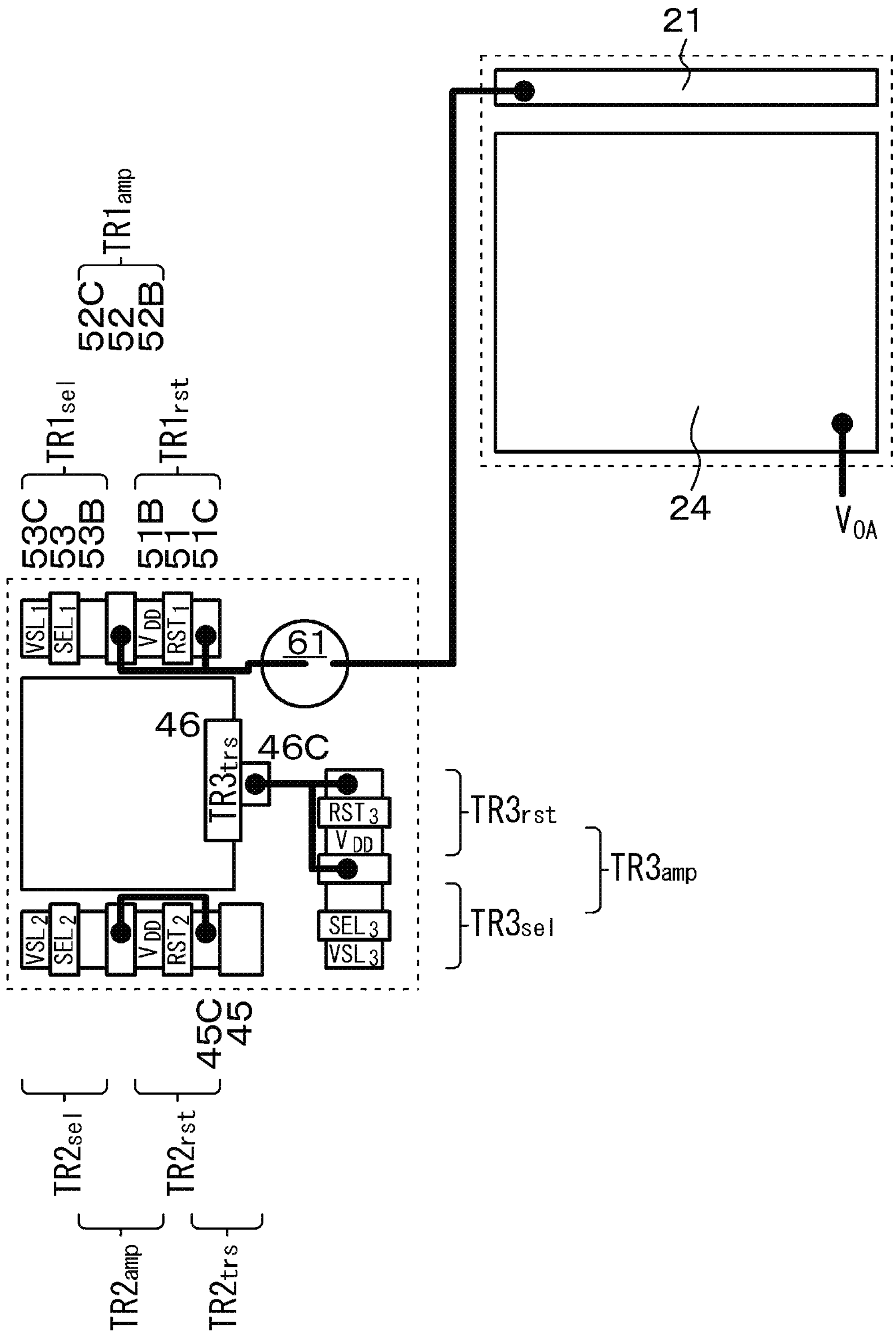
FIG. 4 is a schematic layout diagram of a first electrode, a charge storage electrode, and the transistors constituting a control unit of an imaging device of Example 1.

Example 1 relates to imaging devices according to the first and second embodiments of the present disclosure, a stacked imaging device according to the present disclosure, and a solid-state imaging apparatus according to the second embodiment of the present disclosure. FIG. 1 shows a schematic partial cross-sectional view of an imaging device and a stacked imaging device (hereinafter referred to simply as the "imaging device") of Example 1. FIGS. 2 and 3 show equivalent circuit diagrams of the imaging device of Example 1. FIG. 4 shows a schematic layout diagram of a first electrode and a charge storage electrode that constitute a photoelectric conversion unit of the imaging device of Example 1, and transistors that constitute a control unit. FIG.

Figure 6A:
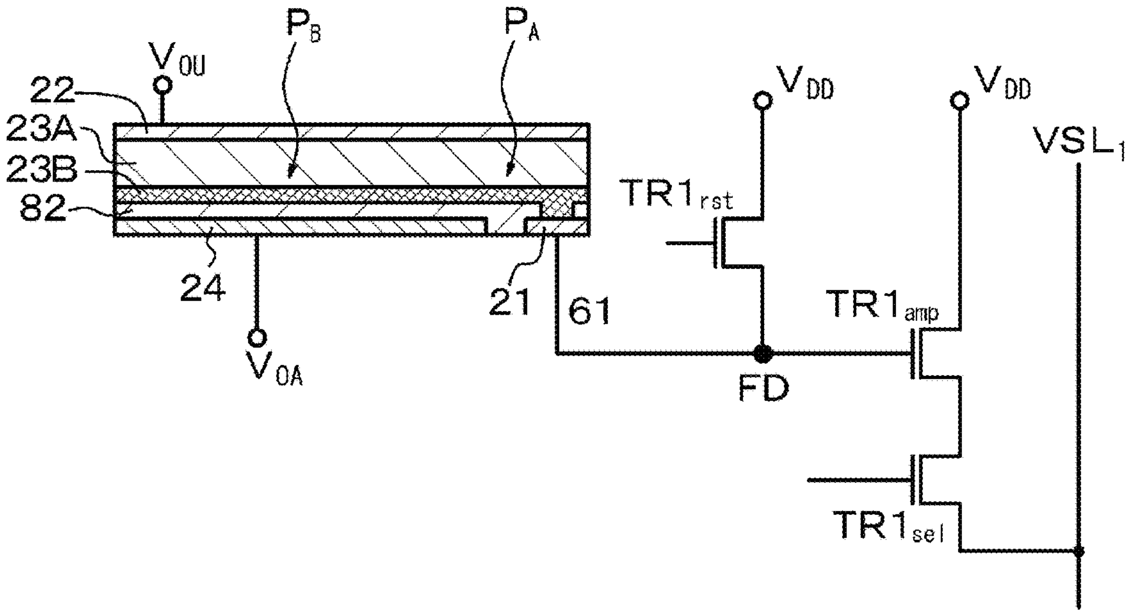
FIGS. 6A, 6B, and 6C are equivalent circuit diagrams of imaging devices of Example 1, Example 4, and Example 6, for explaining respective portions shown in FIG. 5 (Example 1), FIGS. 20 and 21 (Example 4), and FIGS. 32 and 33 (Example 6).
Figure 7:
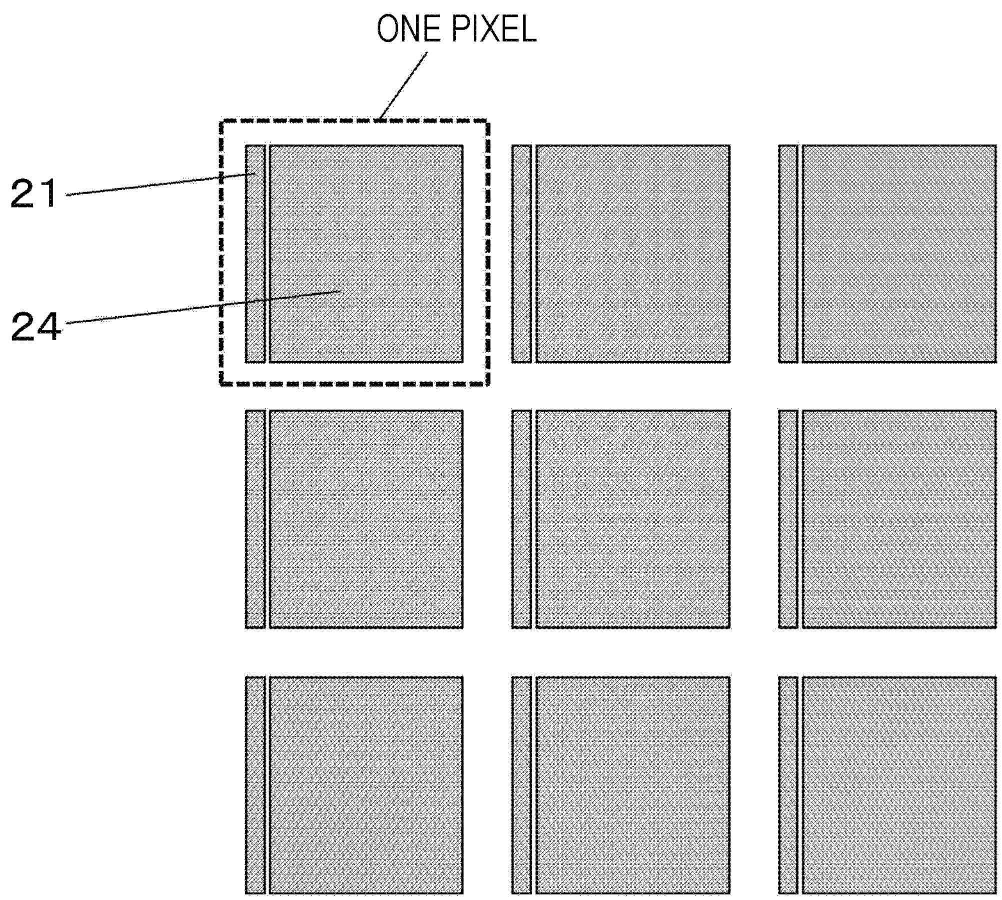
FIG. 7 is a schematic layout diagram of a first electrode and a charge storage electrode that constitute an imaging device of Example 1.
Figure 8:
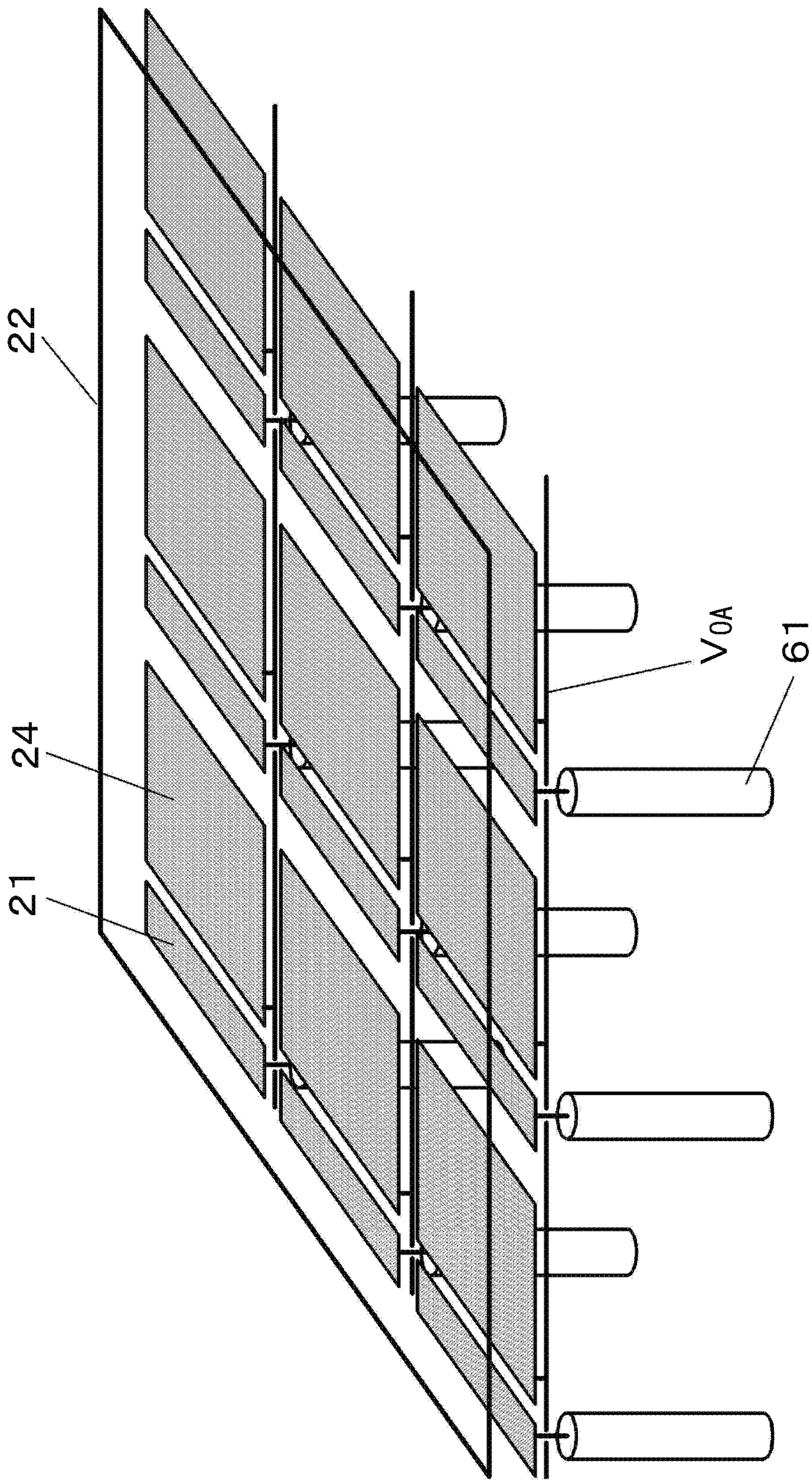
FIG. 8 is a schematic perspective view of a first electrode, a charge storage electrode, a second electrode, and a contact hole portion that constitute an imaging device of Example 1.
Figure 76:
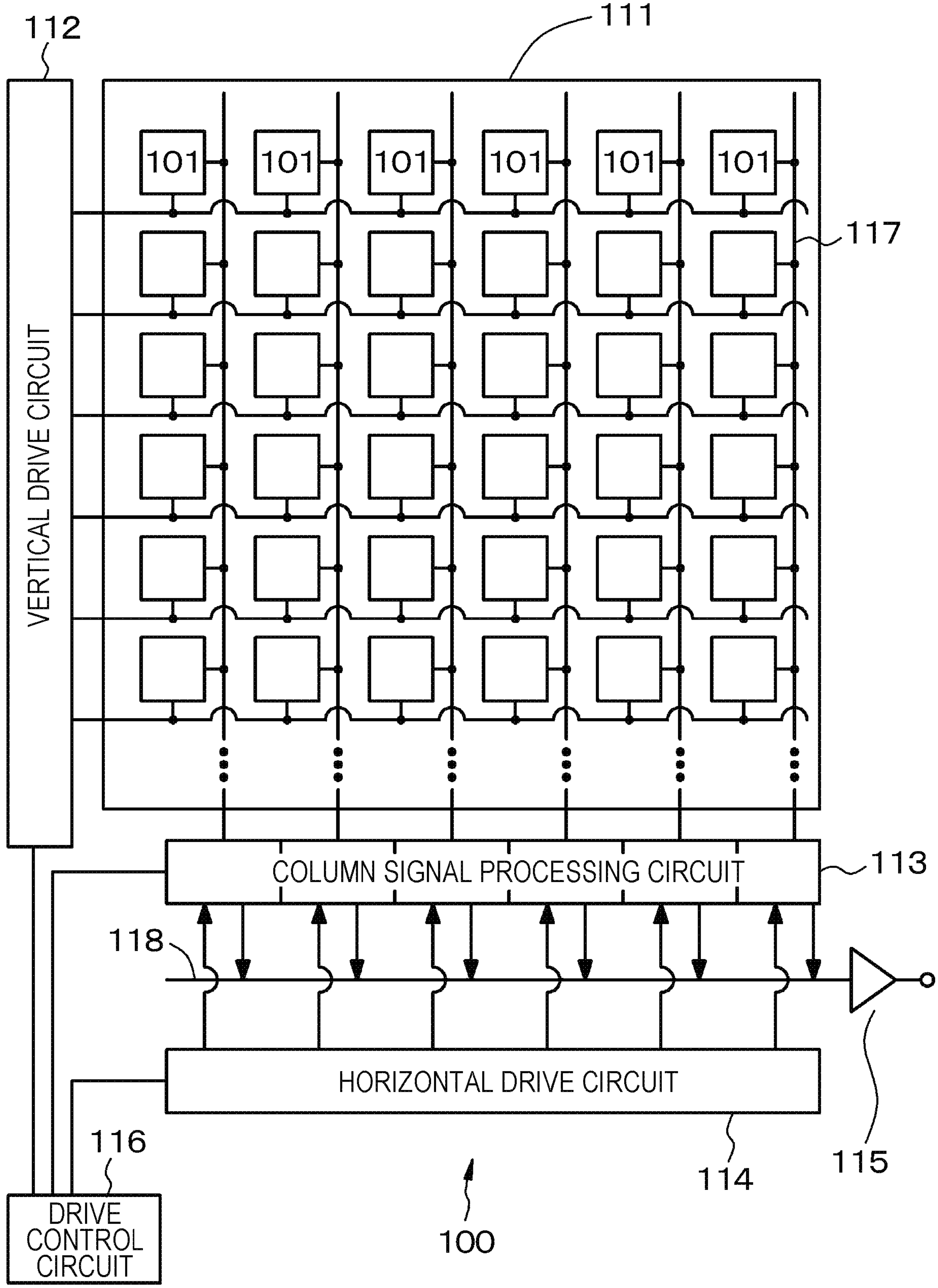
FIG. 76 is a conceptual diagram of a solid-state imaging apparatus of Example 1.

5 schematically shows the states of the potential at respective portions at a time of operation of the imaging device of Example 1. FIG. 6A shows an equivalent circuit diagram for explaining the respective portions of the imaging device of Example 1. Also, FIG. 7 shows a schematic layout diagram of the first electrode and the charge storage electrode that constitute the photoelectric conversion unit of the imaging device of Example 1. FIG. 8 shows a schematic perspective view of the first electrode, the charge storage electrode, a second electrode, and a contact hole portion. Further, FIG. 76 shows a conceptual diagram of the solid-state imaging apparatus of Example 1.

An imaging device of Example 1 includes a photoelectric conversion unit in which a first electrode 21, a photoelectric conversion layer 23A, and a second electrode 22 are stacked. A semiconductor material layer 23B including an inorganic oxide semiconductor material having an amorphous structure at least at a portion thereof is formed between the first electrode 21 and the photoelectric conversion layer 23A. Further, in the imaging device of Example 1, the formation energy of an inorganic oxide semiconductor material that has the same composition as an inorganic oxide semiconductor material having an amorphous structure, and has a crystalline structure (or the formation energy at the time when this inorganic oxide semiconductor material is generated, or the formation energy at the time when this inorganic oxide semiconductor material is supposedly to be generated) has a positive value. Here, in a case where a composition is within ±5% of the set composition, the composition is regarded as the "same composition". In a sputtering method, it is generally known that, even when a sputtering target having a desired composition is used, the composition of the resultant semiconductor material layer differs within ±5% of the composition of the sputtering target (the set composition), depending on the process conditions and the like. Alternatively, in a case where the composition of an inorganic oxide semiconductor material having an amorphous structure is formed with N kinds of metallic atoms $M_n$ (n=2, 3, . . . , N) and oxygen atoms, and an inorganic oxide semiconductor material having a crystalline structure is generated (or is supposedly to be generated) on the basis of reactions of N kinds of metallic oxides formed with the metallic atoms $M_n$ and oxygen atoms, the reaction energy has a positive value.

Here, the formation energy is defined as the reaction energy at a time when an inorganic oxide semiconductor material having a crystalline structure is generated on the basis of a plurality of starting materials for forming an inorganic oxide semiconductor material having a crystalline structure. Further, in Example 1, the signal charges generated in the imaging device are electrons, the metallic element or the metallic atoms forming an inorganic oxide semiconductor material have a closed-shell d orbital, and each of the starting materials is formed with an oxide (a metallic oxide) formed with the metallic atoms constituting an inorganic oxide semiconductor material and oxygen atoms. Examples of metallic atoms having a closed-shell d orbital include the various kinds of metallic atoms described above.

Further, in the imaging device of Example 1, the photoelectric conversion unit includes also includes an insulating layer 82, and a charge storage electrode 24 that is disposed at a distance from the first electrode 21 and is positioned to face the semiconductor material layer 23B via the insulating layer 82. The semiconductor material layer 23B has a region in contact with the first electrode 21, a region that is in contact with the insulating layer 82 and does not have the charge storage electrode 24 existing under the semiconductor material layer 23B, and a region that is in contact with the insulating layer 82 and has the charge storage electrode 24 existing under the semiconductor material layer 23B. Note that light enters from the second electrode 22.

A stacked imaging device of Example 1 includes at least one imaging device of Example 1. Also, a solid-state imaging apparatus of Example 1 includes a plurality of stacked imaging devices of Example 1. Further, the solid-state imaging apparatus of Example 1 forms a digital still camera, a digital video camera, a camcorder, a surveillance camera, a camera to be mounted in a vehicle (an in-vehicle camera), a smartphone camera, a game user interface camera, a biometric authentication camera, or the like, for example.

Figure 79A:
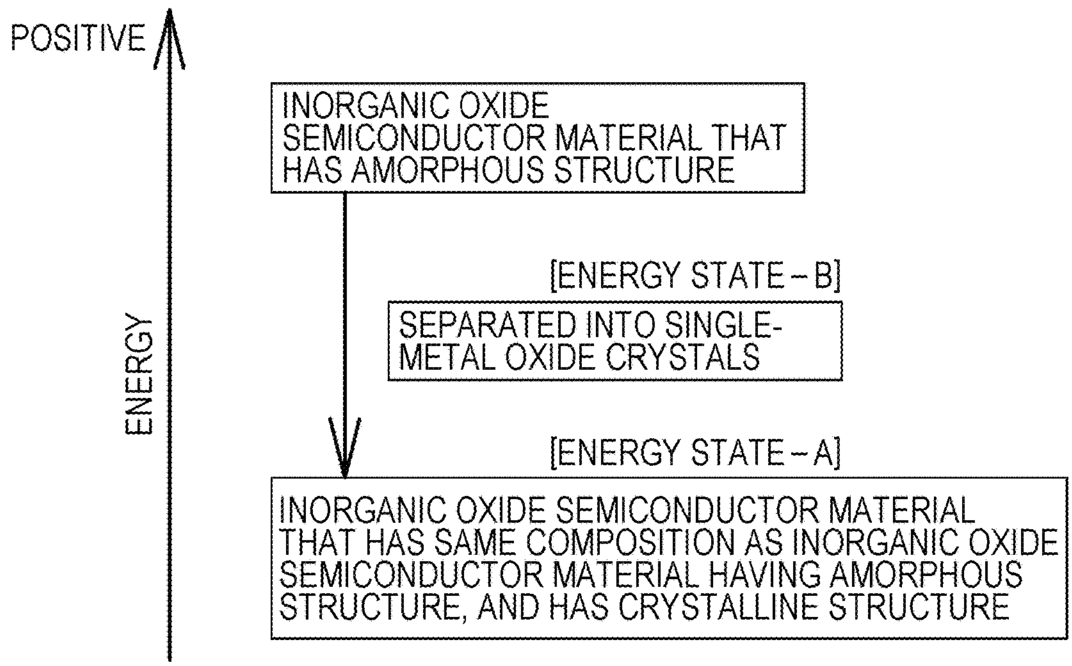
FIGS. 79A and 79B are charts schematically showing the energy state (an energy state—A) of an inorganic oxide semiconductor material that has the same composition as an inorganic oxide semiconductor material having an amorphous structure and has a crystalline structure, and the energy state (an energy state—B) estimated on the assumption that this inorganic oxide semiconductor material is separated into compound crystals with fewer elements.
Figure 79B:
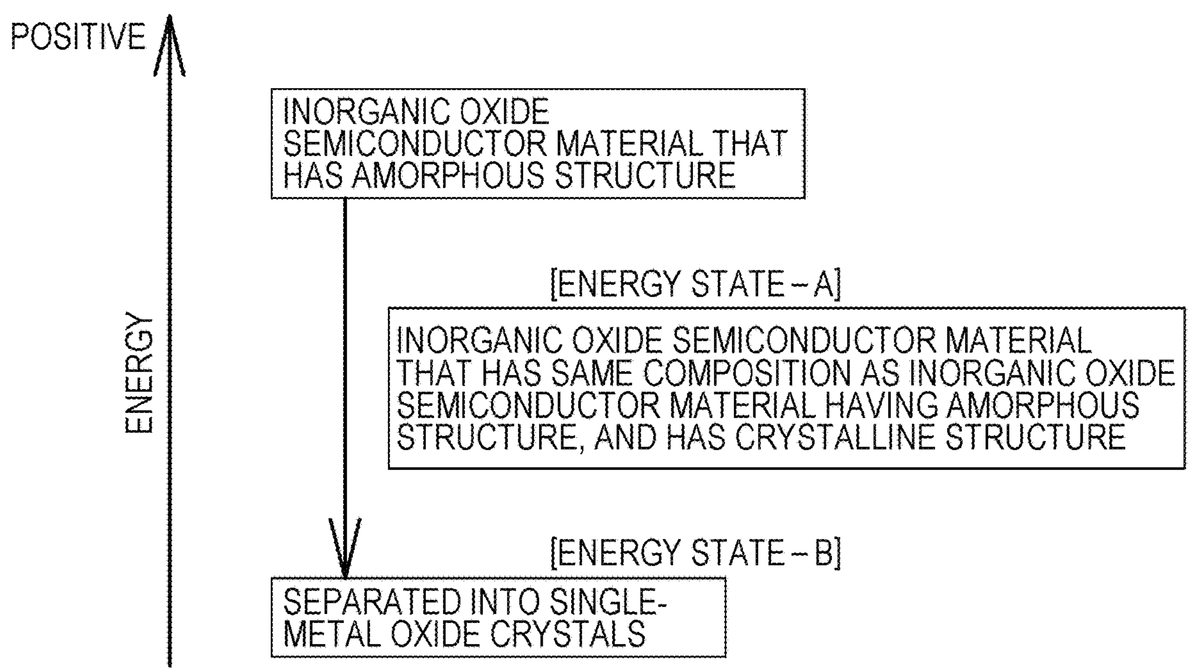

Meanwhile, a semiconductor material layer is formed in an amorphous state on the basis of a physical vapor deposition method (PVD method) such as a sputtering method or a vacuum vapor deposition method. The amorphous state is a metastable state of the material. From a statistical thermodynamic point of view, the semiconductor material layer may be altered in an energy-stable direction by an annealing treatment after the semiconductor material layer is formed, and heat and light irradiation during use of the imaging device. That is, the state of the semiconductor material layer can shift in a more stable direction after the annealing treatment or deterioration over time. Meanwhile, an energy state (called the "energy state—A", for convenience) that has the same composition as an inorganic oxide semiconductor material having an amorphous structure, and has a crystalline structure is compared with the energy state (called the "energy state—B", for convenience) estimated on the assumption that this inorganic oxide semiconductor material is separated into compound crystals (single-metal oxide crystals) with fewer elements, and which energy state is more stable is determined (see FIGS. 79A and 79B). That is, whether the reaction energy at the time when an inorganic oxide semiconductor material having a crystalline structure is generated on the basis of reactions of N kinds of metallic oxides (single-metal oxides) formed with metallic atoms $M_n$ and oxygen atoms has a positive value (an energetically stable state) or has a negative value (an energetically unstable state) is determined, In a case where the energy state—A is more stable than the energy state—B (see FIG. 79A), which is a case where the energy state—A is energetically lower than the energy state—B, or, in other words, in a case where the formation energy of an inorganic oxide semiconductor material that has the same composition as an inorganic oxide semiconductor material having an amorphous structure, and has a crystalline structure has a positive value (an imaging device according to the first embodiment of the present disclosure), or in a case where the reaction energy at the time when an inorganic oxide semiconductor material having a crystalline structure is generated on the basis of reactions of N kinds of metallic oxides formed with metallic atoms $M_n$ and oxygen atoms (an imaging device or the like according to the second embodiment of the present disclosure), it is safe to say that the semiconductor material layer is stable with respect to an annealing treatment after the semiconductor material layer is formed, and heat and light irradiation during use of the imaging device. Conversely, in a case where the energy state—B is more stable than the energy state—A, which is a case where the energy state—A is energetically higher than the energy state—B, or, in other words, in a case where the formation energy or the reaction energy has a negative value (see FIG. 79B), the semiconductor material layer is unstable with respect to the annealing process after the formation of the semiconductor material layer, and the heat and light irradiation during the use of the imaging device, and phase separation might occur, resulting in alteration of the semiconductor material layer. Further, as the semiconductor material layer is stable, it is possible to obtain an imaging device that is stable with respect to the manufacturing process after the formation of the semiconductor material layer, has a high manufacturing yield, and further has high durability.

In the imaging device of Example 1, the following three kinds of inorganic oxide semiconductor materials were examined as the inorganic oxide semiconductor material that has an amorphous structure and forms the semiconductor material layer 23B:

Example 1-A: $Ga_2SnO_5$ (Ga atom proportion:Sn atom proportion=2:1);

Example 1-B: $InGaO_3$ (In atom proportion:Ga atom proportion=1:1); and

Example 1-C: $In_2Sn_2O_7$ (In atom proportion:Sn atom proportion=1:1). As for comparative examples, the following two kinds were also examined:

Comparative Example 1-A: $Zn_2SnO_4$ (Zn atom proportion:Sn atom proportion=2:1); and Comparative Example 1-B: $Ga_2Sn_6O_{15}$ (Ga atom proportion:Sn atom proportion=1:3).

In the description below, the various characteristics of the imaging device of Example 1 will be first described, and, after that, the imaging device and a solid-state imaging apparatus of Example 1 will be described in detail.

As test samples, semiconductor material layers were formed with Example 1-A, Example 1-B, Comparative Example 1-A, and Comparative Example 1-B described above, the thickness of each semiconductor material layer was 50 nm, and the semiconductor material layers were formed on a silicon semiconductor substrate on the basis of a sputtering method. The semiconductor material layers were then subjected to heat treatment at 350° C. for 120 minutes, and the surface roughnesses Ra and Rq of the semiconductor material layers before and after the heat treatment were obtained. The results were as shown below. The surface roughnesses Ra and Rq are based on JIS B0601: 2013. Such smoothness of the semiconductor material layer surface at the interface between the photoelectric conversion layer and the semiconductor material layer reduces scattering and reflection on the semiconductor material layer surface, and can improve the bright current characteristics in photoelectric conversion. Therefore, the values of the surface roughnesses Ra and Rq are preferably small, and changes in the values of the surface roughnesses Ra and Rq before and after the heat treatment serve as the indices of the thermal stability of the semiconductor material layers.

TABLE 1

| | Ra (before heat treatment) | Ra (after heat treatment) |
|---|---|---|
| Example 1-A | 0.6 nm | 0.6 nm |
| Example 1-B | 0.7 nm | 0.7 nm |
| Comparative Example 1-A | 0.7 nm | 0.8 nm |
| Comparative Example 1-B | 0.8 nm | 0.9 nm |

TABLE 2

| | Rq (before heat treatment) | Rq (after heat treatment) |
|---|---|---|
| Example 1-A | 2.5 nm | 2.4 nm |
| Example 1-B | 2.4 nm | 2.3 nm |
| Comparative Example 1-A | 2.7 nm | 2.8 nm |
| Comparative Example 1-B | 2.7 nm | 2.9 nm |

Figure 82:
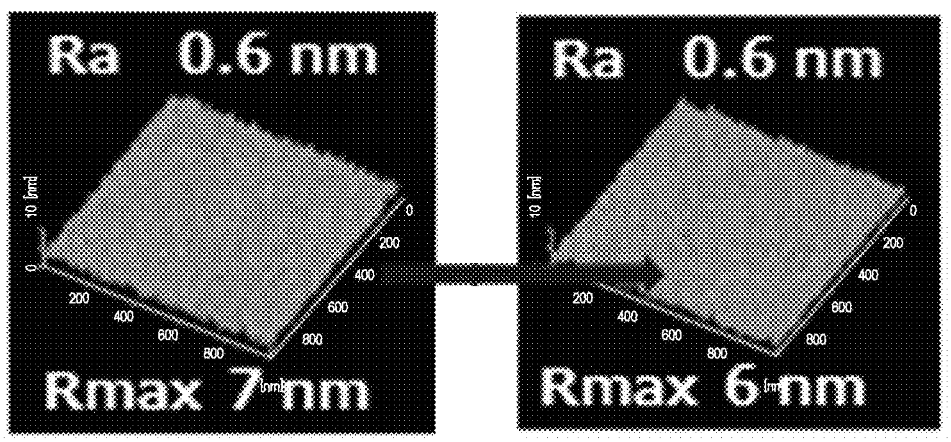
FIG. 82 is electron micrographs showing a result of measurement of a change in the roughness of a semiconductor material layer surface before and after annealing.
Figure 83A:
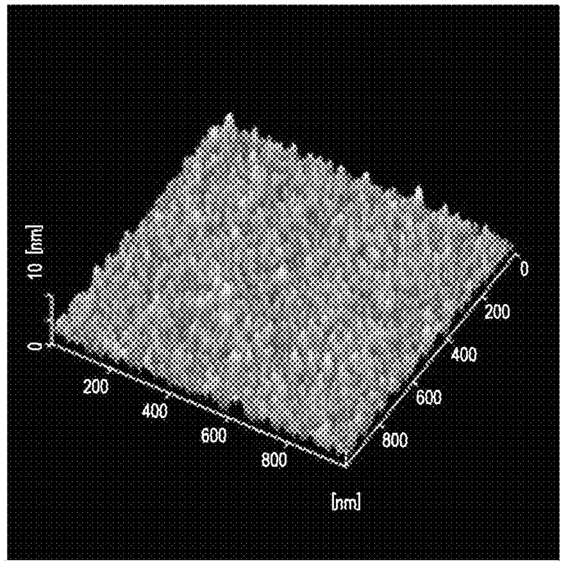
FIGS. 83A and 83B are electron micrographs showing a result of measurement of a change in the roughness of a semiconductor material layer surface before and after annealing.
Figure 83B:
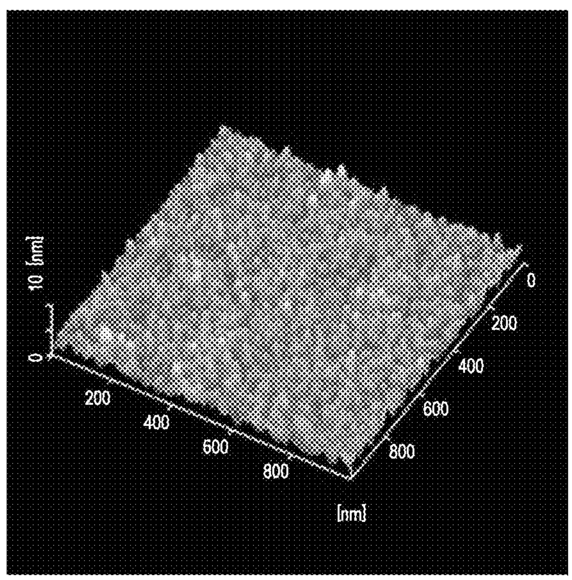

FIG. 82 shows electron micrographs showing the results of evaluation of the surface roughness in an evaluation sample in Example 1-A [y1/(x1+y1)=0.33]. The electron micrograph on the left side in FIG. 82 was taken immediately after the film formation, and the electron micrograph on the right side in FIG. 82 was taken after annealing at 350° C. for 120 minutes. The value of Ra is 0.6 nm before the annealing and is 0.6 nm after the annealing, and the value of $R_{max}$ is 7 nm before the annealing and is 6 nm after the annealing. Changes are hardly seen in the surface roughness of the semiconductor material layer before and after the annealing, and the semiconductor material layer 23B has high heat resistance. FIGS. 83A and 83B also show electron micrographs showing the results of evaluation of the surface roughness in an evaluation sample in which y1/(x1+y1)=0.31 in Example 1. The electron micrograph in FIG. 83A was taken immediately after the film formation, and the electron micrograph in FIG. 83B was taken after annealing at 350° C. for 120 minutes. The value of Ra is 0.4 nm before the annealing and is 0.5 nm after the annealing, and the value of $R_{max}$ is 6 nm before the annealing and is 6 nm after the annealing. Changes are not seen in the surface roughness of the semiconductor material layer before and after the annealing, and the semiconductor material layer 23B has high heat resistance.

Further, the formation energies were calculated on the basis of the method described above. The levels of the formation energies and the thermal stabilities of the semiconductor material layers are summarized in Table 3 shown below.

TABLE 3

| | Formation energy or the like (eV/atom) | Level of thermal stability |
|---|---|---|
| Example 1-A | +0.004 | high |
| Example 1-B | +0.016 | high |
| Example 1-C | +0.078 | high |
| Comparative Example 1-A | −0.555 | low |
| Comparative Example 1-B | −0.089 | low |

Figure 80:
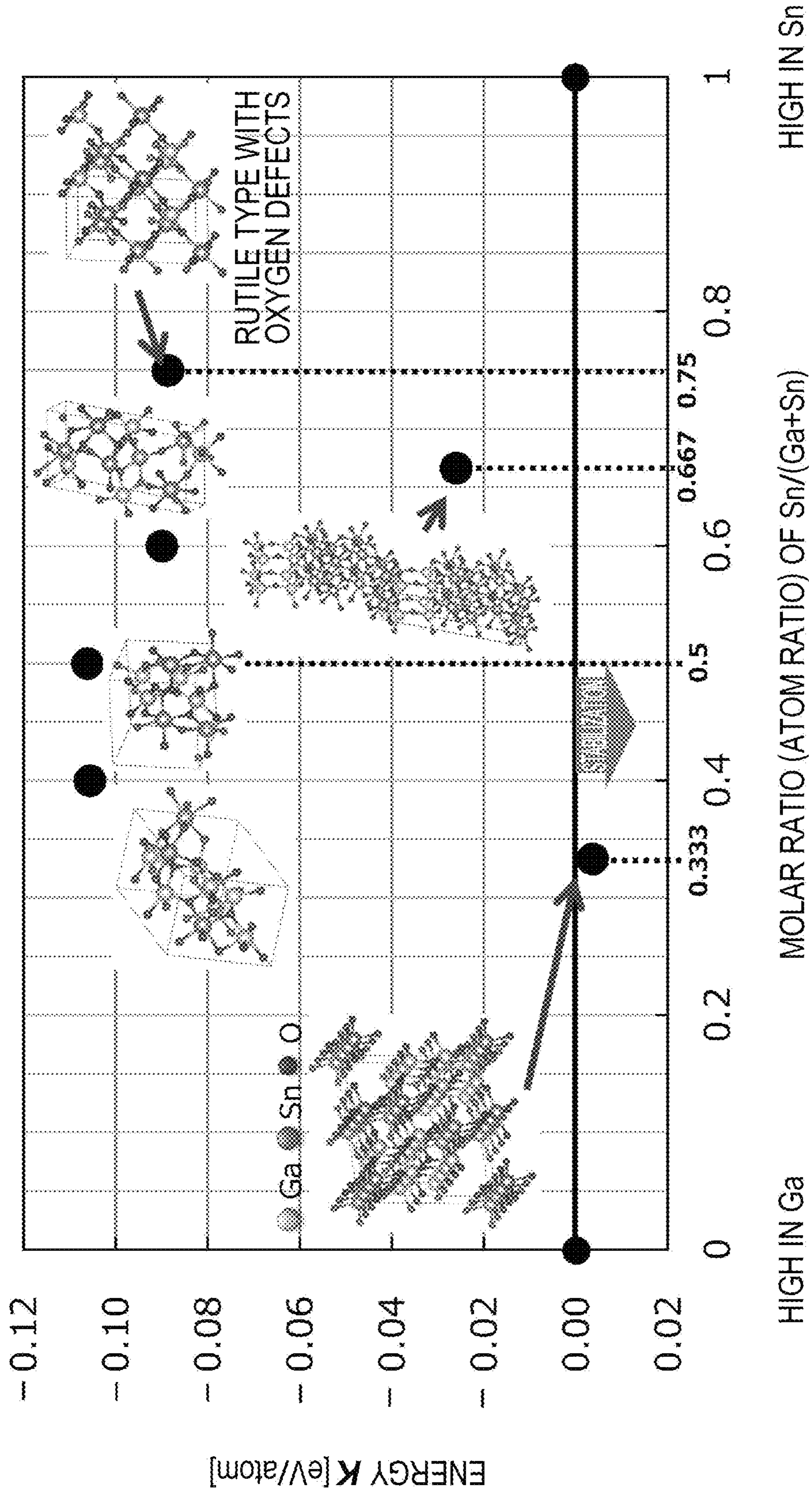
FIG. 80 is a graph showing the results of measurement of the formation energy or the like (eV/atom) and the level of terminal stability at a time when the Ga atom proportion and the Sn atom proportion were changed in a Ga—Sn—O based sample of Example 1-A.

Further, FIG. 80 shows the results of measurement of the formation energy or the like (eV/atom) and the level of terminal stability at a time when the Ga atom proportion and the Sn atom proportion were changed in the Ga—Sn—O based sample of Example 1-A. The results are also shown in Table 4 below. In order for the formation energy or the like (eV/atom) to have a positive value, (Ga atom proportion/Sn atom proportion), which is the value of (x1, y1) in $Ga_{x1}Sn_{y1}O$, preferably satisfies the following:

$$0.28 \leq [y1/(x1+y1)] \leq 0.38$$

$$0.62 \leq [x1/(x1+y1)] \leq 0.72$$

TABLE 4

| Ga—Sn—O based sample of Example 1-A | | |
|---|---|---|
| Ga atom proportion:Sn atom proportion | Formation energy or the like (eV/atom) | Level of thermal stability |
| 2:1 | +0.004 | high |
| 3:2 | −0.105 | low |
| 1:1 | −0.107 | low |
| 2:3 | −0.090 | low |
| 1:2 | −0.026 | low |
| 1:3 | −0.089 | low |

Figure 81:
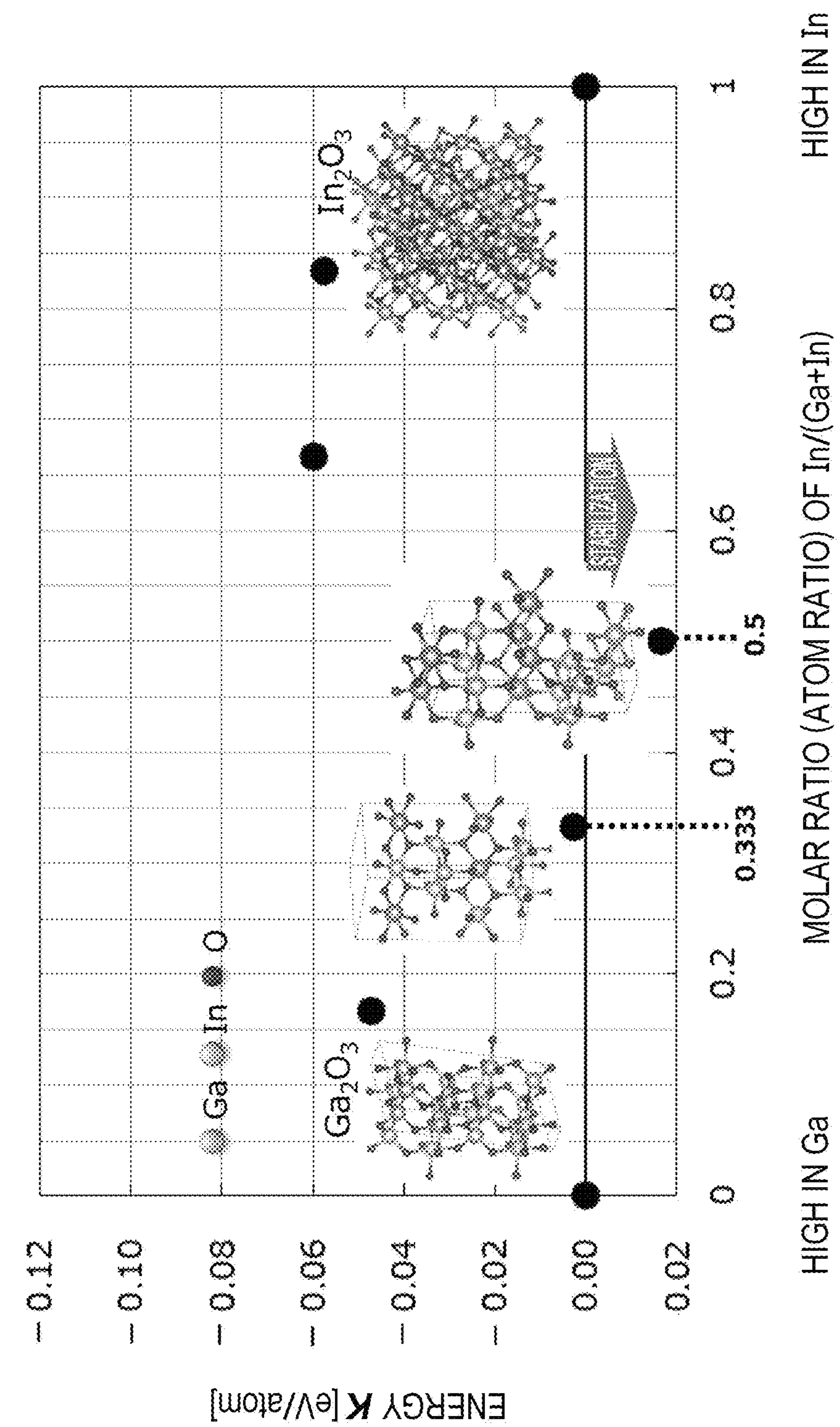
FIG. 81 is a graph showing the results of measurement of the formation energy or the like (eV/atom) and the level of terminal stability at a time when the In atom proportion and the Ga atom proportion were changed in an In—Ga—O based sample of Example 1-B.

Further, FIG. 81 shows the results of measurement of the formation energy or the like (eV/atom) and the level of terminal stability at a time when the In atom proportion and the Ga atom proportion were changed in the In—Ga—O based sample of Example 1-B. The results are also shown in Table 5 below. In order for the formation energy or the like (eV/atom) to have a positive value, (In atom proportion/Ga atom proportion), which is the value of (x2/y2) in $In_{x2}Sn_{y2}O$, preferably satisfies the following:

$$0.45\leq[(x2/(x2+y2)\}\leq 0.55$$

$$0.45\leq[(y2/(x2+y2)\}\leq 0.55$$

TABLE 5

| In—Ga—O based sample of Example 1-B | | |
|---|---|---|
| In atom proportion:Ga atom proportion | Formation energy or the like (eV/atom) | Level of thermal stability |
| 5:1 | −0.058 | low |
| 2:1 | −0.060 | low |
| 1:1 | +0.016 | high |
| 1:2 | −0.003 | low |
| 1:5 | −0.047 | low |

Further, in the imaging device of Example 1, the LUMO value $E_1$ of the material forming the portion of the photoelectric conversion layer 23A located in the vicinity of the semiconductor material layer 23B, and the LUMO value $E_2$ of the material forming the semiconductor material layer 23B satisfy the expression (A) shown below, or preferably, the expression (B) shown below.

$$E_2-E_1\leq 0.1\text{ eV} \quad (A)$$

$$E_2-E_1>0.1\text{ eV} \quad (B)$$

Alternatively, the carrier mobility of the material forming the semiconductor material layer 23B is 10 $cm^2/V\cdot s$ or higher. Meanwhile, the carrier concentration of the semiconductor material layer 23B is lower than $1\times10^{16}/cm^3$. Further, the optical transmittance of the semiconductor material layer 23B for light having a wavelength of 400 nm to 660 nm is 65% or higher (specifically, 83%), and the optical transmittance of the charge storage electrode 24 for light having a wavelength of 400 nm to 660 nm is also 65% or higher (specifically, 75%). The sheet resistance value of the charge storage electrode 24 is $3\times10$ to $1\times10^3$ (specifically, 84Ω/□).

Here, "the portion of the photoelectric conversion layer located in the vicinity of the semiconductor material layer" means the portion of the photoelectric conversion layer located in a region corresponding to 10% or less of the thickness of the photoelectric conversion layer (which is a region spreading from 0% to 10% of the thickness of the photoelectric conversion layer), with the reference being the interface between the semiconductor material layer and the photoelectric conversion layer. The LUMO value $E_1$ of the material forming the portion of the photoelectric conversion layer located in the vicinity of the semiconductor material layer is the average value in the portion of the photoelectric conversion layer located in the vicinity of the semiconductor material layer, and the LUMO value $E_2$ of the material forming the semiconductor material layer is the average value in the semiconductor material layer. The value of HOMO can be obtained on the basis of ultraviolet photoelectron spectroscopy (UPS method), for example. Further, a LUMO value can be calculated from {(valence band energy, HOMO value)+$E_b$}. Furthermore, the bandgap energy $E_b$ can be calculated from the wavelength λ (the optical absorption edge wavelength, the unit being nm) to be optically absorbed, according to the expression shown below:

$$E_b=h\nu=h(c/\lambda)=1239.8/\lambda[\text{eV}]$$

As described above, the formation energy of an inorganic oxide semiconductor material [specifically, $Ga_2SnO_5$] that has the same composition as an inorganic oxide semiconductor material [specifically, $Ga_2SnO_5$] having an amorphous structure, and has a crystalline structure has a positive value. Further, the reaction energy at the time when an inorganic oxide semiconductor material [specifically, $Ga_2SnO_5$] having a crystalline structure is generated on the basis of reactions of N kinds (specifically, two kinds) of metallic oxides (single-metal oxides) [specifically, $GaO_x$ and $SnO_y$] formed with metallic atoms $M_n$ [specifically, metallic atoms Ga and Sn] and oxygen atoms has a positive value. Alternatively, the formation energy of an inorganic oxide semiconductor material [specifically, $InGaO_6$] that has the same composition as an inorganic oxide semiconductor material [specifically, $InGaO_6$] having an amorphous structure, and has a crystalline structure has a positive value. Further, the reaction energy at the time when an inorganic oxide semiconductor material [specifically, $InGaO_6$] having a crystalline structure is generated on the basis of reactions of N kinds (specifically, two kinds) of metallic oxides (single-metal oxides) [specifically, $InO_x$ and $GaO_y$] formed with metallic atoms $M_n$ [specifically, metallic atoms In and Ga] and oxygen atoms has a positive value. Alternatively, the formation energy of an inorganic oxide semiconductor material [specifically, $In_2Sn_2O_7$] that has the same composition as an inorganic oxide semiconductor material [specifically, $In_2Sn_2O_7$] having an amorphous structure, and has a crystalline structure has a positive value. Further, the reaction energy at the time when an inorganic oxide semiconductor material [specifically, $In_2Sn_2O_7$] having a crystalline structure is generated on the basis of reactions of N kinds (specifically, two kinds) of metallic oxides (single-metal oxides) [specifically, $InO_x$ and $SnO_y$] formed with metallic atoms $M_n$ [specifically, metallic atoms In and Sn] and oxygen atoms has a positive value. Further, as a result of the above, the excellent effects described can be achieved.

That is, in the semiconductor material layer including an inorganic oxide semiconductor material, (1) there exists an inorganic oxide semiconductor material that has the same (or substantially the same) composition as an inorganic oxide semiconductor material having an amorphous structure at least in a portion thereof, and has a crystalline structure, and (2) the inorganic oxide semiconductor material having a crystalline structure is more stable than the inorganic oxide semiconductor material separated into single-metal oxides of the crystalline structure forming the inorganic oxide semiconductor material.

As this inorganic oxide semiconductor material is used, it is possible to obtain a stable semiconductor material layer in a case where the formation energy or the reaction energy has a positive value when the value of the formation energy of the inorganic oxide semiconductor material that has the same (or substantially the same) composition as an inorganic oxide semiconductor material having an amorphous structure, and has a crystalline structure is evaluated, or the value of the reaction energy at the time when the inorganic oxide semiconductor material having a crystalline structure is generated on the basis of reactions of N kinds of metallic oxides formed with metallic atoms $M_n$ and oxygen atoms is evaluated. Thus, it is possible to obtain an imaging device and a solid-state imaging apparatus that are stable during the manufacturing process after the formation of the semiconductor material layer, and has a high manufacturing yield and a high durability. Further, the semiconductor material layer can have a high heat resistance. Moreover, the photoelectric conversion unit has a two-layer structure formed with the semiconductor material layer and the photoelectric conversion layer, which means that the semiconductor material layer is in contact with the photoelectric conversion layer. Accordingly, recombination during charge accumulation can be prevented, and the efficiency in transfer of the electric charges accumulated in the photoelectric conversion layer to the first electrode can be further increased. Further, the electric charge generated in the photoelectric conversion layer can be temporarily retained, so that the transfer timing and the like can be controlled, and generation of dark current can be reduced. Furthermore, since it is necessary to transfer signal charges within a limited time, the carrier mobility of the semiconductor material layer is preferably high. Therefore, the semiconductor material layer preferably includes an inorganic oxide semiconductor material that has an amorphous structure at least in a portion thereof.

In the description below, imaging devices according to the first and second embodiments of the present disclosure, a stacked imaging device of the present disclosure, and a solid-state imaging apparatus according to the second embodiment of the present disclosure will be briefly explained, followed by a detailed explanation of an imaging device and a solid-state imaging apparatus of Example 1.

In imaging devices according to the first and second embodiments of the present disclosure including the various preferred modes described above, the imaging devices according to the first and second embodiments of the present disclosure constituting a stacked imaging device of the present disclosure, and the imaging devices according to the first and second embodiments of the present disclosure constituting solid-state imaging apparatuses according to the first and second embodiments of the present disclosure (these imaging devices will be hereinafter collectively referred to an "imaging device or the like of the present disclosure" in some cases), the photoelectric conversion unit may further include an insulating layer, and a charge storage electrode that is disposed at a distance from the first electrode and is positioned to face the semiconductor material layer via the insulating layer.

Further, in an imaging device or the like of the present disclosure including the various preferred modes described above, the carrier mobility of the material forming the semiconductor material layer may be 10 $cm^2/V \cdot s$ or higher.

Furthermore, in an imaging device or the like of the present disclosure including the various preferred modes described above, the thickness of the semiconductor material layer may be $1 \times 10^{-8}$ m to $1.5 \times 10^{-7}$ m, or preferably, $2 \times 10^{-8}$ m to $1.0 \times 10^{-7}$ m, or more preferably, $3 \times 10^{-8}$ m to $1.0 \times 10^{-7}$ m.

Furthermore, in an imaging device or the like of the present disclosure including the preferred modes described above, the electric charges generated in the photoelectric conversion layer can be moved to the first electrode via the semiconductor material layer. In this case, the electric charges may be electrons.

Further, in an imaging device or the like of the present disclosure including the various preferred modes described above, light may enter from the second electrode, and the surface roughness Ra of the semiconductor material layer surface at the interface between the photoelectric conversion layer and the semiconductor material layer may be 1.5 nm or smaller, and the value of the root-mean-square roughness Rq of the semiconductor material layer surface may be 2.5 nm or smaller. The surface roughness Ra of the charge storage electrode surface may be 1.5 nm or smaller, and the root-mean-square roughness Rq of the charge storage electrode surface may be 2.5 nm or smaller.

Further, in an imaging device or the like of the present disclosure including the various preferred modes described above, the carrier concentration of the semiconductor material layer is preferably lower than $1 \times 10^{16}/cm^3$.

Figure 78:
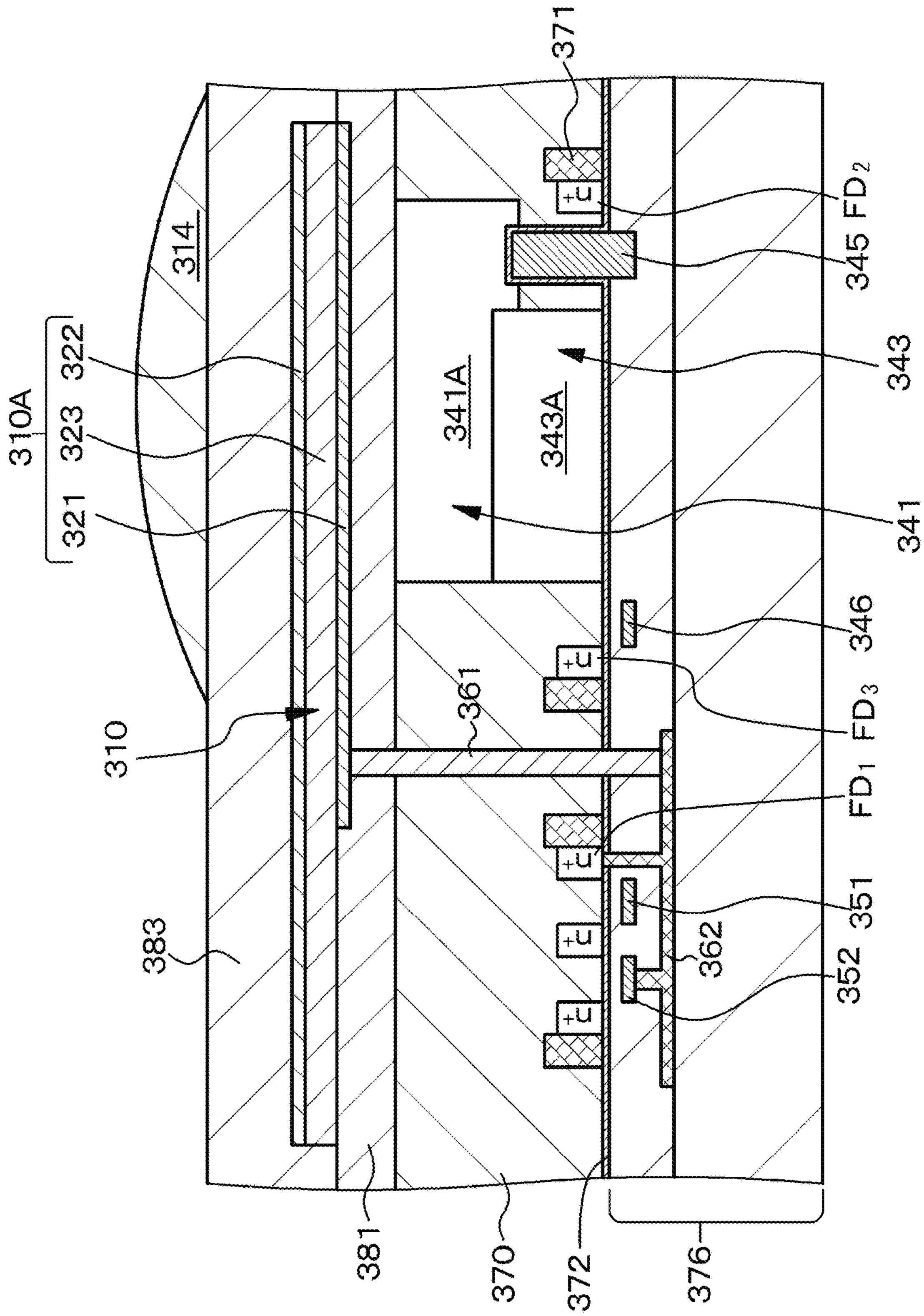
FIG. 78 is a conceptual diagram of a conventional stacked imaging device (a stacked solid-state imaging apparatus).

In a conventional imaging device shown in FIG. 78, the electric charges generated through photoelectric conversion in a second photoelectric conversion unit 341A and a third photoelectric conversion unit 343A are temporarily stored in the second photoelectric conversion unit 341A and the third photoelectric conversion unit 343A, and are then transferred to a second floating diffusion layer $FD_2$ and a third floating diffusion layer $FD_3$. Thus, the second photoelectric conversion unit 341A and the third photoelectric conversion unit 343A can be fully depleted. However, the electric charges generated through photoelectric conversion in a first photoelectric conversion unit 310A are stored directly into a first floating diffusion layer $FD_2$. Therefore, it is difficult to fully deplete the first photoelectric conversion unit 310A. As a result of the above, kTC noise might then become larger, random noise might be aggravated, and imaging quality might be degraded.

In an imaging device or the like of the present disclosure, the photoelectric conversion unit includes the charge storage electrode that is disposed at a distance from the first electrode and is positioned to face the semiconductor material layer via the insulating layer, as described above. With this arrangement, electric charges can be accumulated in the semiconductor material layer (or in the semiconductor material layer and the photoelectric conversion layer in some cases) when light is emitted onto the photoelectric conversion unit and is photoelectrically converted at the photoelectric conversion unit. Accordingly, at the start of exposure, the charge storage portion can be fully depleted, and the electric charges can be erased. As a result, it is possible to reduce or prevent the occurrence of a phenomenon in which the kTC noise becomes larger, the random noise is aggravated, and the imaging quality is lowered. Note that, in the description below, the semiconductor material layer, or the semiconductor material layer and the photoelectric conversion layer may be collectively referred to as the "semiconductor material layer and the like".

The semiconductor material layer may have a single-layer configuration, or may have a multilayer configuration. Further, the material forming the semiconductor material layer located above the charge storage electrode may differ from the material forming the semiconductor material layer located above the first electrode.

The semiconductor material layer can be formed on the basis of a sputtering method, for example. Specifically, according to an example of the sputtering method, the sputtering device to be used may be a parallel plate sputtering device, a DC magnetron sputtering device, or an RF sputtering device, an argon (Ar) gas may be used as the process gas, and a desired sintered compact may be used as the target, for example.

Note that it is possible to control the energy level of the semiconductor material layer by controlling the amount of oxygen gas (oxygen partial pressure) introduced when the semiconductor material layer is formed on the basis of a sputtering method. Specifically, when the semiconductor material layer is formed on the basis of a sputtering method, $$\text{the oxygen partial pressure}=(O_2\text{ gas pressure})/(\text{total pressure of Ar gas and }O_2\text{ gas})$$

is preferably 0.005 to 0.10. Further, in an imaging device or the like of the present disclosure, the content rate of oxygen in the semiconductor material layer may be lower than the content rate of oxygen in a stoichiometric composition. Here, the energy level of the semiconductor material layer can be controlled on the basis of the content rate of oxygen, and the energy level can be made deeper as the content rate of oxygen becomes lower than the content rate of oxygen in the stoichiometric composition, or as oxygen defects increase.

An imaging device that is an imaging device or the like of the present disclosure including the preferred modes described above, and includes a charge storage electrode may be hereinafter referred to as an "imaging device or the like including a charge storage electrode of the present disclosure" in some cases, for convenience.

In an imaging device or the like including a charge storage electrode of the present disclosure, the optical transmittance of the semiconductor material layer for light having a wavelength of 400 nm to 660 nm is preferably 65% or higher. The optical transmittance of the charge storage electrode for light having a wavelength of 400 nm to 660 nm is also preferably 65% or higher. The sheet resistance value of the charge storage electrode is preferably $3\times10\Omega/\square$ to $1\times10^3\Omega/\square$.

An imaging device or the like including a charge storage electrode of the present disclosure may further include a semiconductor substrate, and the photoelectric conversion unit may be disposed above the semiconductor substrate. Note that the first electrode, the charge storage electrode, the second electrode, and the like are connected to a drive circuit that will be described later.

The second electrode located on the light incident side may be shared by a plurality of imaging devices. That is, the second electrode can be a so-called solid electrode. The photoelectric conversion layer may be shared by a plurality of imaging devices. In other words, one photoelectric conversion layer may be formed for a plurality of imaging devices, or may be provided for each imaging device. The semiconductor material layer is preferably provided for each imaging device, but may be shared by a plurality of imaging devices in some cases. That is, a charge transfer control electrode that will be described later may be disposed between an imaging device and an imaging device, for example, so that a single-layer semiconductor material layer can be formed in a plurality of imaging devices. In a case where a single-layer semiconductor material layer is formed and shared in a plurality of imaging devices, the edge portion of the semiconductor material layer is preferably covered at least with the photoelectric conversion layer, to protect the edge portion of the semiconductor material layer.

Further, in an imaging device or the like including a charge storage electrode of the present disclosure including the various preferred modes described above, the first electrode may extend in an opening formed in the insulating layer, and be connected to the semiconductor material layer. Alternatively, the semiconductor material layer may extend in an opening formed in the insulating layer and be connected to the first electrode.

In this case, the edge portion of the top surface of the first electrode may be covered with the insulating layer, the first electrode may be exposed through the bottom surface of the opening, and, where the surface of the insulating layer in contact with the top surface of the first electrode is a first surface, and the surface of the insulating layer in contact with the portion of the semiconductor material layer facing the charge storage electrode is a second surface, a side surface of the opening may be a slope spreading from the first surface toward the second surface, and further, the side surface of the opening having the slope spreading from the first surface toward the second surface may be located on the charge storage electrode side.

Further, in an imaging device or the like including the charge storage electrode of the present disclosure including the various preferred modes described above, a control unit that is disposed in the semiconductor substrate, and includes a drive circuit may be further provided, the first electrode and the charge storage electrode may be connected to the drive circuit, in a charge accumulation period, the drive circuit may apply a potential $V_{11}$ to the first electrode, and a potential $V_{12}$ to the charge storage electrode, to accumulate electric charges in the semiconductor material layer (or the semiconductor material layer and the photoelectric conversion layer), and, in a charge transfer period, the drive circuit may apply a potential $V_{21}$ to the first electrode, and a potential $V_{22}$ to the charge storage electrode, to read the electric charges accumulated in the semiconductor material layer (or the semiconductor material layer and the photoelectric conversion layer) into the control unit via the first electrode. Here, the potential of the first electrode is higher than the potential of the second electrode, to satisfy the following:

$$V_{12}\geq V_{11},\text{ and } V_{22}<V_{21}$$

An imaging device or the like including the charge storage electrode of the present disclosure including the various preferred modes described above may further include a transfer control electrode (a charge transfer electrode) that is provided between the first electrode and the charge storage electrode, is disposed at a distance from the first electrode and the charge storage electrode, and is positioned to face the semiconductor material layer via the insulating layer. An imaging device or the like including the charge storage electrode of the present disclosure of such a form is also referred to as an "imaging device or the like including the transfer control electrode of the present disclosure", for convenience.

Further, in an imaging device or the like including the transfer control electrode of the present disclosure, a control unit that is disposed in the semiconductor substrate and includes a drive circuit may be further provided, the first electrode, the charge storage electrode, and the transfer control electrode may be connected to the drive circuit, in a charge accumulation period, the drive circuit may apply a potential $V_{11}$ to the first electrode, a potential $V_{12}$ to the charge storage electrode, and a potential $V_{13}$ to the transfer control electrode, to accumulate electric charges in the semiconductor material layer (or the semiconductor material layer and the photoelectric conversion layer), and, in a charge transfer period, the drive circuit may apply a potential $V_{21}$ to the first electrode, a potential $V_{22}$ to the charge storage electrode, and a potential $V_{23}$ to the transfer control electrode, to read the electric charges accumulated in the semiconductor material layer (or the semiconductor material layer and the photoelectric conversion layer) into the control unit via the first electrode. Here, the potential of the first electrode is higher than the potential of the second electrode, to satisfy the following:

$$V_{12}>V_{13}, \text{ and } V_{22}<V_{23}<V_{21}$$

An imaging device or the like including the charge storage electrode of the present disclosure including the various preferred modes described above may further include a charge emission electrode that is connected to the semiconductor material layer, and is disposed at a distance from the first electrode and the charge storage electrode. An imaging device or the like including the charge storage electrode of the present disclosure of such a form is also referred to as an "imaging device or the like including the charge emission electrode of the present disclosure", for convenience. Further, in an imaging device or the like including the charge emission electrode of the present disclosure, the charge emission electrode may be disposed to surround the first electrode and the charge storage electrode (in other words, like a frame). The charge emission electrode may be shared (made common) among a plurality of imaging devices. Further, in this case, the semiconductor material layer may extend in a second opening formed in the insulating layer, and be connected to the charge emission electrode, the edge portion of the top surface of the charge emission electrode may be covered with the insulating layer, the charge emission electrode may be exposed through the bottom surface of the second opening, and a side surface of the second opening may be a slope spreading from a third surface toward a second surface, the third surface being the surface of the insulating layer in contact with the top surface of the charge emission electrode, the second surface being the surface of the insulating layer in contact with the portion of the semiconductor material layer facing the charge storage electrode.

Further, in an imaging device or the like including the charge emission electrode of the present disclosure, a control unit that is disposed in the semiconductor substrate and includes a drive circuit may be further provided, the first electrode, the charge storage electrode, and the charge emission electrode may be connected to the drive circuit, in a charge accumulation period, the drive circuit may apply a potential $V_{11}$ to the first electrode, a potential $V_{12}$ to the charge storage electrode, and a potential $V_{14}$ to the charge emission electrode, to accumulate electric charges in the semiconductor material layer (or the semiconductor material layer and the photoelectric conversion layer), and, in a charge transfer period, the drive circuit may apply a potential $V_{21}$ to the first electrode, a potential $V_{22}$ to the charge storage electrode, and a potential $V_{24}$ to the charge emission electrode, to read the electric charges accumulated in the semiconductor material layer (or the semiconductor material layer and the photoelectric conversion layer) into the control unit via the first electrode. Here, the potential of the first electrode is higher than the potential of the second electrode, to satisfy the following:

$$V_{14}>V_{11}, \text{ and } V_{24}<V_{21}$$

Further, in the various preferred modes described above in an imaging device or the like including the charge storage electrode of the present disclosure, the charge storage electrode may be formed with a plurality of charge storage electrode segments. An imaging device or the like including the charge storage electrode of the present disclosure of such a form is also referred to as an "imaging device or the like including a plurality of charge storage electrode segments of the present disclosure", for convenience. The number of charge storage electrode segments is two or larger. Further, in an imaging device or the like including a plurality of charge storage electrode segments of the present disclosure, in a case where a different potential is applied to each of N charge storage electrode segments, in a case where the potential of the first electrode is higher than the potential of the second electrode, the potential to be applied to the charge storage electrode segment (the first photoelectric conversion unit segment) located closest to the first electrode may be higher than the potential to be applied to the charge storage electrode segment (the Nth photoelectric conversion unit segment) located farthest from the first electrode in a charge transfer period, and, in a case where the potential of the first electrode is lower than the potential of the second electrode, the potential to be applied to the charge storage electrode segment (the first photoelectric conversion unit segment) located closest to the first electrode may be lower than the potential to be applied to the charge storage electrode segment (the Nth photoelectric conversion unit segment) located farthest from the first electrode in a charge transfer period.

In an imaging device or the like including the charge storage electrode of the present disclosure including the various preferred modes described above, at least a floating diffusion layer and an amplification transistor that constitute the control unit may be disposed in the semiconductor substrate, and the first electrode may be connected to the floating diffusion layer and the gate portion of the amplification transistor. Furthermore, in this case, a reset transistor and a selection transistor that constitute the control unit may be further disposed in the semiconductor substrate, the floating diffusion layer may be connected to one source/drain region of the reset transistor, and one source/drain region of the amplification transistor may be connected to one source/drain region of the selection transistor, and the other source/drain region of the selection transistor may be connected to a signal line.

Further, in an imaging device or the like including the charge storage electrode of the present disclosure including the various preferred modes described above, the size of the charge storage electrode may be larger than that of the first electrode. Where the area of the charge storage electrode is represented by $S_1'$, and the area of the first electrode is represented by $S_1$, it is preferable, but is not necessary, to satisfy $$4 \le S_1'/S_1.$$

Alternatively, modifications of an imaging device or the like of the present disclosure including the various preferred modes described above may include imaging devices of first through sixth configurations described below. Specifically, in imaging devices of the first through sixth configurations in imaging devices or the like of the present disclosure including the various preferable modes described above, the photoelectric conversion unit is formed with N (N≥2) photoelectric conversion unit segments, the semiconductor material layer and the photoelectric conversion layer are formed with N photoelectric conversion layer segments, the insulating layer is formed with N insulating layer segments, the charge storage electrode is formed with N charge storage electrode segments in imaging devices of the first through third configurations, the charge storage electrode is formed with N charge storage electrode segments that are disposed at a distance from one another in imaging devices of the fourth and fifth configurations, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode. Here, a "photoelectric conversion layer segment" means a segment formed by stacking a photoelectric conversion layer and a semiconductor material layer.

Further, in an imaging device of the first configuration, the thicknesses of the insulating layer segments gradually vary from the first photoelectric conversion unit segment to the Nth photoelectric conversion unit segment. Meanwhile, in an imaging device of the second configuration, the thicknesses of the photoelectric conversion layer segments gradually vary from the first photoelectric conversion unit segment to the Nth photoelectric conversion unit segment. Note that, in the photoelectric conversion layer segments, the thickness of the portion of the photoelectric conversion layer may be varied, and the thickness of the portion of the semiconductor material layer may be made constant, so that the thicknesses of the photoelectric conversion layer segments vary. The thickness of the portion of the photoelectric conversion layer may be made constant, and the thickness of the portion of the semiconductor material layer may be made to vary, so that the thicknesses of the photoelectric conversion layer segments vary. The thickness of the portion of the photoelectric conversion layer may be varied, and the thickness of the portion of the semiconductor material layer may be varied, so that the thicknesses of the photoelectric conversion layer segments vary. Further, in an imaging device of the third configuration, the material forming the insulating layer segment differs between adjacent photoelectric conversion unit segments. Further, in an imaging device of the fourth configuration, the material forming the charge storage electrode segment differs between adjacent photoelectric conversion unit segments. Further, in an imaging device of the fifth configuration, the areas of the charge storage electrode segments become gradually smaller from the first photoelectric conversion unit segment to the Nth photoelectric conversion unit segment. The areas may become smaller continuously or in a stepwise manner.

Alternatively, in an imaging device of the sixth configuration in an imaging device or the like of the present disclosure including the various preferred modes described above, the cross-sectional area of the stacked portion of the charge storage electrode, the insulating layer, the semiconductor material layer, and the photoelectric conversion layer taken along a Y-Z virtual plane varies depending on the distance from the first electrode, where the stacking direction of the charge storage electrode, the insulating layer, the semiconductor material layer, and the photoelectric conversion layer is the Z direction, and the direction away from the first electrode is the X direction. The change in the cross-sectional area may be continuous or stepwise.

In the imaging devices of the first and second configurations, the N photoelectric conversion layer segments are continuously arranged, the N insulating layer segments are also continuously arranged, and the N charge storage electrode segments are also continuously arranged. In the imaging devices of the third through fifth configurations, the N photoelectric conversion layer segments are continuously arranged. Further, in the imaging devices of the fourth and fifth configurations, the N insulating layer segments are continuously arranged. In the imaging device of the third configuration, on the other hand, the N insulating layer segments are provided for the respective photoelectric conversion unit segments in one-to-one correspondence. Further, in the imaging devices of the fourth and fifth configurations, and in the imaging device of the third configuration in some cases, N charge storage electrode segments are provided for the respective photoelectric conversion unit segments in one-to-one correspondence. In the imaging devices of the first through sixth configurations, the same potential is applied to all of the charge storage electrode segments. Alternatively, in the imaging devices of the fourth and fifth configurations, and in the imaging device of the third configuration in some cases, a different potential may be applied to each of the N charge storage electrode segments.

In imaging devices or the like of the present disclosure formed with imaging devices of the first through sixth configurations, the thickness of each insulating layer segment is specified, the thickness of each photoelectric conversion layer segment is specified, the materials forming the insulating layer segments vary, the materials forming the charge storage electrode segments vary, the area of each charge storage electrode segment is specified, or the cross-sectional area of each stacked portion is specified. Accordingly, a kind of charge transfer gradient is formed, and thus, the electric charges generated through photoelectric conversion can be more easily and reliably transferred to the first electrode. As a result, it is possible to further prevent generation of a residual image and generation of a charge transfer residue.

In the imaging devices of the first through fifth configurations, a photoelectric conversion unit segment having a greater value as n is located farther away from the first electrode, and whether or not a photoelectric conversion unit segment is located far from the first electrode is determined on the basis of the X direction. Further, in the imaging device of the sixth configuration, the direction away from the first electrode is the X direction. However, the "X direction" is defined as follows. Specifically, a pixel region in which a plurality of imaging devices or stacked imaging devices is arranged is formed with a plurality of pixels arranged regularly in a two-dimensional array, or in the X direction and the Y direction. In a case where the planar shape of each pixel is a rectangular shape, the direction in which the side closest to the first electrode extends is set as the Y direction, and a direction orthogonal to the Y direction is set as the X direction. Alternatively, in a case where the planar shape of each pixel is a desired shape, a general direction including the line segment or the curved line closest to the first electrode is set as the Y direction, and a direction orthogonal to the Y direction is set as the X direction.

In the description below, imaging devices of the first through sixth configurations in cases where the potential of the first electrode is higher than the potential of the second electrode are described.

In an imaging device of the first configuration, the thicknesses of the insulating layer segments gradually vary from the first photoelectric conversion unit segment to the Nth photoelectric conversion unit segment. However, the thicknesses of the insulating layer segments preferably become gradually greater, and a kind of charge transfer gradient is formed by this variation. Further, when $|V_{12}| \geq |V_{11}|$ in a charge accumulation period, the nth photoelectric conversion unit segment can store more electric charges than the (n+1)th photoelectric conversion unit segment, and a strong electric field is applied so that electric charges can be reliably prevented from flowing from the first photoelectric conversion unit segment toward the first electrode. Furthermore, when $|V_{22}| < |V_{21}|$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the second configuration, the thicknesses of the photoelectric conversion layer segments gradually vary from the first photoelectric conversion unit segment to the Nth photoelectric conversion unit segment. However, the thicknesses of the photoelectric conversion layer segments preferably become gradually greater, and a kind of charge transfer gradient is formed by this variation. Further, when $V_{12} \geq V_{11}$ in a charge accumulation period, a stronger electric field is applied to the nth photoelectric conversion unit segment than to the (n+1)th photoelectric conversion unit segment, so that electric charges can be reliably prevented from flowing from the first photoelectric conversion unit segment toward the first electrode. Furthermore, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the third configuration, the material forming the insulating layer segment differ between adjacent photoelectric conversion unit segments, and because of this, a kind of charge transfer gradient is formed. However, the values of the relative dielectric constants of the materials forming the insulating layer segments preferably become gradually smaller from the first photoelectric conversion unit segment to the Nth photoelectric conversion unit segment.

As such a configuration is adopted, when $V_{12} \geq V_{11}$ in a charge accumulation period, the nth photoelectric conversion unit segment can then store more electric charges than the (n+1)th photoelectric conversion unit segment. Furthermore, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the fourth configuration, the material forming the charge storage electrode segment differ between adjacent photoelectric conversion unit segments, and because of this, a kind of charge transfer gradient is formed. However, the values of the work functions of the materials forming the insulating layer segments preferably become gradually greater from the first photoelectric conversion unit segment to the Nth photoelectric conversion unit segment. As such a configuration is adopted, it then becomes possible to form a potential gradient that is advantageous for signal charge transfer, regardless of whether the voltage (potential) is positive or negative.

In an imaging device of the fifth configuration, the areas of the charge storage electrode segments become gradually smaller from the first photoelectric conversion unit segment to the Nth photoelectric conversion unit segment, and because of this, a kind of charge transfer gradient is formed. Accordingly, when $V_{12} \geq V_{11}$ in a charge accumulation period, the nth photoelectric conversion unit segment can store more electric charges than the (n+1)th photoelectric conversion unit segment. Furthermore, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the sixth configuration, the cross-sectional area of the stacked portion varies depending on the distance from the first electrode, and because of this, a kind of charge transfer gradient is formed. Specifically, in a configuration in which the thicknesses of cross-sections of the stacked portion are made uniform while the width of a cross-section of the stacked portion is smaller at a position farther away from the first electrode, when $V_{12} \geq V_{11}$ in a charge accumulation period, a region closer to the first electrode can accumulate more electric charges than a region farther away from the first electrode, as in the above described imaging device of the fifth configuration. Accordingly, when $V_{22} < V_{21}$ in a charge transfer period, it is possible to reliably secure the flow of electric charges from a region closer to the first electrode toward the first electrode, and the flow of electric charges from a farther region toward a closer region. On the other hand, in a configuration in which the widths of cross-sections of the stacked portion are made uniform while the thicknesses of cross-sections of the stacked portion, or specifically, the thicknesses of the insulating layer segments, are gradually increased, when $V_{12} \geq V_{11}$ in a charge accumulation period, a region closer to the first electrode can accumulate more electric charges than a region farther away from the first electrode, and a stronger electric field is applied to the closer region. Thus, it is possible to reliably prevent the flow of electric charges from the region closer to the first electrode toward the first electrode, as in the above described imaging device of the first configuration. When $V_{22} < V_{21}$ in a charge transfer period, it then becomes possible to reliably secure the flow of electric charges from a region closer to the first electrode toward the first electrode, and the flow of electric charges from a farther region toward a closer region. Further, in a configuration in which the thicknesses of the photoelectric conversion layer segments are gradually increased, when $V_{12} \geq V_{11}$ in a charge accumulation period, a stronger electric field is applied to a region closer to the first electrode than to a region farther away from the first electrode, and it is possible to reliably prevent the flow of electric charges from the region closer to the first electrode toward the first electrode, as in the above described imaging device of the second configuration. When $V_{22}<V_{21}$ in a charge transfer period, it then becomes possible to reliably secure the flow of electric charges from a region closer to the first electrode toward the first electrode, and the flow of electric charges from a farther region toward a closer region.

A modification of a solid-state imaging apparatus according to the first or second embodiment of the present disclosure may be a solid-state imaging apparatus that includes a plurality of imaging devices of any of the first through sixth configurations, an imaging device block is formed with a plurality of imaging devices, and a first electrode is shared among the plurality of imaging devices constituting the imaging device block. A solid-state imaging apparatus having such a configuration is referred to as a "solid-state imaging apparatus of the first configuration", for convenience. Alternatively, a modification of a solid-state imaging apparatus according to the first or second embodiment of the present disclosure may be a solid-state imaging apparatus that includes a plurality of imaging devices of any of the first through sixth configurations, or a plurality of stacked imaging devices including at least one imaging device of any of the first through sixth configurations, an imaging device block is formed with a plurality of imaging devices or stacked imaging devices, and a first electrode is shared among the plurality of imaging devices or stacked imaging devices constituting the imaging device block. A solid-state imaging apparatus having such a configuration is referred to as a "solid-state imaging apparatus of the second configuration", for convenience. Further, in a case where a first electrode is shared among the plurality of imaging devices constituting an imaging device block as above, the configuration and the structure in the pixel region in which a plurality of imaging devices is arranged can be simplified and miniaturized.

In solid-state imaging apparatuses of the first and second configurations, one floating diffusion layer is provided for a plurality of imaging devices (or one imaging device block). Here, the plurality of imaging devices provided for one floating diffusion layer may be formed with a plurality of imaging devices of the first type described later, or may be formed with at least one imaging device of the first type and one or more imaging devices of the second type described later. The timing of a charge transfer period is then appropriately controlled, so that the plurality of imaging devices can share the one floating diffusion layer. The plurality of imaging devices is operated in conjunction with one another, and is connected as an imaging device block to the drive circuit described later. In other words, a plurality of imaging devices constituting an imaging device block is connected to one drive circuit. However, charge storage electrode control is performed for each imaging device. Further, a plurality of imaging devices can share one contact hole portion. As for the layout relationship between the first electrode being shared among a plurality of imaging devices and the charge storage electrodes of the respective imaging devices, the first electrode may be disposed adjacent to the charge storage electrodes of the respective imaging devices in some cases. Alternatively, the first electrode is disposed adjacent to the charge storage electrode of one of the plurality of imaging devices, and is not adjacent to the charge storage electrodes of the plurality of remaining imaging devices. In such a case, electric charges are transferred from the plurality of remaining imaging devices to the first electrode via the one of the plurality of imaging devices. To ensure electric charge transfer from each imaging device to the first electrode, the distance (called the "distance A", for convenience) between a charge storage electrode of an imaging device or and a charge storage electrode of another imaging device is preferably longer than the distance (called the "distance B", for convenience) between the first electrode and the charge storage electrode in the imaging device adjacent to the first electrode. Further, the value of the distance A is preferably greater for an imaging device located farther away from the first electrode. Note that the above explanation can be applied not only to solid-state imaging apparatuses of the first and second configurations but also to solid-state imaging apparatuses according to the first and second embodiments of the present disclosure.

Furthermore, in an imaging device or the like of the present disclosure including the various preferred modes described above, light may enter from the second electrode side, and a light blocking layer may be formed on a light incident side closer to the second electrode. Alternatively, light may enter from the second electrode side, while light does not enter the first electrode (or the first electrode and the transfer control electrode in some cases). Further, in this case, a light blocking layer may be formed on a light incident side closer to the second electrode and above the first electrode (or the first electrode and the transfer control electrode in some cases). Alternatively, an on-chip microlens may be provided above the charge storage electrode and the second electrode, and light that enters the on-chip microlens may be gathered to the charge storage electrode. Here, the light blocking layer may be disposed above the surface of the second electrode on the light incident side, or may be disposed on the surface of the second electrode on the light incident side. In some cases, the light blocking layer may be formed in the second electrode. Examples of the material that forms the light blocking layer include chromium (Cr), copper (Cu), aluminum (Al), tungsten (W), and resin (polyimide resin, for example) that does not transmit light.

Specific examples of imaging devices or the like of the present disclosure include: an imaging device (referred to as a "blue-light imaging device of the first type", for convenience) that includes a photoelectric conversion layer or a photoelectric conversion unit (referred to as a "blue-light photoelectric conversion layer of the first type" or a "blue-light photoelectric conversion unit of the first type", for convenience) that absorbs blue light (light of 425 nm to 495 nm), and has sensitivity to blue light; an imaging device (referred to as a "green-light imaging device of the first type", for convenience) that includes a photoelectric conversion layer or a photoelectric conversion unit (referred to as a "green-light photoelectric conversion layer of the first type" or a "green-light photoelectric conversion unit of the first type", for convenience) that absorbs green light (light of 495 nm to 570 nm), and has sensitivity to green light; and an imaging device (referred to as a "red-light imaging device of the first type", for convenience) that includes a photoelectric conversion layer or a photoelectric conversion unit (referred to as a "red-light photoelectric conversion layer of the first type" or a "red-light photoelectric conversion unit of the first type", for convenience) that absorbs red light (light of 620 nm to 750 nm), and has sensitivity to red light. Further, of conventional imaging devices not including any charge storage electrode, an imaging device having sensitivity to blue light is referred to as a "blue-light imaging device of the second type", for convenience, an imaging device having sensitivity to green light is referred to as a "green-light imaging device of the second type", for convenience, an imaging device having sensitivity to red light is referred to as a "red-light imaging device of the second type", for convenience, a photoelectric conversion layer or a photoelectric conversion unit forming a blue-light imaging device of the second type is referred to as a "blue-light photoelectric conversion layer of the second type" or a "blue-light photoelectric conversion unit of the second type", for convenience, a photoelectric conversion layer or a photoelectric conversion unit forming a green-light imaging device of the second type is referred to as a "green-light photoelectric conversion layer of the second type" of a "green-light photoelectric conversion unit of the second type", for convenience, and a photoelectric conversion layer or a photoelectric conversion unit forming a red-light imaging device of the second type is referred to as a "red-light photoelectric conversion layer of the second type" or a "red-light photoelectric conversion unit of the second type", for convenience.

Specific examples of stacked imaging devices each including a charge storage electrode include:

[A] a configuration and a structure in which a blue-light photoelectric conversion unit of the first type, a green-light photoelectric conversion unit of the first type, and a red-light photoelectric conversion unit of the first type are stacked in a vertical direction, and the respective control units of a blue-light imaging device of the first type, a green-light imaging device of the first type, and a red-light imaging device of the first type are disposed in a semiconductor substrate;

[B] a configuration and a structure in which a blue-light photoelectric conversion unit of the first type and a green-light photoelectric conversion unit of the first type are stacked in a vertical direction, a red-light photoelectric conversion unit of the second type is disposed below these two photoelectric conversion units of the first type, and the respective control units of a blue-light imaging device of the first type, a green-light imaging device of the first type, and a red-light imaging device of the second type are disposed in a semiconductor substrate;

[C] a configuration and a structure in which a blue-light photoelectric conversion unit of the second type and a red-light photoelectric conversion unit of the second type are disposed below a green-light photoelectric conversion unit of the first type, and the respective control units of a green-light imaging device of the first type, a blue-light imaging device of the second type, and a red-light imaging device of the second type are disposed in a semiconductor substrate; and

[D] a configuration and a structure in which a green-light photoelectric conversion unit of the second type and a red-light photoelectric conversion unit of the second type are disposed below a blue-light photoelectric conversion unit of the first type, and the respective control units of a blue-light imaging device of the first type, a green-light imaging device of the second type, and a red-light imaging device of the second type are disposed in a semiconductor substrate, for example. The arrangement sequence of the photoelectric conversion units of these imaging devices in a vertical direction is preferably as follows: a blue-light photoelectric conversion unit, a green-light photoelectric conversion unit, and a red-light photoelectric conversion unit from the light incident direction, or a green-light photoelectric conversion unit, a blue-light photoelectric conversion unit, and a red-light photoelectric conversion unit from the light incident direction. This is because light of a shorter wavelength is more efficiently absorbed on the incident surface side. Since red has the longest wavelength among the three colors, it is preferable to dispose a red-light photoelectric conversion unit in the lowermost layer when viewed from the light incidence face. A stack structure formed with these imaging devices forms one pixel. Further, a near-infrared light photoelectric conversion unit (or an infrared-light photoelectric conversion unit) of the first type may be included. Here, the photoelectric conversion layer of the infrared-light photoelectric conversion unit of the first type includes an organic material, for example, and is preferably disposed in the lowermost layer of a stack structure of imaging devices of the first type, and above imaging devices of the second type. Alternatively, a near-infrared light photoelectric conversion unit (or an infrared-light photoelectric conversion unit) of the second type may be disposed below a photoelectric conversion unit of the first type.

In an imaging device of the first type, the first electrode is formed on an interlayer insulating layer provided on the semiconductor substrate, for example. An imaging device formed on the semiconductor substrate may be of a back-illuminated type or of a front-illuminated type.

In a case where a photoelectric conversion layer includes an organic material, the photoelectric conversion layer may have one of the following four forms:

(1) formed with a p-type organic semiconductor;

(2) formed with an n-type organic semiconductor;

(3) formed with a stack structure of a p-type organic semiconductor layer and an n-type organic semiconductor layer, a stack structure of a p-type organic semiconductor layer, a mixed layer (a bulk heterostructure) of a p-type organic semiconductor and an n-type organic semiconductor, and an n-type organic semiconductor layer, a stack structure of a p-type organic semiconductor layer and a mixed layer (a bulk heterostructure) of a p-type organic semiconductor and an n-type organic semiconductor, or a stack structure of an n-type organic semiconductor layer and a mixed layer (a bulk heterostructure) of a p-type organic semiconductor and an n-type organic semiconductor; and (4) formed with a mixed structure (a bulk heterostructure) of a p-type organic semiconductor and an n-type organic semiconductor. However, the stacking order may be changed as appropriate in each configuration.

Examples of p-type organic semiconductors include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having a heterocyclic compound as a ligand, polythiophene derivatives, polybenzothiadiazole derivatives, and polyfluorene derivatives. Examples of n-type organic semiconductors include fullerenes, fullerene derivatives (fullerenes (higher-order fullerenes) such as C60, C70, and C74, and endohedral fullerenes, for example) or fullerene derivatives (fullerene fluorides, PCBM fullerene compounds, and fullerene multimers, for example), organic semiconductors with greater (deeper) HOMO and LUMO than p-type organic semiconductors, and transparent inorganic metallic oxides. Specific examples of n-type organic semiconductors include heterocyclic compounds containing nitrogen atom, oxygen atom, and sulfur atom, such as pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, imidazole derivatives, benzoimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, organic molecules containing polyfluorene derivatives or the like as part of the molecular backbone, organometallic complexes, and subphthalocyanine derivatives. Examples of groups contained in fullerene derivatives include: halogen atom; a linear, branched, or cyclic alkyl group or phenyl group; a group containing a linear or fused aromatic compound; a group containing a halide; a partial fluoroalkyl group; a perfluoroalkyl group; a silyl alkyl group; a silyl alkoxy group; an aryl silyl group; an aryl sulfanyl group; an alkyl sulfanyl group; an aryl sulfonyl group; an alkyl sulfonyl group; an aryl sulfide group: an alkyl sulfide group; an amino group; an alkylamino group; an arylamino group; a hydroxy group; an alkoxy group; an acylamino group: an acyloxy group; a carbonyl group; a carboxy group; a carboxoamide group; a carboalkoxy group; an acyl group; a sulfonyl group; a cyano group; a nitro group; a group containing chalcogenide; a phosphine group; a phosphonate group; and derivatives of these materials. The thickness of a photoelectric conversion layer formed with an organic material (also referred to as an "organic photoelectric conversion layer" in some cases) is not limited to any particular value, but may be $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, or even more preferably $1\times10^{-7}$ m to $1.8\times10^{-7}$ m, for example. Note that organic semiconductors are often classified into the p-type and the n-type. The p-type means that holes can be easily transported, and the n-type means that electrons can be easily transported. Unlike an inorganic semiconductor, an organic semiconductor is not interpreted as containing holes or electrons as majority carriers for thermal excitation.

Alternatively, examples of the material forming an organic photoelectric conversion layer that photoelectrically converts green light include rhodamine dyes, merocyanine dyes, quinacridone derivatives, and subphthalocyanine dyes (subphthalocyanine derivatives). Examples of the material forming an organic photoelectric conversion layer that photoelectrically converts blue light include coumaric acid dyes, tris-8-hydroxyquinolyl aluminum (Alq3), and merocyanine dyes. Examples of the material forming an organic photoelectric conversion layer that photoelectrically converts red light include phthalocyanine dyes and a subphthalocyanine pigments (subphthalocyanine derivatives).

Alternatively, examples of an inorganic material forming a photoelectric conversion layer include crystalline silicon, amorphous silicon, microcrystalline silicon, crystalline selenium, amorphous selenium, and compound semiconductors such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, and $AgInSe_2$, which are chalcopyrite compounds, GaAs, InP, AlGaAs, InGaP, AlGaInP, and InGaAsP, which are III-V compounds, and further, CdSe, CdS, $In_2Se_3$, $In_2S_3$, $Bi_2Se_3$, $Bi_2S_3$, ZnSe, ZnS, PbSe, and PbS. In addition to that, it is also possible to use quantum dots including these materials for a photoelectric conversion layer.

A single-panel color solid-state imaging apparatus can be formed with a solid-state imaging apparatus according to the first or second embodiment of the present disclosure, or a solid-state imaging apparatus of the first or second configuration.

A solid-state imaging apparatus according to the second embodiment of the present disclosure including stacked imaging devices differs from a solid-state imaging apparatus including Bayer-array imaging devices (in other words, blue, green, and red color separation is not performed with color filter layers). In such a solid-state imaging apparatus, imaging devices having sensitivity to light of a plurality of kinds of wavelengths are stacked in the light incident direction in the same pixel, to form one pixel. Thus, sensitivity can be increased, and the pixel density per unit volume can also be increased. Further, an organic material has a high absorption coefficient. Accordingly, the thickness of an organic photoelectric conversion layer can be made smaller than that of a conventional Si-based photoelectric conversion layer. Thus, light leakage from adjacent pixels, and restrictions on light incident angle are reduced. Furthermore, in a conventional Si-based imaging device, false color occurs because an interpolation process is performed among pixels of three colors to create color signals. In a solid-state imaging apparatus according to the second embodiment of the present disclosure including stacked imaging devices, on the other hand, generation of false color is reduced. Since an organic photoelectric conversion layer also functions as a color filter layer, color separation is possible without any color filter layer.

Meanwhile, in s solid-state imaging apparatus according to the first embodiment of the present disclosure, the use of a color filter layer can alleviate the requirement for the spectral characteristics of blue, green, and red, and achieves a high mass productivity. Examples of the array of imaging devices in a solid-state imaging apparatus according to the first embodiment of the present disclosure include not only a Bayer array but also an interlined array, a G-striped RB-checkered array, a G-striped RB-completely-checkered array, a checkered complementary color array, a striped array, an obliquely striped array, a primary color difference array, a field color difference sequence array, a frame color difference sequence array, a MOS-type array, an improved MOS-type array, a frame interleaved array, and a field interleaved array. Here, one pixel (or a subpixel) is formed with one imaging device.

The color filter layer (wavelength selecting means) may be a filter layer that transmits not only red, green, and blue, but also specific wavelengths of cyan, magenta, yellow, and the like in some cases, for example. The color filter layer is not necessarily formed with an organic material-based color filter layer using an organic compound such as a pigment or a dye, but may be formed with photonic crystal, a wavelength selection element using plasmon (a color filter layer having a conductor grid structure provided with a grid-like hole structure in a conductive thin film; see Japanese Patent Application Laid-Open No. 2008-177191, for example), or a thin film including an inorganic material such as amorphous silicon.

The pixel region in which a plurality of imaging devices or the like of the present disclosure is disposed is formed with a plurality of pixels arranged regularly in a two-dimensional array. The pixel region includes an effective pixel region that actually receives light, amplifies signal charges generated through photoelectric conversion, and reads the signal charges into the drive circuit, and a black reference pixel region (also called an optically black pixel region (OPB)) for outputting optical black that serves as the reference for black levels. The black reference pixel region is normally located in the outer periphery of the effective pixel region.

In an imaging device or the like of the present disclosure including the various preferred modes described above, light is emitted, photoelectric conversion occurs in the photoelectric conversion layer, and carriers are separated into holes and electrons. The electrode from which holes are extracted is then set as the anode, and the electrode from which electrons are extracted is set as the cathode. The first electrode forms the cathode, and the second electrode forms the anode.

The first electrode, the charge storage electrode, the transfer control electrode, the charge emission electrode, and the second electrode may be formed with a transparent conductive material. The first electrode, the charge storage electrode, the transfer control electrode, and the charge emission electrode may be collectively referred to as the "first electrode and the like". Alternatively, in a case where imaging devices or the like of the present disclosure are arranged in a plane like a Bayer array, for example, the second electrode may be formed with a transparent conductive material, and the first electrode may be formed with a metallic material. In this case, specifically, the second electrode located on the light incident side may be formed with a transparent conductive material, and the first electrode and the like may be formed with Al—Nd (an alloy of aluminum and neodymium) or ASC (an alloy of aluminum, samarium, and copper). An electrode formed with a transparent conductive material may be referred to as a "transparent electrode". Here, the bandgap energy aluminum is added as a dopant to zinc oxide, gallium-zinc oxides (GZO) in which gallium is added as a dopant to zinc oxide, titanium oxide ($TiO_2$), niobium-titanium oxide (TNO) in which niobium is added as a dopant to titanium oxide, antimony oxide, CuI, $InSbO_4$, ZnMgO, $CuInO_2$, $MgIn_2O_4$, CdO, $ZnSnO_3$, spinel-type oxides, and oxides each having a $YbFe_2O_4$ structure. Alternatively, the transparent electrode may have a base layer including gallium oxide, titanium oxide, niobium oxide, nickel oxide, or the like. The thickness of the transparent electrode may be $2\times10^{-8}$ m to $2\times10^{-7}$ m, or preferably, $3\times10^{-8}$ m to $1\times10^{-7}$ m. In a case where the first electrode is required to be transparent, the charge emission electrode is preferably also formed with a transparent conductive material, from the viewpoint of simplification of the manufacturing process.

Alternatively, in a case where transparency is not required, the conductive material forming the cathode having a function as the electrode for extracting electrons is preferably a conductive material having a low work function ($\varphi$=3.5 eV to 4.5 eV, for example), and specific examples of the conductive material include alkali metals (such as Li, Na, and K, for example) and fluorides or oxides thereof, alkaline-earth metals (such as Mg and Ca, for example) and fluorides or oxides thereof, aluminum (Al), zinc (Zn), tin (Sn), thallium (Tl), sodium-potassium alloys, aluminum-lithium alloys, magnesium-silver alloys, and rare earth metals such as indium and ytterbium or alloys thereof. Alternatively, examples of the material forming the cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo), alloys containing these metallic elements, conductive particles including these metals, conductive particles containing an alloy of these metals, polysilicon containing impurities, carbon-based materials, oxide semiconductor materials, carbon nanotubes, and conductive materials such as graphene. The cathode may also be formed with a stack structure containing these elements. Further, the material forming the cathode may be an organic material (conductive polymer) such as poly(3,4-ethylenedioxythiophene)/polystyrene sulfonate (PEDOT/PSS). Alternatively, any of these conductive materials may be mixed with a binder (polymer), to form a paste or ink, and the paste or ink may be then cured to be used as an electrode.

The film formation method for forming the first electrode and the like, and the second electrode (the cathode or the anode) may be a dry method or a wet method. Examples of dry methods include physical vapor deposition methods (PVD methods) and chemical vapor deposition methods (CVD methods). Examples of film formation methods using the principles of PVD methods include a vacuum vapor deposition method using resistance heating or high frequency heating, an EB (electron beam) vapor deposition method, various sputtering methods (a magnetron sputtering method, an RF-DC coupled bias sputtering method, an ECR sputtering method, a facing target sputtering method, and a radio-frequency sputtering method), an ion plating method, a laser ablation method, a molecular beam epitaxy method, and a laser transfer method. Further, examples of CVD methods include a plasma CVD method, a thermal CVD method, a metalorganic (MO) CVD method, and an optical CVD method. Meanwhile, examples of wet methods include an electrolytic plating method, an electroless plating method, a spin coating method, an inkjet method, a spray coating method, a stamp method, a microcontact printing method, a flexographic printing method, an offset printing method, a gravure printing method, and a dip method. Examples of patterning methods include a shadow mask technique, laser transfer, chemical etching such as photolithography, and physical etching using ultraviolet light, laser, and the like. The planarization technique for the first electrode and the like, and the second electrode may be a laser planarization method, a reflow method, a chemical mechanical polishing (CMP) method, or the like.

Examples of materials forming the insulating layer include not only inorganic materials that are typically metallic oxide high-dielectric insulating materials such as: silicon oxide materials; silicon nitride ($SiN_Y$); and aluminum oxide ($Al_2O_3$), but also organic insulating materials (organic polymers) that are typically straight-chain hydrocarbons having a functional group capable of binding to a control electrode at one end, such as: polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac-type phenolic resins; fluorocarbon resins; octadecanethiol; and dodecylisocyanate. Combinations of these materials may also be used. Examples of silicon oxide materials include silicon oxide (SiOx), BPSG, PSG, BSG, AsSG, PbSG, silicon oxynitride (SiON), spin-on glass (SOG), and low-dielectric-constant insulating materials (polyarylethers, cycloperfluorocarbon polymers, benzocyclobutene, cyclic fluorine resin, polytetrafluoroethylene, fluorinated aryl ether, fluorinated polyimide, amorphous carbon, and organic SOG, for example). The insulating layer may be formed with a single layer or a plurality of layers (two layers, for example) that are stacked. In the latter case, an insulating layer/under layer is formed at least on the charge storage electrode and in a region between the charge storage electrode and the first electrode, and a planarization process is performed on the insulating layer/under layer. In this manner, the insulating layer/under layer is left in the region between the charge storage electrode and the first electrode, and an insulating layer/top layer is formed over the remaining insulating layer/under layer and the charge storage electrode. Thus, the insulating layer can be planarized without fail. Materials forming the various interlayer insulating layers and insulating material films are only required to be selected from these materials as appropriate.

The configurations and the structures of the floating diffusion layer, the amplification transistor, the reset transistor, and the selection transistor that constitute the control unit may be similar to the configurations and the structures of a conventional floating diffusion layer, a conventional amplification transistor, a conventional reset transistor, and a conventional selection transistor. The drive circuit may also have a known configuration and structure.

The first electrode is connected to the floating diffusion layer and the gate portion of the amplification transistor, but a contact hole portion is only required to be formed to connect the first electrode to the floating diffusion layer and the gate portion of the amplification transistor. Examples of the material forming the contact hole portion include polysilicon doped with impurities, high-melting-point metals such as tungsten, Ti, Pt, Pd, Cu, TiW, TiN, TiNW, $WSi_2$, $MoSi_2$, metal silicides, and stack structures formed with these materials (Ti/TiN/W, for example).

A first carrier blocking layer may be provided between the semiconductor material layer and the first electrode, or a second carrier blocking layer may be provided between the organic photoelectric conversion layer and the second electrode. Further, a first charge injection layer may be provided between the first carrier blocking layer and the first electrode, or a second charge injection layer may be provided between the second carrier blocking layer and the second electrode. For example, the material forming an electron injection layer may be an alkali metal such as lithium (Li), sodium (Na), or potassium (K), a fluoride or oxide of such an alkali metal, an alkaline-earth metal such as magnesium (Mg) or calcium (Ca), or a fluoride or oxide of such an alkaline-earth metal.

Examples of film formation methods for forming the various organic layers include dry film formation methods and wet film formation methods. Examples of dry film formation methods include resistance heating or radio-frequency heating, a vacuum vapor deposition method using electron beam heating, a flash vapor deposition method, a plasma vapor deposition method, an EB vapor deposition method, various sputtering methods (a bipolar sputtering method, a direct-current sputtering method, a direct-current magnetron sputtering method, a radio-frequency sputtering method, a magnetron sputtering method, an RF-DC coupled bias sputtering method, an ECR sputtering method, a facing target sputtering method, a radio-frequency sputtering method, and an ion beam sputtering method), a direct current (DC) method, an RF method, a multiple cathode method, an activation reaction method, an electric field deposition method, various ion plating methods such as a radio-frequency ion plating method and a reactive ion plating method, a laser ablation method, a molecular beam epitaxy method, a laser transfer method, and a molecular beam epitaxy method (MBE method). Further, examples of CVD methods include a plasma CVD method, a thermal CVD method, a MOCVD method, and an optical CVD method. Meanwhile, specific examples of wet methods include various printing methods such as: a spin coating method; an immersion method; a casting method; a micro-contact printing method; a drop casting method; a screen printing method; an inkjet printing method; an offset printing method; a gravure printing method; and a flexographic printing method, and various coating methods such as: a stamp method; a spray method; an air doctor coating method; a blade coating method; a rod coating method; a knife coating method; a squeeze coating method; a reverse roll coating method; a transfer roll coating method; a gravure coating method; a kiss coating method; a cast coating method; a spray coating method; a slit orifice coating method; and a calendar coating method. In a coating method, non-polar or low-polarity organic solvent such as toluene, chloroform, hexane, or ethanol may be used as the solvent, for example. Examples of patterning methods include a shadow mask technique, laser transfer, chemical etching such as photolithography, and physical etching using ultraviolet light, laser, and the like. The planarization technique for the various organic layers may be a laser planarization method, a reflow method, or the like.

Two types or more of the imaging devices of the first through sixth configurations described above may be combined as desired.

As described above, in imaging devices or a solid-state imaging apparatus, on-chip microlenses and light blocking layers may be provided as needed, and drive circuits and wiring lines for driving the imaging devices are provided. If necessary, a shutter for controlling light entering the imaging devices may be provided, and the solid-state imaging apparatus may include an optical cut filter, depending on its purpose.

Further, in solid-state imaging apparatuses of the first and second configurations, one on-chip microlens may be disposed above one imaging device or the like of the present disclosure. Alternatively, an imaging device block may be formed with two imaging devices or the like of the present disclosure, and one on-chip microlens may be disposed above the imaging device block.

For example, in a case where a solid-state imaging apparatus and a readout integrated circuit (ROIC) are stacked, a drive substrate on which the readout integrated circuit and a connecting portion including copper (Cu) are formed, and an imaging device on which a connecting portion is formed are stacked on each other so that the connecting portions are brought into contact with each other, and the connecting portions are joined to each other. In this manner, the solid-state imaging apparatus and the readout integrated circuit can be stacked, and the connecting portions can be joined to each other with solder bumps or the like.

Meanwhile, in a method of driving a solid-state imaging apparatus according to the first or second embodiment of the present disclosure may be a method of driving a solid-state imaging apparatus by repeating the following steps:

in all the imaging devices, the electric charges in the first electrodes are simultaneously released out of the system, while electric charges are accumulated in the semiconductor material layers (or the semiconductor material layers and the photoelectric conversion layers);

after that, in all the imaging devices, the electric charges accumulated in the semiconductor material layers (or the semiconductor material layers and the photoelectric conversion layers) are simultaneously transferred to the first electrodes; and, after the transfer is completed, the electric charges transferred to the first electrode are sequentially read out in each of the imaging devices.

In such a method of driving a solid-state imaging apparatus, each imaging device has a structure in which light that has entered from the second electrode side does not enter the first electrode, and the electric charges in the first electrode are released out of the system while electric charges are accumulated in the semiconductor material layer and the like in all the imaging devices. Thus, the first electrodes can be reliably reset at the same time in all the imaging devices. After that, the electric charges accumulated in the semiconductor material layers and the like are simultaneously transferred to the first electrodes in all the imaging devices, and, after the transfer is completed, the electric charges transferred to the first electrode are sequentially read out in each imaging device. Because of this, a so-called global shutter function can be easily achieved.

In the description below, imaging devices and a solid-state imaging apparatus of Example 1 are described in detail.

An imaging device of Example 1 further includes a semiconductor substrate (more specifically, a silicon semiconductor layer) 70, and a photoelectric conversion unit is disposed above the semiconductor substrate 70. A control unit is further provided in the semiconductor substrate 70, and the control unit includes a drive circuit to which the first electrode 21 and the second electrode 22 are connected. Here, the light incidence face of the semiconductor substrate 70 is the upper side, and the opposite side of the semiconductor substrate 70 is the lower side. A wiring layer 62 formed with a plurality of wiring lines is provided below the semiconductor substrate 70.

The semiconductor substrate 70 is provided with at least a floating diffusion layer $FD_1$ and an amplification transistor $TR1_{amp}$ that form the control unit, and the first electrode 21 is connected to the floating diffusion layer $FD_1$ and the gate portion of the amplification transistor $TR1_{amp}$. The semiconductor substrate 70 is further provided with a reset transistor $TR1_{rst}$ and a selection transistor $TR1_{sel}$ that form the control unit. The floating diffusion layer $FD_1$ is connected to one of the source/drain regions of the reset transistor $TR1_{rst}$, one of the source/drain regions of the amplification transistor $TR1_{amp}$ is connected to one of the source/drain regions of the selection transistor $TR1_{sel}$, and the other one of the source/drain regions of the selection transistor $TR1_{sel}$ is connected to a signal line $VSL_1$. The amplification transistor $TR1_{amp}$, the reset transistor $TR1_{rst}$, and the selection transistor $TR1_{sel}$ constitute a drive circuit.

Specifically, an imaging device of Example 1 is a back-illuminated imaging device, and has a structure in which three imaging devices are stacked. The three imaging devices are: a green-light imaging device of Example 1 of a first type that includes a green-light photoelectric conversion layer of the first type that absorbs green light, and has sensitivity to green light (this imaging device will be hereinafter referred to as the "first imaging device"); a conventional blue-light imaging device of a second type that includes a blue-light photoelectric conversion layer of the second type that absorbs blue light, and has sensitivity to blue light (this imaging device will be hereinafter referred to as the "second imaging device"); and a conventional red-light imaging device of the second type that includes a red-light photoelectric conversion layer of the second type that absorbs red light, and has sensitivity to red light (this imaging device will be hereinafter referred to as the "third imaging device"). Here, the red-light imaging device (the third imaging device) and the blue-light imaging device (the second imaging device) are disposed in the semiconductor substrate 70, and the second imaging device is located closer to the light incident side than the third imaging device is. Further, the green-light imaging device (the first imaging device) is disposed above the blue-light imaging device (the second imaging device). One pixel is formed with the stack structure of the first imaging device, the second imaging device, and the third imaging device. Any color filter layer is not provided.

In the first imaging device, the first electrode 21 and the charge storage electrode 24 are formed at a distance from each other on an interlayer insulating layer 81. The interlayer insulating layer 81 and the charge storage electrode 24 are covered with the insulating layer 82. The semiconductor material layer 23B and the photoelectric conversion layer 23A are formed on the insulating layer 82, and the second electrode 22 is formed on the photoelectric conversion layer 23A. An insulating layer 83 is formed on the entire surface including the second electrode 22, and the on-chip microlens 14 is provided on the insulating layer 83. Any color filter layer is not provided. The first electrode 21, the charge storage electrode 24, and the second electrode 22 are formed with transparent electrodes formed with ITO (work function: about 4.4 eV), for example. The semiconductor material layer 23B includes an inorganic oxide semiconductor material in which at least one of the various types has an amorphous structure. The photoelectric conversion layer 23A is formed with a layer containing a known organic photoelectric conversion material (an organic material such as a rhodamine dye, a merocyanine dye, or quinacridone, for example) having sensitivity to at least green light. The interlayer insulating layer 81 and the insulating layers 82 and 83 are formed with a known insulating material ($SiO_2$ or SiN, for example). The semiconductor material layer 23B and the first electrode 21 are connected by a connecting portion 67 formed in the insulating layer 82. The semiconductor material layer 23B extends in the connecting portion 67. In other words, the semiconductor material layer 23B extends in an opening 85 formed in the insulating layer 82, and is connected to the first electrode 21.

The charge storage electrode 24 is connected to a drive circuit. Specifically, the charge storage electrode 24 is connected to a vertical drive circuit 112 forming a drive circuit, via a connecting hole 66, a pad portion 64, and a wiring line $V_{OA}$ provided in the interlayer insulating layer 81.

The size of the charge storage electrode 24 is larger than that of the first electrode 21. Where the area of the charge storage electrode 24 is represented by $S_1'$, and the area of the first electrode 21 is represented by $S_1$, it is preferable to satisfy $$4 \geq S_1'/S_1,$$

which is not restrictive though.

In Example 1, $$S1'/S1=8, \text{ for example,}$$

which is not restrictive though. Note that, in Examples 7 through 10 described later, three photoelectric conversion unit segments $\mathbf{10'}_1$, $\mathbf{10'}_2$, and $\mathbf{10'}_3$ have the same size, and also have the same planar shape.

A device separation region 71 is formed on the side of a first surface (front surface) 70A of the semiconductor substrate 70, and an oxide film 72 is formed on the first surface 70A of the semiconductor substrate 70. Further, on the first surface side of the semiconductor substrate 70, the reset transistor TR1$_{rst}$, the amplification transistor TR1$_{amp}$, and the selection transistor TR1$_{sel}$ constituting the control unit of the first imaging device are provided, and the first floating diffusion layer $FD_1$ is also provided.

The reset transistor TR1$_{rst}$ includes a gate portion 51, a channel formation region 51A, and source/drain regions 51B and 51C. The gate portion 51 of the reset transistor TR1$_{rst}$ is connected to a reset line $RST_1$, one source/drain region 51C of the reset transistor TR1$_{rst}$ also serves as the first floating diffusion layer $FD_1$, and the other source/drain region 51B is connected to a power supply $V_{DD}$.

The first electrode 21 is connected to one source/drain region 51C (the first floating diffusion layer $FD_1$) of the reset transistor TR1$_{rst}$, via a connecting hole 65 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor TR1$_{amp}$ includes a gate portion 52, a channel formation region 52A, and source/drain regions 52B and 52C. The gate portion 52 is connected to the first electrode 21 and one source/drain region 51C (the first floating diffusion layer $FD_1$) of the reset transistor TR1$_{rst}$, via the wiring layer 62. Further, one source/drain region 52B is connected to the power supply $V_{DD}$.

The selection transistor TR1$_{sel}$ includes a gate portion 53, a channel formation region 53A, and source/drain regions 53B and 53C. The gate portion 53 is connected to a selection line $SEL_1$. Further, one source/drain region 53B shares a region with the other source/drain region 52C forming the amplification transistor TR1$_{amp}$, and the other source/drain region 53C is connected to a signal line (a data output line) $VSL_1$ (117).

The second imaging device includes a photoelectric conversion layer that is an n-type semiconductor region 41 provided in the semiconductor substrate 70. The gate portion 45 of a transfer transistor TR2$_{trs}$ formed with a vertical transistor extends to the n-type semiconductor region 41, and is connected to a transfer gate line $TG_2$. Further, a second floating diffusion layer $FD_2$ is disposed in a region 45C near the gate portion 45 of the transfer transistor TR2$_{trs}$ in the semiconductor substrate 70. The electric charges stored in the n-type semiconductor region 41 are read into the second floating diffusion layer $FD_2$ via a transfer channel formed along the gate portion 45.

In the second imaging device, a reset transistor TR2$_{rst}$, an amplification transistor TR2$_{amp}$, and a selection transistor TR2$_{sel}$ that constitute the control unit of the second imaging device are further disposed on the first surface side of the semiconductor substrate 70.

The reset transistor TR2$_{rst}$ includes a gate portion, a channel formation region, and source/drain regions. The gate portion of the reset transistor TR2$_{rst}$ is connected to a reset line $RST_2$, one of the source/drain regions of the reset transistor TR2$_{rst}$ is connected to the power supply $V_{DD}$, and the other one of the source/drain regions also serves as the second floating diffusion layer $FD_2$.

The amplification transistor TR2$_{amp}$ includes a gate portion, a channel formation region, and source/drain regions. The gate portion is connected to the other one of the source/drain regions (the second floating diffusion layer $FD_2$) of the reset transistor TR2$_{rst}$. Further, one of the source/drain regions is connected to the power supply $V_{DD}$.

The selection transistor TR2$_{sel}$ includes a gate portion, a channel formation region, and source/drain regions. The gate portion is connected to a selection line $SEL_2$. Further, one of the source/drain regions shares a region with the other one of the source/drain regions forming the amplification transistor TR2$_{amp}$, and the other one of the source/drain regions is connected to a signal line (a data output line) $VSL_2$.

The third imaging device includes a photoelectric conversion layer that is an n-type semiconductor region 43 provided in the semiconductor substrate 70. The gate portion 46 of a transfer transistor TR3$_{trs}$ is connected to a transfer gate line $TG_3$. Further, a third floating diffusion layer $FD_3$ is disposed in a region 46C near the gate portion 46 of the transfer transistor TR3$_{trs}$ in the semiconductor substrate 70. The electric charges stored in the n-type semiconductor region 43 are read into the third floating diffusion layer $FD_3$ via a transfer channel 46A formed along the gate portion 46.

In the third imaging device, a reset transistor TR3$_{rst}$, an amplification transistor TR3$_{amp}$, and a selection transistor TR3$_{sel}$ that constitute the control unit of the third imaging device are further disposed on the first surface side of the semiconductor substrate 70.

The reset transistor TR3$_{rst}$ includes a gate portion, a channel formation region, and source/drain regions. The gate portion of the reset transistor TR3$_{rst}$ is connected to a reset line $RST_3$, one of the source/drain regions of the reset transistor TR3$_{rst}$ is connected to the power supply $V_{DD}$, and the other one of the source/drain regions also serves as the third floating diffusion layer $FD_3$.

The amplification transistor TR3$_{amp}$ includes a gate portion, a channel formation region, and source/drain regions. The gate portion is connected to the other one of the source/drain regions (the third floating diffusion layer $FD_3$) of the reset transistor TR3$_{rst}$. Further, one of the source/drain regions is connected to the power supply $V_{DD}$.

The selection transistor TR3$_{sel}$ includes a gate portion, a channel formation region, and source/drain regions. The gate portion is connected to a selection line $SEL_3$. Further, one of the source/drain regions shares a region with the other one of the source/drain regions forming the amplification transistor TR3$_{amp}$, and the other one of the source/drain regions is connected to a signal line (a data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical drive circuit 112 that forms a drive circuit, and the signal lines (data output lines) $VSL_1$, $VSL_2$, and $VSL_3$ are connected to a column signal processing circuit 113 that forms a drive circuit.

A $p^+$-layer 44 is provided between the n-type semiconductor region 43 and the front surface 70A of the semiconductor substrate 70, to reduce generation of dark current. A $p^+$-layer 42 is formed between the n-type semiconductor region 41 and the n-type semiconductor region 43, and, further, part of a side surface of the n-type semiconductor region 43 is surrounded by the $p^+$-layer 42. A $p^+$-layer 73 is formed on the side of the back surface 70B of the semiconductor substrate 70, and a $HfO_2$ film 74 and an insulating material film 75 are formed in the portion extending from the $p^+$-layer 73 to the formation region of the contact hole portion 61 in the semiconductor substrate 70. In the interlayer insulating layer 76, wiring lines are formed across a plurality of layers, but are not shown in the drawings.

The $HfO_2$ film 74 is a film having a negative fixed electric charge. As such a film is included, generation of dark current can be reduced. Instead of a $HfO_2$ film, it is possible to use an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolinium oxide ($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or an aluminum oxynitride film. These films may be formed by a CVD method, a PVD method, or an ALD method, for example.

Figure 5:
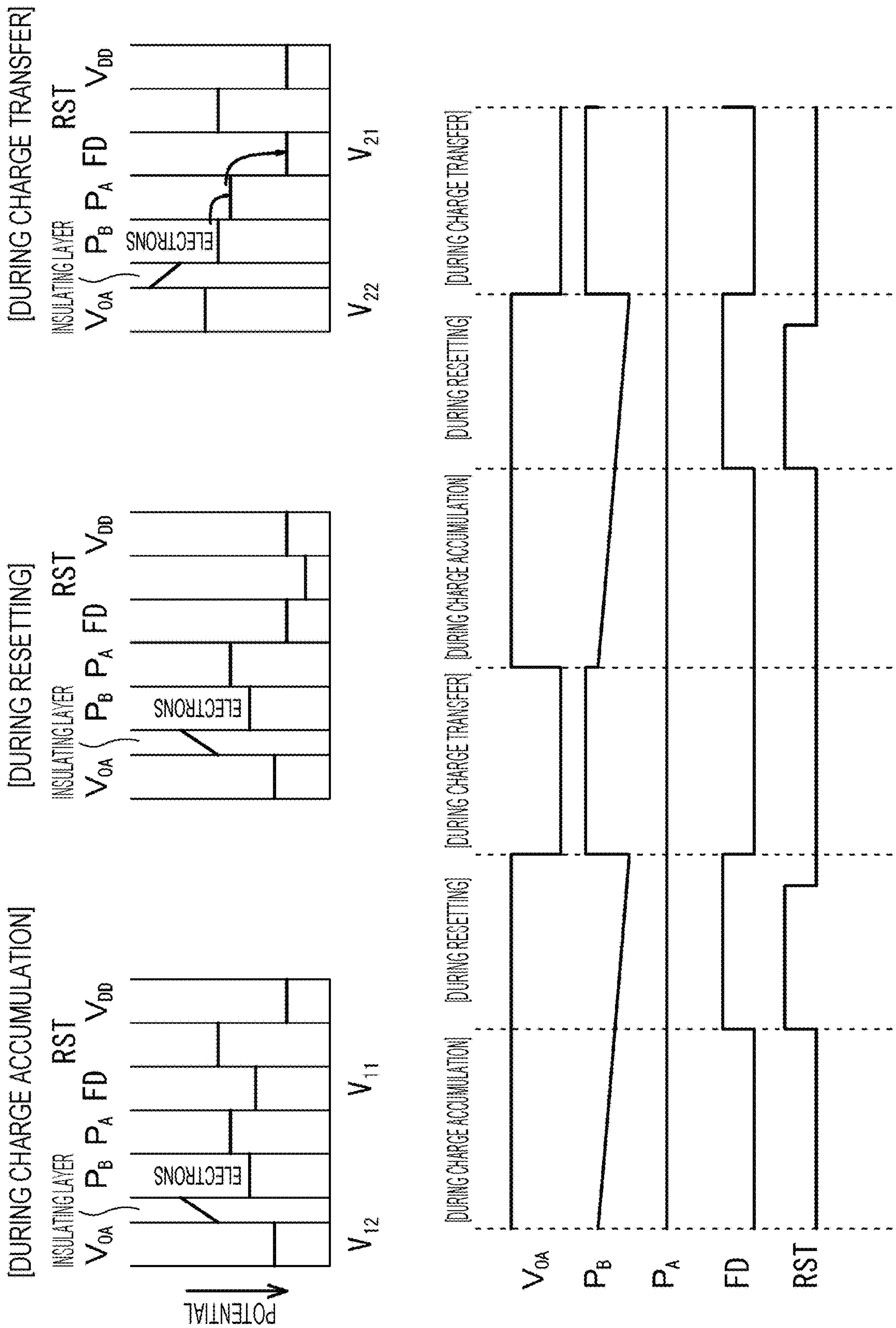
FIG. 5 is a diagram schematically showing the states of the potentials at respective portions during an operation of an imaging device of Example 1.

In the description below, operation of a stacked imaging device (the first imaging device) including the charge storage electrode of Example 1 is described with reference to FIGS. 5 and 6A. The imaging device of Example 1 is provided on the semiconductor substrate 70, and further includes a control unit having a drive circuit. The first electrode 21, the second electrode 22, and the charge storage electrode 24 are connected to the drive circuit. Here, the potential of the first electrode 21 is higher than the potential of the second electrode 22. Specifically, the first electrode 21 has a positive potential, the second electrode 22 has a negative potential, and electrons generated through photoelectric conversion in the photoelectric conversion layer 23A are read into the floating diffusion layer, for example. The same applies to the other Examples.

Figure 20:
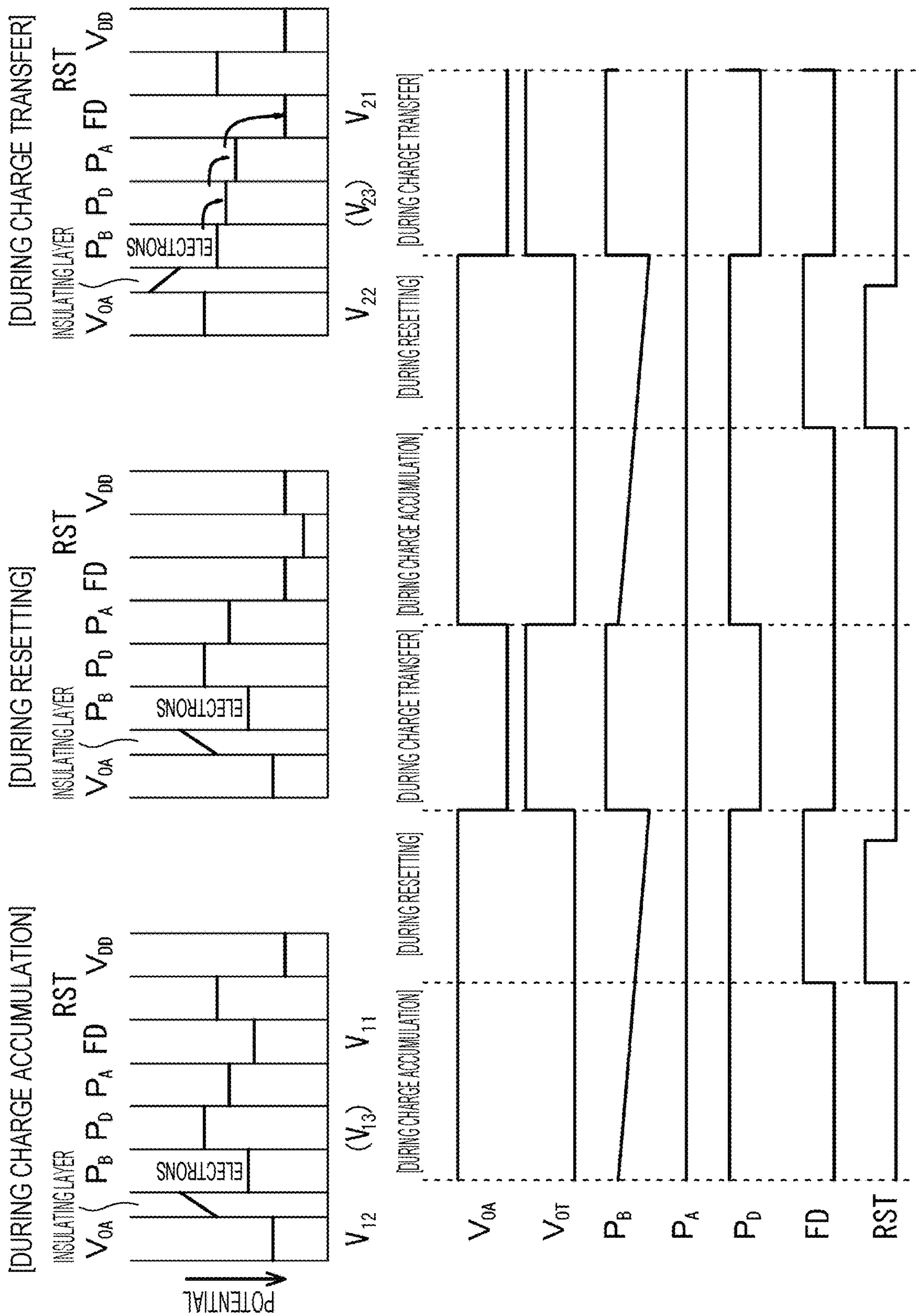
FIG. 20 is a diagram schematically showing the states of the potentials at respective portions during an operation of an imaging device of Example 4.
Figure 21:
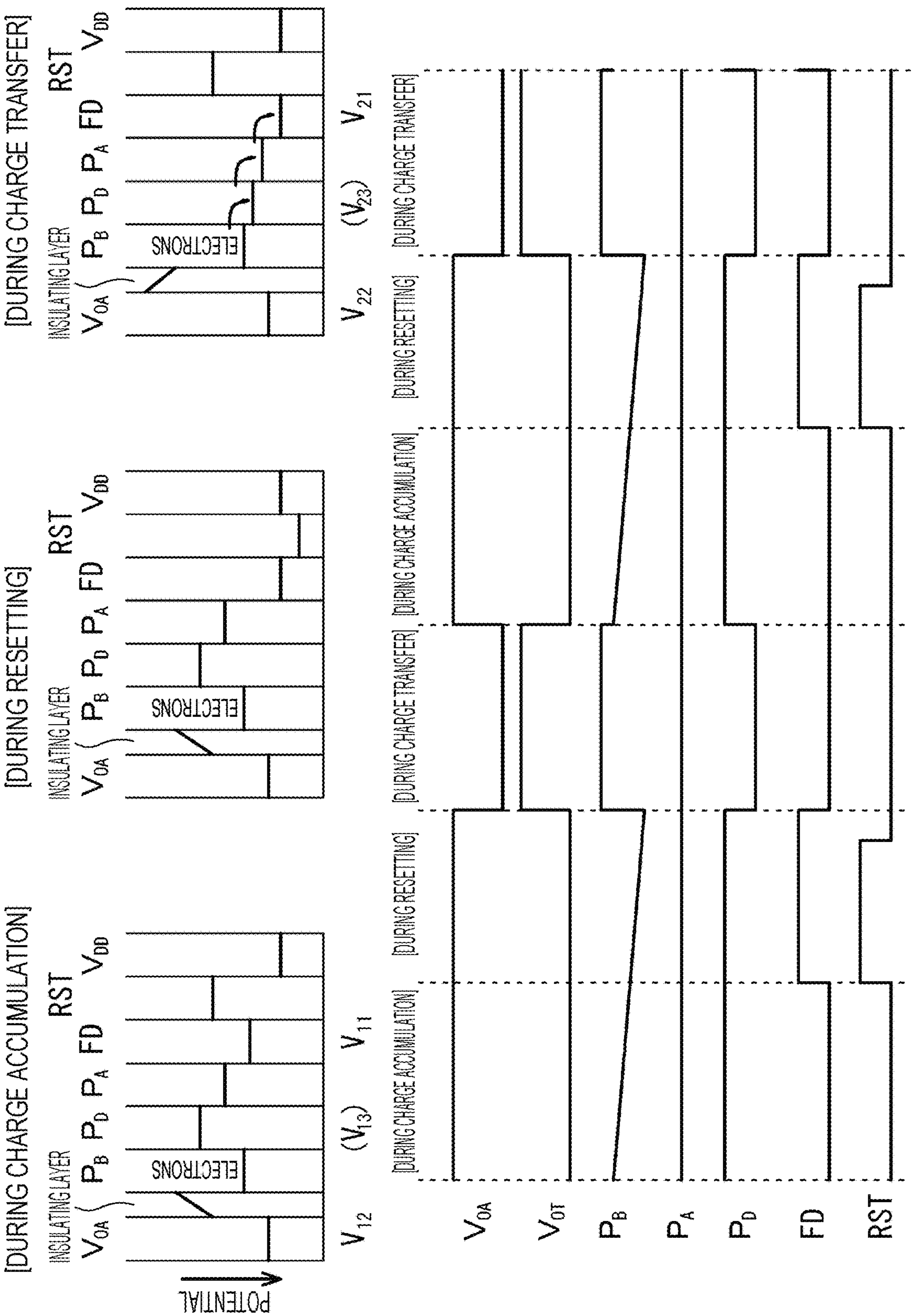
FIG. 21 is a diagram schematically showing the states of the potentials at respective portions during another operation of the imaging device of Example 4.

The symbols used in FIG. 5, in FIGS. 20 and 21 for Example 4 described later, and in FIGS. 32 and 33 for Example 6 described later are as follows.

$P_A$: the potential at a point $P_A$ in a region of the semiconductor material layer 23B facing a region located between the charge storage electrode 24 or a transfer control electrode (charge transfer electrode) 25 and the first electrode 21

$P_B$: the potential at a point $P_B$ in a region of the semiconductor material layer 23B facing the charge storage electrode 24

$P_{c1}$: the potential at a point $P_{c1}$ in a region of the semiconductor material layer 23B facing a charge storage electrode segment 24A $P_{c2}$: the potential at a point $P_{c2}$ in a region of the semiconductor material layer 23B facing a charge storage electrode segment 24B $P_{c3}$: the potential at a point $P_{c3}$ in a region of the semiconductor material layer 23B facing a charge storage electrode segment 24C $P_D$: the potential at a point $P_D$ in a region of the semiconductor material layer 23B facing the transfer control electrode (charge transfer electrode) 25

FD: the potential in the first floating diffusion layer $FD_1$ $V_{OA}$: the potential at the charge storage electrode 24

$V_{OA\text{-}A}$: the potential at the charge storage electrode segment 24A $V_{OA\text{-}B}$: the potential at the charge storage electrode segment 24B $V_{OA\text{-}C}$: the potential at the charge storage electrode segment 24C $V_{OT}$: the potential at the transfer control electrode (charge transfer electrode) 25

RST: the potential at the gate portion 51 of the reset transistor $TR1_{rst}$ $V_{DD}$: the potential of the power supply $VSL_1$: the signal line (data output line) $VSL_1$ $TR1_{rst}$: the reset transistor $TR1_{rst}$ $TR1_{amp}$: the amplification transistor $TR1_{amp}$ $TR1_{sel}$: the selection transistor $TR1_{sel}$ In a charge accumulation period, the drive circuit applies a potential $V_{11}$ to the first electrode 21, and a potential $V_{12}$ to the charge storage electrode 24. Light that has entered the photoelectric conversion layer 23A causes photoelectric conversion in the photoelectric conversion layer 23A. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12} \geq V_{11}$, or preferably, $V_{12} > V_{11}$. With this arrangement, the electrons generated through photoelectric conversion are attracted to the charge storage electrode 24, and stay in the semiconductor material layer 23B, or in the semiconductor material layer 23B and the photoelectric conversion layer 23A facing the charge storage electrode 24 (hereinafter, these layers will be referred to as the "semiconductor material layer 23B and the like"). That is, electric charges are accumulated in the semiconductor material layer 23B and the like. Since $V_{12} > V_{11}$, electrons generated in the photoelectric conversion layer 23A will not move toward the first electrode 21. With the passage of time for photoelectric conversion, the potential in the region of the semiconductor material layer 23B and the like facing the charge storage electrode 24 becomes a more negative value.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 21, and a potential $V_{22}$ to the charge storage electrode 24. Here, $V_{22} < V_{21}$. As a result, the electrons remaining in the region of the semiconductor material layer 23B and the like facing the charge storage electrode 24 are read into the first electrode 21 and further into the first floating diffusion layer $FD_1$. In other words, the electric charges accumulated in the semiconductor material layer 23B and the like are read into the control unit.

In the above manner, a series of operations including charge accumulation, reset operation, and charge transfer is completed.

The operations of the amplification transistor $TR1_{amp}$ and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer. Further, the reset noise in the first floating diffusion layer $FD_1$ can be eliminated by a correlated double sampling (CDS) process as in conventional operations.

As described above, in Example 1, the charge storage electrode is disposed at a distance from the first electrode, and is positioned to face the photoelectric conversion layer via the insulating layer. Accordingly, when light is emitted onto the photoelectric conversion layer, and photoelectric conversion is performed in the photoelectric conversion layer, a kind of capacitor is formed by the semiconductor material layer and the like, the insulating layer, and the charge storage electrode, and electric charges can be stored in the semiconductor material layer and the like. Accordingly, at the start of exposure, the charge storage portion can be fully depleted, and the electric charges can be erased. As a result, it is possible to reduce or prevent the occurrence of a phenomenon in which the kTC noise becomes larger, the random noise is aggravated, and the imaging quality is lowered. Further, all the pixels can be reset simultaneously, a so-called global shutter function can be achieved.

FIG. 76 is a conceptual diagram of a solid-state imaging apparatus of Example 1. A solid-state imaging apparatus 100 of Example 1 includes an imaging region 111 in which stacked imaging devices 101 are arranged in a two-dimensional array, the vertical drive circuit 112 as the drive circuit (a peripheral circuit) for the stacked imaging devices 101, the column signal processing circuits 113, a horizontal drive circuit 114, an output circuit 115, and a drive control circuit 116. These circuits may be formed with known circuits, or may of course be formed with other circuit configurations (various circuits that are used in conventional CCD imaging devices or CMOS imaging devices, for example). In FIG. 76, reference numeral "101" for the stacked imaging devices 101 is only shown in one row.

On the basis of a vertical synchronization signal, a horizontal synchronization signal, and a master clock, the drive control circuit 116 generates a clock signal and a control signal that serve as the references for operations of the vertical drive circuit 112, the column signal processing circuits 113, and the horizontal drive circuit 114. The generated clock signal and control signal are then input to the vertical drive circuit 112, the column signal processing circuits 113, and the horizontal drive circuit 114.

The vertical drive circuit 112 is formed with a shift register, for example, and selectively scans the respective stacked imaging devices 101 in the imaging region 111 sequentially in the vertical direction row by row. A pixel signal (an image signal) based on the current (signal) generated in accordance with the amount of light received in each stacked imaging device 101 is then sent to the column signal processing circuit 113 via a signal line (a data output line) 117 and a VSL.

The column signal processing circuits 113 are provided for the respective columns of the stacked imaging devices 101, for example, and perform signal processing such as noise removal and signal amplification on the image signals output from the stacked imaging devices 101 of one row in accordance with a signal from a black reference pixel (formed around an effective pixel region, though not shown) for each imaging device. Horizontal select switches (not shown) are provided between and connected to the output stages of the column signal processing circuits 113 and a horizontal signal line 118.

The horizontal drive circuit 114 is formed with a shift register, for example. The horizontal drive circuit 114 sequentially selects the respective column signal processing circuits 113 by sequentially outputting horizontal scan pulses, and causes the respective column signal processing circuits 113 to output signals to the horizontal signal line 118.

The output circuit 115 performs signal processing on signals sequentially supplied from the respective column signal processing circuits 113 through the horizontal signal line 118, and outputs the processed signals.

Figure 9:
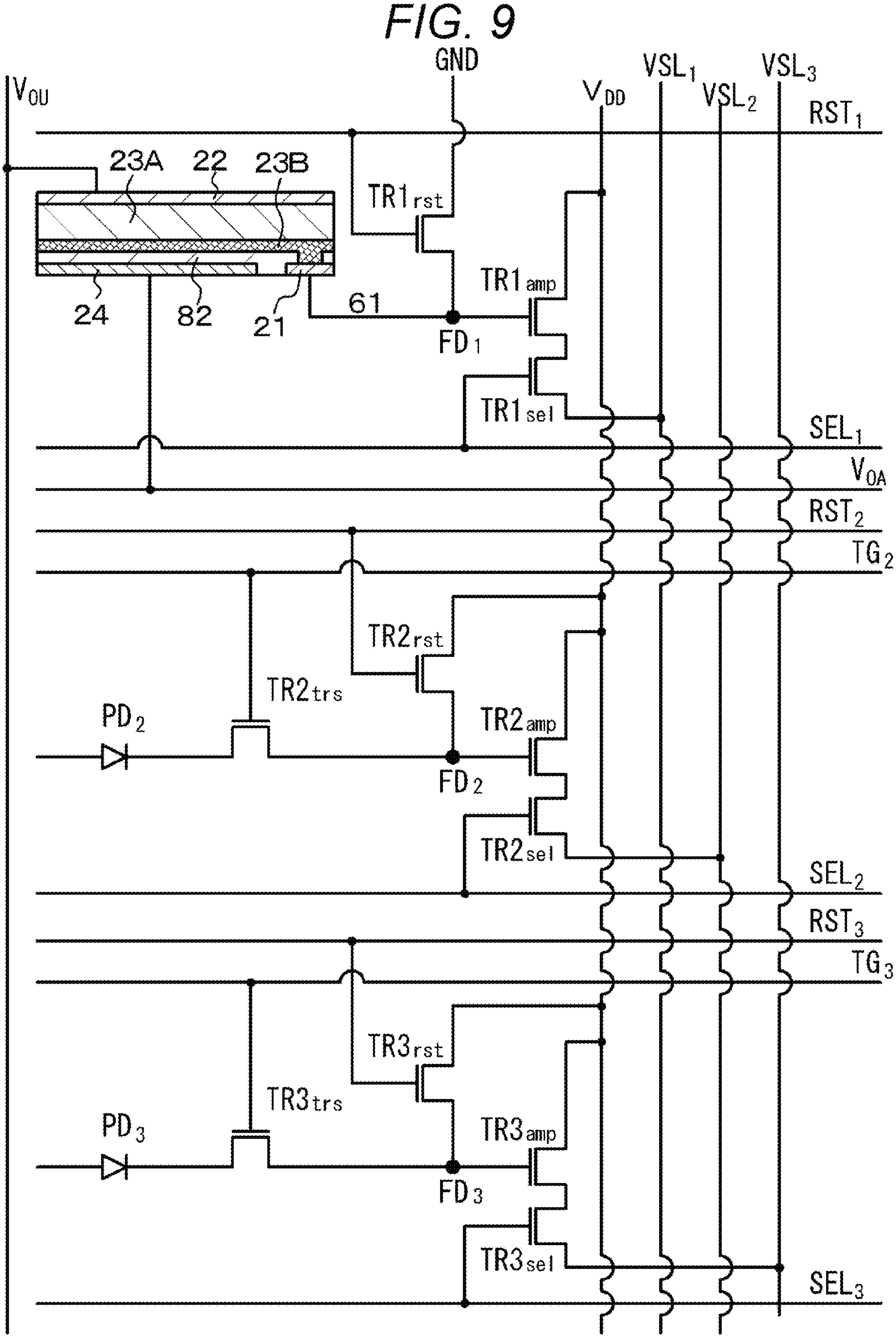
FIG. 9 is an equivalent circuit diagram of a modification of an imaging device of Example 1.
Figure 10:
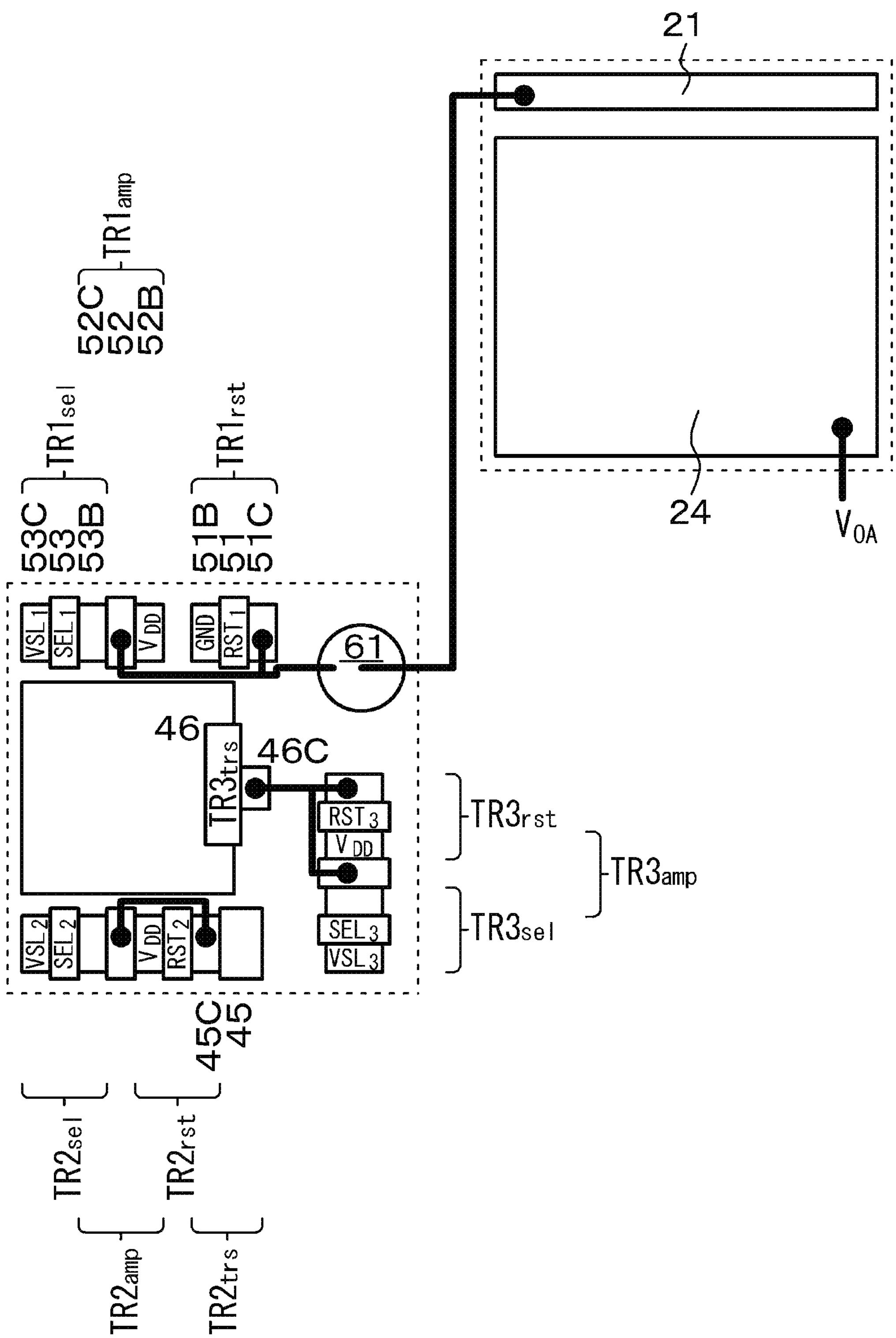
FIG. 10 is a schematic layout diagram of a first electrode, a charge storage electrode, and the transistors constituting a control unit of the modification of an imaging device of Example 1 shown in FIG. 9.

FIG. 9 shows an equivalent circuit diagram of a modification of an imaging device of Example 1, and FIG. 10 shows a schematic layout diagram of the first electrode, the charge storage electrode, and the transistors constituting the control unit. As shown in FIG. 10, the other source/drain region 51B of the reset transistor $TR1_{rst}$ may be grounded, instead of being connected to the power supply $V_{DD}$.

An imaging device of Example 1 can be manufactured by the method described below, for example. Specifically, an SOI substrate is first prepared. A first silicon layer is then formed on the surface of the SOI substrate by an epitaxial growth method, and the $p^+$-layer 73 and the n-type semiconductor region 41 are formed in the first silicon layer. A second silicon layer is then formed on the first silicon layer by an epitaxial growth method, and the device separation region 71, the oxide film 72, the $p^+$-layer 42, the n-type semiconductor region 43, and the $p^+$-layer 44 are formed in the second silicon layer. Further, various transistors and the like that constitute the control unit of the imaging device are formed in the second silicon layer, and the wiring layer 62, the interlayer insulating layer 76, and various wiring lines are formed thereon. After that, the interlayer insulating layer 76 and a support substrate (not shown) are bonded to each other. After that, the SOT substrate is removed, to expose the first silicon layer. The surface of the second silicon layer corresponds to the front surface 70A of the semiconductor substrate 70, and the surface of the first silicon layer corresponds to the back surface 70B of the semiconductor substrate 70. Further, the first silicon layer and the second silicon layer are collectively referred to as the semiconductor substrate 70. The opening for forming the contact hole portion 61 is then formed on the side of the back surface 70B of the semiconductor substrate 70, and the $HfO_2$ film 74, the insulating material film 75, and the contact hole portion 61 are formed. Further, the pad portions 63 and 64, the interlayer insulating layer 81, the connecting holes 65 and 66, the first electrode 21, the charge storage electrode 24, and the insulating layer 82 are formed. An opening is then formed in the connecting portion 67, and the semiconductor material layer 23B, the photoelectric conversion layer 23A, the second electrode 22, the insulating layer 83, and the on-chip microlens 14 are formed. In this manner, an imaging device of Example 1 can be obtained.

Further, although not shown in any of the drawings, the insulating layer 82 may have a two-layer configuration including an insulating layer/under layer and an insulating layer/top layer. That is, the insulating layer/under layer is formed at least on the charge storage electrode 24 and in a region between the charge storage electrode 24 and the first electrode 21 (more specifically, the insulating layer/under layer is formed on the interlayer insulating layer 81 including the charge storage electrode 24), and a planarization process is performed on the insulating layer/under layer. After that, the insulating layer/top layer is formed over the insulating layer/under layer and the charge storage electrode 24. Thus, the insulating layer 82 can be planarized without fail. An opening is then formed in the thus obtained insulating layer 82, so that the connecting portion 67 is formed.

Example 2

Figure 11:
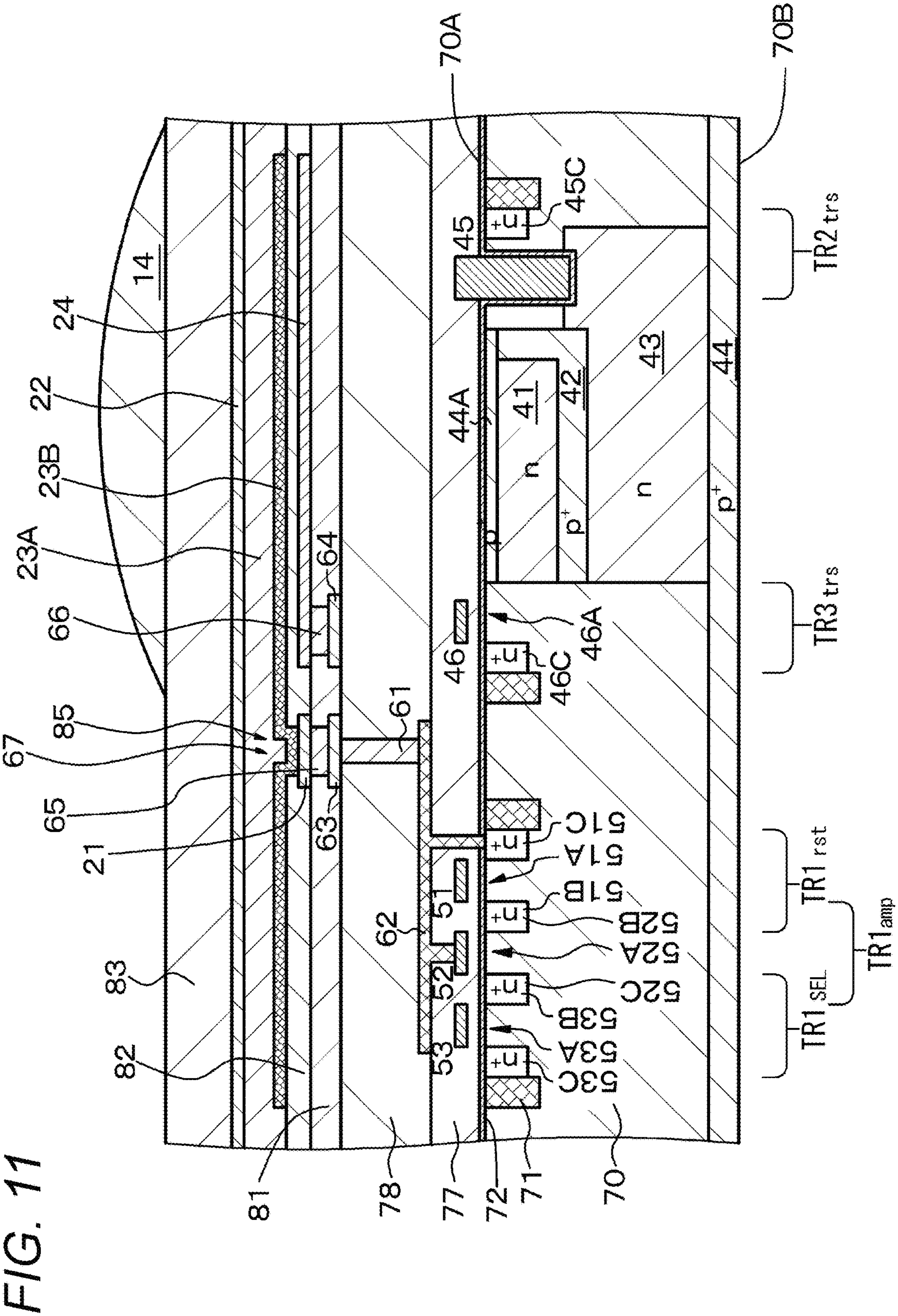
FIG. 11 is a schematic partial cross-sectional view of an imaging device of Example 2.

Example 2 is a modification of Example 1. FIG. 11 shows schematic partial cross-sectional view of a front-illuminated imaging device of Example 2. The front-illuminated imaging device has a structure in which three imaging devices are stacked. The three imaging devices are: a green-light imaging device of Example 1 of a first type (a first imaging device) that includes a green-light photoelectric conversion layer of the first type that absorbs green light, and has sensitivity to green light; a conventional blue-light imaging device of a second type (a second imaging device) that includes a blue-light photoelectric conversion layer of the second type that absorbs blue light, and has sensitivity to blue light; and a conventional red-light imaging device of the second type (a third imaging device) that includes a red-light photoelectric conversion layer of the second type that absorbs red light, and has sensitivity to red light. Here, the red-light imaging device (the third imaging device) and the blue-light imaging device (the second imaging device) are disposed in the semiconductor substrate 70, and the second imaging device is located closer to the light incident side than the third imaging device is. Further, the green-light imaging device (the first imaging device) is disposed above the blue-light imaging device (the second imaging device).

On the side of the front surface 70A of the semiconductor substrate 70, various transistors that constitute the control unit are provided, as in Example 1. These transistors may have configurations and structures substantially similar to those of the transistors described in Example 1. Further, the second imaging device and the third imaging device are provided in the semiconductor substrate 70, and these imaging devices may have configurations and structures substantially similar to those of the second imaging device and the third imaging device described in Example 1.

The interlayer insulating layer 81 is formed above the front surface 70A of the semiconductor substrate 70, and the photoelectric conversion unit (the first electrode 21, the semiconductor material layer 23B, the photoelectric conversion layer 23A, the second electrode 22, the charge storage electrode 24, and the like) including the charge storage electrode forming the imaging device of Example 1 is provided above the interlayer insulating layer 81.

As described above, except for being of the front-illuminated type, the configuration and the structure of the imaging device of Example 2 may be similar to the configuration and the structure of the imaging device of Example 1, and therefore, detailed explanation thereof is not made herein.

Example 3

Example 3 is modifications of Examples 1 and 2.

Figure 12:
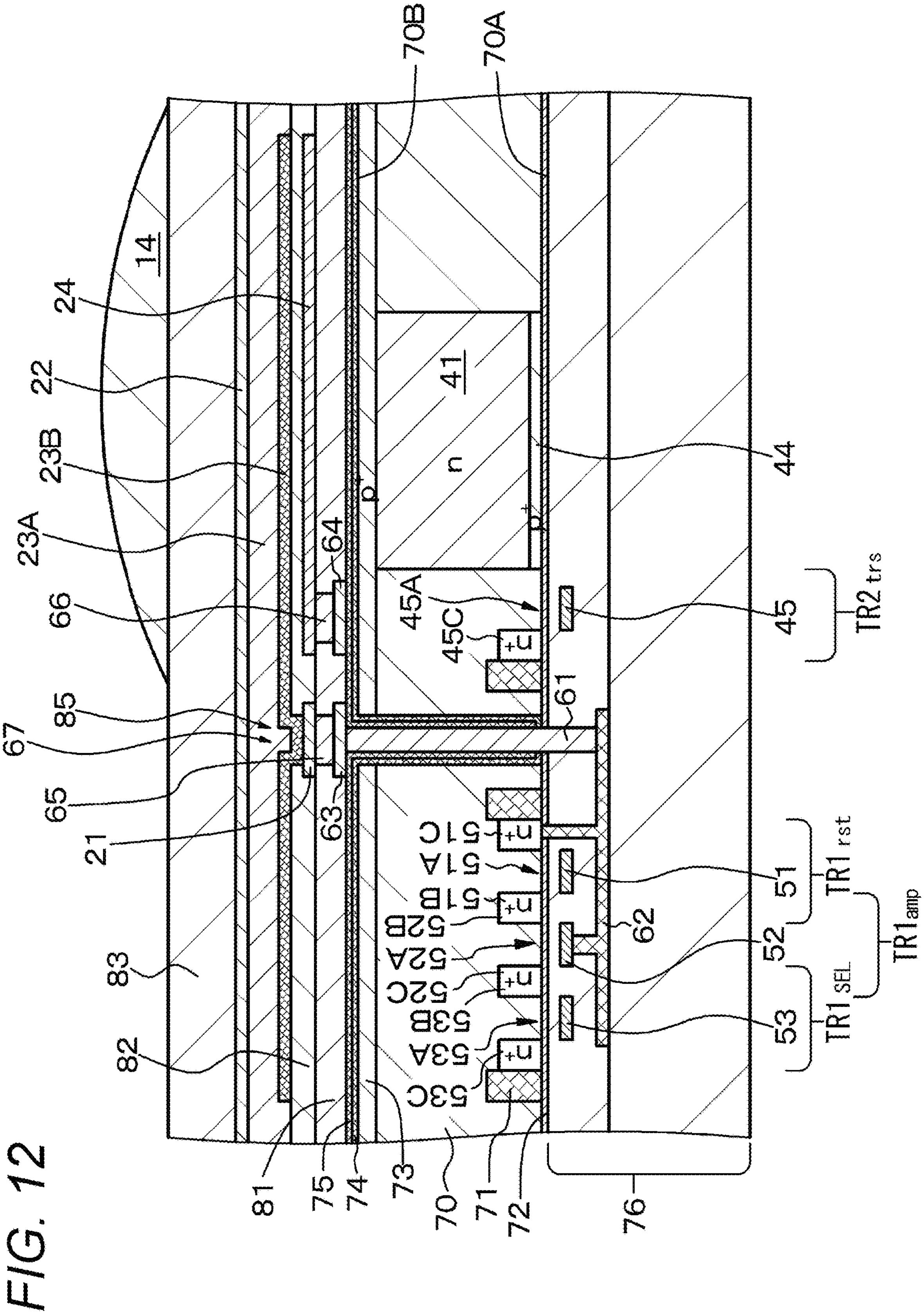
FIG. 12 is a schematic partial cross-sectional view of an imaging device of Example 3.
Figure 13:
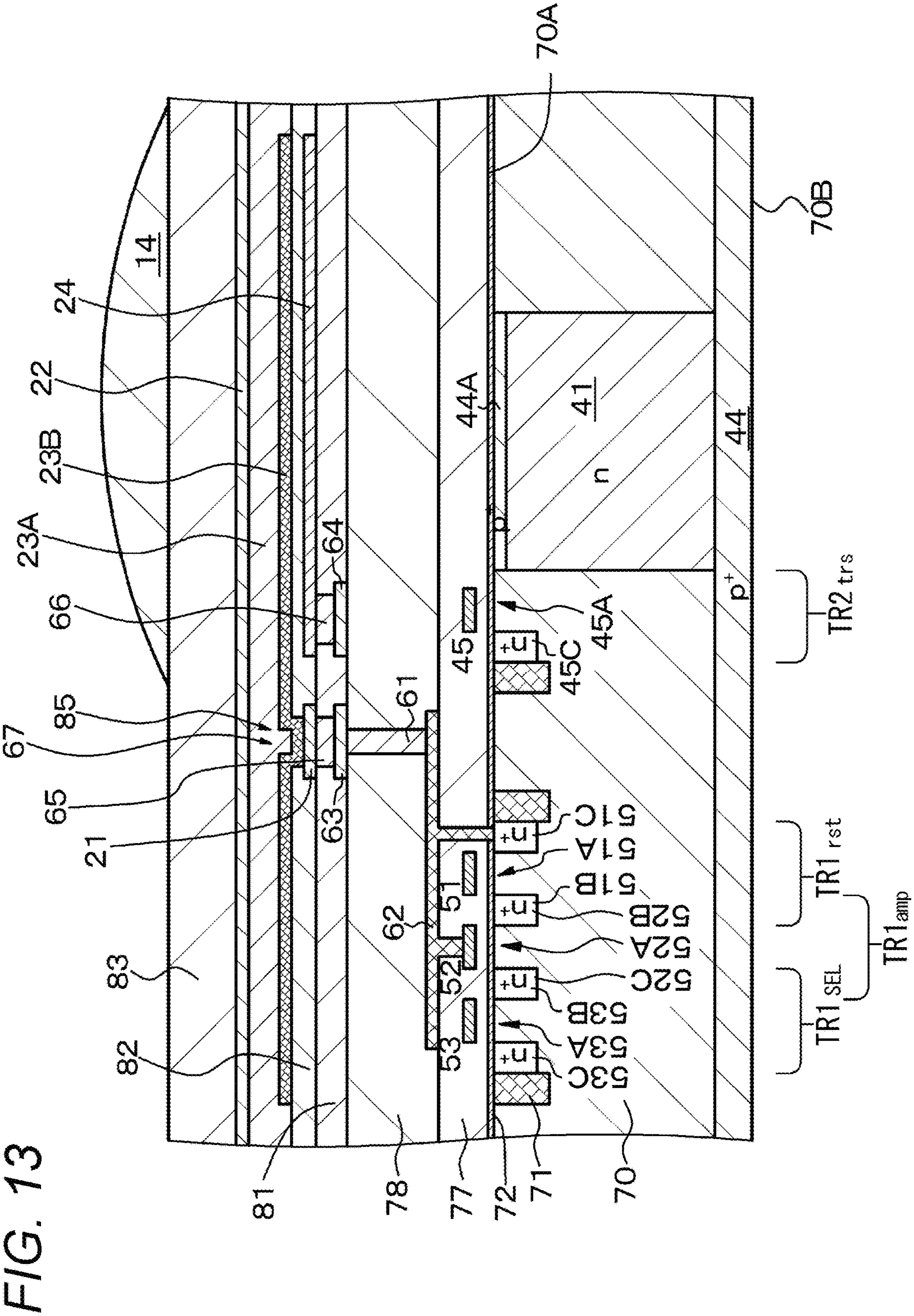
FIG. 13 is a schematic partial cross-sectional view of a modification of an imaging device of Example 3.

FIG. 12 shows a schematic partial cross-sectional view of a back-illuminated imaging device of Example 3. This imaging device has a structure in which the two imaging devices that are the first imaging device of the first type of Example 1 and the second imaging device of the second type are stacked. Further, FIG. 13 shows a schematic partial cross-sectional view of a modification of the imaging device of Example 3. This modification is a front-illuminated imaging device, and has a structure in which the two imaging devices that are the first imaging device of the first type of Example 1 and the second imaging device of the second type are stacked. Here, the first imaging device absorbs primary color light, and the second imaging device absorbs complementary color light. Alternatively, the first imaging device absorbs white light, and the second imaging device absorbs infrared rays. The electric charges stored in the n-type semiconductor region 41 are read into the second floating diffusion layer $FD_2$ via a transfer channel 45A formed along the gate portion 45.

Figure 14:
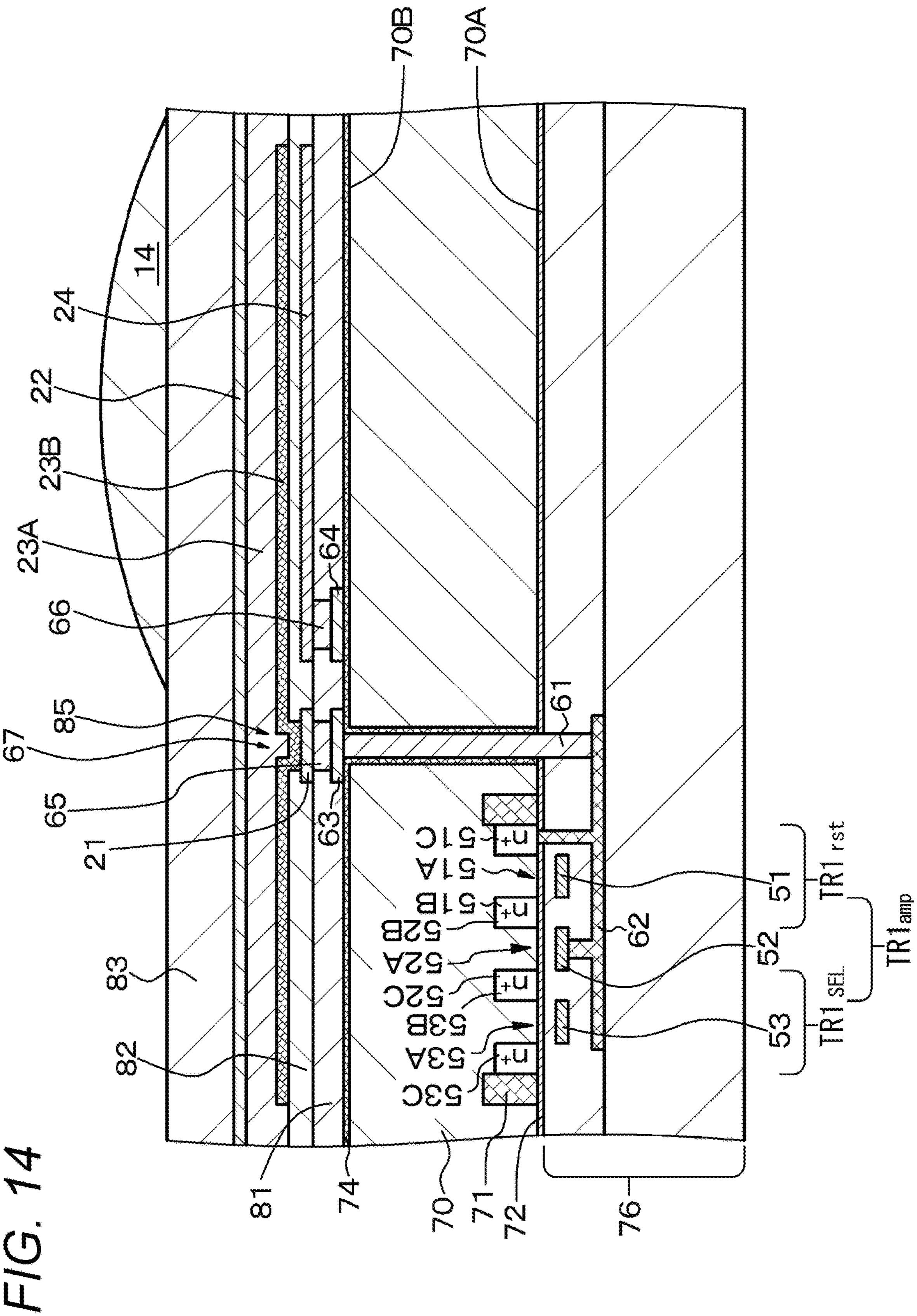
FIG. 14 is a schematic partial cross-sectional view of another modification of an imaging device of Example 3.
Figure 15:
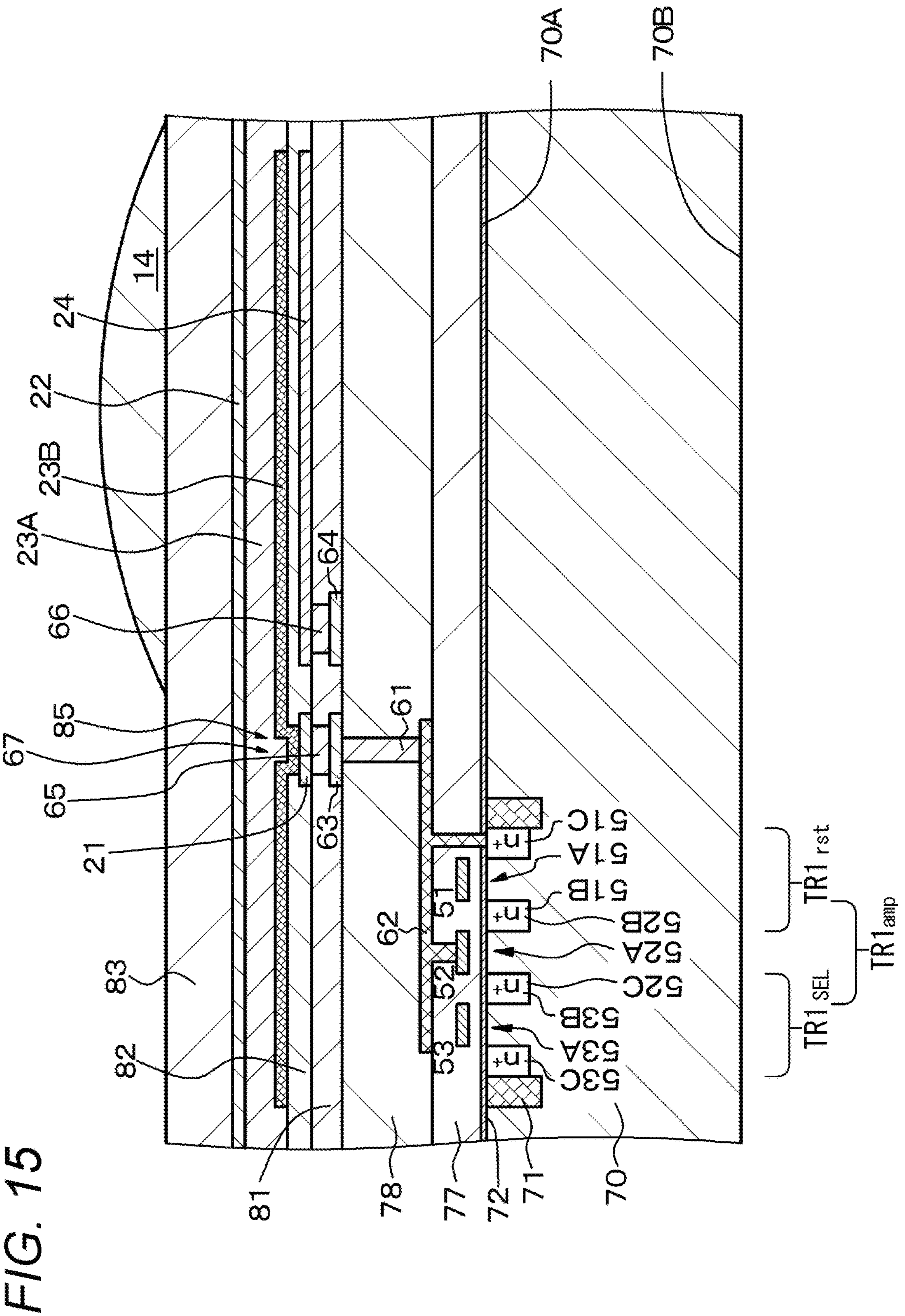
FIG. 15 is a schematic partial cross-sectional view of yet another modification of an imaging device of Example 3.

Further, FIG. 14 shows a schematic partial cross-sectional view of a modification of the imaging device of Example 3. This modification is a back-illuminated imaging device, and is formed with the first imaging device of the first type of Example 1. Further, FIG. 15 shows a schematic partial cross-sectional view of a modification of the imaging device of Example 3. This modification is a front-illuminated imaging device, and is formed with the first imaging device of the first type of Example 1. Here, the first imaging device is formed with three types of imaging devices that are an imaging device that absorbs red light, an imaging device that absorbs green light, and an imaging device that absorbs blue light. Further, a plurality of these imaging devices constitutes a solid-state imaging apparatus according to the first embodiment of the present disclosure. The plurality of these imaging devices may be arranged in a Bayer array. On the light incident side of each imaging device, a color filter layer for performing blue, green, or red spectral separation is disposed as necessary.

Instead of one photoelectric conversion unit including the charge storage electrode of the first type of Example 1, two photoelectric conversion units may be stacked (in other words, two photoelectric conversion units each including the charge storage electrode may be stacked, and the control units for the two photoelectric conversion units may be provided in the semiconductor substrate). Alternatively, three photoelectric conversion units may be stacked (in other words, three photoelectric conversion units each including the charge storage electrode may be stacked, and the control units for the three photoelectric conversion units may be provided in the semiconductor substrate). Examples of stack structures formed with imaging devices of the first type and imaging devices of the second type are shown in the table below.

| | First type | Second type |
|---|---|---|
| Back-illuminated type and front-illuminated type | 1<br>Green | 2<br>Blue + red |
| | 1<br>Primary colors | 1<br>Complementary colors |
| | 1<br>White | 1<br>Infrared rays |
| | 1<br>Blue, green, or red | 0 |
| | 2<br>Green + infrared light | 2<br>Blue + red |
| | 2<br>Green + blue | 1<br>Red |
| | 2<br>White + infrared light | 0 |
| | 3<br>Green + blue + red | 2<br>Blue-green (emerald) + infrared light |
| | 3<br>Green + blue + red | 1<br>Infrared light |
| | 3<br>Blue + green + red | 0 |

Example 4

Figure 6B:
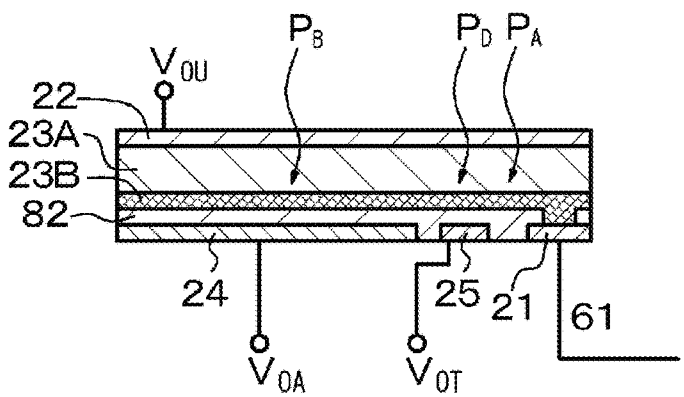
Figure 16:
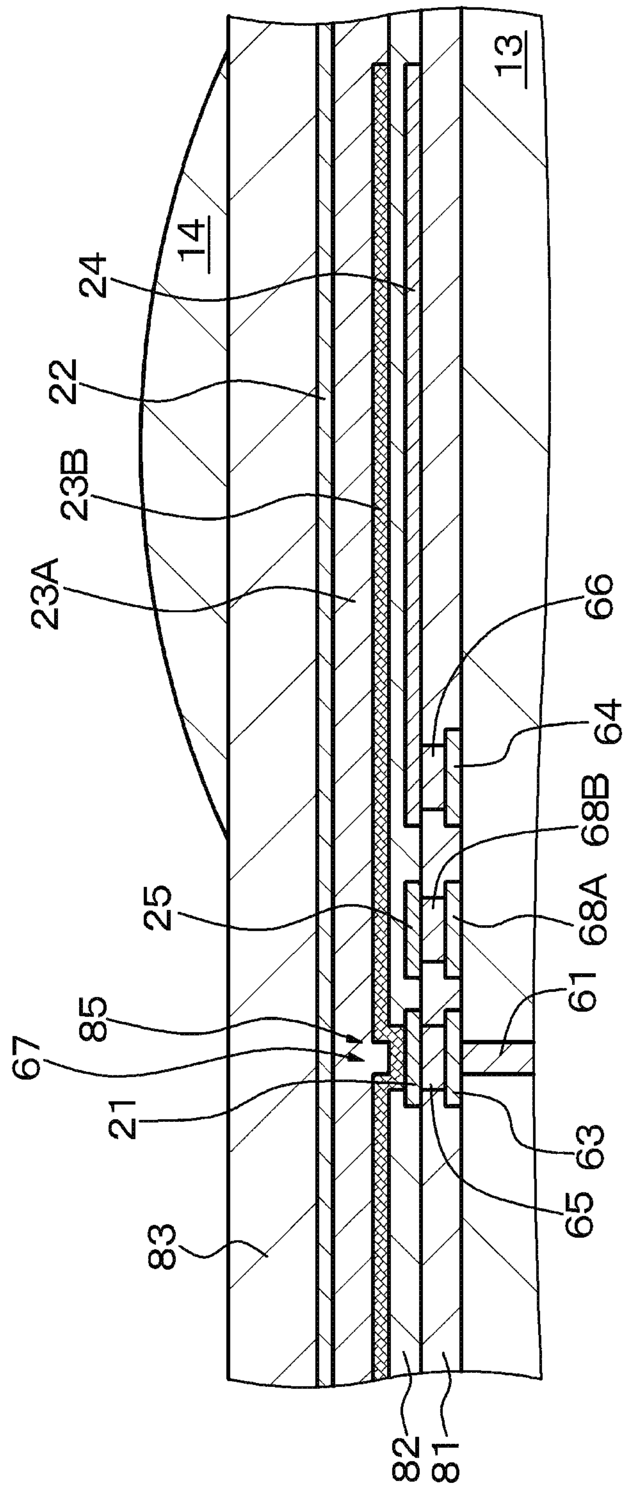
FIG. 16 is a schematic partial cross-sectional view of part of an imaging device of Example 4.
Figure 17:
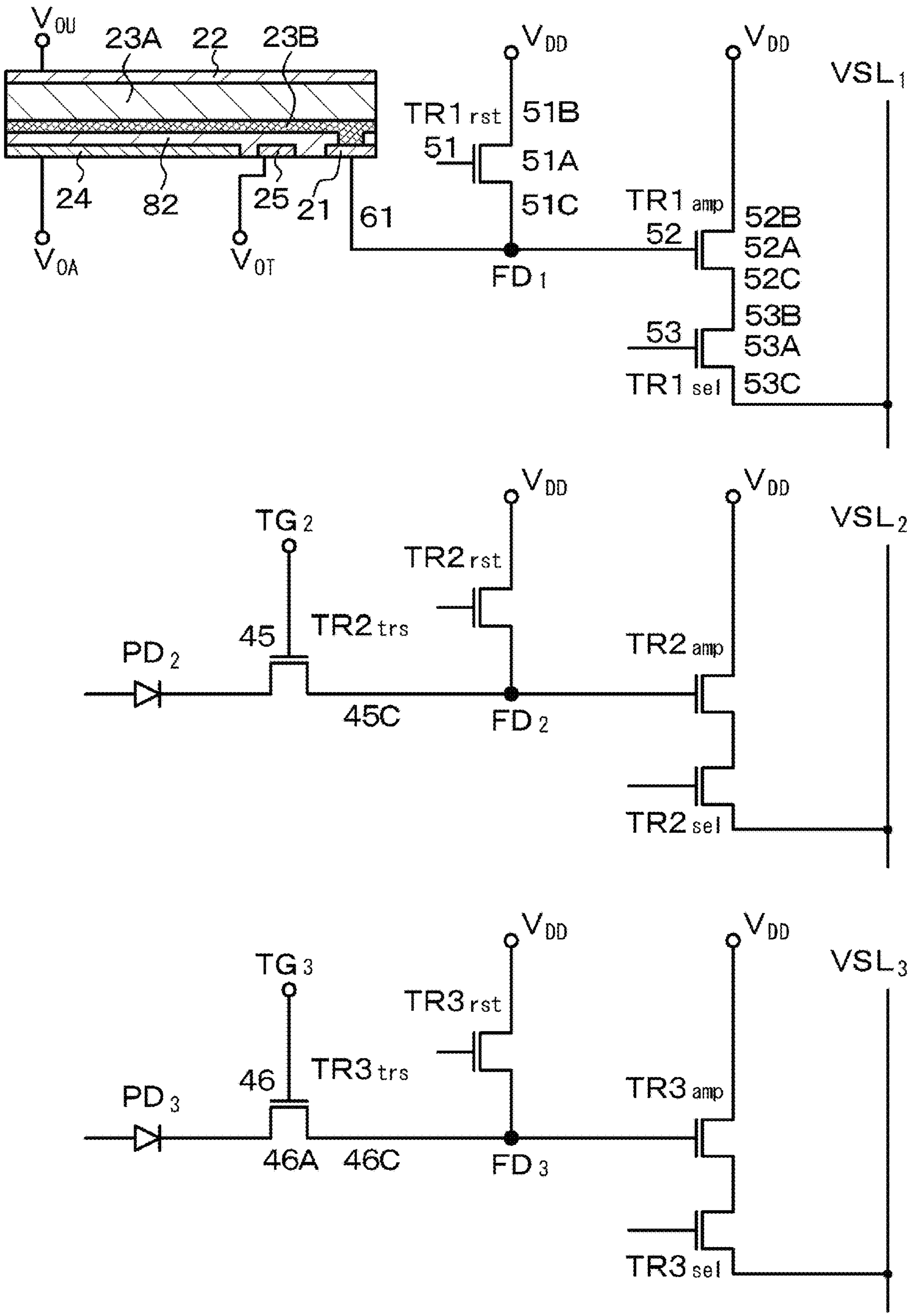
FIG. 17 is an equivalent circuit diagram of an imaging device of Example 4.
Figure 18:
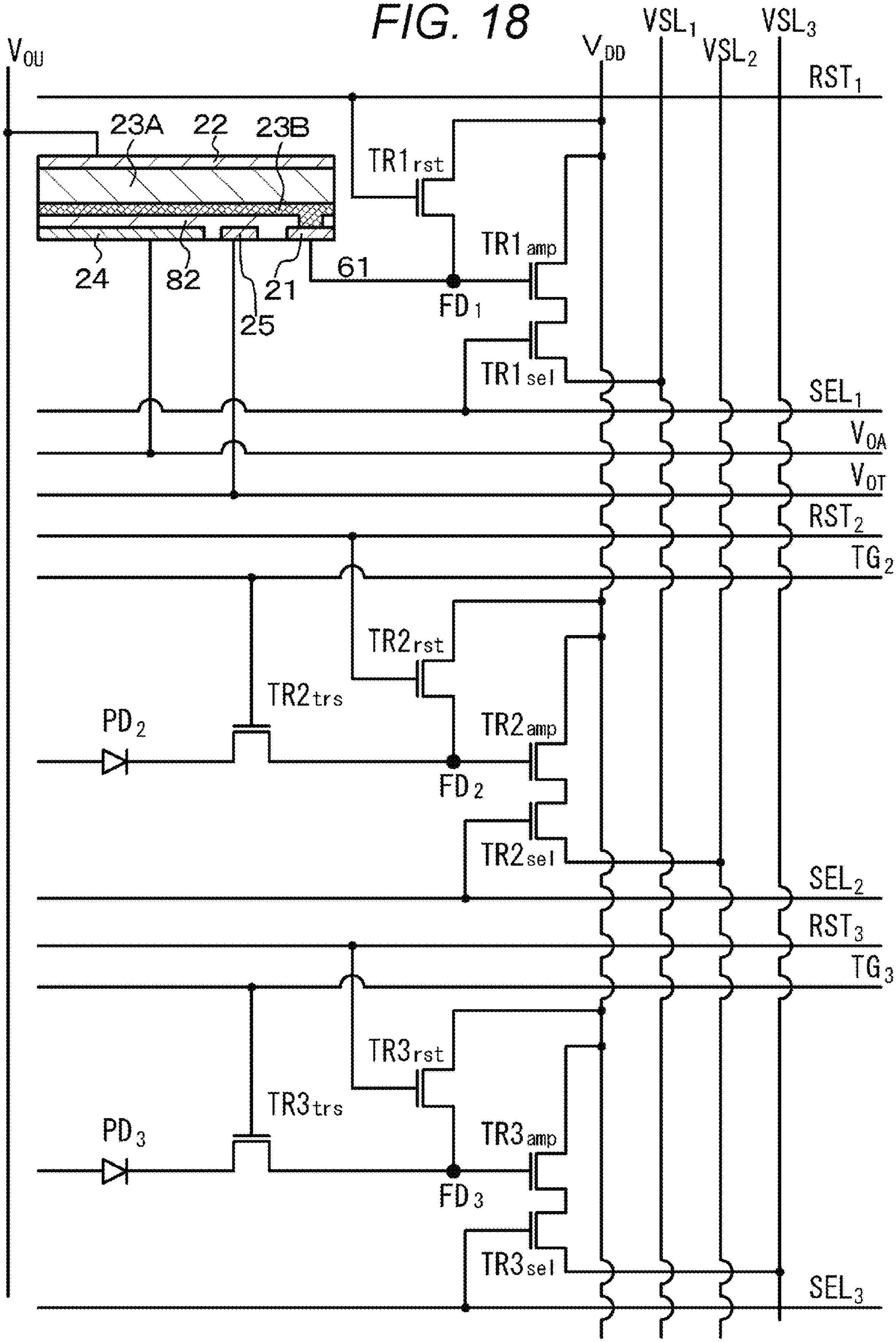
FIG. 18 is an equivalent circuit diagram of an imaging device of Example 4.
Figure 19:
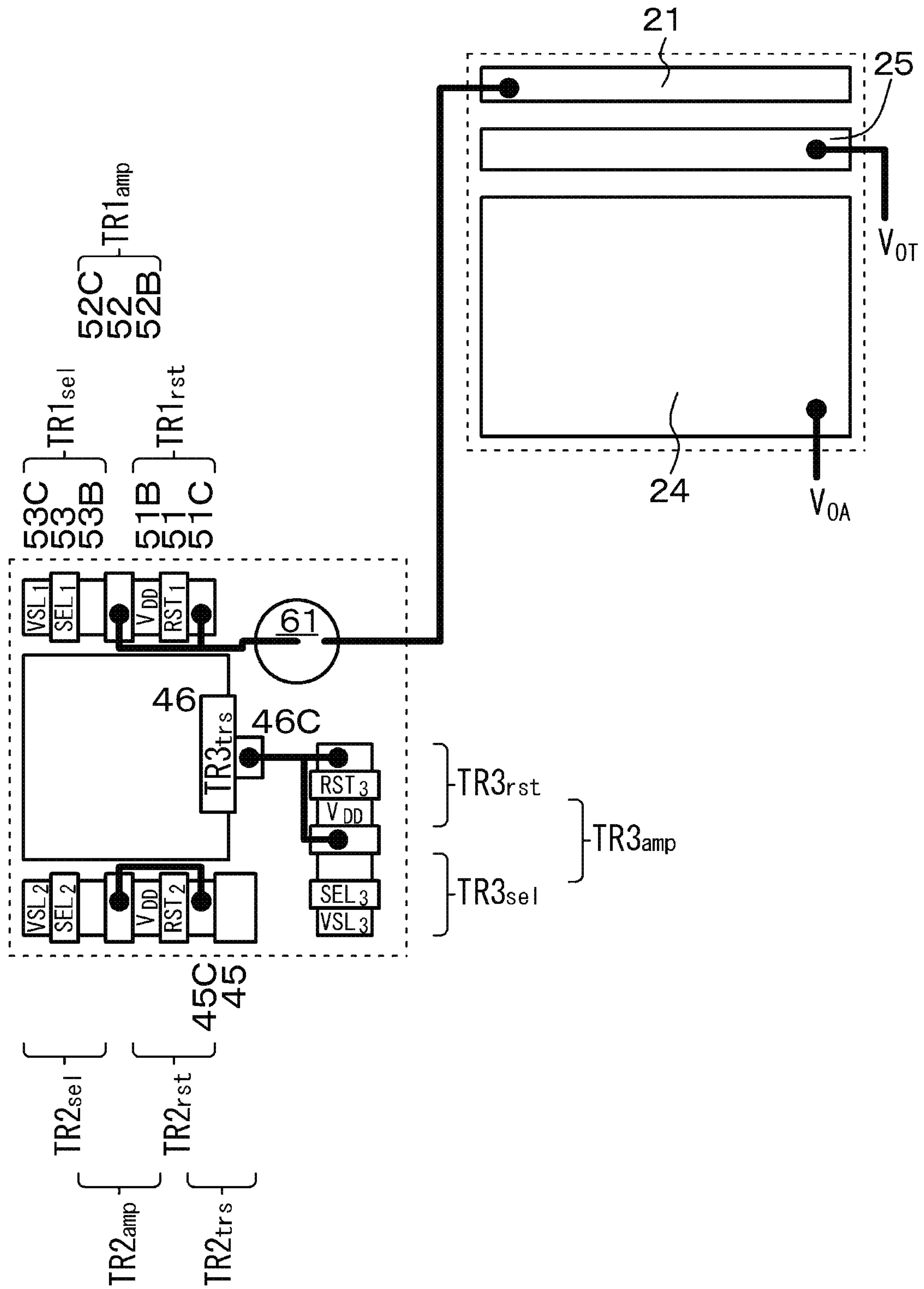
FIG. 19 is a schematic layout diagram of a first electrode, a transfer control electrode, a charge storage electrode, and the transistors constituting a control unit of an imaging device of Example 4.
Figure 22:
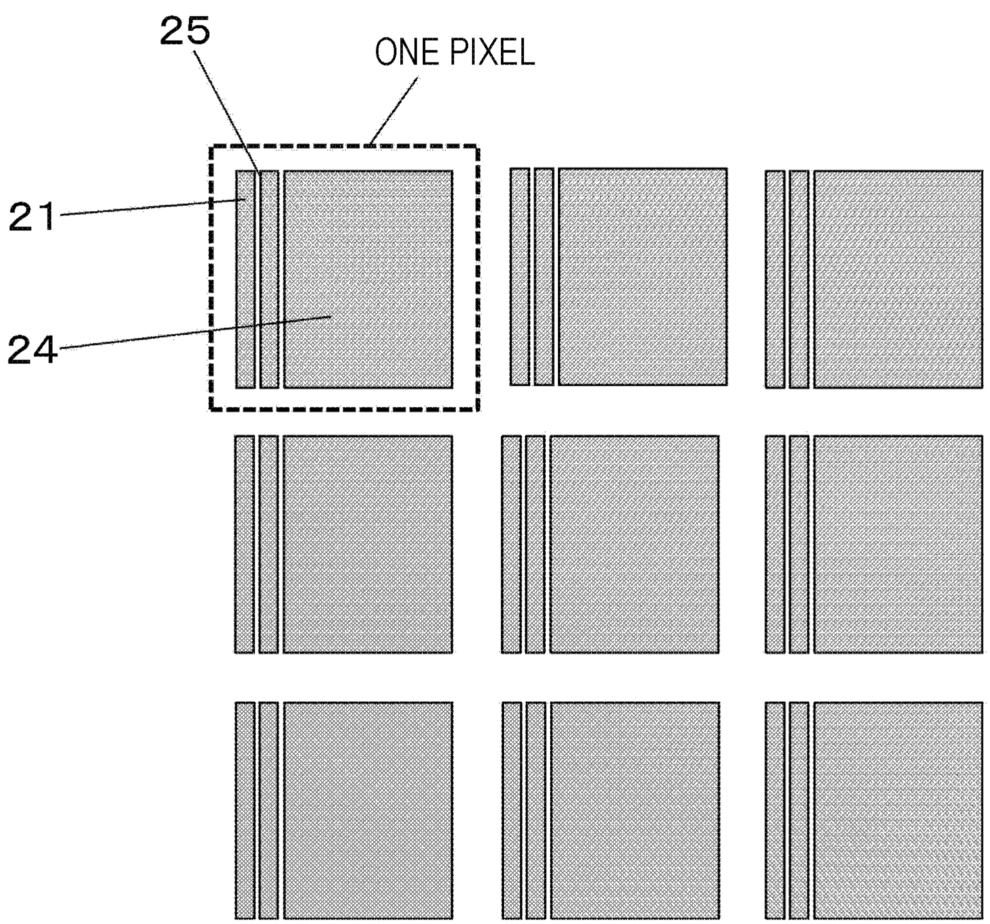
FIG. 22 is a schematic layout diagram of a first electrode, a transfer control electrode, and a charge storage electrode that constitute an imaging device of Example 4.
Figure 23:
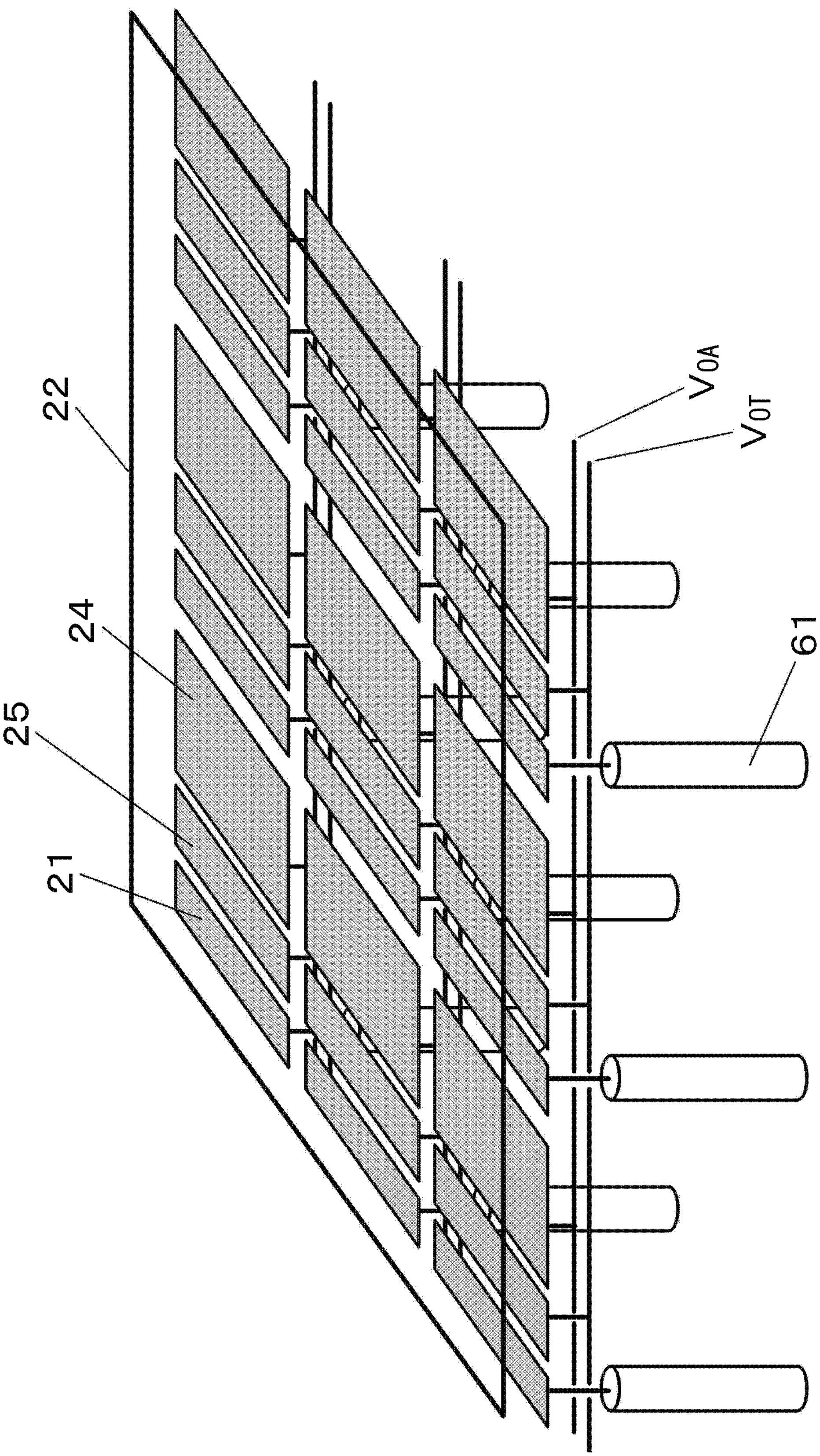
FIG. 23 is a schematic perspective view of a first electrode, a transfer control electrode, a charge storage electrode, a second electrode, and a contact hole portion that constitute an imaging device of Example 4.

Example 4 is modifications of Examples 1 through 3, and relates to imaging devices or the like including a transfer control electrode (a charge transfer electrode) of the present disclosure. FIG. 16 shows a schematic partial cross-sectional view of part of an imaging device of Example 4. FIGS. 17 and 18 show equivalent circuit diagrams of the imaging device of Example 4. FIG. 19 shows a schematic layout diagram of a first electrode, a transfer control electrode, and a charge storage electrode that constitute a photoelectric conversion unit of the imaging device of Example 4, and transistors that constitute a control unit. FIGS. 20 and 21 schematically show the states of the potentials at respective portions at a time of operation of the imaging device of Example 4. FIG. 6B shows an equivalent circuit diagram for explaining the respective portions of the imaging device of Example 4. Further, FIG. 22 shows a schematic layout diagram of the first electrode, the transfer control electrode, and the charge storage electrode that constitute the photoelectric conversion unit of the imaging device of Example 4. FIG. 23 shows a schematic perspective view of the first electrode, the transfer control electrode, the charge storage electrode, a second electrode, and a contact hole portion.

In the imaging device of Example 4, a transfer control electrode (a charge transfer electrode) 25 is further provided between the first electrode 21 and the charge storage electrode 24. The transfer control electrode 25 is disposed at a distance from the first electrode 21 and the charge storage electrode 24, and is positioned to face the semiconductor material layer 23B via the insulating layer 82. The transfer control electrode 25 is connected to the pixel drive circuit that forms the drive circuit, via a connecting hole 68B, a pad portion 68A, and a wiring line $V_{OT}$ that are formed in the interlayer insulating layer 81. Note that, to simplify the drawings in FIGS. 16, 25, 28, 67, 71, and 73, the various imaging device components located below the interlayer insulating layer 81 are collectively denoted by reference numeral 13 for the sake of convenience.

In the description below, operation of the imaging device (the first imaging device) of Example 4 is described, with reference to FIGS. 20 and 21. Note that the value of the potential to be applied to the charge storage electrode 24 and the value of the potential at point $P_D$ are different between FIGS. 20 and 21.

In a charge accumulation period, the drive circuit applies a potential $V_{11}$ to the first electrode 21, a potential $V_{12}$ to the charge storage electrode 24, and a potential $V_{13}$ to the transfer control electrode 25. Light that has entered the photoelectric conversion layer 23A causes photoelectric conversion in the photoelectric conversion layer 23A. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12}>V_{13}$ ($V_{12}>V_{11}>V_{13}$, or $V_{11}>V_{12}>V_{13}$, for example). As a result, electrons generated by the photoelectric conversion are attracted to the charge storage electrode 24, and stay in the region of the semiconductor material layer 23B and the like facing the charge storage electrode 24. That is, electric charges are accumulated in the semiconductor material layer 23B and the like. Since $V_{12}>V_{13}$, the electrons generated in the photoelectric conversion layer 23A can be reliably prevented from moving toward the first electrode 21. With the passage of time for photoelectric conversion, the potential in the region of the semiconductor material layer 23B and the like facing the charge storage electrode 24 becomes a more negative value.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 21, a potential $V_{22}$ to the charge storage electrode 24, and a potential $V_{23}$ to the transfer control electrode 25. Here, $V_{22} \leq V_{23} \leq V_{21}$ (preferably, $V_{22}<V_{23}<V_{21}$). In a case where the potential $V_{13}$ is applied to the transfer control electrode 25, it is only required to satisfy $V_{22} \leq V_{13} \leq V_{21}$ (preferably, $V_{22}<V_{13}<V_{21}$). As a result, the electrons remaining in the region of the semiconductor material layer 23B and the like facing the charge storage electrode 24 are read into the first electrode 21 and further into the first floating diffusion layer $FD_1$ without fail. In other words, the electric charges accumulated in the semiconductor material layer 23B and the like are read into the control unit.

In the above manner, a series of operations including charge accumulation, reset operation, and charge transfer is completed.

The operations of the amplification transistor $TR1_{amp}$ and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer, for example.

Figure 24:
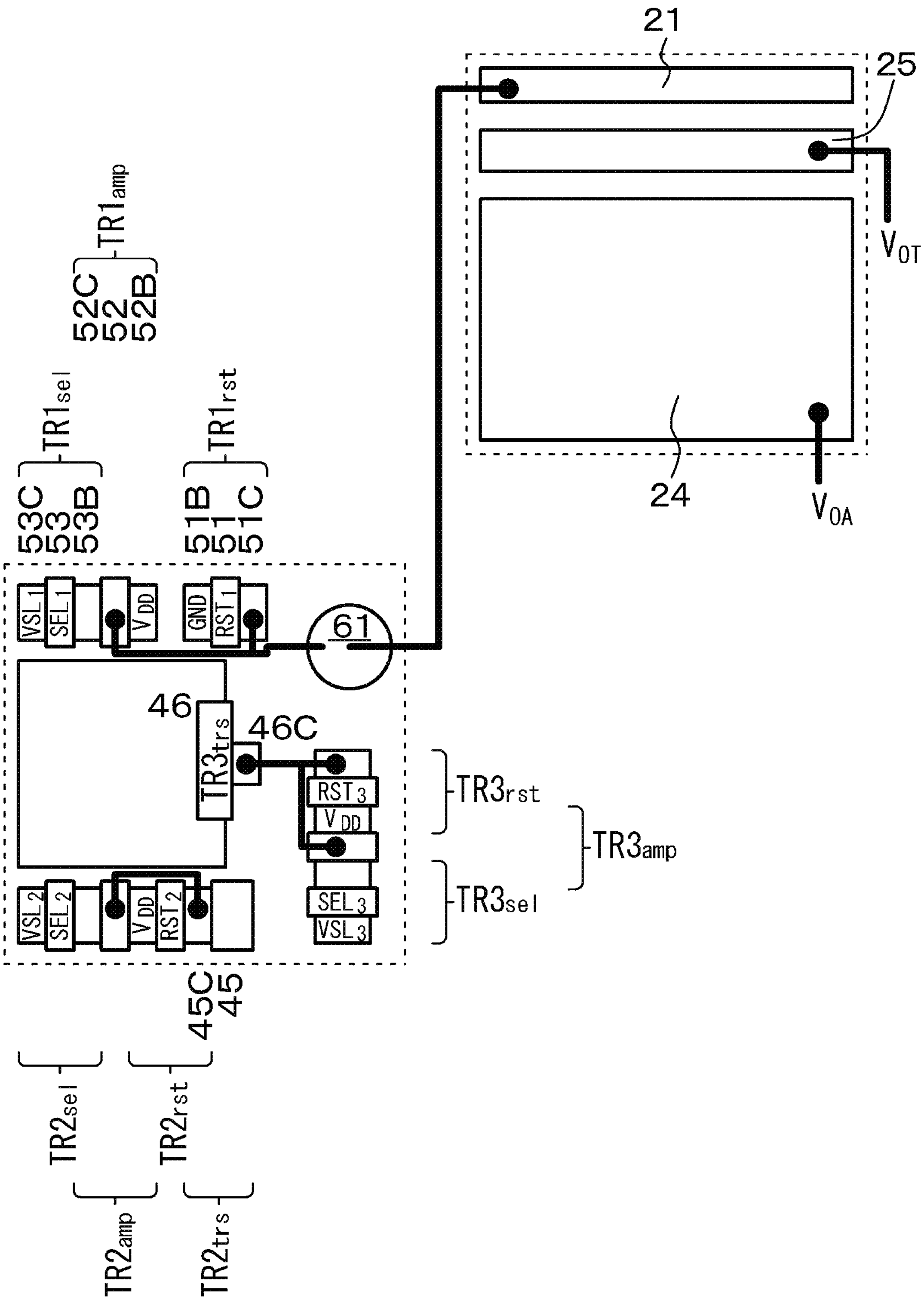
FIG. 24 is a schematic layout diagram of a first electrode, a transfer control electrode, a charge storage electrode, and the transistors constituting a control unit of a modification of an imaging device of Example 4.

FIG. 24 shows a schematic layout diagram of the first electrode, the charge storage electrode, and the transistors constituting the control unit of a modification of the imaging device of Example 4. As shown in FIG. 24, the other source/drain region 51B of the reset transistor $TR1_{rst}$ may be grounded, instead of being connected to the power supply $V_{DD}$.

Example 5

Figure 25:
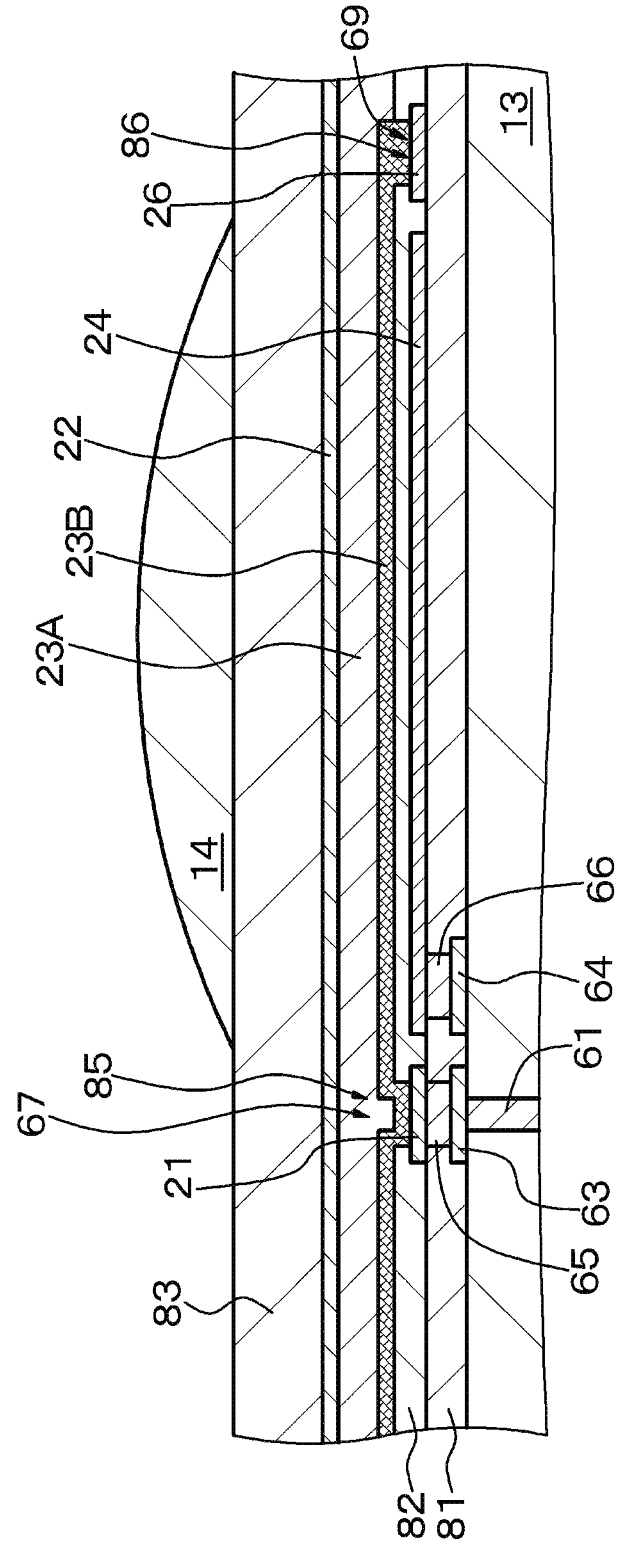
FIG. 25 is a schematic partial cross-sectional view of part of an imaging device of Example 5.
Figure 26:
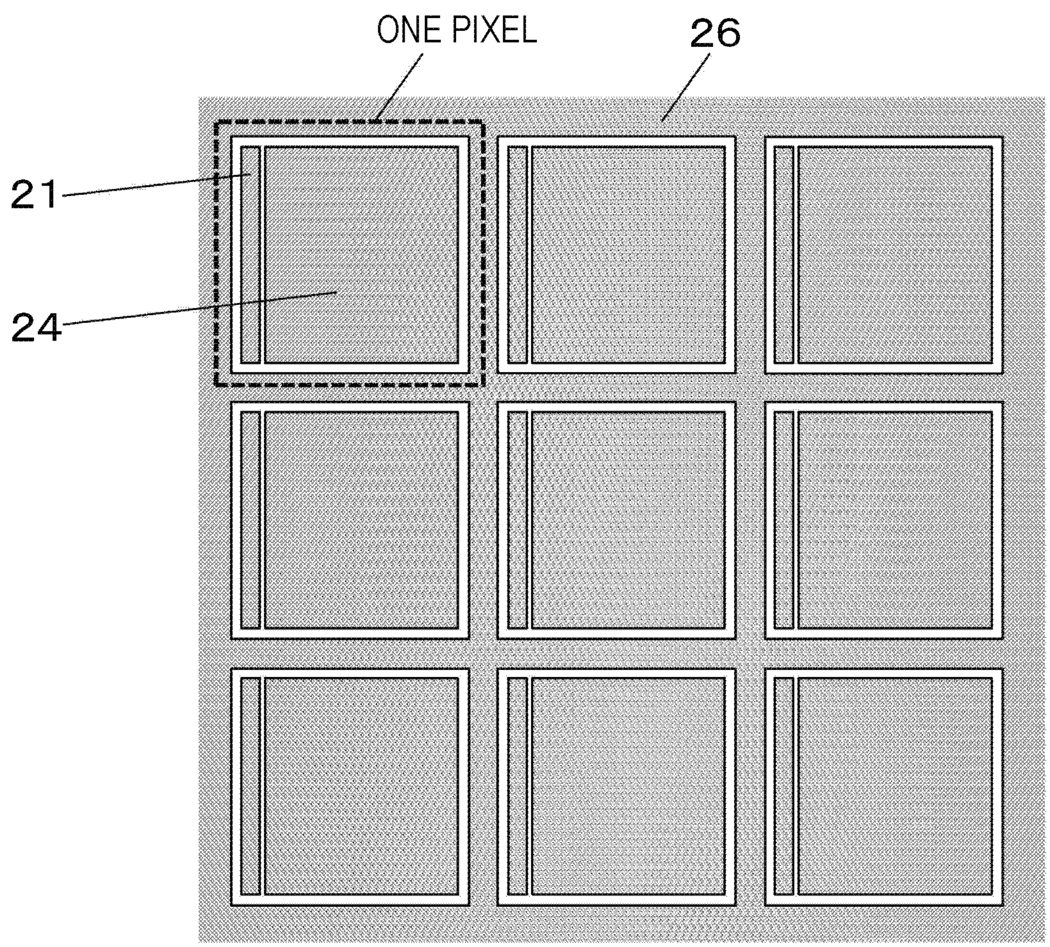
FIG. 26 is a schematic layout diagram of a first electrode, a charge storage electrode, and a charge emission electrode that constitute an imaging device of Example 5.
Figure 27:
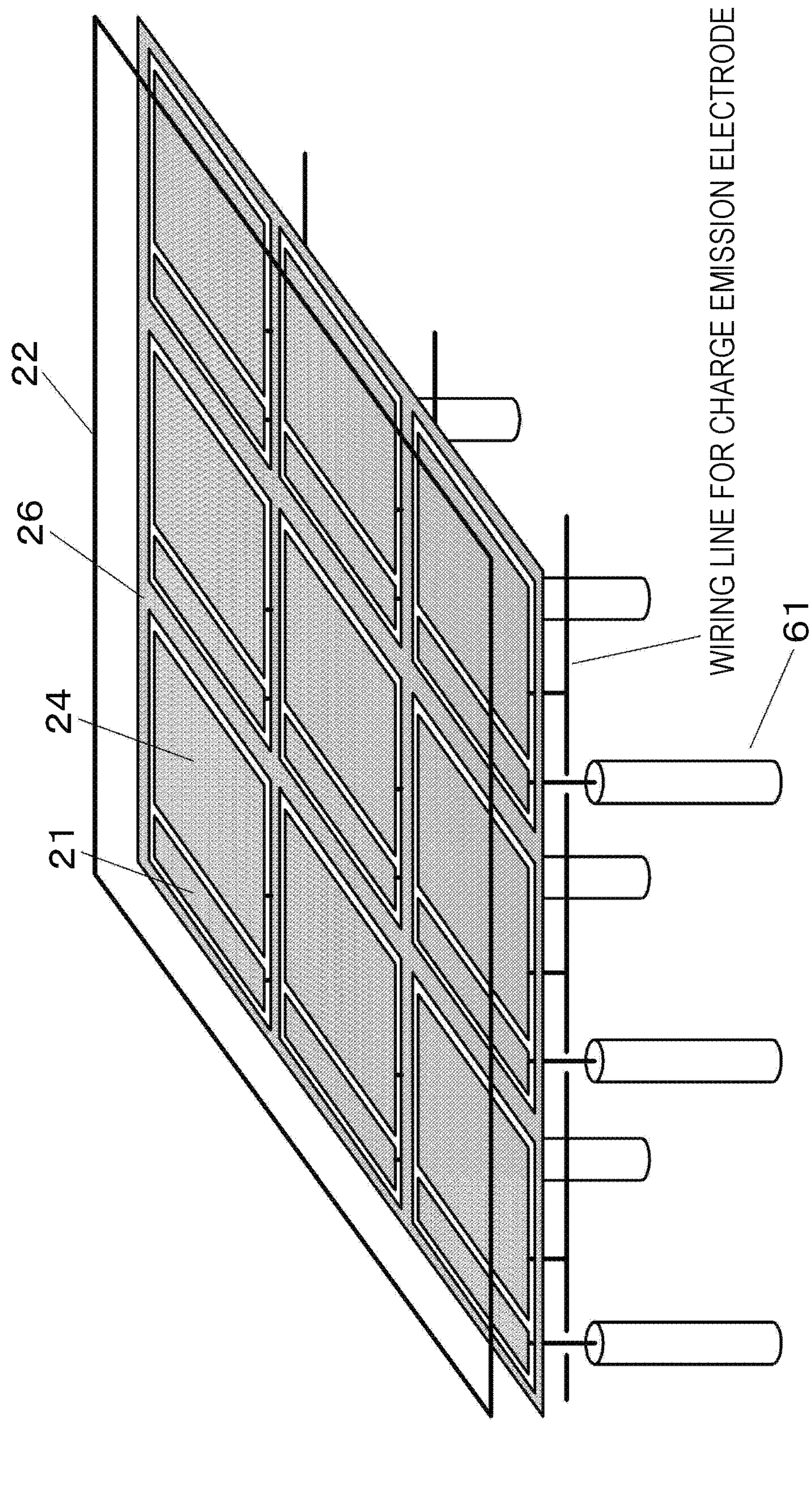
FIG. 27 is a schematic perspective view of a first electrode, a charge storage electrode, a charge emission electrode, a second electrode, and a contact hole portion that constitute an imaging device of Example 5.

Example 5 is modifications of Examples 1 through 4, and relates to imaging devices or the like including a charge emission electrode of the present disclosure. FIG. 25 shows a schematic partial cross-sectional view of part of an imaging device of Example 5. FIG. 26 shows a schematic layout diagram of the first electrode, the charge storage electrode, and the charge emission electrode that constitute the photoelectric conversion unit including the charge storage electrode of the imaging device of Example 5. FIG. 27 shows a schematic perspective view of the first electrode, the charge storage electrode, the charge emission electrode, the second electrode, and the contact hole portion.

In the imaging device of Example 5, a charge emission electrode 26 is further provided. The charge emission electrode 26 is connected to the semiconductor material layer 23B via a connecting portion 69, and is disposed at a distance from the first electrode 21 and the charge storage electrode 24. Here, the charge emission electrode 26 is disposed so as to surround the first electrode 21 and the charge storage electrode 24 (or like a frame). The charge emission electrode 26 is connected to a pixel drive circuit that forms a drive circuit. The semiconductor material layer 23B extends in the connecting portion 69. In other words, the semiconductor material layer 23B extends in a second opening 86 formed in the insulating layer 82, and is connected to the charge emission electrode 26. The charge emission electrode 26 is shared (made common) in a plurality of imaging devices. The charge emission electrode 26 can be used as a floating diffusion or an overflow drain of the photoelectric conversion unit, for example.

In Example 5, in a charge accumulation period, the drive circuit applies a potential $V_{11}$ to the first electrode 21, a potential $V_{12}$ to the charge storage electrode 24, and a potential $V_{14}$ to the charge emission electrode 26, and electric charges are accumulated in the semiconductor material layer 23B and the like. Light that has entered the photoelectric conversion layer 23A causes photoelectric conversion in the photoelectric conversion layer 23A. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{14}>V_{11}$ ($V_{12}>V_{14}>V_{11}$, for example). As a result, the electrons generated by the photoelectric conversion are attracted to the charge storage electrode 24, and stay in the region of the semiconductor material layer 23B and the like facing the charge storage electrode 24. Thus, the electrons can be reliably prevented from moving toward the first electrode 21. However, electrons not sufficiently attracted by the charge storage electrode 24, or electrons not accumulated in the semiconductor material layer 23B and the like (so-called overflowed electrons) are sent to the drive circuit via the charge emission electrode 26.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 21, a potential $V_{22}$ to the charge storage electrode 24, and a potential $V_{24}$ to the charge emission electrode 26. Here, $V_{24}<V_{21}$ ($V_{24}<V_{22}<V_{21}$, for example). As a result, the electrons remaining in the region of the semiconductor material layer 23B and the like facing the charge storage electrode 24 are read into the first electrode 21 and further into the first floating diffusion layer $FD_1$ without fail. In other words, the electric charges accumulated in the semiconductor material layer 23B and the like are read into the control unit.

In the above manner, a series of operations including charge accumulation, reset operation, and charge transfer is completed.

The operations of the amplification transistor $TR\mathbf{1}_{amp}$ and the selection transistor $TR\mathbf{1}_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer, for example.

In Example 5, so-called overflowed electrons are sent to the drive circuit via the charge emission electrode 26, so that leakage into the charge storage portions of the adjacent pixels can be reduced, and blooming can be prevented. Thus, the imaging performance of the imaging device can be improved.

Example 6

Example 6 is modifications of Examples 1 through 5, and relates to imaging devices or the like including a plurality of charge storage electrode segments of the present disclosure.

Figure 6C:
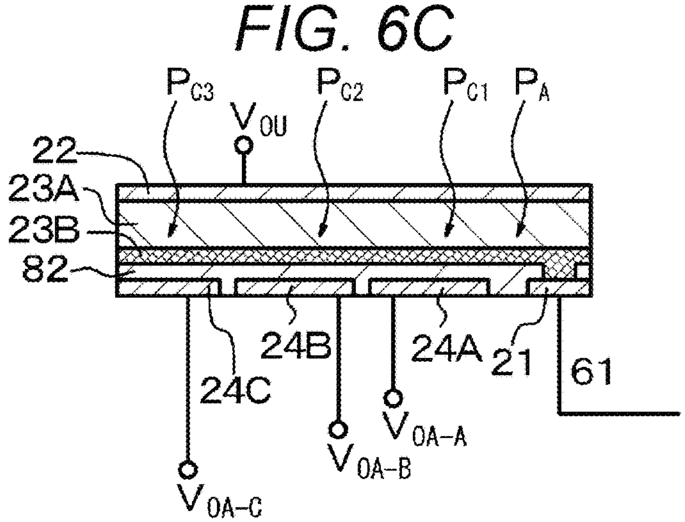
Figure 28:
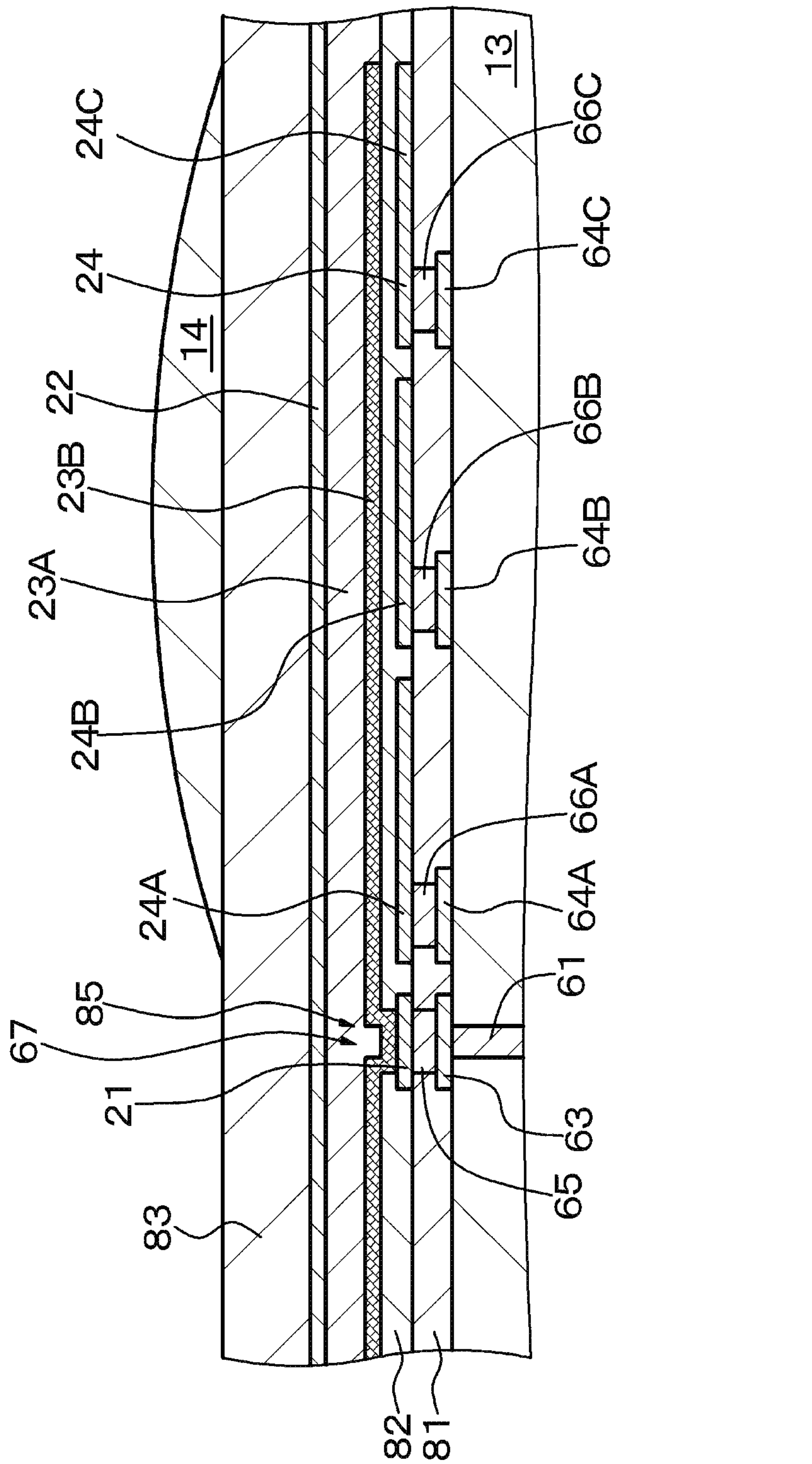
FIG. 28 is a schematic partial cross-sectional view of an imaging device of Example 6.
Figure 29:
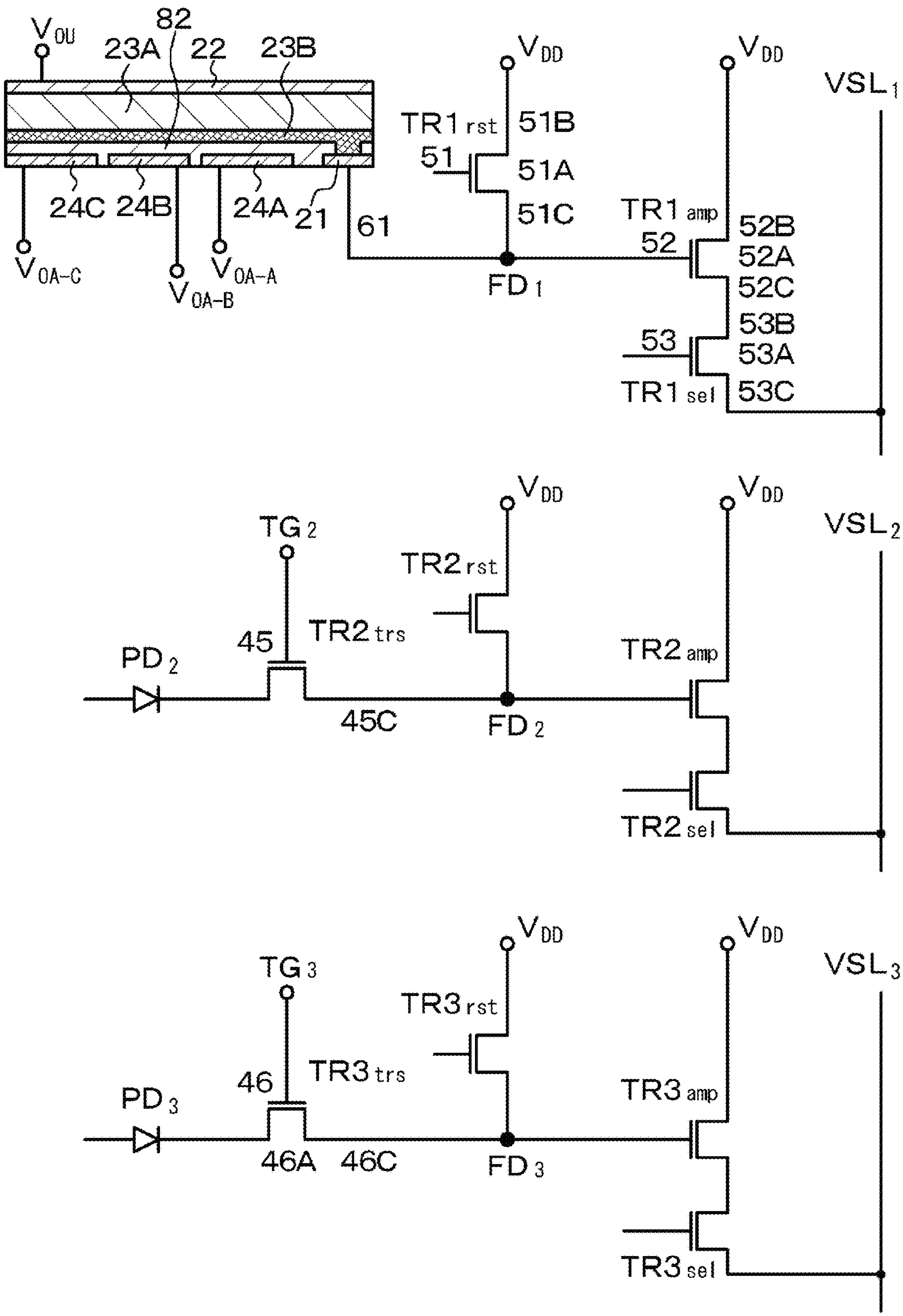
FIG. 29 is an equivalent circuit diagram of an imaging device of Example 6.
Figure 30:
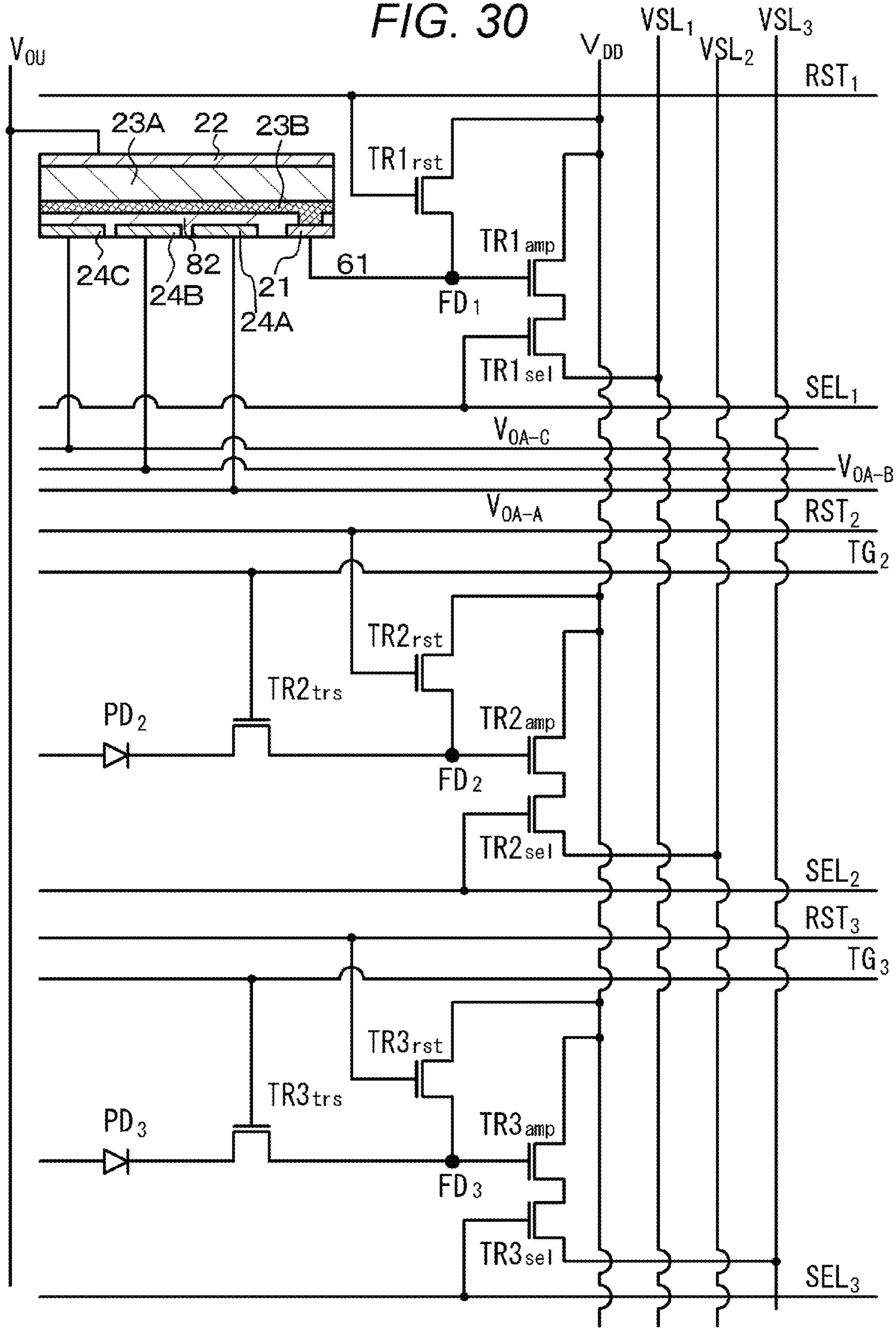
FIG. 30 is an equivalent circuit diagram of an imaging device of Example 6.
Figure 31:
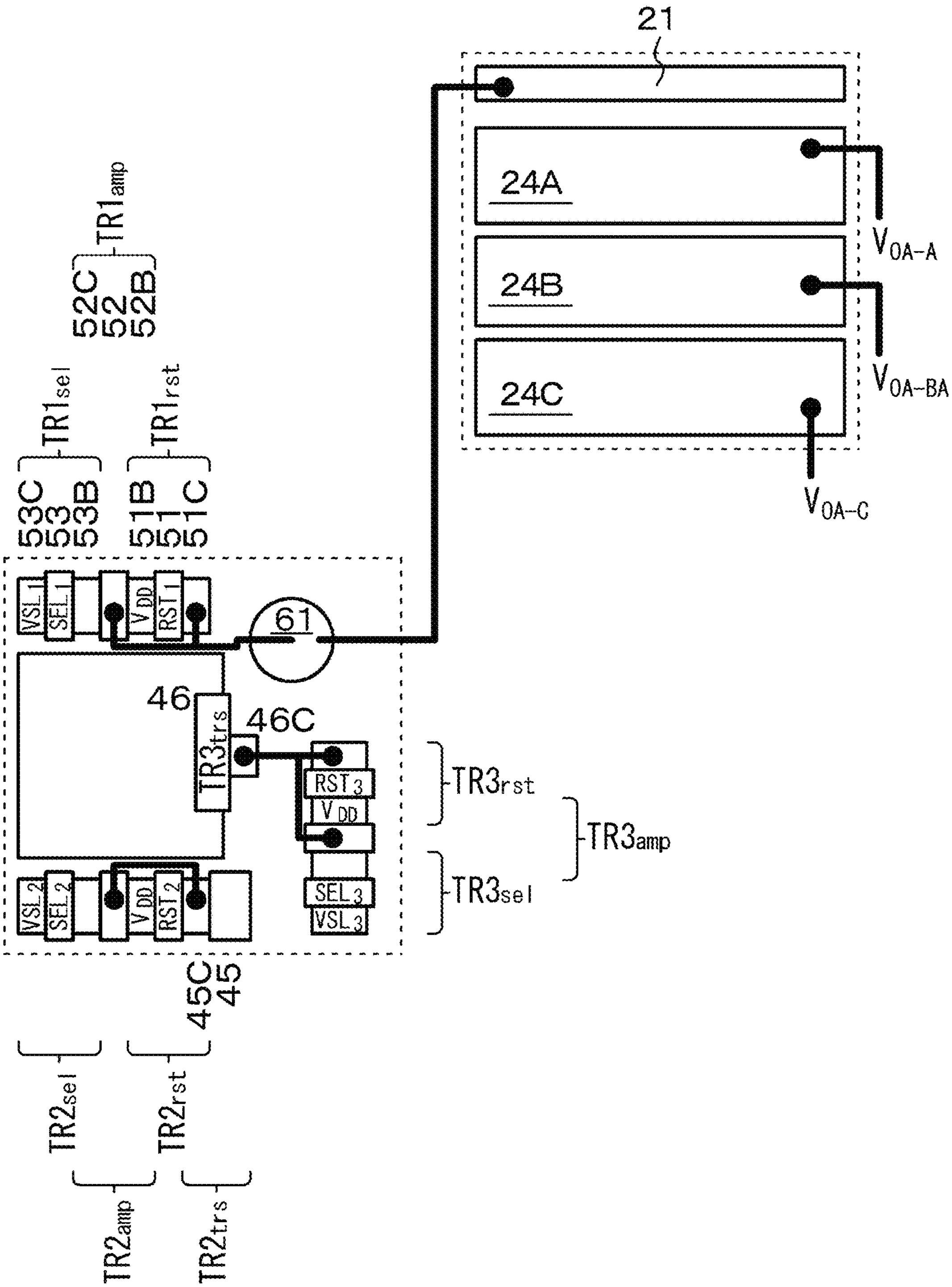
FIG. 31 is a schematic layout diagram of a first electrode, a charge storage electrode, and the transistors constituting a control unit of an imaging device of Example 6.
Figure 33:
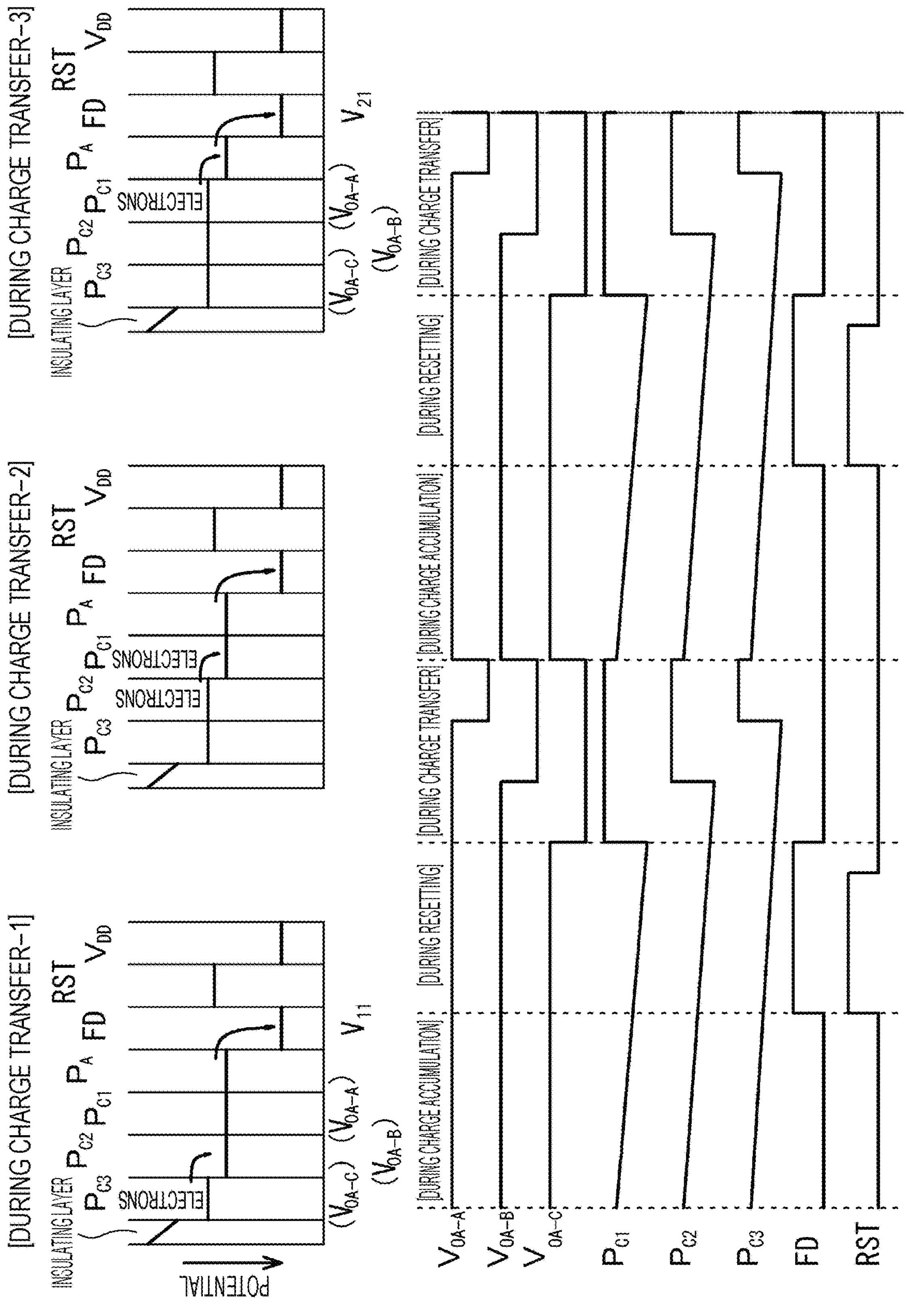
FIG. 33 is a diagram schematically showing the states of the potentials at respective portions during another operation of the imaging device of Example 6.
Figure 34:
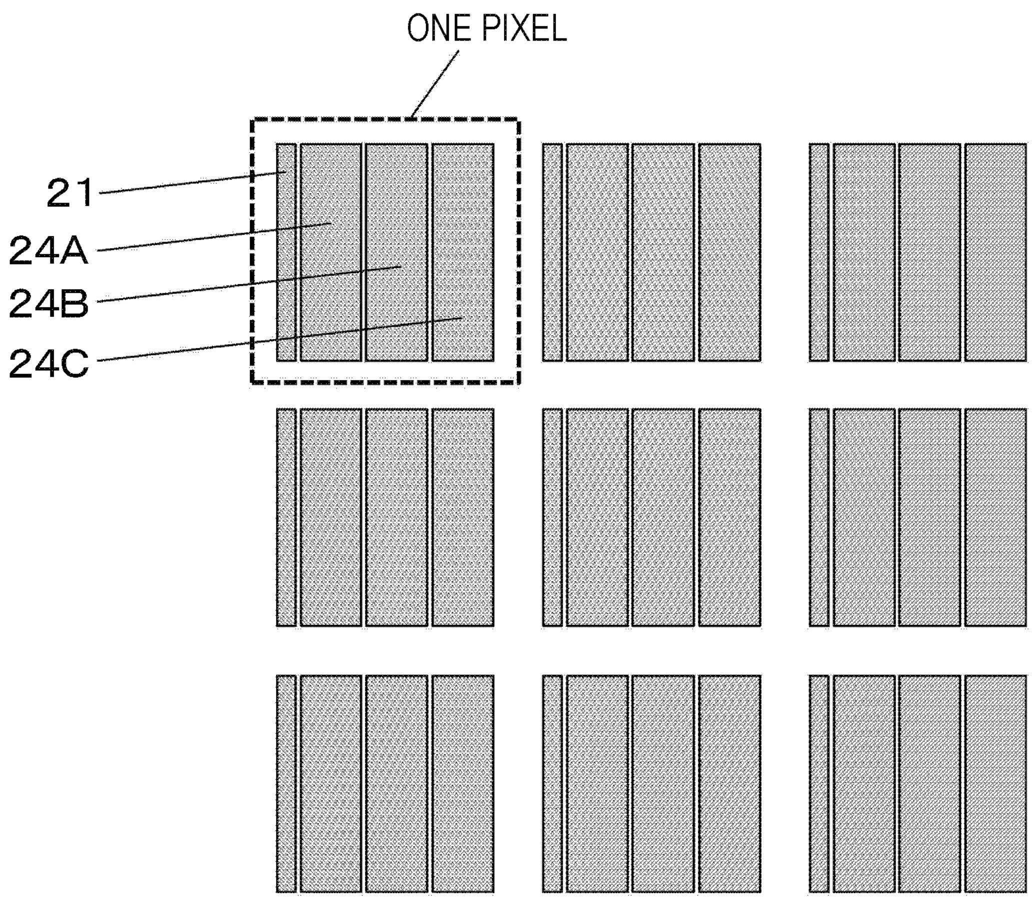
FIG. 34 is a schematic layout diagram of a first electrode and a charge storage electrode that constitute an imaging device of Example 6.
Figure 35:
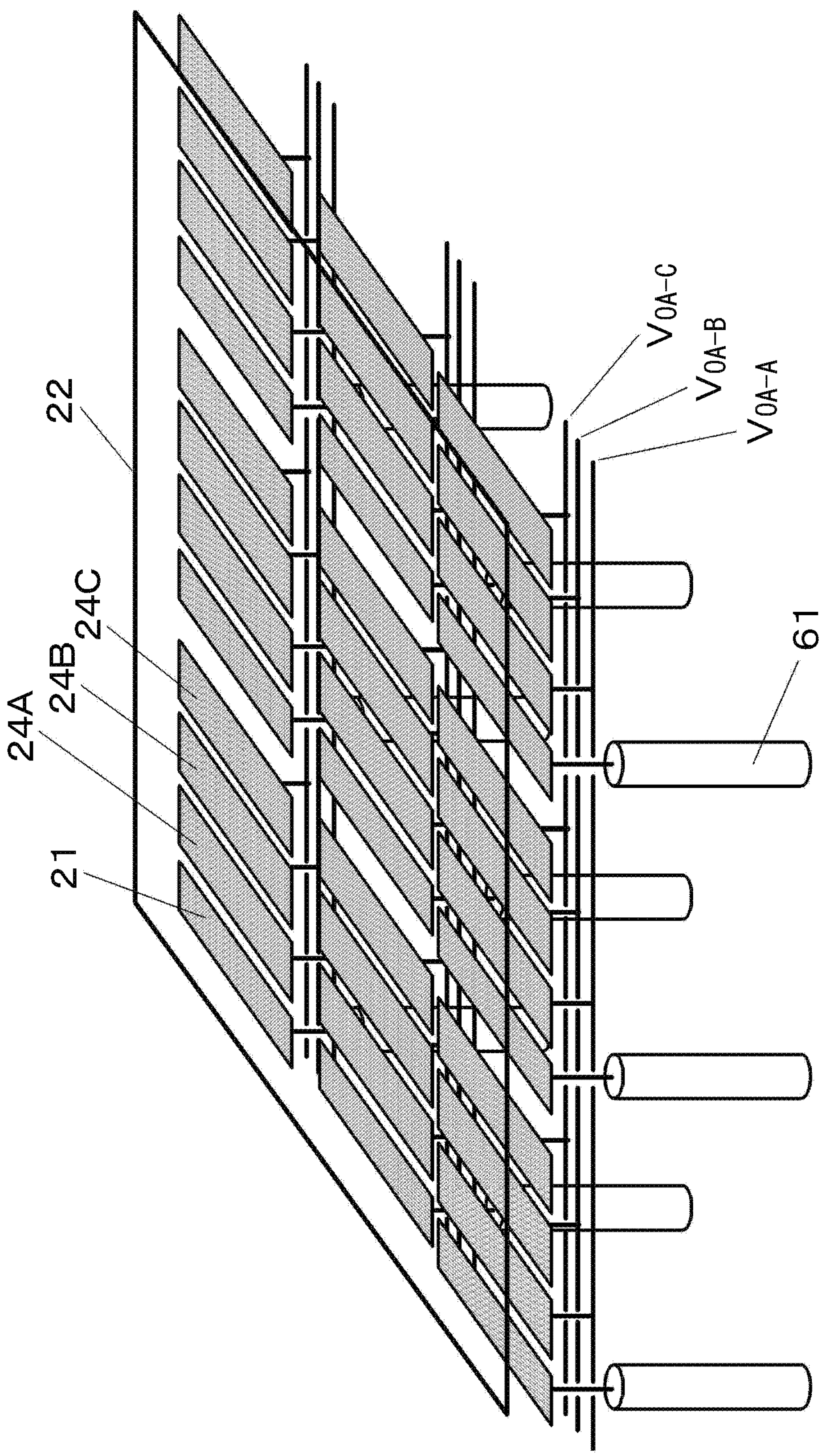
FIG. 35 is a schematic perspective view of a first electrode, a charge storage electrode, a second electrode, and a contact hole portion that constitute an imaging device of Example 6.

FIG. 28 shows a schematic partial cross-sectional view of part of an imaging device of Example 6. FIGS. 29 and 30 show equivalent circuit diagrams of the imaging device of Example 6. FIG. 31 shows a schematic layout diagram of a first electrode and a charge storage electrode that constitute a photoelectric conversion unit including the charge storage electrode of the imaging device of Example 6, and transistors that constitute a control unit. FIGS. 32 and 33 schematically show the states of the potentials at respective portions at a time of operation of the imaging device of Example 6. FIG. 6C shows an equivalent circuit diagram for explaining the respective portions of the imaging device of Example 6. Further, FIG. 34 shows a schematic layout diagram of the first electrode and the charge storage electrode that constitute the photoelectric conversion unit including the charge storage electrode of the imaging device of Example 6. FIG. 35 shows a schematic perspective view of the first electrode, the charge storage electrode, a second electrode, and a contact hole portion.

In Example 6, the charge storage electrode 24 is formed with a plurality of charge storage electrode segments 24A, 24B, and 24C. The number of charge storage electrode segments is two or larger, and is "3" in Example 6. Further, in the imaging device of Example 6, the potential of the first electrode 21 is higher than the potential of the second electrode 22, or a positive potential is applied to the first electrode 21 while a negative potential is applied to the second electrode 22, for example. Further, in a charge transfer period, the potential to be applied to the charge storage electrode segment 24A located closest to the first electrode 21 is higher than the potential to be applied to the charge storage electrode segment 24C located farthest from the first electrode 21. As such a potential gradient is formed in the charge storage electrode 24, electrons remaining in the region of the semiconductor material layer 23B and the like facing the charge storage electrode 24 are read into the first electrode 21 and further into the first floating diffusion layer $FD_1$ with higher reliability. In other words, the electric charges accumulated in the semiconductor material layer 23B and the like are read into the control unit.

Figure 32:
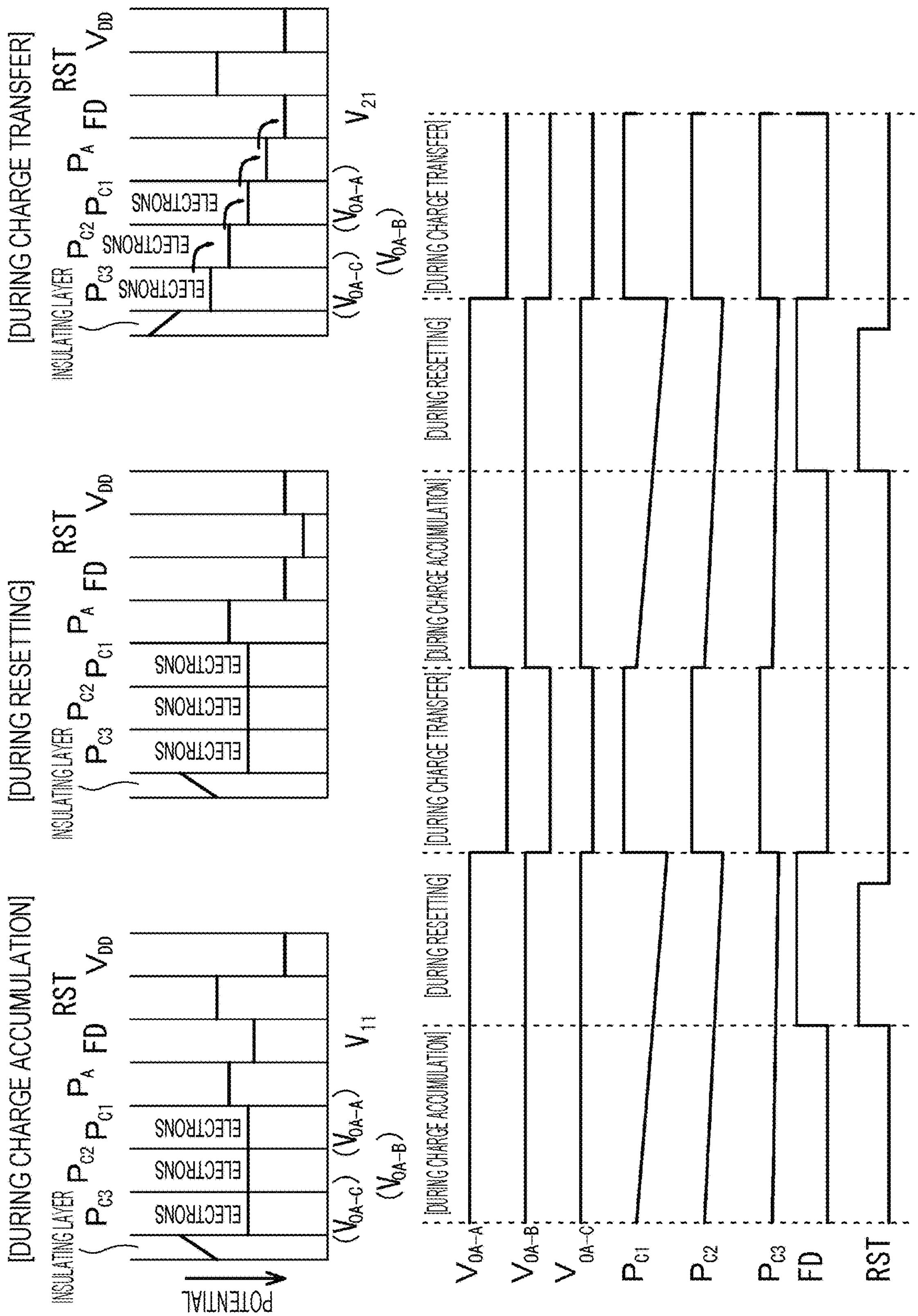
FIG. 32 is a diagram schematically showing the states of the potentials at respective portions during an operation of an imaging device of Example 6.

In an example shown in FIG. 32, in a charge transfer period, the potential of the charge storage electrode segment 24C<the potential of the charge storage electrode segment 24B<the potential of the charge storage electrode segment 24A. With this arrangement, the electrons remaining in the region of the semiconductor material layer 23B and the like are simultaneously read into the first floating diffusion layer $FD_1$. In an example shown in FIG. 33, on the other hand, in a charge transfer period, the potential of the charge storage electrode segment 24C, the potential of the charge storage electrode segment 24B, and the potential of the charge storage electrode segment 24A are gradually varied (in other words, varied in a stepwise or slope-like manner). With this arrangement, the electrons remaining in the region of the semiconductor material layer 23B and the like facing the charge storage electrode segment 24C are moved to the region of the semiconductor material layer 23B and the like facing the charge storage electrode segment 24B, the electrons remaining in the region of the semiconductor material layer 23B and the like facing the charge storage electrode segment 24B are then moved to the region of the semiconductor material layer 23B and the like facing the charge storage electrode segment 24A, and the electrons remaining in the region of the semiconductor material layer 23B and the like facing the charge storage electrode segment 24A are then read into the first floating diffusion layer $FD_1$ without fail.

Figure 36:
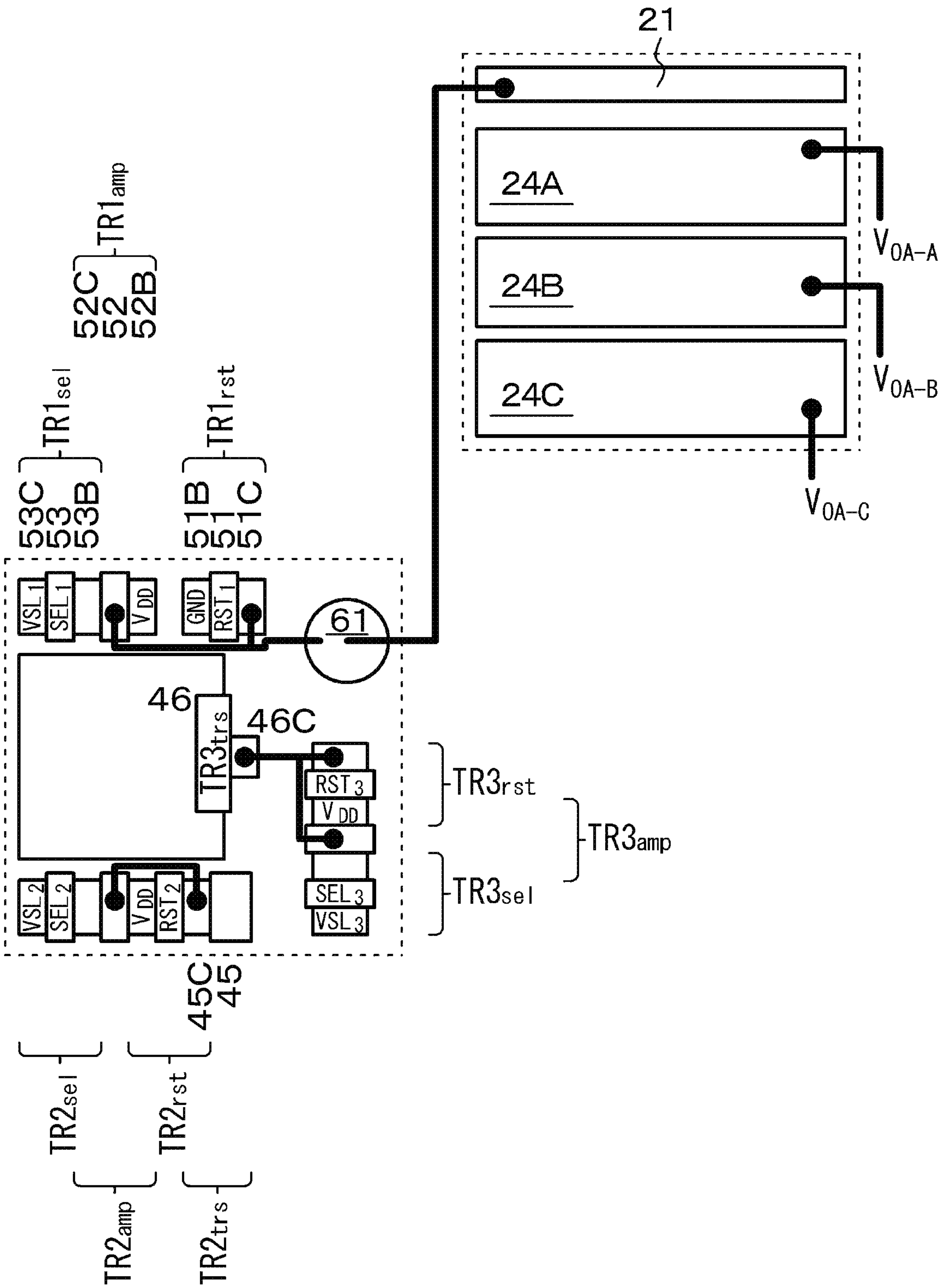
FIG. 36 is a schematic layout diagram of a first electrode and a charge storage electrode that constitute a modification of an imaging device of Example 6.

FIG. 36 shows a schematic layout diagram of the first electrode, the charge storage electrode, and the transistors constituting the control unit of a modification of an imaging device of Example 6. As shown in FIG. 36, the other source/drain region 51B of the reset transistor $TR1_{rst}$ may be grounded, instead of being connected to the power supply $V_{DD}$.

Example 7

Example 7 is modifications of Examples 1 through 6, and relates to imaging devices of the first configuration and the sixth configuration.

Figure 37:
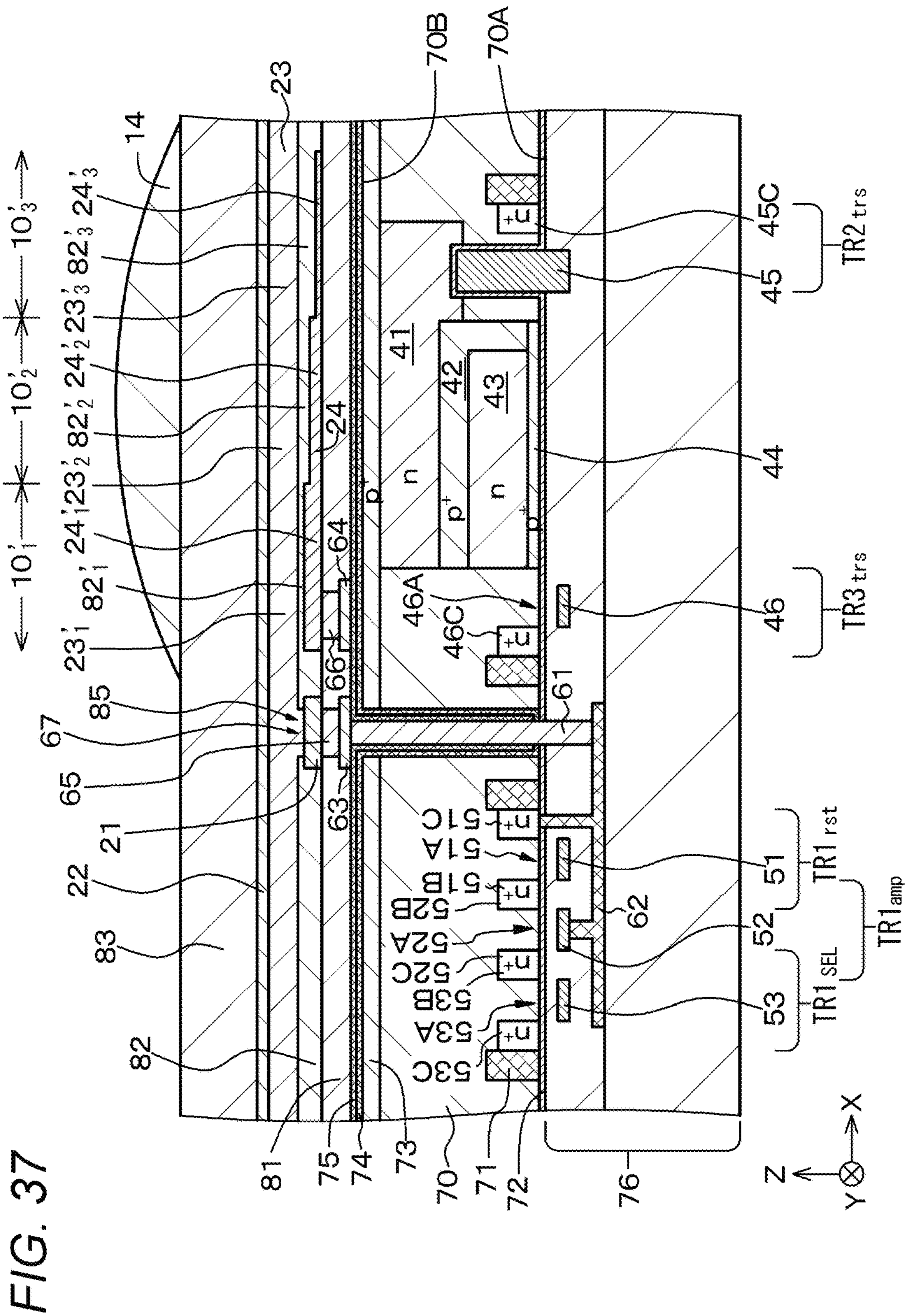
FIG. 37 is a schematic partial cross-sectional view of an imaging device of Example 7.
Figure 38:
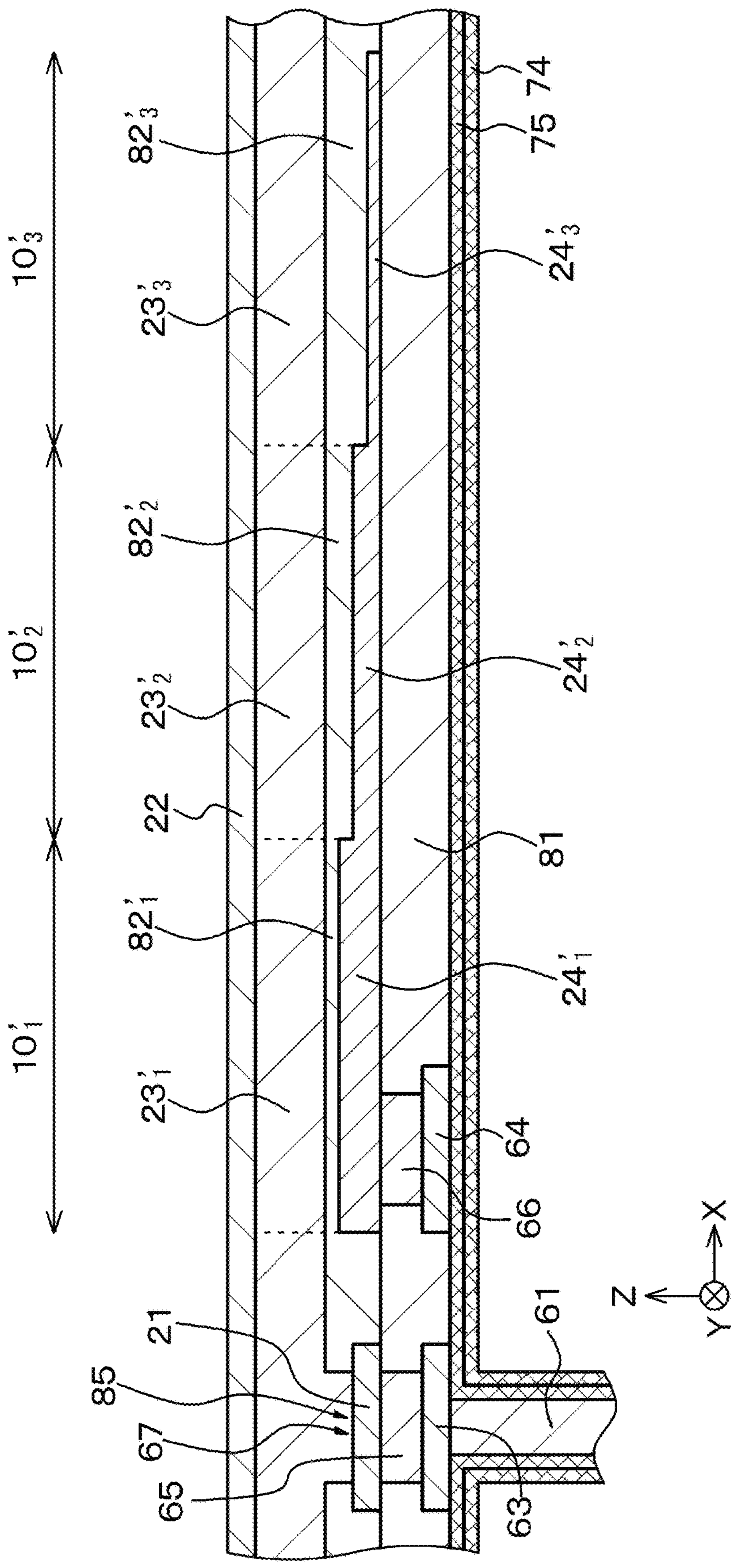
FIG. 38 is a schematic partial cross-sectional view showing an enlarged view of the portion in which a charge storage electrode, a photoelectric conversion layer, and a second electrode are stacked in an imaging device of Example 7.

FIG. 37 shows a schematic partial cross-sectional view of an imaging device of Example 7. FIG. 38 shows a schematic partial enlarged cross-sectional view of a portion in which a charge storage electrode, a semiconductor material layer, a photoelectric conversion layer, and a second electrode are stacked. An equivalent circuit diagram of the imaging device of Example 7 is similar to the equivalent circuit diagram of the imaging device of Example 1 described with reference to FIGS. 2 and 3. A schematic layout diagram of the first electrode and the charge storage electrode constituting the photoelectric conversion unit including the charge storage electrode, and the transistors constituting the control unit of the imaging device of Example 7 is similar to that of the imaging device of Example 1 described with reference to FIG. 4. Further, operation of the imaging device (the first imaging device) of Example 7 is substantially similar to operation of the imaging device of Example 1.

Here, in the imaging device of Example 7 or in each imaging device of Examples 8 through 12 described later, a photoelectric conversion unit is formed with N (N≥2) photoelectric conversion unit segments (specifically, three photoelectric conversion unit segments $\mathbf{10'}_1$, $\mathbf{10'}_2$, and $\mathbf{10'}_3$), the semiconductor material layer 23B and the photoelectric conversion layer 23A are formed with N photoelectric conversion layer segments (specifically, three photoelectric conversion layer segments $\mathbf{23'}_1$, $\mathbf{23'}_2$, and $\mathbf{23'}_3$), and the insulating layer 82 is formed with N insulating layer segments (specifically, three insulating layer segments $\mathbf{82'}_1$, $\mathbf{82'}_2$, and $\mathbf{82'}_3$).

In Examples 7 through 9, the charge storage electrode 24 is formed with N charge storage electrode segments (specifically, three charge storage electrode segments $\mathbf{24'}_1$, $\mathbf{24'}_2$, and $\mathbf{24'}_3$ in each of these Example).

In Examples 10 and 11, and in Example 9 in some cases, the charge storage electrode 24 is formed with N charge storage electrode segments (specifically, three charge storage electrode segments $\mathbf{24'}_1$, $\mathbf{24'}_2$, and $\mathbf{24'}_3$) that are disposed at a distance from one another, the nth (n=1, 2, 3, . . . N) photoelectric conversion unit segment $\mathbf{10'}_n$ is formed with the nth charge storage electrode segment $\mathbf{24'}_n$ the nth insulating layer segment $\mathbf{82'}_n$ and the nth photoelectric conversion layer segments $\mathbf{23'}_n$ and a photoelectric conversion unit segment having a larger value for n is located farther away from the first electrode 21. Here, the photoelectric conversion layer segments $\mathbf{23'}_1$, $\mathbf{23'}_2$, and $\mathbf{23'}_3$ refer to segments formed by stacking a photoelectric conversion layer and a semiconductor material layer, but are shown as one layer in the drawings, for simplification. The same applies in the description below.

Note that, in the photoelectric conversion layer segments, the thickness of the portion of the photoelectric conversion layer may be varied, and the thickness of the portion of the semiconductor material layer may be made constant, so that the thicknesses of the photoelectric conversion layer segments vary. The thickness of the portion of the photoelectric conversion layer may be made constant, and the thickness of the portion of the semiconductor material layer may be made to vary, so that the thicknesses of the photoelectric conversion layer segments vary. The thickness of the portion of the photoelectric conversion layer may be varied, and the thickness of the portion of the semiconductor material layer may be varied, so that the thicknesses of the photoelectric conversion layer segments vary.

Alternatively, the imaging device of Example 7 or an imaging device of Example 8 or 11 described later further includes a photoelectric conversion unit in which the first electrode 21, the semiconductor material layer 23B, the photoelectric conversion layer 23A, and the second electrode 22 are stacked.

The photoelectric conversion unit further includes the charge storage electrode 24 that is disposed at a distance from the first electrode 21, and is positioned to face the semiconductor material layer 23B via the insulating layer 82.

Where the stacking direction of the charge storage electrode 24, the insulating layer 82, the semiconductor material layer 23B, and the photoelectric conversion layer 23A is the Z direction, and the direction away from the first electrode 21 is the X direction, cross-sectional areas of the stacked portions of the charge storage electrode 24, the insulating layer 82, the semiconductor material layer 23B, and the photoelectric conversion layer 23A taken along a Y-Z virtual plane vary depending on the distance from the first electrode.

Further, in the imaging device of Example 7, the thicknesses of the insulating layer segments gradually vary from the first photoelectric conversion unit segment $\mathbf{10'}_1$ to the Nth photoelectric conversion unit segment $\mathbf{10'}_N$. Specifically, the thicknesses of the insulating layer segments are made gradually greater. Alternatively, in the imaging device of Example 7, the widths of cross-sections of the stacked portions are constant, and the thickness of a cross-section of a stacked portion, or specifically, the thickness of an insulating layer segment gradually increases depending on the distance from the first electrode 21. Note that the thicknesses of the insulating layer segments are increased stepwise. The thickness of the insulating layer segment $\mathbf{82'}_n$ in the nth photoelectric conversion unit segment $\mathbf{10'}_n$ is constant. Where the thickness of the insulating layer segment $\mathbf{82'}_n$ in the nth photoelectric conversion unit segment $\mathbf{10'}_n$ is "1", the thickness of the insulating layer segment $\mathbf{82'}_{(n+1)}$ in the (n+1)th photoelectric conversion unit segment $\mathbf{10'}_{(n+1)}$ may be 2 to 10, for example, but is not limited to such values. In Example 7, the thicknesses of the charge storage electrode segments $\mathbf{24'}_1$, $\mathbf{24'}_2$, and $\mathbf{24'}_3$ are made to become gradually smaller, so that the thicknesses of the insulating layer segments $\mathbf{82'}_1$, $\mathbf{82'}_2$, and $\mathbf{82'}_3$ become gradually greater. The thicknesses of the photoelectric conversion layer segments $\mathbf{23'}_1$, $\mathbf{23'}_2$, and $\mathbf{23'}_3$ are uniform.

In the description below, operation of the imaging device of Example 7 is described.

In a charge accumulation period, the drive circuit applies a potential $V_{11}$ to the first electrode 21, and a potential $V_{12}$ to the charge storage electrode 24. Light that has entered the photoelectric conversion layer 23A causes photoelectric conversion in the photoelectric conversion layer 23A. Holes generated by the photoelectric conversion are sent from the second electrode 22 to the drive circuit via a wiring line $V_{OU}$. Meanwhile, since the potential of the first electrode 21 is higher than the potential of the second electrode 22, or a positive potential is applied to the first electrode 21 while a negative potential is applied to the second electrode 22, for example, $V_{12} \geq V_{11}$, or preferably, $V_{12} > V_{11}$. As a result, electrons generated by the photoelectric conversion are attracted to the charge storage electrode 24, and stay in the region of the semiconductor material layer 23B and the like facing the charge storage electrode 24. That is, electric charges are accumulated in the semiconductor material layer 23B and the like. Since $V_{12}>V_{11}$, electrons generated in the photoelectric conversion layer 23A will not move toward the first electrode 21. With the passage of time for photoelectric conversion, the potential in the region of the semiconductor material layer 23B and the like facing the charge storage electrode 24 becomes a more negative value.

The imaging device of Example 7 has a configuration in which the thicknesses of the insulating layer segments gradually increase. Accordingly, in a charge accumulation period, when $V_{12}\geq V_{11}$, the nth photoelectric conversion unit segment $10'_n$ can store more electric charges than the (n+1)th photoelectric conversion unit segment $10'_{(n+1)}$, and a strong electric field is applied so that electric charges can be reliably prevented from flowing from the first photoelectric conversion unit segment $10'_1$ toward the first electrode 21.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 21, and a potential $V_{22}$ to the charge storage electrode 24. Here, $V_{21}>V_{22}$. As a result, the electrons remaining in the region of the semiconductor material layer 23B and the like facing the charge storage electrode 24 are read into the first electrode 21 and further into the first floating diffusion layer $FD_1$. In other words, the electric charges accumulated in the semiconductor material layer 23B and the like are read into the control unit.

More specifically, when $V_{21}>V_{22}$ in a charge transfer period, it is possible to reliably secure the flow of electric charges from the first photoelectric conversion unit segment $10'_1$ toward the first electrode 21, and the flow of electric charges from the (n+1)th photoelectric conversion unit segment $10'_{(n+1)}$ toward the nth photoelectric conversion unit segment $10'_n$.

In the above manner, a series of operations including charge accumulation, reset operation, and charge transfer is completed.

In the imaging device of Example 7, a kind of charge transfer gradient is formed, and the electric charges generated through photoelectric conversion can be transferred more easily and reliably, because the thicknesses of the insulating layer segments gradually vary from the first photoelectric conversion unit segment to the Nth photoelectric conversion unit segment, or because cross-sectional areas of the stacked portions of the charge storage electrode, the insulating layer, the semiconductor material layer, and the photoelectric conversion layer taken along the Y-Z virtual plane vary depending on the distance from the first electrode.

An imaging device of Example 7 can be manufactured by a method substantially similar to the method for manufacturing an imaging device of Example 1, and therefore, detailed explanation thereof is not made herein.

Note that, in an imaging device of Example 7, to form the first electrode 21, the charge storage electrode 24, and the insulating layer 82, a conductive material layer for forming the charge storage electrode $24'_3$ is first formed on the interlayer insulating layer 81, and patterning is performed on the conductive material layer, to leave the conductive material layer in the regions in which the photoelectric conversion unit segments $10'_1$, $10'_2$, and $10'_3$ and the first electrode 21 are to be formed. In this manner, part of the first electrode 21 and the charge storage electrode $24'_3$ can be obtained. An insulating layer for forming the insulating layer segment $82'_3$ is then formed on the entire surface, patterning is performed on the insulating layer, and a planarization process is performed, to obtain the insulating layer segment $82'_3$. A conductive material layer for forming the charge storage electrode $24'_2$ is then formed on the entire surface, and patterning is performed on the conductive material layer, to leave the conductive material layer in the regions in which the photoelectric conversion unit segments $10'_1$ and $10'_2$ and the first electrode 21 are to be formed. In this manner, part of the first electrode 21 and the charge storage electrode $24'_2$ can be obtained. An insulating layer for forming the insulating layer segment $82'_2$ is then formed on the entire surface, patterning is performed on the insulating layer, and a planarization process is performed, to obtain the insulating layer segment $82'_2$. A conductive material layer for forming the charge storage electrode $24'_1$ is then formed on the entire surface, and patterning is performed on the conductive material layer, to leave the conductive material layer in the regions in which the photoelectric conversion unit segment $10'_1$ and the first electrode 21 are to be formed. In this manner, the first electrode 21 and the charge storage electrode $24'_1$ can be obtained. An insulating layer is then formed on the entire surface, and a planarization process is performed, to obtain the insulating layer segment $82'_1$ (the insulating layer 82). The semiconductor material layer 23B and the photoelectric conversion layer 23A are then formed on the insulating layer 82. Thus, the photoelectric conversion unit segments $10'_1$, $10'_2$, and $10'_3$ can be obtained.

Figure 39:
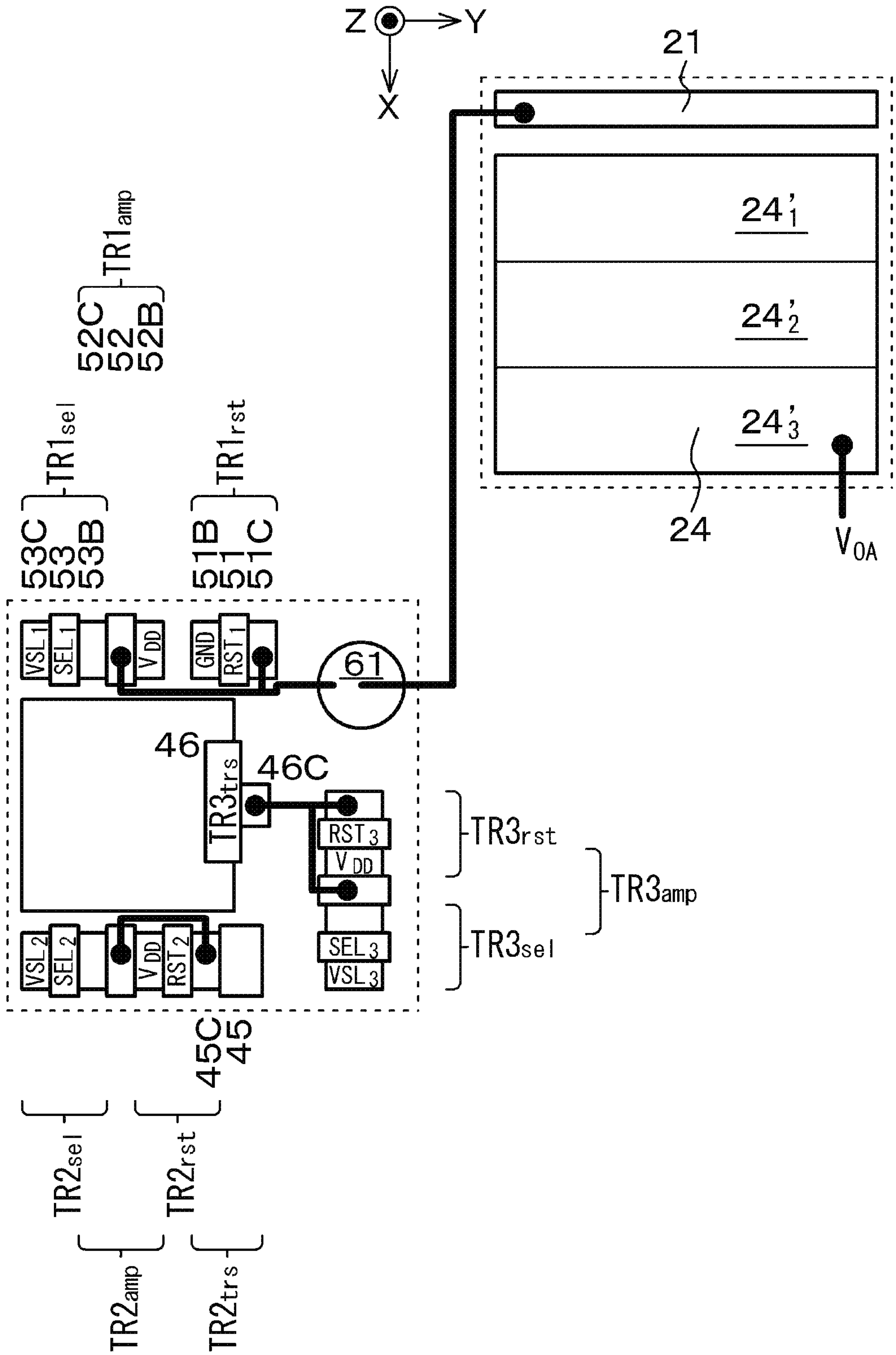
FIG. 39 is a schematic layout diagram of a first electrode, a charge storage electrode, and the transistors constituting a control unit of a modification of an imaging device of Example 7.

FIG. 39 shows a schematic layout diagram of the first electrode, the charge storage electrode, and the transistors constituting the control unit of a modification of an imaging device of Example 7. As shown in FIG. 39, the other source/drain region 51B of the reset transistor $TR1_{rst}$ may be grounded, instead of being connected to the power supply $V_{DD}$.

Example 8

Figure 40:
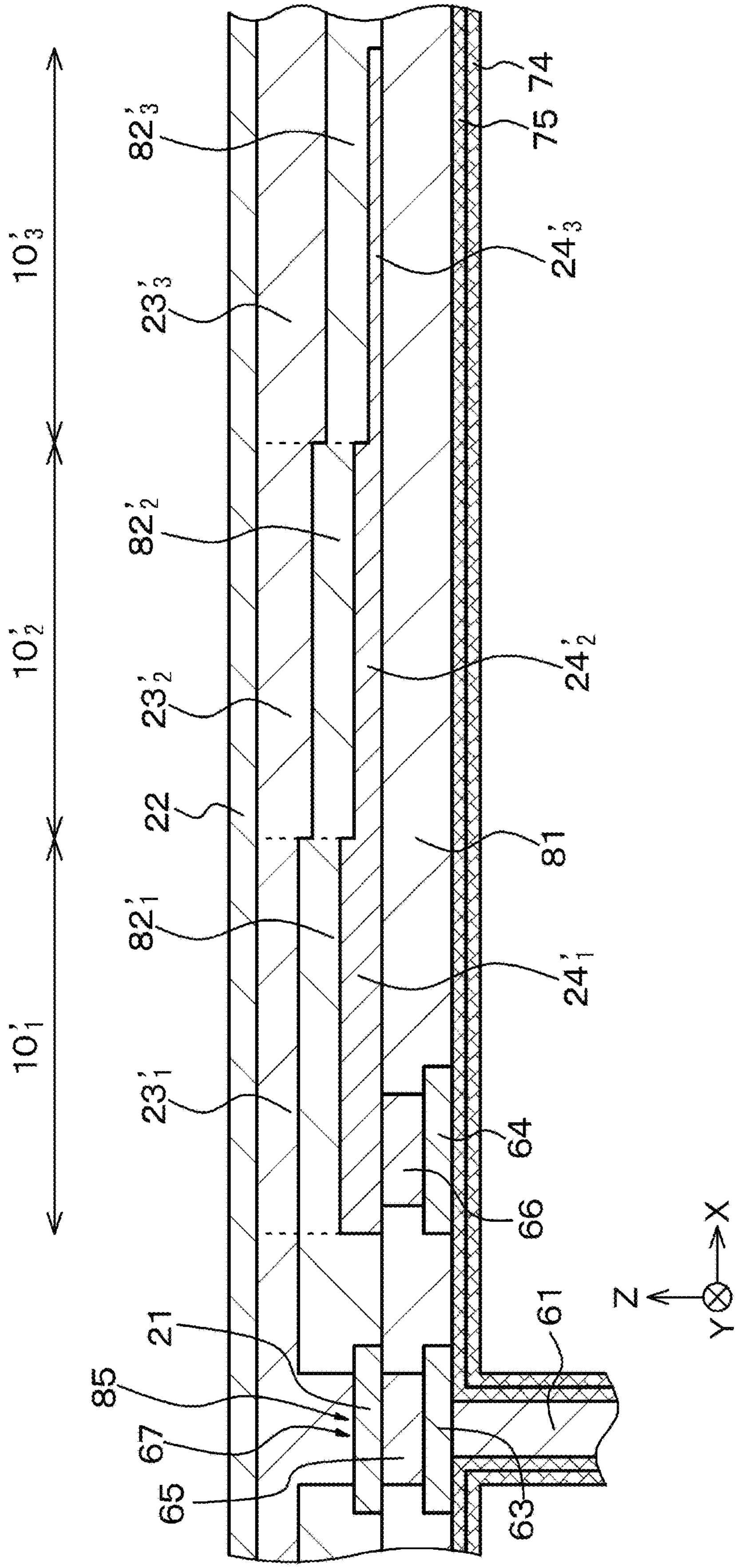
FIG. 40 is a schematic partial cross-sectional view showing an enlarged view of the portion in which a charge storage electrode, a photoelectric conversion layer, and a second electrode are stacked in an imaging device of Example 8.

Imaging devices of Example 8 relate to imaging devices of the second configuration and the sixth configuration of the present disclosure. FIG. 40 is a schematic partial cross-sectional view showing an enlarged view of the portion in which the charge storage electrode, the semiconductor material layer, the photoelectric conversion layer, and the second electrode are stacked. As shown in FIG. 40, in an imaging device of Example 8, the thicknesses of the photoelectric conversion layer segments gradually vary from the first photoelectric conversion unit segment $10'_1$ to the Nth photoelectric conversion unit segment $10'_N$. Alternatively, in an imaging device of Example 8, the widths of cross-sections of the stacked portions are constant, and the thickness of a cross-section of a stacked portion, or specifically, the thickness of a photoelectric conversion layer segment, gradually increases depending on the distance from the first electrode 21. More specifically, the thicknesses of the photoelectric conversion layer segments are gradually increased. Note that the thicknesses of the photoelectric conversion layer segments are increased stepwise. The thickness of the photoelectric conversion layer segment $23'_n$ in the nth photoelectric conversion unit segment $10'_n$ is constant. Where the thickness of the photoelectric conversion layer segment $23'_n$ in the nth photoelectric conversion unit segment $10'_n$ is "1", the thickness of the photoelectric conversion layer segment $23'_{(n+1)}$ in the (n+1)th photoelectric conversion unit segment $10'_{(n+1)}$ may be 2 to 10, for example, but is not limited to such values. In Example 8, the thicknesses of the charge storage electrode segments $24'_1$, $24'_2$, and $24'_3$ are made to become gradually smaller, so that the thicknesses of the photoelectric conversion layer segments $23'_1$, $23'_2$, and $23'_3$ become gradually greater. The thicknesses of the insulating layer segments $82'_1$, $82'_2$, and $82'_3$ are uniform. Further, in the photoelectric conversion layer segments, the thicknesses of the photoelectric conversion layer portions may be varied while the thicknesses of the semiconductor material layer portions are constant, for example. In this manner, the thicknesses of the photoelectric conversion layer segments may be varied.

In the imaging device of Example 8, the thicknesses of the photoelectric conversion layer segments gradually increase. Accordingly, in a charge accumulation period, when $V_{12}>V_{11}$, a stronger electric field is applied to the nth photoelectric conversion unit segment $10'_n$ than to the (n+1) th photoelectric conversion unit segment $10'_{(n+1)}$, and electric charges can be reliably prevented from flowing from the first photoelectric conversion unit segment $10'_1$ toward the first electrode 21. Further, when $V_{22}<V_{21}$ in a charge transfer period, it is possible to reliably secure the flow of electric charges from the first photoelectric conversion unit segment $10'_1$ toward the first electrode 21, and the flow of electric charges from the (n+1)th photoelectric conversion unit segment $10'_{(n+1)}$ toward the nth photoelectric conversion unit segment $10'_n$.

As described above, in an imaging device of Example 8, a kind of charge transfer gradient is formed, and the electric charges generated through photoelectric conversion can be transferred more easily and reliably, because the thicknesses of the photoelectric conversion layer segments gradually vary from the first photoelectric conversion unit segment to the Nth photoelectric conversion unit segment, or because cross-sectional areas of the stacked portions of the charge storage electrode, the insulating layer, the semiconductor material layer, and the photoelectric conversion layer taken along the Y-Z virtual plane vary depending on the distance from the first electrode.

In a stacked imaging device or the like of Example 8, to form the first electrode 21, the charge storage electrode 24, the insulating layer 82, the semiconductor material layer 23B, and the photoelectric conversion layer 23A, a conductive material layer for forming the charge storage electrode $24'_3$ is first formed on the interlayer insulating layer 81, and patterning is performed on the conductive material layer, to leave the conductive material layer in the regions in which the photoelectric conversion unit segments $10'_1$, $10'_2$, and $10'_3$ and the first electrode 21 are to be formed. In this manner, part of the first electrode 21 and the charge storage electrode $24'_3$ can be obtained. A conductive material layer for forming the charge storage electrode $24'_2$ is then formed on the entire surface, and patterning is performed on the conductive material layer, to leave the conductive material layer in the regions in which the photoelectric conversion unit segments $10'_1$ and $10'_2$ and the first electrode 21 are to be formed. In this manner, part of the first electrode 21 and the charge storage electrode $24'_2$ can be obtained. A conductive material layer for forming the charge storage electrode $24'_1$ is then formed on the entire surface, and patterning is performed on the conductive material layer, to leave the conductive material layer in the regions in which the photoelectric conversion unit segment $10'_1$ and the first electrode 21 are to be formed. In this manner, the first electrode 21 and the charge storage electrode $24'_1$ can be obtained. The insulating layer 82 is then formed conformally on the entire surface. The semiconductor material layer 23B and the photoelectric conversion layer 23A are then formed on the insulating layer 82, and a planarization process is performed on the photoelectric conversion layer 23A. Thus, the photoelectric conversion unit segments $10'_1$, $10'_2$, and $10'_3$ can be obtained.

Example 9

Figure 41:
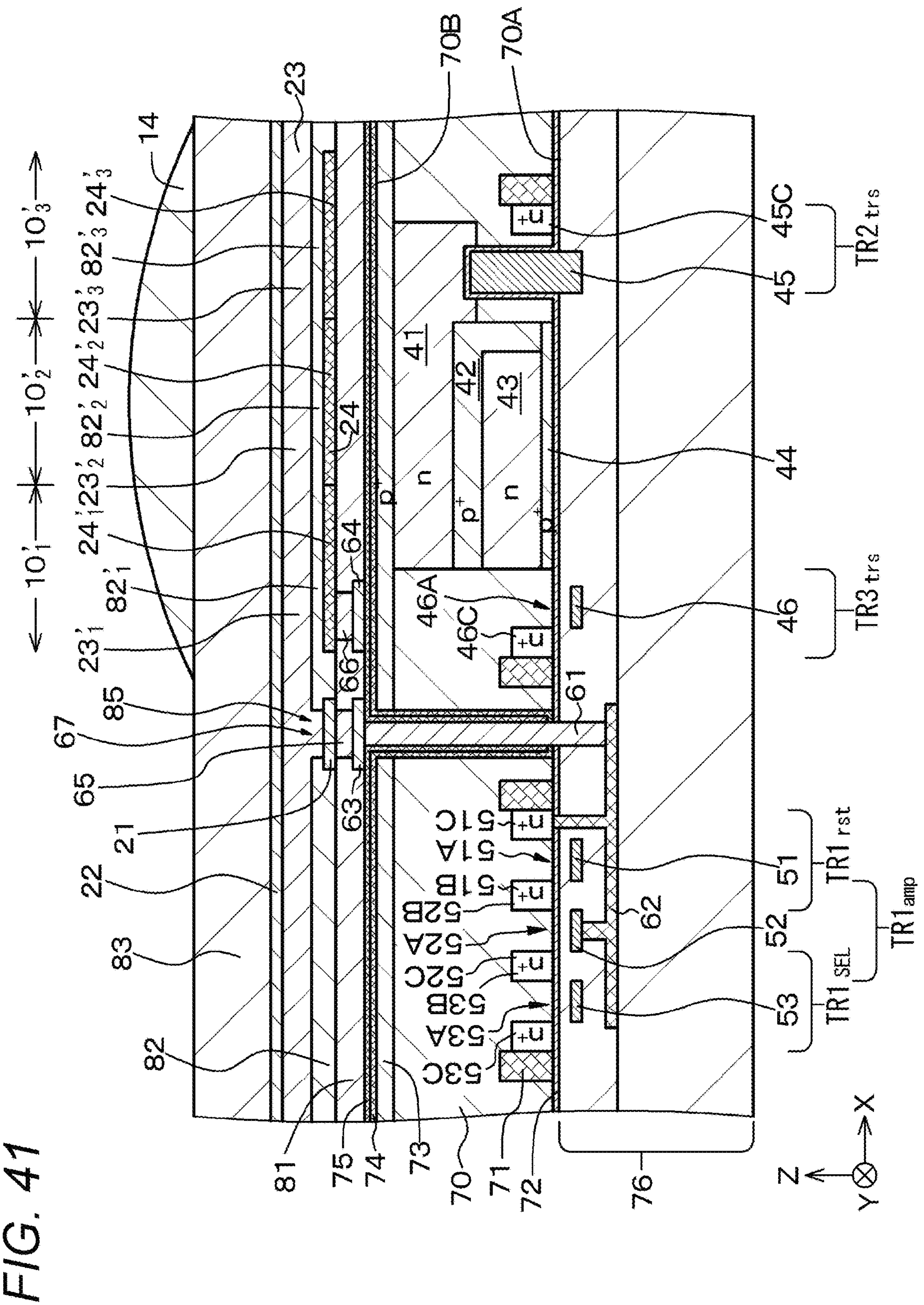
FIG. 41 is a schematic partial cross-sectional view of an imaging device of Example 9.

Example 9 relates to an imaging device of the third configuration. FIG. 41 shows a schematic partial cross-sectional view of an imaging device of Example 9. In an imaging device of Example 9, the material forming the insulating layer segment is different between adjacent photoelectric conversion unit segments. Here, the values of the relative dielectric constants of the materials forming the insulating layer segments are gradually reduced from the first photoelectric conversion unit segment $10'_1$ to the Nth photoelectric conversion unit segment $10'_N$. In an imaging device of Example 9, the same potential may be applied to all of the N charge storage electrode segments, or different potentials may be applied to the respective N charge storage electrode segments. In the latter case, the charge storage electrode segments $24'_1$, $24'_2$, and $24'_3$ that are disposed at a distance from one another are only required to be connected to the vertical drive circuit 112 forming the drive circuit, via pad portions $64_1$, $64_2$, and $64_3$, as in a manner similar to that described later in Example 10.

As such a configuration is adopted, a kind of charge transfer gradient is then formed, and, when $V_{12}\geq V_{11}$ in a charge accumulation period, the nth photoelectric conversion unit segment can store more electric charges than the (n+1)th photoelectric conversion unit segment. Further, when $V_{22}<V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

Example 10

Figure 42:
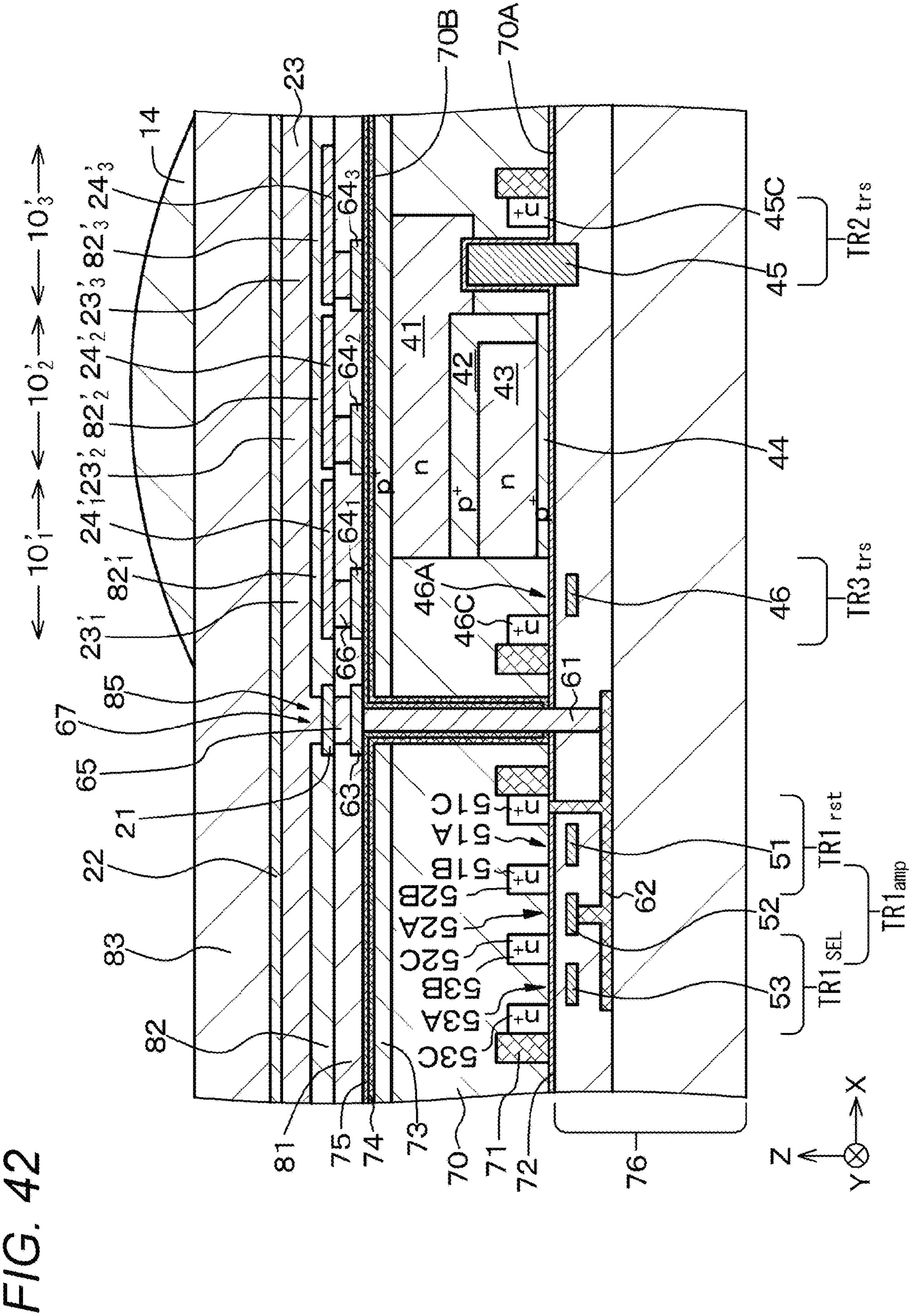
FIG. 42 is a schematic partial cross-sectional view of an imaging device of Example 10 and Example 11.
Figure 43A:
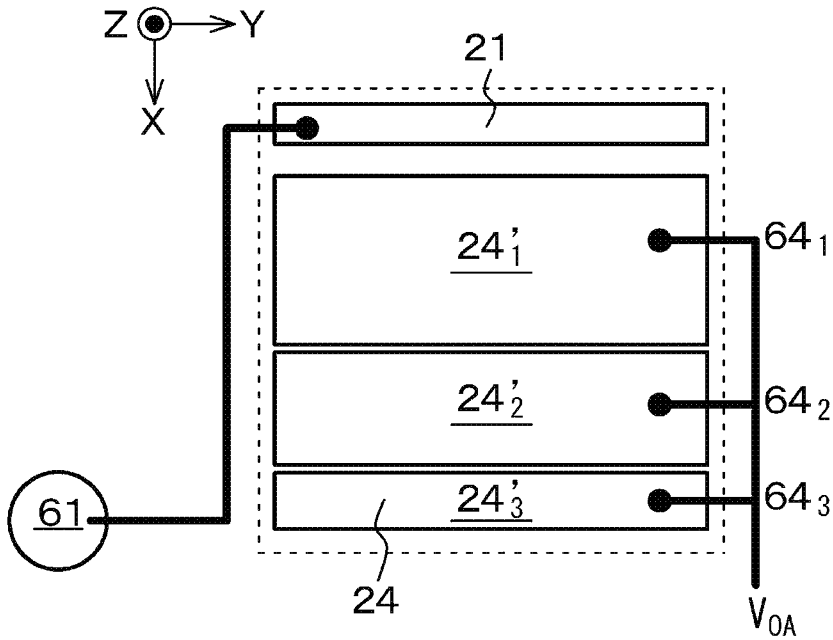
FIGS. 43A and 43B are schematic plan views of a charge storage electrode segment in Example 11.
Figure 43B:
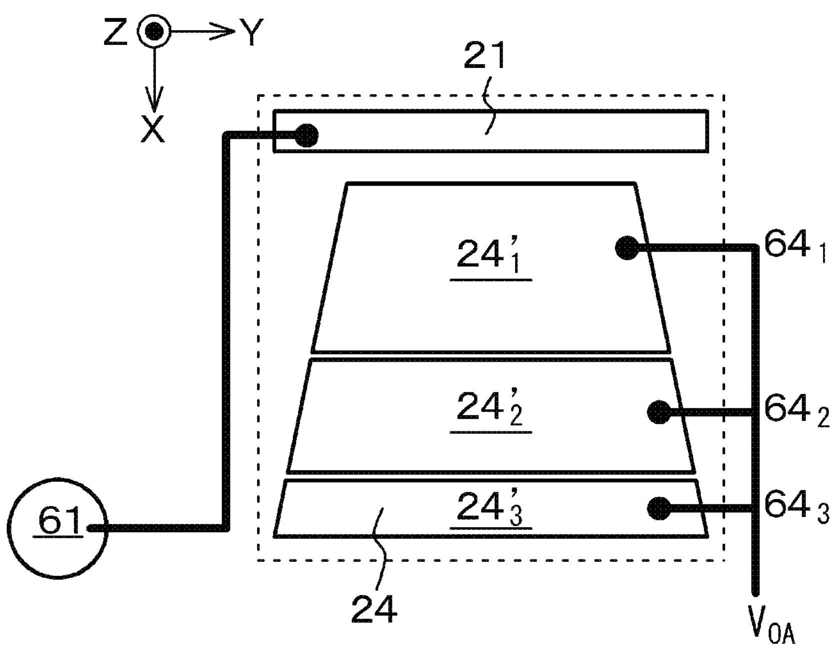
Figure 44A:
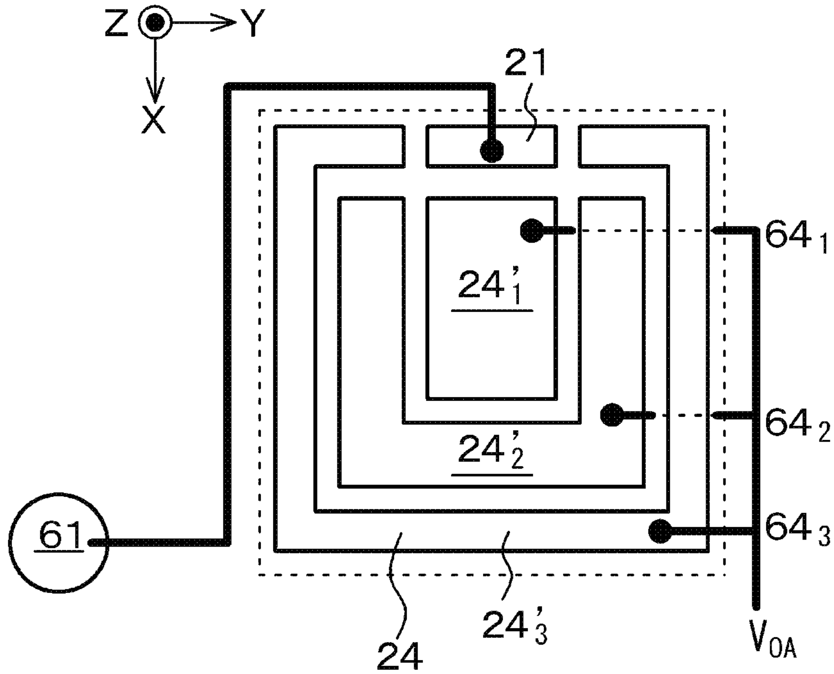
FIGS. 44A and 44B are schematic plan views of a charge storage electrode segment in Example 11.
Figure 44B:
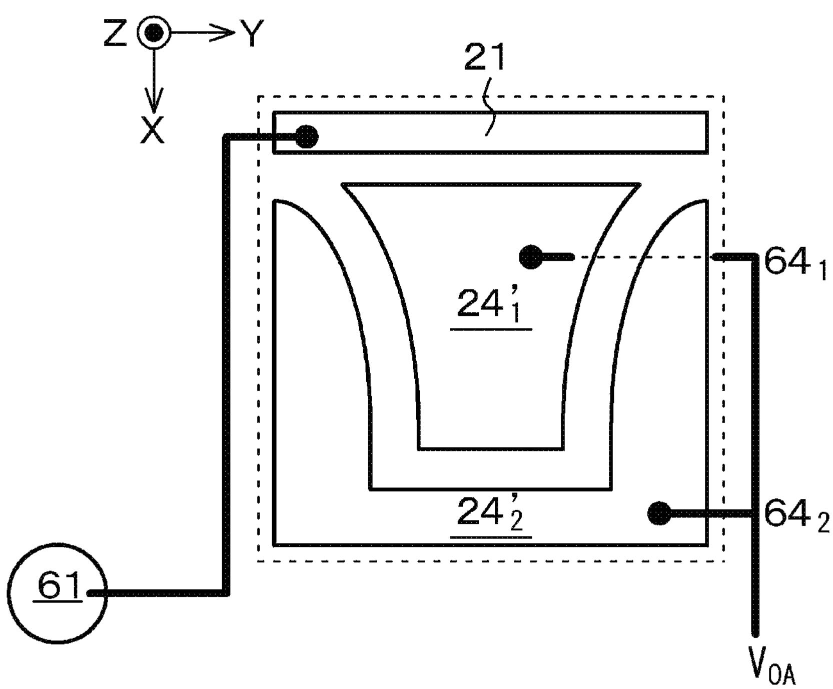

Example 10 relates to an imaging device of the fourth configuration. FIG. 42 shows a schematic partial cross-sectional view of an imaging device of Example 10. In an imaging device of Example 10, the material forming the charge storage electrode segment is different between adjacent photoelectric conversion unit segments. Here, the values of the work functions of the materials forming the insulating layer segments are gradually increased from the first photoelectric conversion unit segment $10'_1$ to the Nth photoelectric conversion unit segment $10'_N$. In an imaging device of Example 10, the same potential may be applied to all of the N charge storage electrode segments, or different potentials may be applied to the respective N charge storage electrode segments. In the latter case, the charge storage electrode segments $24'_1$, $24'_2$, and $24'_3$ are connected to the vertical drive circuit 112 forming the drive circuit, via pad portions $64_1$, $64_2$, and $64_3$.

Example 11

Figure 45:
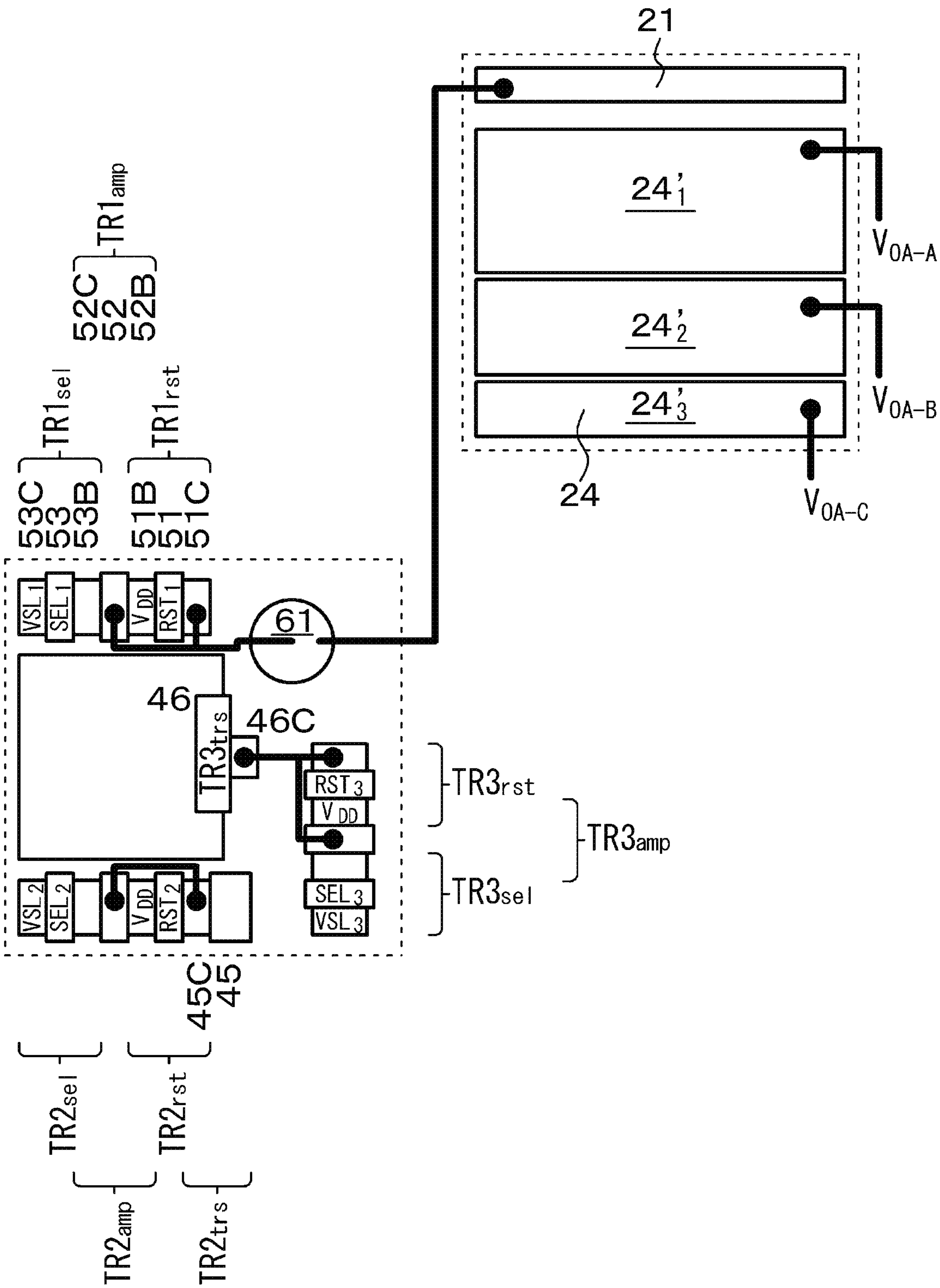
FIG. 45 is a schematic layout diagram of a first electrode, a charge storage electrode, and the transistors constituting a control unit of an imaging device of Example 11.

Imaging devices of Example 11 relate to imaging devices of the fifth configuration. FIGS. 43A, 43B, 44A, and 44B show schematic plan views of charge storage electrode segments in Example 11. FIG. 45 shows a schematic layout diagram of the first electrode and the charge storage electrode that constitute the photoelectric conversion unit including the charge storage electrode of an imaging device of Example 11, and the transistors that constitute the control unit. A schematic partial cross-sectional view of an imaging device of Example 11 is similar to that shown in FIG. 42 or 47. In an imaging device of Example 11, the areas of the charge storage electrode segments are gradually reduced from the first photoelectric conversion unit segment 10'$_1$ to the Nth photoelectric conversion unit segment 10'$_N$. In an imaging device of Example 11, the same potential may be applied to all of the N charge storage electrode segments, or different potentials may be applied to the respective N charge storage electrode segments. Specifically, the charge storage electrode segments 24'$_1$, 24'$_2$, and 24'$_3$ that are disposed at a distance from one another are only required to be connected to the vertical drive circuit 112 forming the drive circuit, via pad portions 64$_1$, 64$_2$, and 64$_3$, as in a manner similar to that described in Example 10.

In Example 11, the charge storage electrode 24 is formed with a plurality of charge storage electrode segments 24'$_1$, and 24'$_2$, and 24'$_3$. The number of charge storage electrode segments is two or larger, and is "3" in Example 11. Further, in an imaging device of Example 11, the potential of the first electrode 21 is higher than the potential of the second electrode 22, or a positive potential is applied to the first electrode 21 while a negative potential is applied to the second electrode 22, for example. Therefore, in a charge transfer period, the potential to be applied to the charge storage electrode segment 24'$_1$ located closest to the first electrode 21 is higher than the potential to be applied to the charge storage electrode segment 24'$_3$ located farthest from the first electrode 21. As such a potential gradient is formed in the charge storage electrode 24, electrons remaining in the region of the semiconductor material layer 23B and the like facing the charge storage electrode 24 are read into the first electrode 21 and further into the first floating diffusion layer $FD_1$ with higher reliability. In other words, the electric charges accumulated in the semiconductor material layer 23B and the like are read into the control unit.

Further, in a charge transfer period, the potential of the charge storage electrode segment 24'$_3$<the potential of the charge storage electrode segment 24'$_2$<the potential of the charge storage electrode segment 24'$_1$. With this arrangement, the electrons remaining in the region of the semiconductor material layer 23B and the like are simultaneously read into the first floating diffusion layer $FD_1$. Alternatively, in a charge transfer period, the potential of the charge storage electrode segment 24'$_3$, the potential of the charge storage electrode segment 24'$_2$, and the potential of the charge storage electrode segment 24'$_1$ are gradually varied (in other words, varied in a stepwise or slope-like manner). With this arrangement, the electrons remaining in the region of the semiconductor material layer 23B and the like facing the charge storage electrode segment 24'$_3$ are moved to the region of the semiconductor material layer 23B and the like facing the charge storage electrode segment 24'$_2$, the electrons remaining in the region of the semiconductor material layer 23B and the like facing the charge storage electrode segment 24'$_2$ are then moved to the region of the semiconductor material layer 23B and the like facing the charge storage electrode segment 24'$_1$, and, after that, the electrons remaining in the region of the semiconductor material layer 23B and the like facing the charge storage electrode segment 24'$_1$ can be read into the first floating diffusion layer $FD_1$ without fail.

Figure 46:
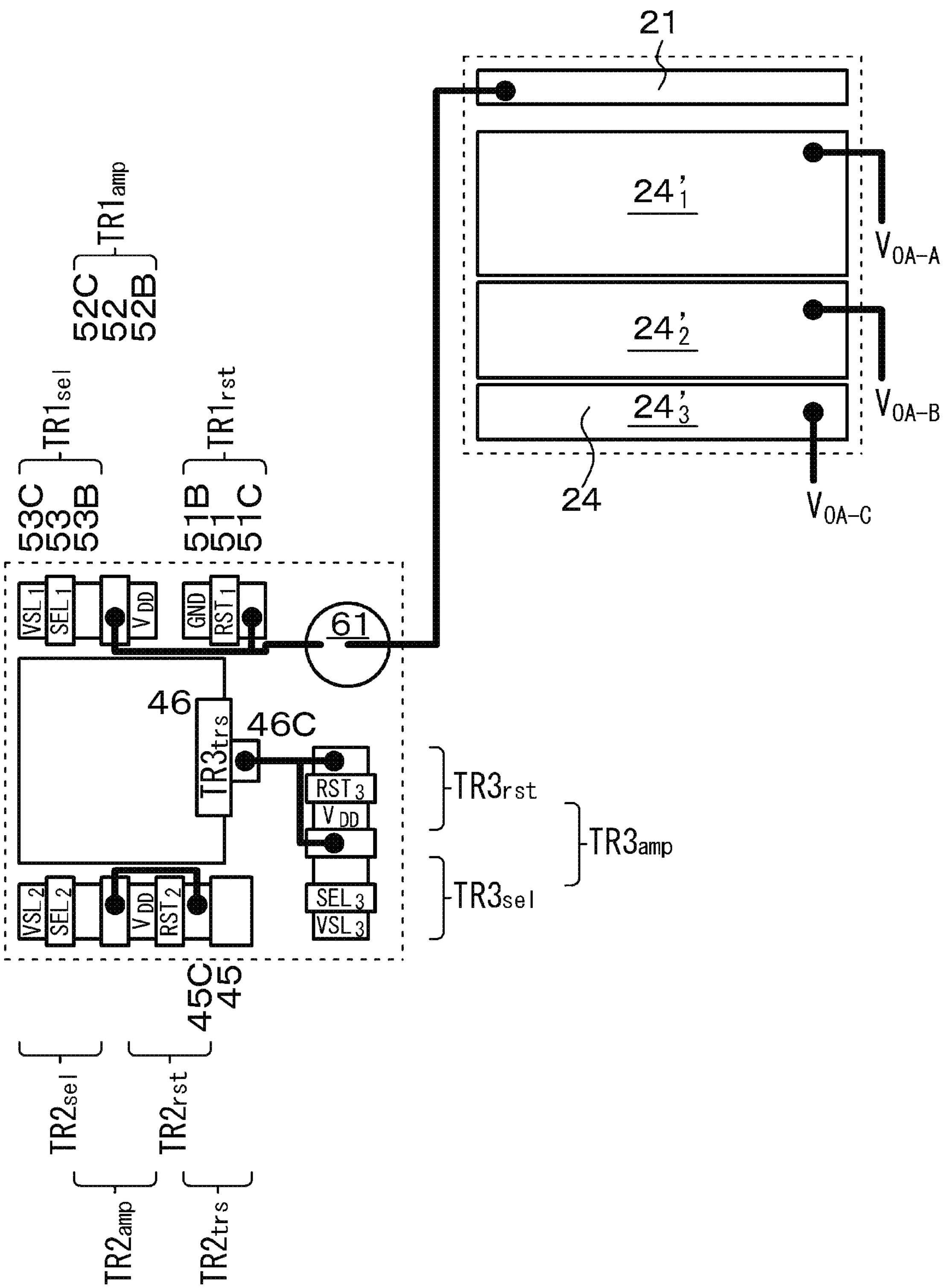
FIG. 46 is a schematic layout diagram of a first electrode and a charge storage electrode that constitute a modification of an imaging device of Example 11.

FIG. 46 shows a schematic layout diagram of the first electrode, the charge storage electrode, and the transistors constituting the control unit of a modification of an imaging device of Example 11. As shown in FIG. 46, the other source/drain region 51B of the reset transistor $TR3_{rst}$ may be grounded, instead of being connected to the power supply $V_{DD}$.

In an imaging device of Example 11, such a configuration is adopted, so that a kind of charge transfer gradient is formed. In other words, the areas of the charge storage electrode segments gradually decrease from the first photoelectric conversion unit segment 10'$_1$ to the Nth photoelectric conversion unit segment 10'$_N$. Accordingly, when $V_{12} \geq V_{11}$ in a charge accumulation period, the nth photoelectric conversion unit segment can store more electric charges than the (n+1)th photoelectric conversion unit segment. Further, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

Example 12

Figure 47:
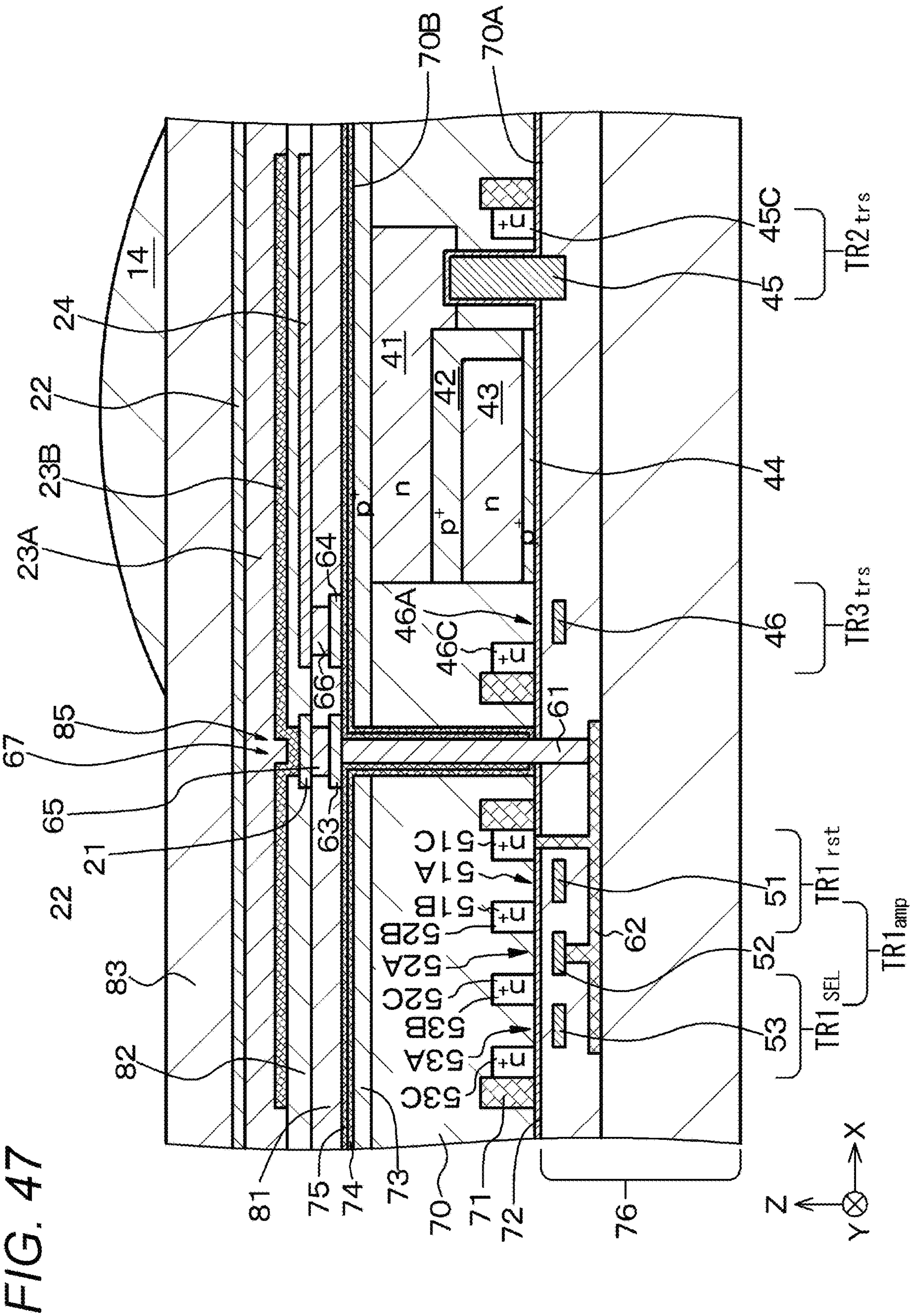
FIG. 47 is a schematic partial cross-sectional view of an imaging device of Example 12 and Example 11.
Figure 48A:
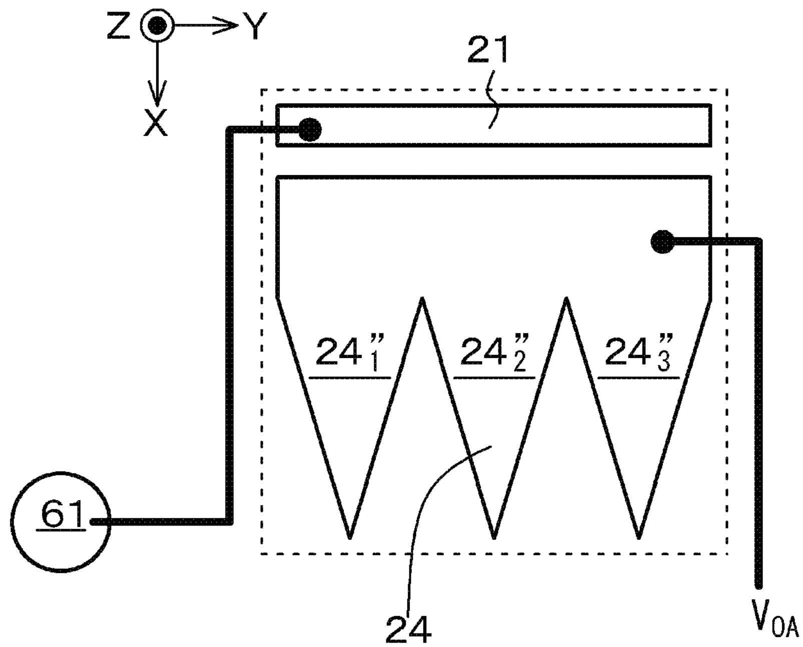
FIGS. 48A and 48B are schematic plan views of a charge storage electrode segment in Example 12.
Figure 48B:
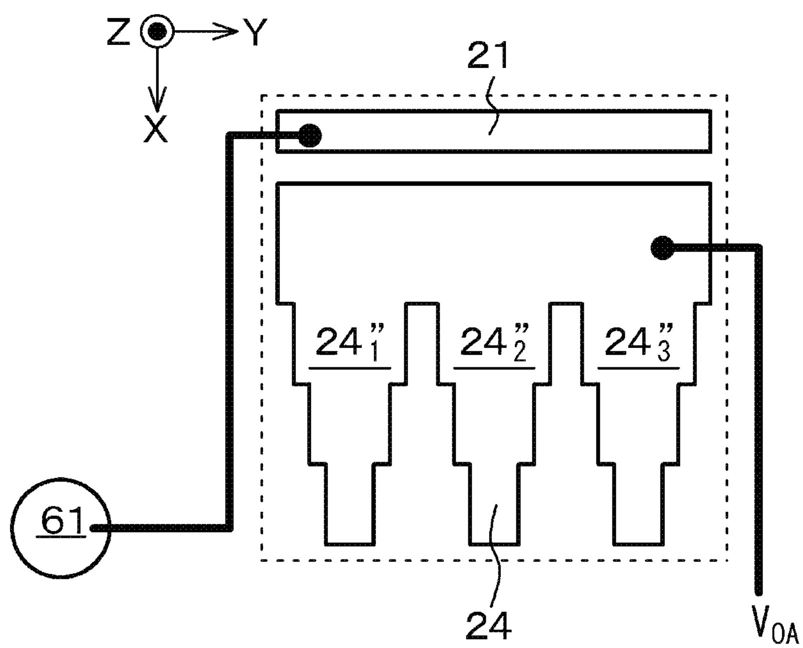

Example 12 relates to an imaging device of the sixth configuration. FIG. 47 shows a schematic partial cross-sectional view of an imaging device of Example 12. Further, FIGS. 48A and 48B are schematic plan views of charge storage electrode segments in Example 12. An imaging device of Example 12 includes a photoelectric conversion unit formed by stacking the first electrode 21, the semiconductor material layer 23B, the photoelectric conversion layer 23A, and the second electrode 22, and the photoelectric conversion unit further includes the charge storage electrode 24 (24"$_1$, 24"$_2$, and 24"$_3$) that are disposed at a distance from the first electrode 21 and are positioned to face the semiconductor material layer 23B via the insulating layer 82. Further, where the stacking direction of the charge storage electrode 24 (24"$_1$, 24"$_2$, and 24"$_3$), the insulating layer 82, the semiconductor material layer 23B, and the photoelectric conversion layer 23A is the Z direction, and the direction away from the first electrode 21 is the X direction, the cross-sectional area of a stacked portion of the charge storage electrode 24 (24"$_1$, 24"$_2$, and 24"$_3$), the insulating layer 82, the semiconductor material layer 23B, and the photoelectric conversion layer 23A taken along the Y-Z virtual plane varies depending on the distance from the first electrode 21.

Specifically, in an imaging device of Example 12, the thicknesses of cross-sections of stacked portions are constant, and the width of a cross-section of a stacked portion is narrower at a longer distance from the first electrode 21. Note that the widths may be narrowed continuously (see FIG. 48A) or may be narrowed stepwise (see FIG. 48B).

As described above, in an imaging device of Example 12, a kind of charge transfer gradient is formed, and the electric charges generated through photoelectric conversion can be transferred more easily and reliably, because cross-sectional areas of the stacked portions of the charge storage electrode 24 (24"$_1$, 24"$_2$, and 24"$_3$), the insulating layer 82, and the photoelectric conversion layer 23A taken along a Y-Z virtual plane vary depending on the distance from the first electrode.

Example 13

Example 13 relates to solid-state imaging apparatuses of the first configuration and the second configuration.

A solid-state imaging apparatus of Example 13 includes a photoelectric conversion unit in which a first electrode 21, a semiconductor material layer 23B, a photoelectric conversion layer 23A, and a second electrode 22 are stacked, the photoelectric conversion unit further includes a plurality of imaging devices each including a charge storage electrode 24 that is disposed at a distance from the first electrode 21 and is positioned to face the semiconductor material layer 23B via an insulating layer 82, an imaging device block is formed with a plurality of imaging devices, and the plurality of imaging devices that forms the imaging device block shares the first electrode 21.

Alternatively, a solid-state imaging apparatus of Example 13 includes a plurality of imaging devices described in any of Examples 1 through 12.

In Example 13, one floating diffusion layer is provided for a plurality of imaging devices. The timing of a charge transfer period is then appropriately controlled, so that the plurality of imaging devices can share the one floating diffusion layer. Further, in this case, the plurality of imaging devices can share one contact hole portion.

Note that a solid-state imaging apparatus of Example 13 has a configuration and a structure that are similar to those of the solid-state imaging apparatuses described in Examples 1 through 12, except that the plurality of imaging devices constituting an imaging device block shares the first electrode 21.

Figure 49:
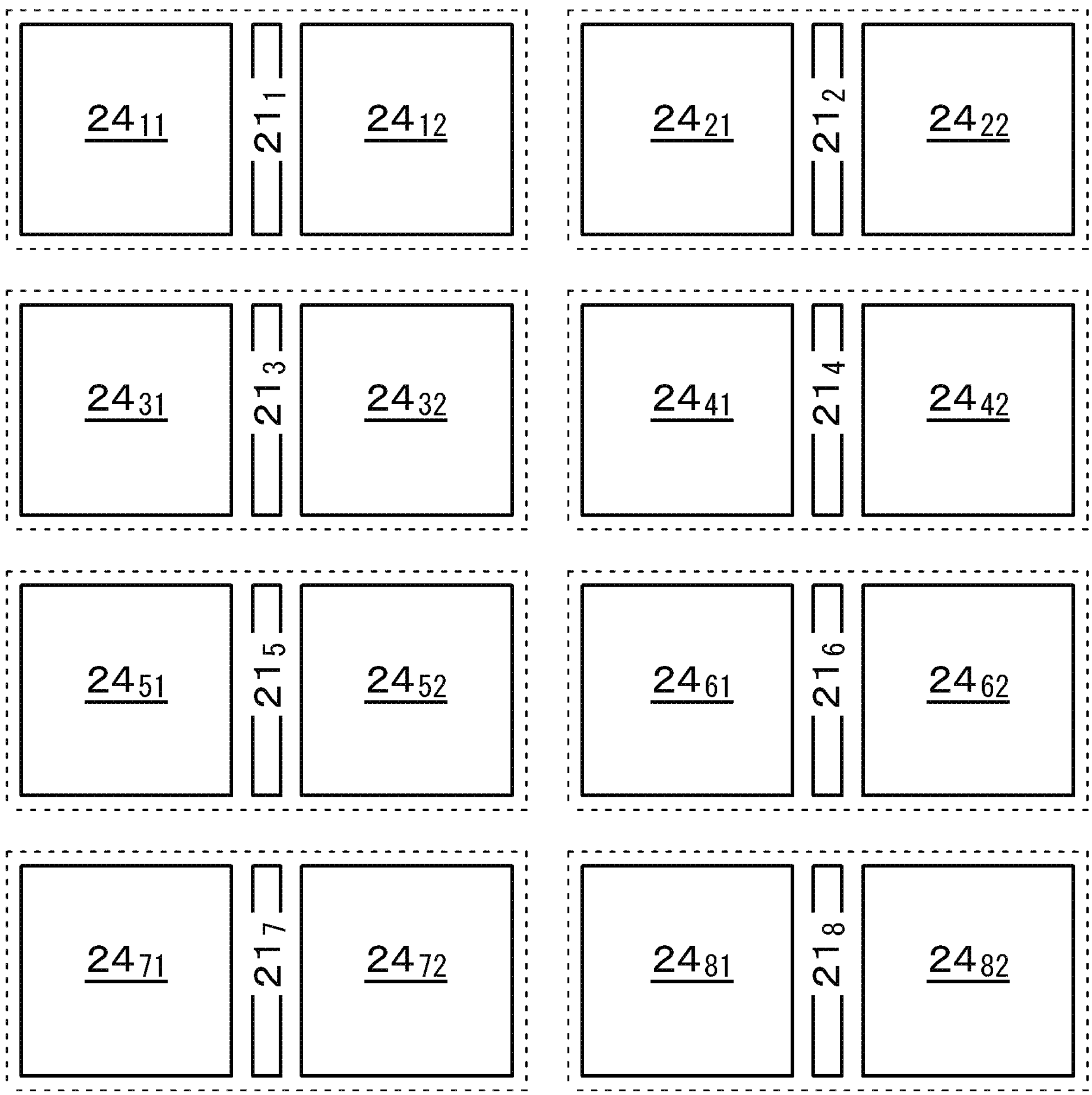
FIG. 49 is a schematic plan view of first electrodes and charge storage electrode segments in a solid-state imaging apparatus of Example 13.
Figure 50:
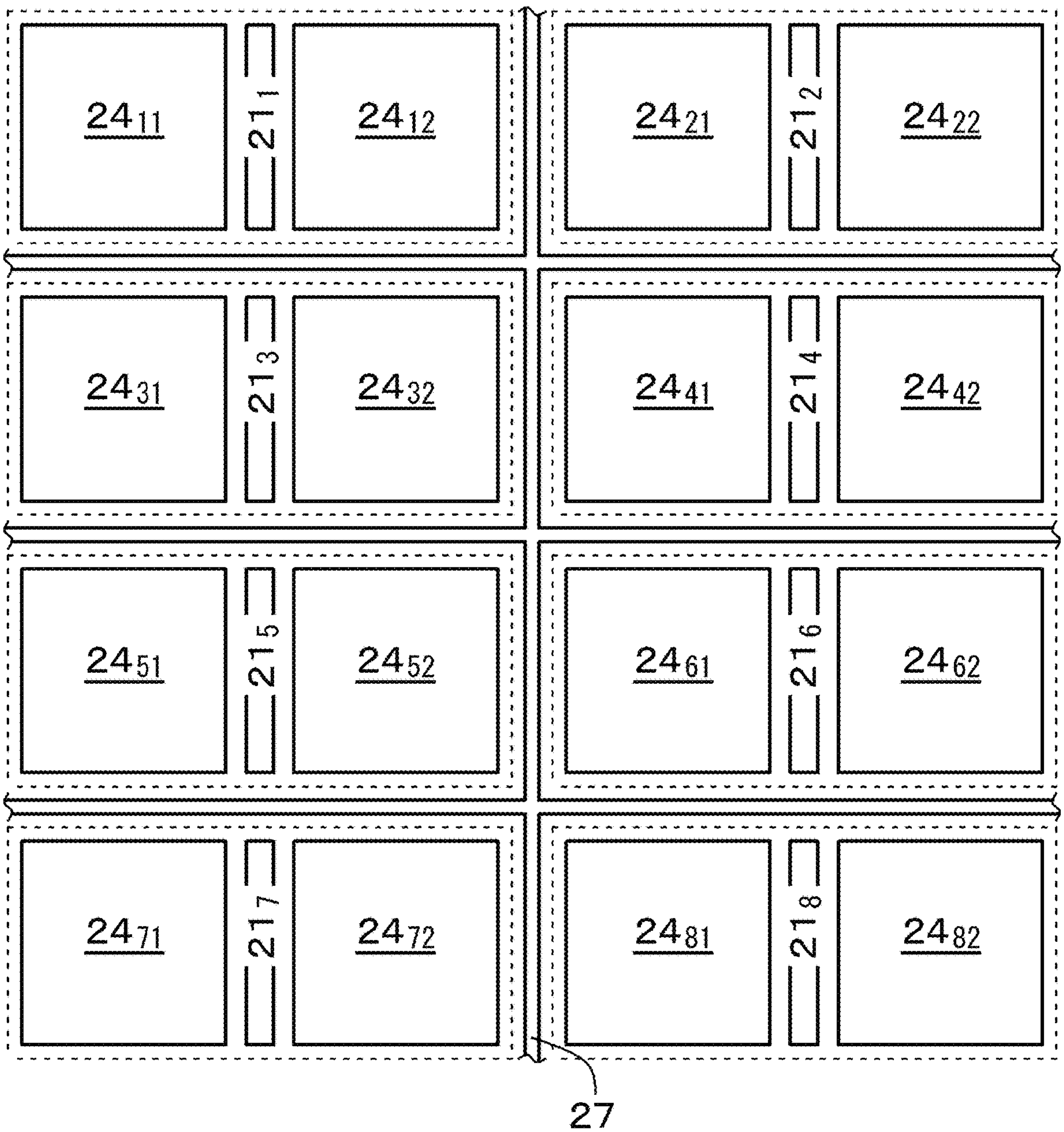
FIG. 50 is a schematic plan view of first electrodes and charge storage electrode segments in a first modification of a solid-state imaging apparatus of Example 13.
Figure 51:
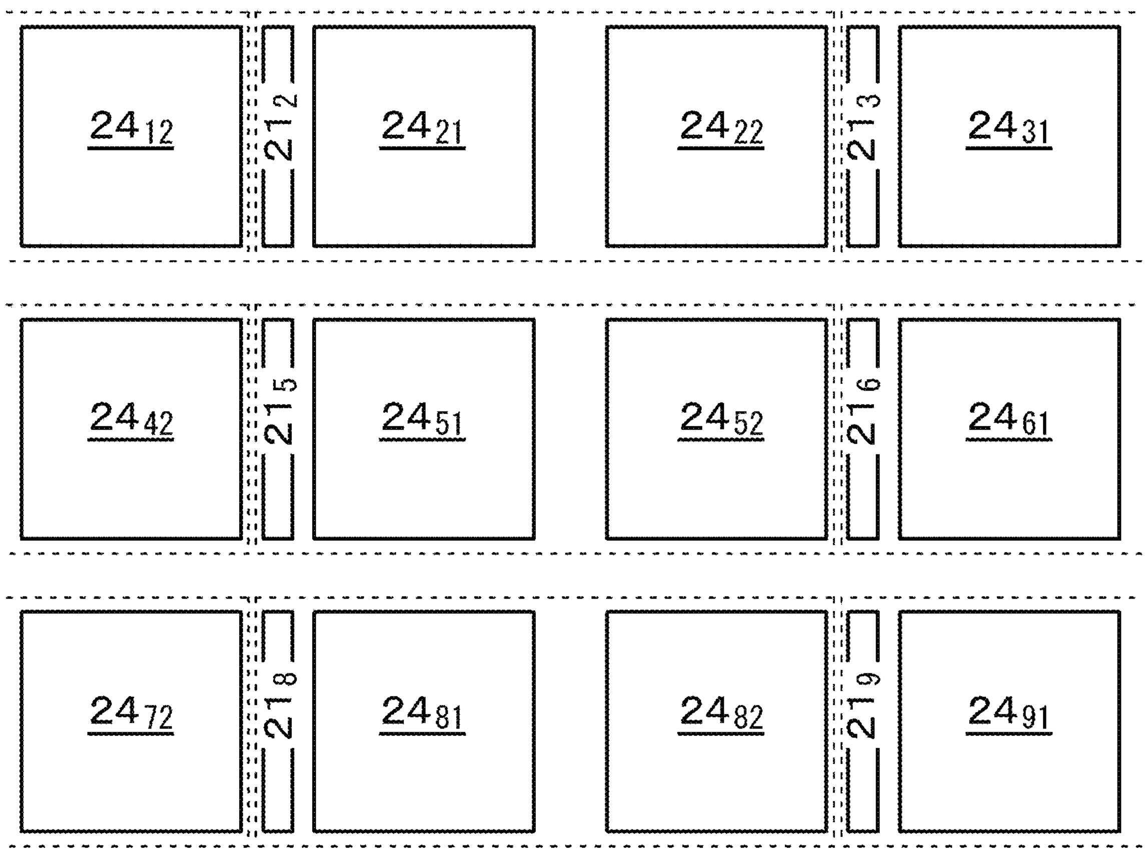
FIG. 51 is a schematic plan view of first electrodes and charge storage electrode segments in a second modification of a solid-state imaging apparatus of Example 13.
Figure 52:
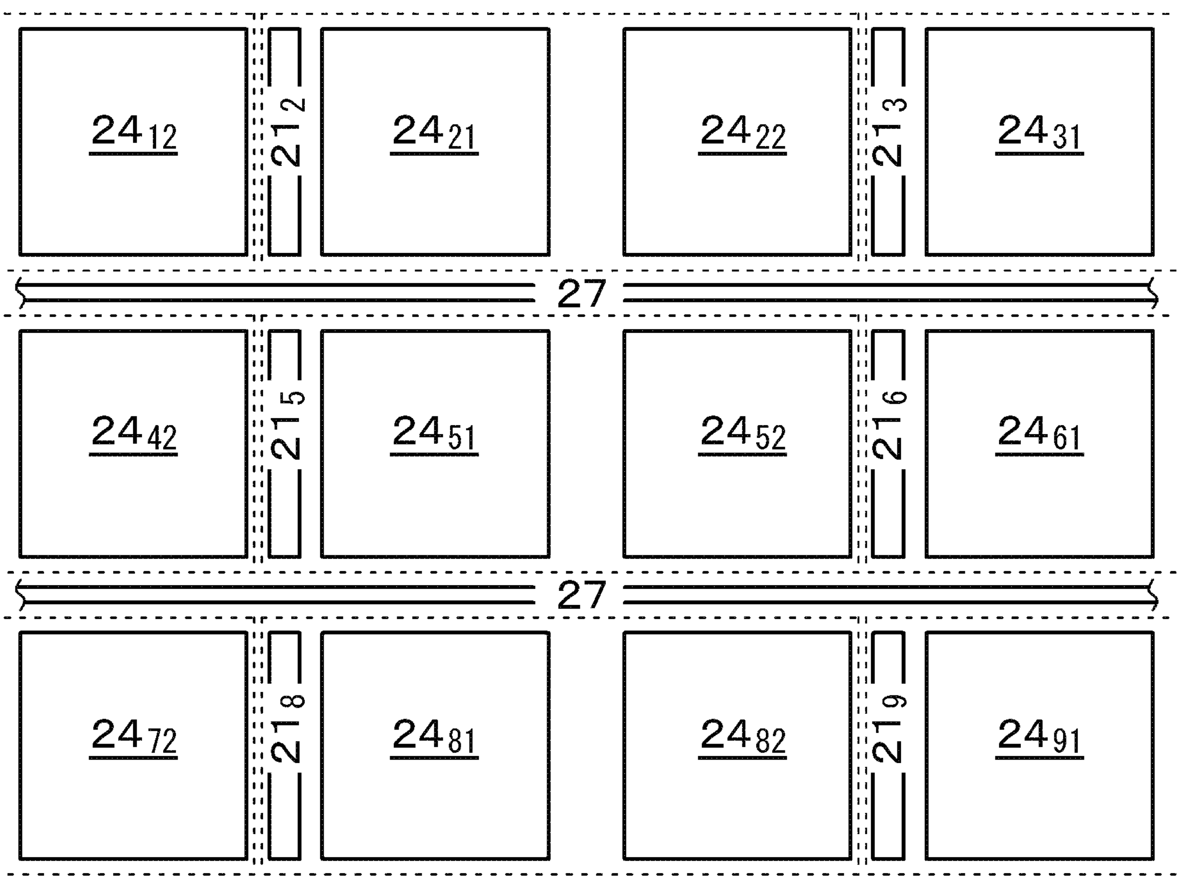
FIG. 52 is a schematic plan view of first electrodes and charge storage electrode segments in a third modification of a solid-state imaging apparatus of Example 13.
Figure 53:
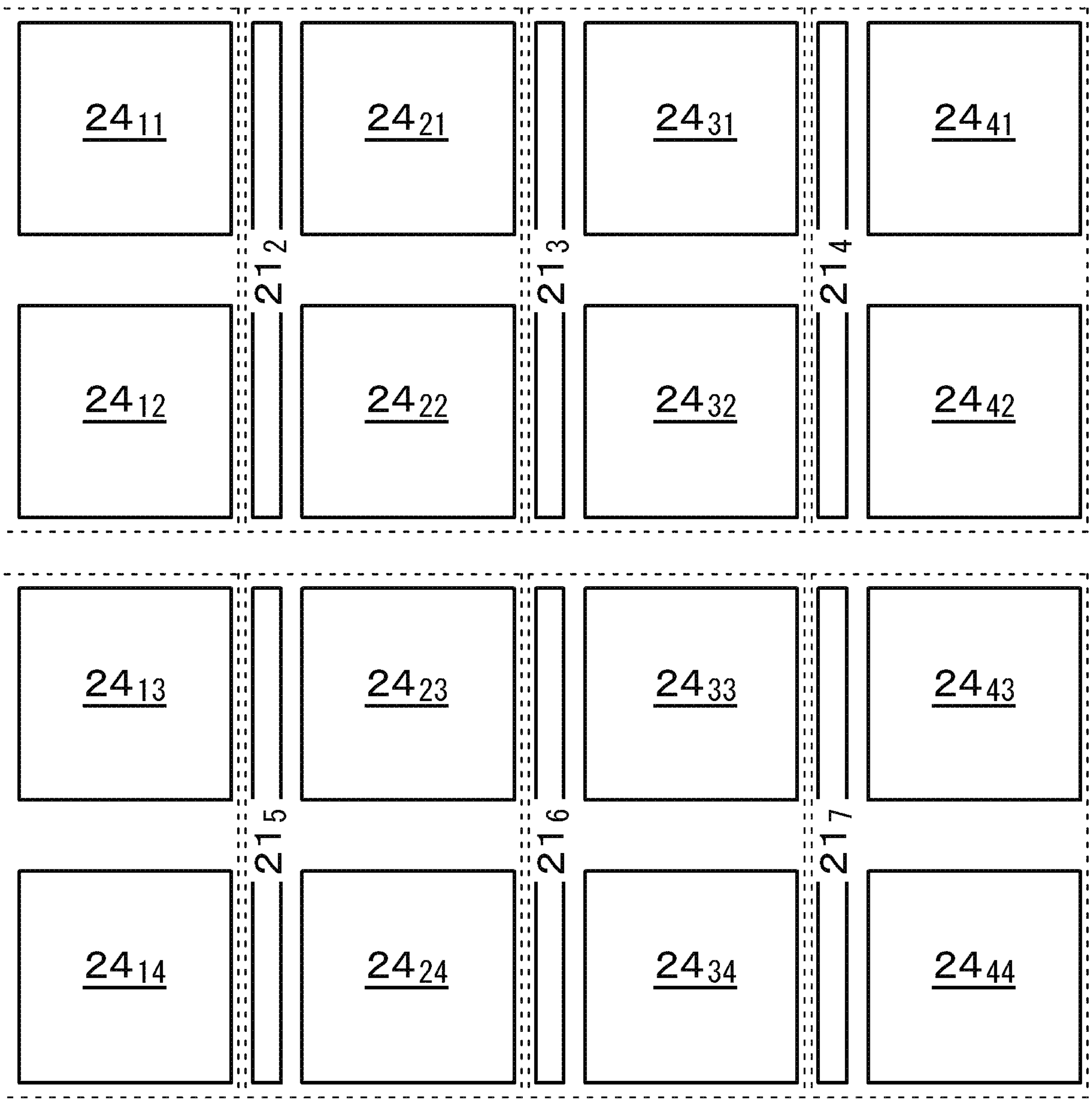
FIG. 53 is a schematic plan view of first electrodes and charge storage electrode segments in a fourth modification of a solid-state imaging apparatus of Example 13.
Figure 54:
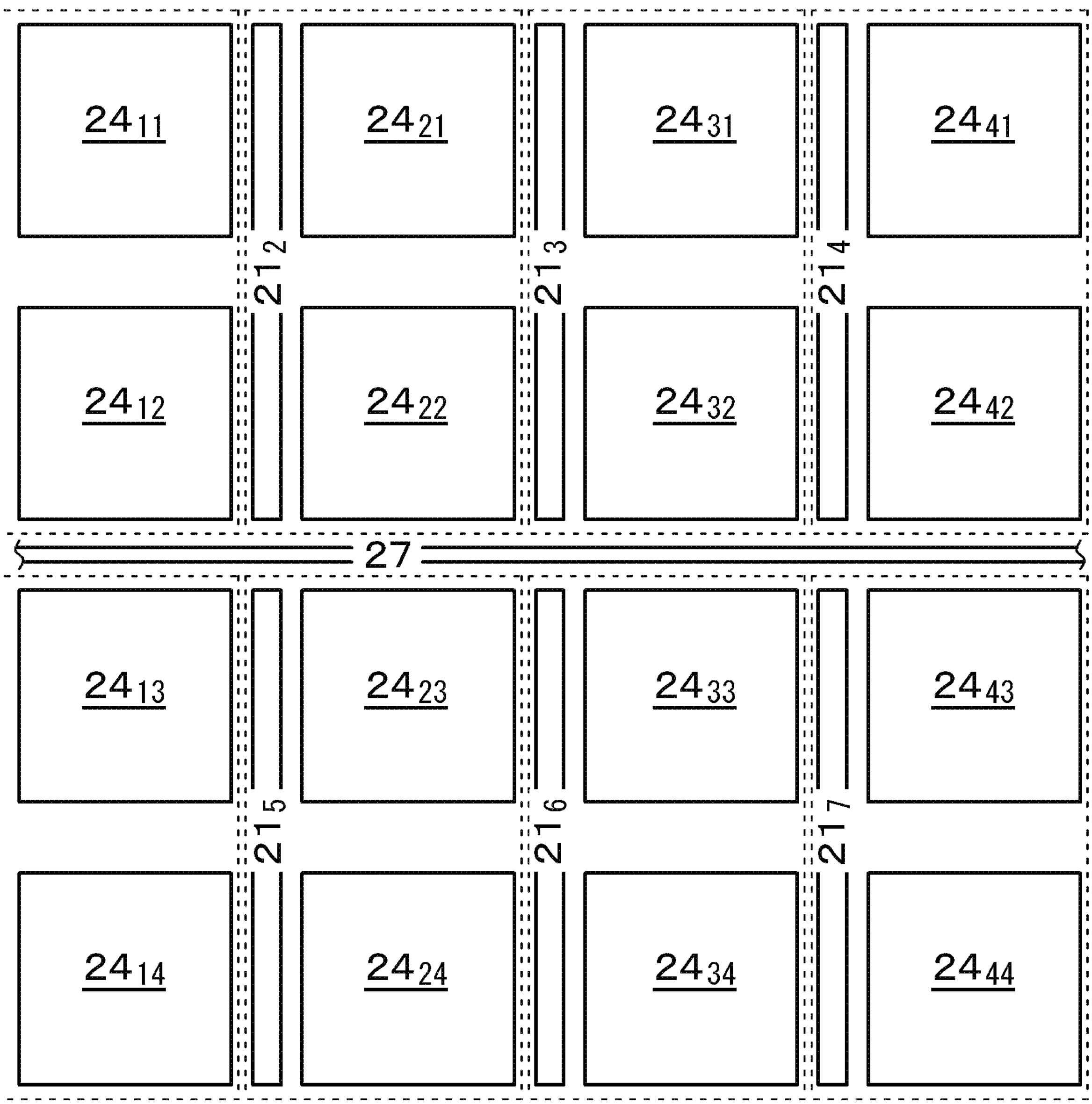
FIG. 54 is a schematic plan view of first electrodes and charge storage electrode segments in a fifth modification of a solid-state imaging apparatus of Example 13.

Layouts of first electrodes 21 and charge storage electrodes 24 in solid-state imaging apparatuses of Example 13 are schematically shown in FIG. 49 (Example 13), FIG. 50 (a first modification of Example 13), FIG. 51 (a second modification of Example 13), FIG. 52 (a third modification of Example 13), and FIG. 53 (a fourth modification of Example 13). FIGS. 49, 50, 53, and 54 show 16 imaging devices, and FIGS. 51 and 52 show 12 imaging devices. Further, each imaging device block is formed with two imaging devices. Each imaging device block is surrounded by a dotted line in the drawings. The suffixes attached to the first electrodes 21 and the charge storage electrodes 24 are for distinguishing the first electrodes 21 and the charge storage electrodes 24. The same applies to in the descriptions below. Meanwhile, one on-chip microlens (not shown in FIGS. 49 through 58) is disposed above each imaging device. Further, in each imaging device block, two charge storage electrodes 24 are disposed, with one first electrode 21 being interposed in between (see FIGS. 49 and 50). Alternatively, one first electrode 21 is disposed to face two charge storage electrodes 24 that are arranged in parallel (see FIGS. 53 and 54). In other words, one first electrode is disposed adjacent to the charge storage electrodes in each imaging device. Alternatively, the first electrode is disposed adjacent to the charge storage electrode of one of the plurality of imaging devices, and is not adjacent to the charge storage electrodes of the plurality of remaining imaging devices (see FIGS. 51 and 52). In such a case, electric charges are transferred from the plurality of remaining imaging devices to the first electrode via the one of the plurality of imaging devices. To ensure electric charge transfer from each imaging device to the first electrode, the distance A between a charge storage electrode of an imaging device and another charge storage electrode of the imaging device is preferably longer than the distance B between the first electrode and the charge storage electrodes in the imaging device adjacent to the first electrode. Further, the value of the distance A is preferably greater for an imaging device located farther away from the first electrode. Meanwhile, in the examples shown in FIGS. 50, 52, and 54, a charge transfer control electrode 27 is disposed between the plurality of imaging devices constituting the imaging device blocks. As the charge transfer control electrode 27 is provided, it is possible to reliably reduce electric charge transfer in the imaging device blocks located to interpose the charge transfer control electrode 27. Note that, where the potential to be applied to the charge transfer control electrode 27 is represented by $V_{17}$, it is only required to satisfy $V_{12}>V_{17}$.

The charge transfer control electrode 27 may be formed on the first electrode side at the same level as the first electrode 21 or the charge storage electrodes 24, or may be formed at a different level (specifically, at a level lower than the first electrode 21 or the charge storage electrodes 24). In the former case, the distance between the charge transfer control electrode 27 and the photoelectric conversion layer can be shortened, and accordingly, the potential can be easily controlled. In the latter case, on the other hand, the distance between the charge transfer control electrode 27 and the charge storage electrodes 24 can be shortened, which is advantageous for miniaturization.

The following is a description of operation of an imaging device block formed with a first electrode $\mathbf{21}_2$ and two two charge storage electrodes $\mathbf{24}_{21}$ and $\mathbf{24}_{22}$.

In a charge accumulation period, the drive circuit applies a potential $V_a$ to the first electrode $\mathbf{21}_2$, and a potential $V_A$ to the charge storage electrodes $\mathbf{24}_{21}$ and $\mathbf{24}_{22}$. Light that has entered the photoelectric conversion layer 23A causes photoelectric conversion in the photoelectric conversion layer 23A. Holes generated by the photoelectric conversion are sent from the second electrode 22 to the drive circuit via a wiring line $V_{OU}$. Meanwhile, since the potential of the first electrode $\mathbf{21}_2$ is higher than the potential of the second electrode 22, or a positive potential is applied to the first electrode $\mathbf{21}_2$ while a negative potential is applied to the second electrode 22, for example, $V_A \geq V_a$, or preferably, $V_A>V_a$. As a result, electrons generated by the photoelectric conversion are attracted to the charge storage electrodes $\mathbf{24}_{21}$ and $\mathbf{24}_{22}$, and stay in the region of the semiconductor material layer 23B and the like facing the charge storage electrodes $\mathbf{24}_{21}$ and $\mathbf{24}_{22}$. That is, electric charges are accumulated in the semiconductor material layer 23B and the like. Since $V_A \geq V_a$, electrons generated in the photoelectric conversion layer 23A will not move toward the first electrode $\mathbf{21}_2$. With the passage of time for photoelectric conversion, the potential in the region of the semiconductor material layer 23B and the like facing the charge storage electrodes $\mathbf{24}_{21}$ and $\mathbf{24}_{22}$ becomes a more negative value.

A reset operation is performed in the latter period in the charge accumulation period. As a result, the potential of the first floating diffusion layer is reset, and the potential of the first floating diffusion layer becomes the potential $V_{DD}$ of the power supply.

After completion of the reset operation, the electric charges are read out. In other words, in a charge transfer period, the drive circuit applies a potential $V_b$ to the first electrode $\mathbf{21}_2$, a potential $V_{21\text{-}B}$ to the charge storage electrode $\mathbf{24}_{21}$, and a potential $V_{22\text{-}B}$ to the charge storage electrode $\mathbf{24}_{22}$. Here, $V_{21\text{-}B}<V_b<V_{22\text{-}B}$. As a result, the electrons remaining in the region of the semiconductor material layer 23B and the like facing the charge storage electrode $\mathbf{24}_{21}$ are read into the first electrode $\mathbf{21}_2$ and further into the first floating diffusion layer. In other words, the electric charges stored in the region of the semiconductor material layer 23B and the like facing the charge storage electrode $\mathbf{24}_{21}$ are read into the control unit. After the reading is completed, $V_{22\text{-}B} \leq V_{21\text{-}B} < V_b$. Note that, in the examples shown in FIGS. 53 and 54, $V_{22\text{-}B} < V_b < V_{21}B$ may be satisfied. As a result, the electrons remaining in the region of the semiconductor material layer 23B and the like facing the charge storage electrode $\mathbf{24}_{22}$ are read into the first electrode $\mathbf{21}_2$ and further into the first floating diffusion layer. Further, in the examples shown in FIGS. 51 and 52, the electrons remaining in the region of the semiconductor material layer 23B and the like facing the charge storage electrode $\mathbf{24}_{22}$ may be read into the first floating diffusion layer via the first electrode 213 to which the charge storage electrode $\mathbf{24}_{22}$ is adjacent. In this manner, the electric charges stored in the region of the semiconductor material layer 23B and the like facing the charge storage electrode $\mathbf{24}_{22}$ are read into the control unit. Note that, after all the electric charges stored in the region of the semiconductor material layer 23B and the like facing the charge storage electrode $\mathbf{24}_{21}$ have been read into the control unit, the potential of the first floating diffusion layer may be reset.

Figure 59A:
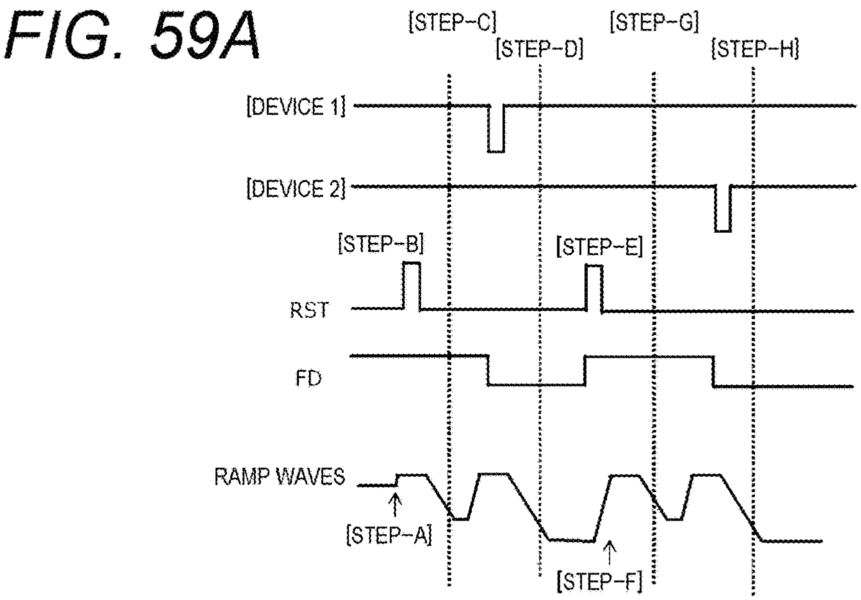
FIGS. 59A, 59B, and 59C are charts showing examples of readout driving in an imaging device block of Example 13.

FIG. 59A shows an example of readout driving in an imaging device block of Example 13.

[Step-A]

Autozero signal input to a comparator;

[Step-B]

a reset operation on a shared floating diffusion layer;

[Step-C]

P-phase readout and electric charge transfer to the first electrode $\mathbf{21}_2$ in the imaging device corresponding to the charge storage electrode $\mathbf{24}_{21}$;

[Step-D]

D-phase readout and electric charge transfer to the first electrode $\mathbf{21}_2$ in the imaging device corresponding to the charge storage electrode $\mathbf{24}_{21}$;

[Step-E]

a reset operation on a shared floating diffusion layer;

[Step-F]

autozero signal input to the comparator;

[Step-G]

P-phase readout and electric charge transfer to the first electrode $\mathbf{21}_2$ in the imaging device corresponding to the charge storage electrode $\mathbf{24}_{22}$; and

[Step-H]

D-phase readout and electric charge transfer to the first electrode $\mathbf{21}_2$ in the imaging device corresponding to the charge storage electrode $\mathbf{24}_{22}$.

In this flow, signals from the two imaging devices corresponding to the charge storage electrode $\mathbf{24}_{21}$ and the charge storage electrode $\mathbf{24}_{22}$ are read out. On the basis of a correlated double sampling (CDS) process, the difference between the P-phase readout in [Step-C] and the D-phase readout in [Step-D] is a signal from the imaging device corresponding to the charge storage electrode $\mathbf{24}_{21}$, and the difference between the P-phase readout in [Step-G] and the D-phase readout in [Step-H] is a signal from the imaging device corresponding to the charge storage electrode $\mathbf{24}_{22}$.

Figure 59B:
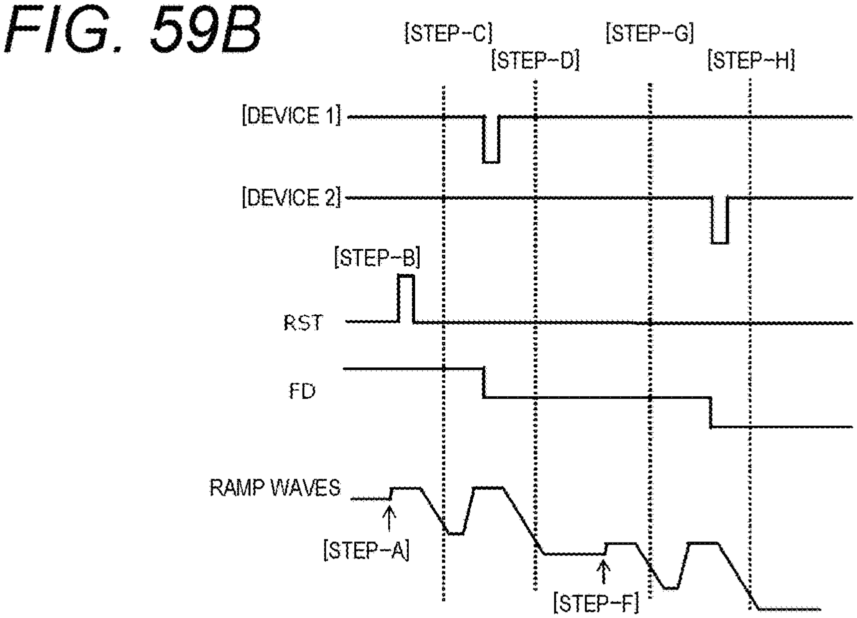
Figure 59C:
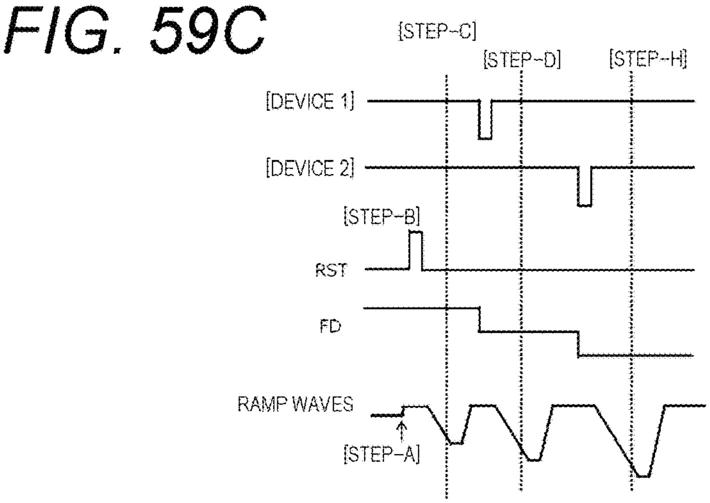
Figure 60:
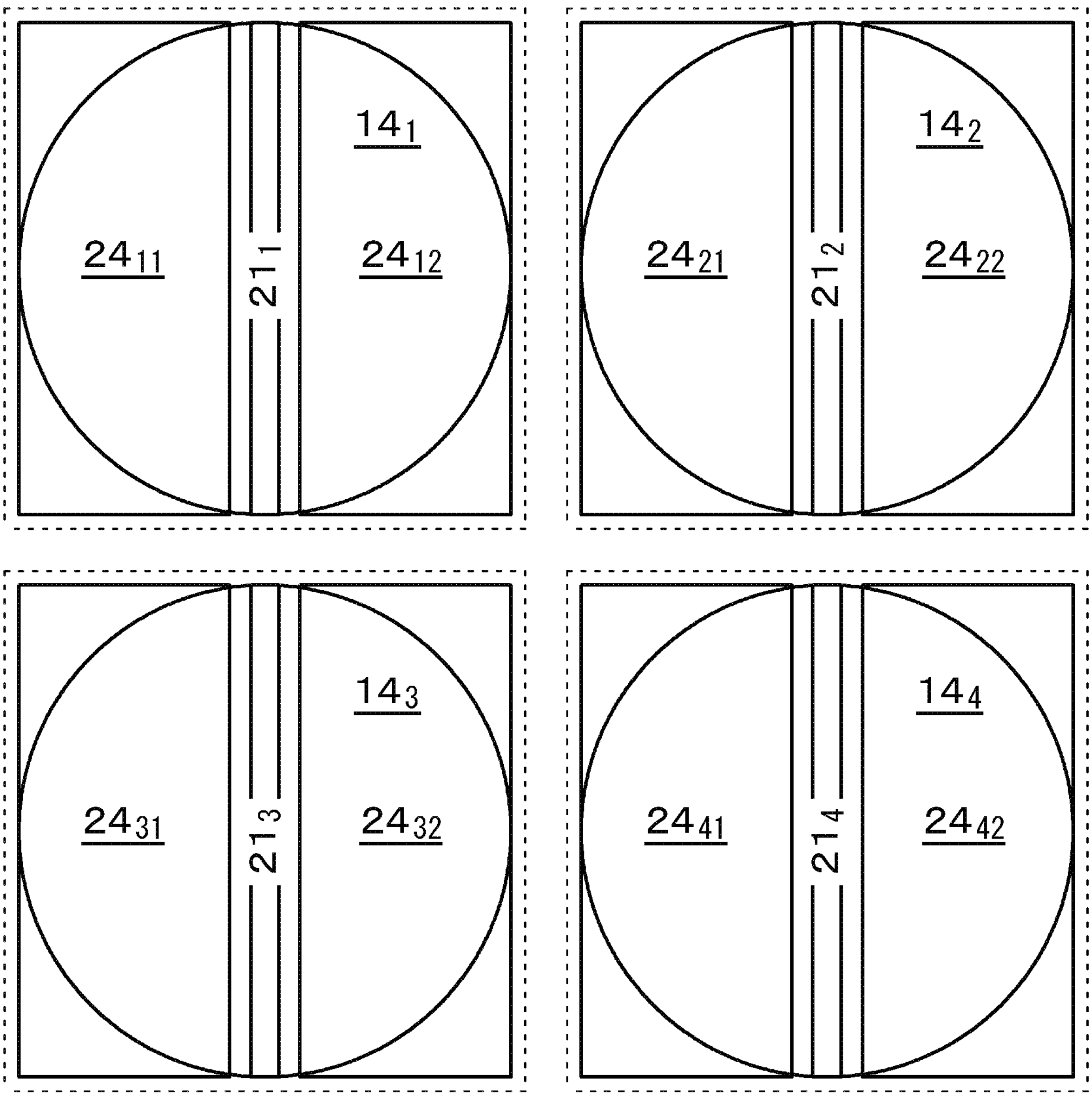
FIG. 60 is a schematic plan view of first electrodes and charge storage electrode segments in a solid-state imaging apparatus of Example 14.
Figure 61:
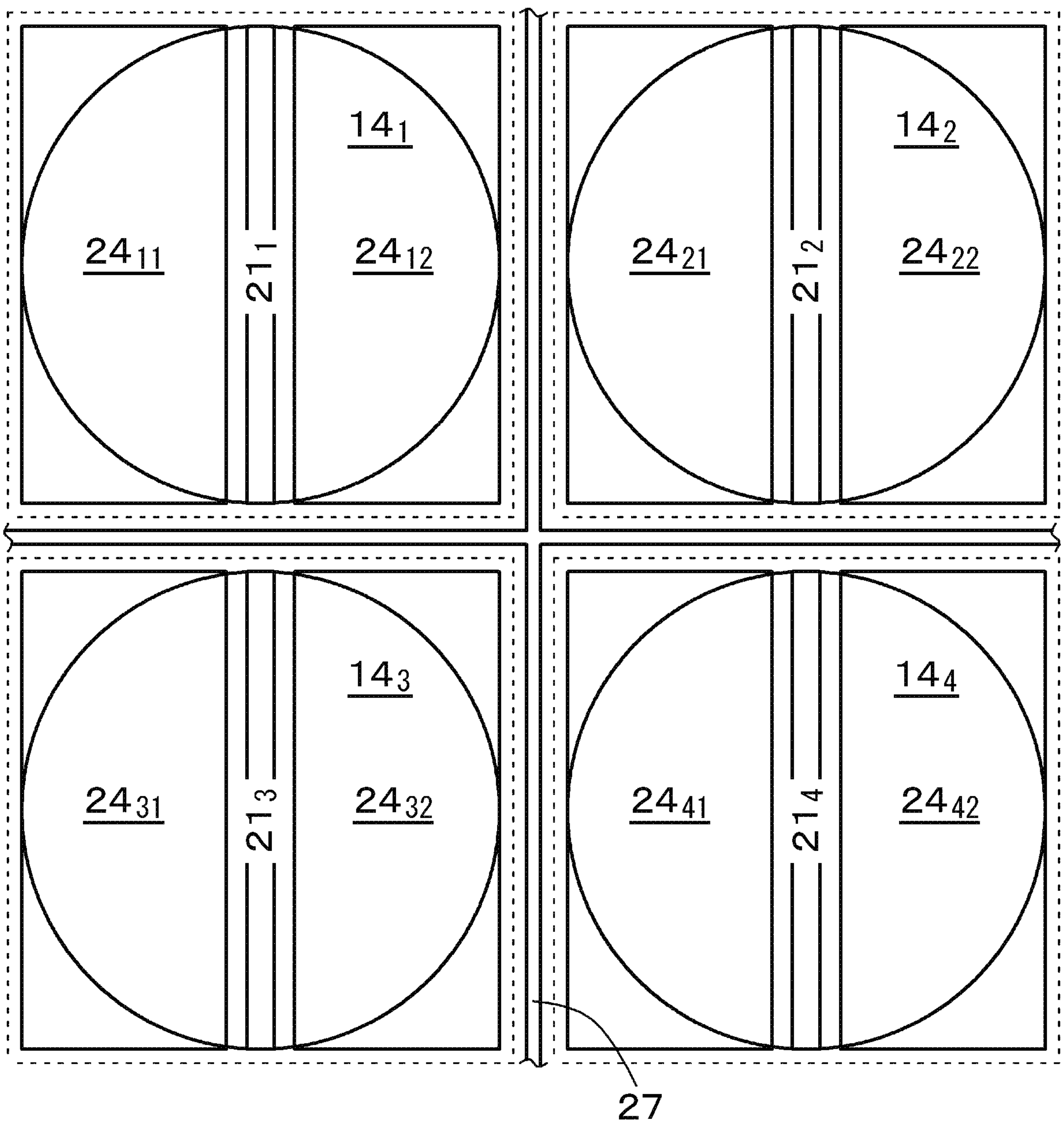
FIG. 61 is a schematic plan view of first electrodes and charge storage electrode segments in a modification of a solid-state imaging apparatus of Example 14.
Figure 62:
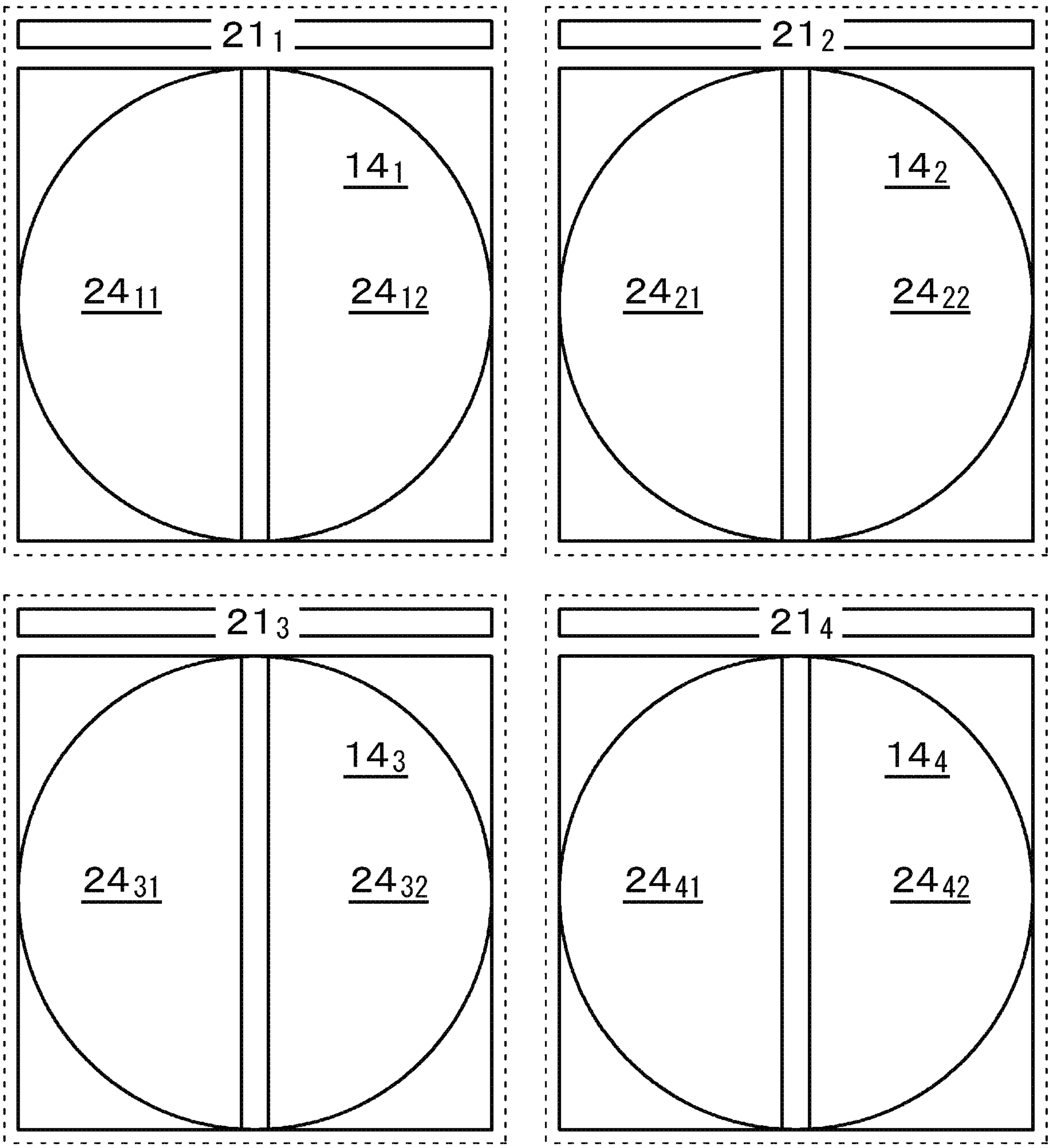
FIG. 62 is a schematic plan view of first electrodes and charge storage electrode segments in a modification of a solid-state imaging apparatus of Example 14.
Figure 63:
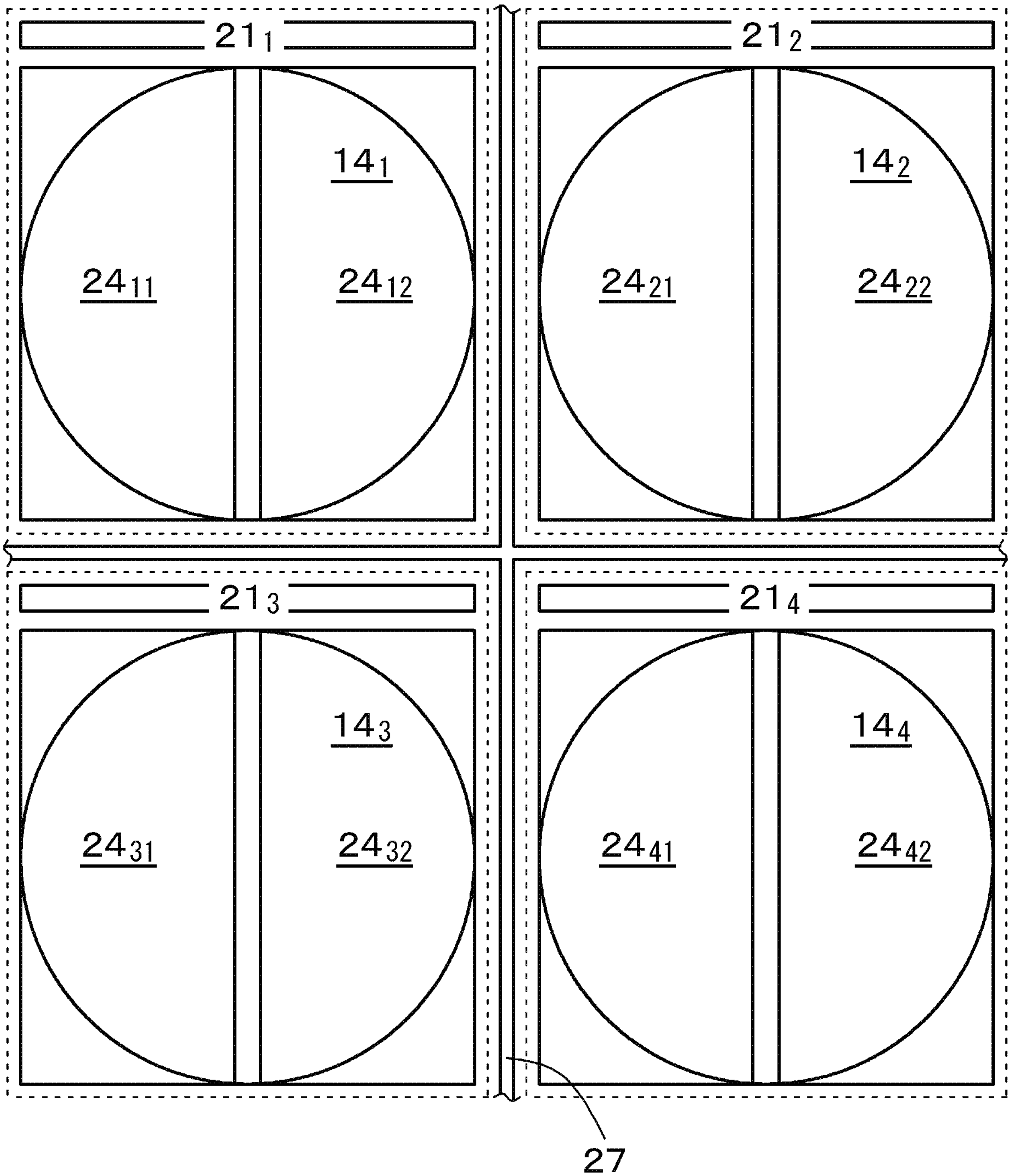
FIG. 63 is a schematic plan view of first electrodes and charge storage electrode segments in a modification of a solid-state imaging apparatus of Example 14.

Note that the operation in [Step-E] may be skipped (see FIG. 59B). Further, the operation in [Step-F] may also be omitted, and furthermore, in this case, [Step-G] may also be omitted (see FIG. 59C), and the difference between the P-phase readout in [Step-C] and the D-phase readout in [Step-D] is a signal from the imaging device corresponding to the charge storage electrode $\mathbf{24}_{21}$, and the difference between the D-phase readout in [Step-D] and the D-phase readout in [Step-H] is a signal from the imaging device corresponding to the charge storage electrode $\mathbf{24}_{22}$.

Figure 55:
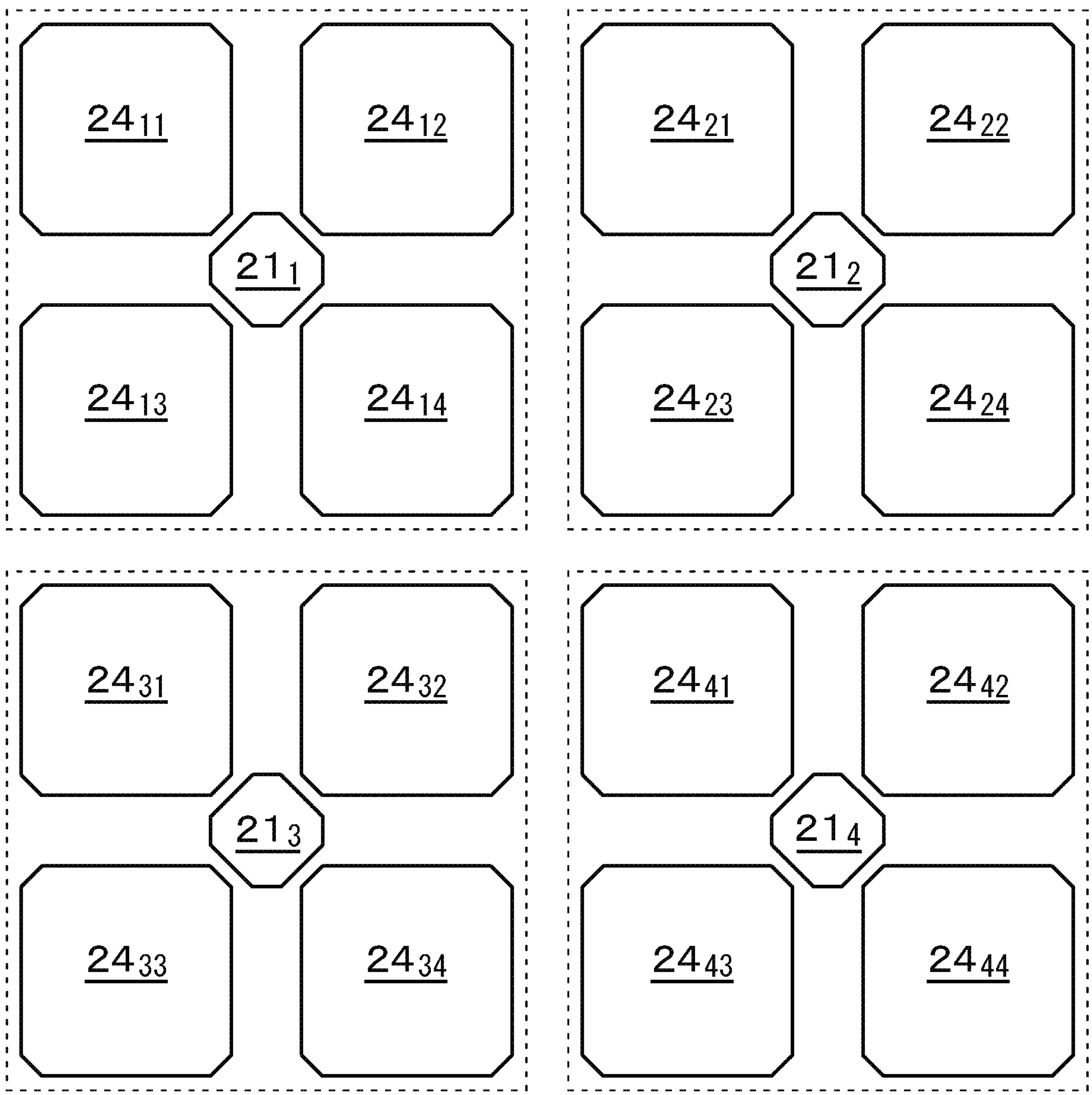
FIG. 55 is a schematic plan view of first electrodes and charge storage electrode segments in a sixth modification of a solid-state imaging apparatus of Example 13.
Figure 56:
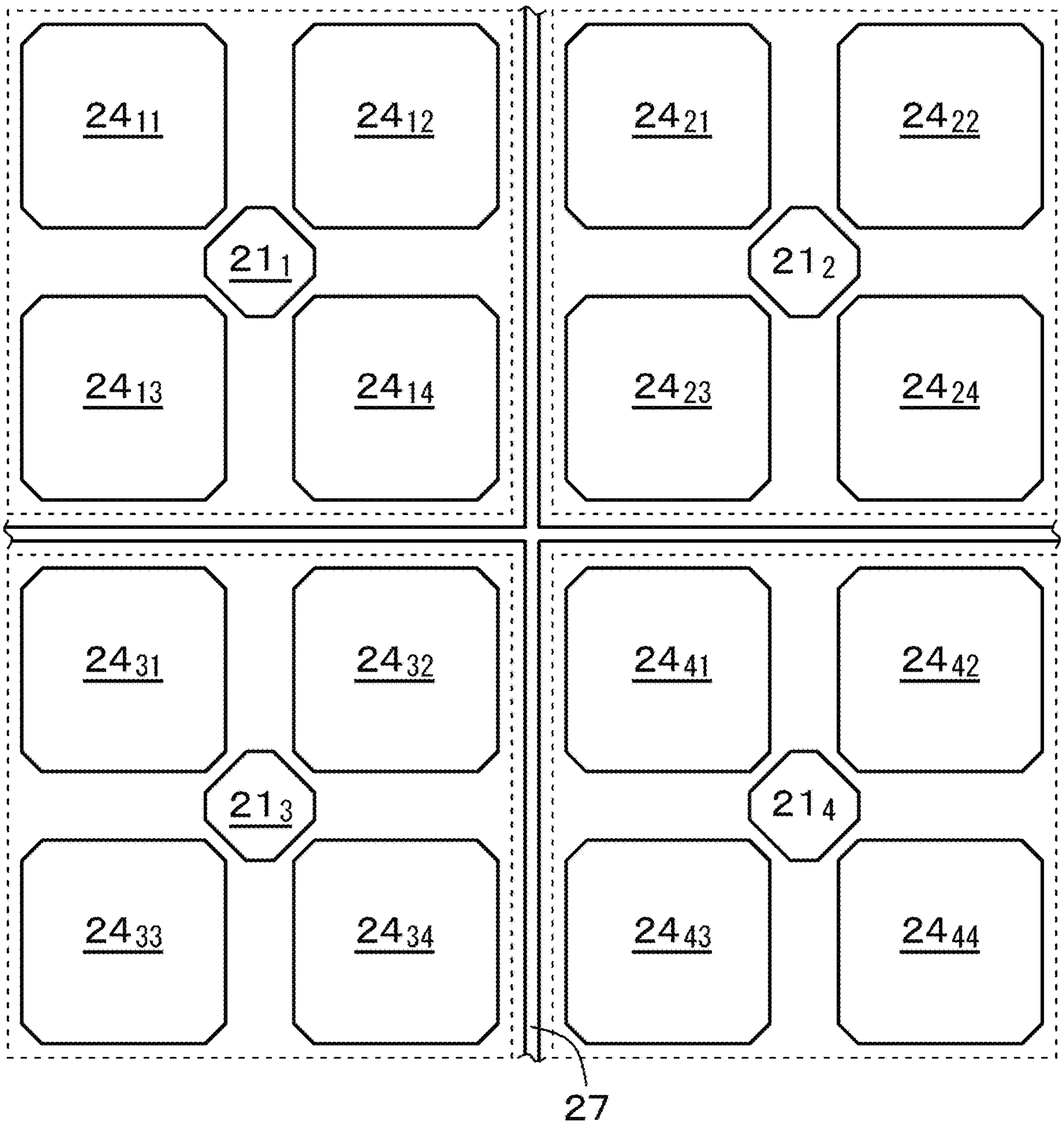
FIG. 56 is a schematic plan view of first electrodes and charge storage electrode segments in a seventh modification of a solid-state imaging apparatus of Example 13.

In modifications shown in FIG. 55 (a sixth modification of Example 13) and FIG. 56 (a seventh modification of Example 13) schematically showing layouts of first electrodes 21 and charge storage electrodes 24, an imaging device block is formed with four imaging devices. Operations of these solid-state imaging apparatuses may be substantially similar to operations of the solid-state imaging apparatuses shown in FIGS. 49 through 54.

Figure 57:
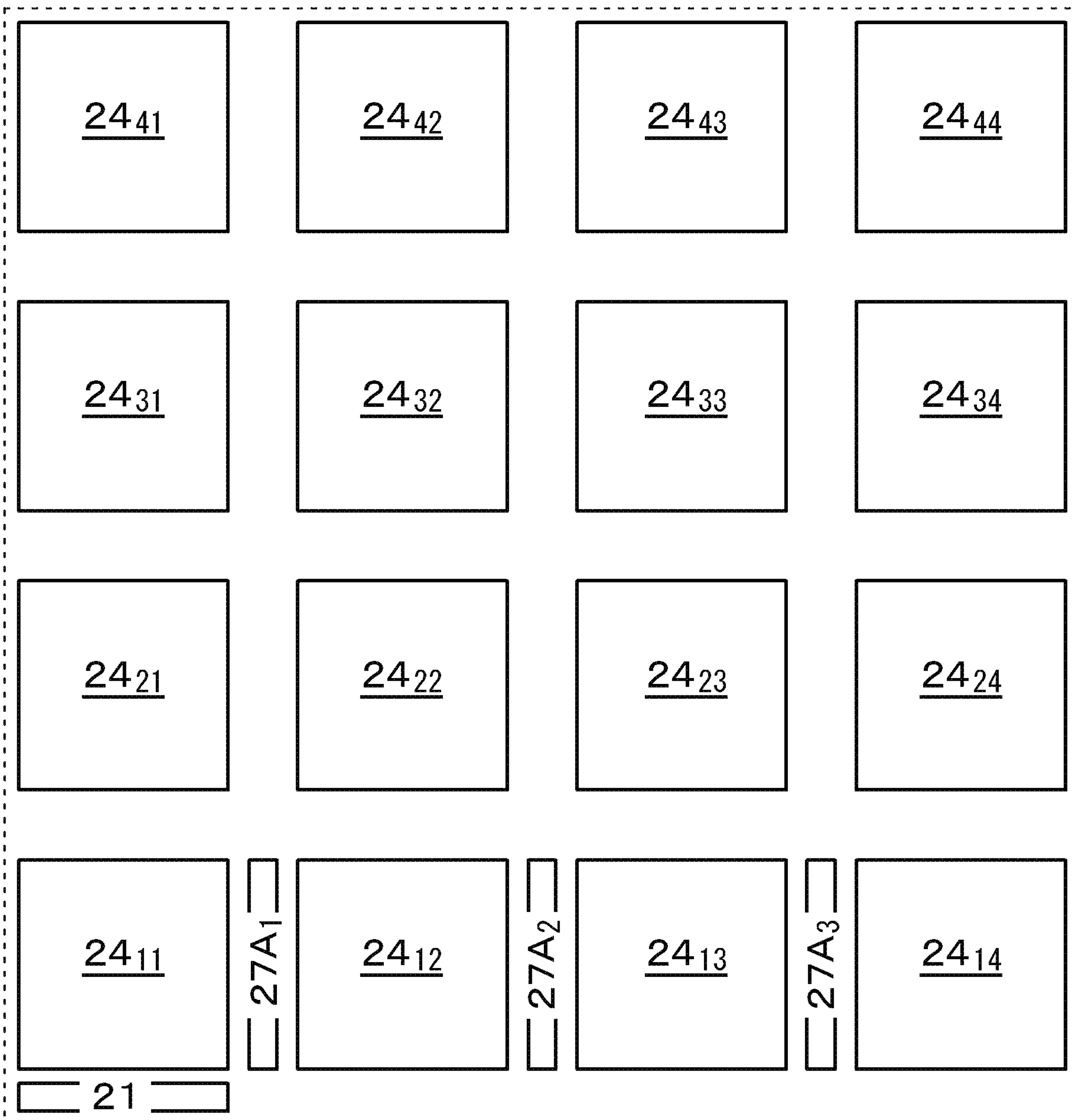
FIG. 57 is a schematic plan view of first electrodes and charge storage electrode segments in an eighth modification of a solid-state imaging apparatus of Example 13.
Figure 58:
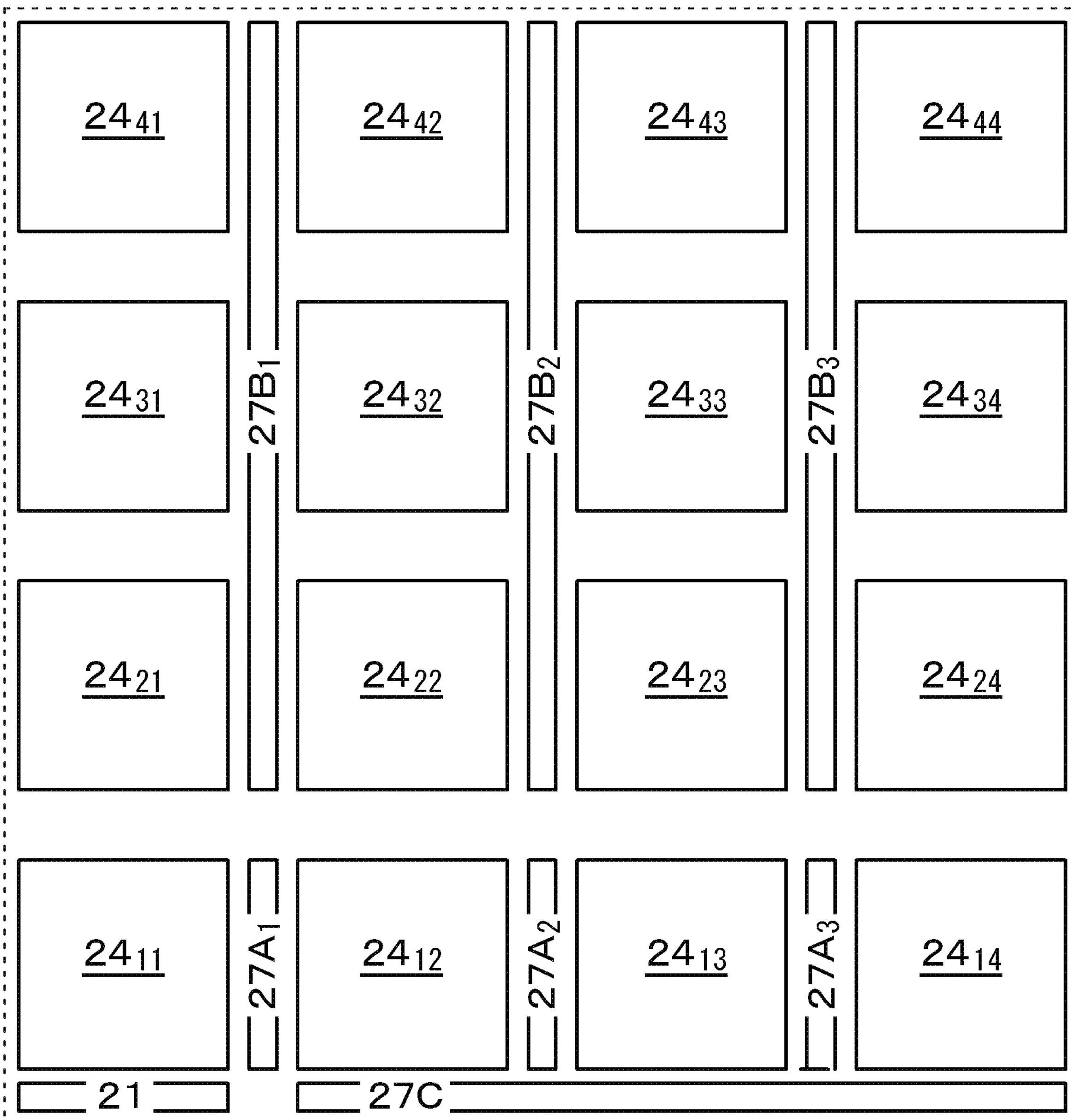
FIG. 58 is a schematic plan view of first electrodes and charge storage electrode segments in a ninth modification of a solid-state imaging apparatus of Example 13.

In an eighth modification shown in FIG. 57 and a ninth modification shown in FIG. 58 schematically showing layouts of a first electrode 21 and charge storage electrodes 24, an imaging device block is formed with 16 imaging devices. As shown in FIGS. 57 and 58, charge transfer control electrodes $\mathbf{27}A_1$, $\mathbf{27}A_2$, and $\mathbf{27}A_3$ are disposed between the charge storage electrode $\mathbf{24}_{11}$ and the charge storage electrode $\mathbf{24}_{12}$, between the charge storage electrode $\mathbf{24}_{12}$ and the charge storage electrode $\mathbf{24}_{13}$, and between the charge storage electrode $\mathbf{24}_{13}$ and the charge storage electrode $\mathbf{24}_{14}$. Alternatively, as shown in FIG. 58, charge transfer control electrodes $\mathbf{27}B_1$, $\mathbf{27}B_2$, and $\mathbf{27}B_3$ are disposed between charge storage electrodes $\mathbf{24}_{21}$, $\mathbf{24}_{31}$, and $\mathbf{24}_{41}$ and the charge storage electrodes $\mathbf{24}_{22}$, $\mathbf{24}_{32}$, and $\mathbf{24}_{42}$, between the charge storage electrodes $\mathbf{24}_{22}$, $\mathbf{24}_{32}$, and $\mathbf{24}_{42}$ and the charge storage electrodes $\mathbf{24}_{23}$, $\mathbf{24}_{33}$, and $\mathbf{24}_{43}$, and between the charge storage electrodes $\mathbf{24}_{23}$, $\mathbf{24}_{33}$, and $\mathbf{24}_{43}$ and the charge storage electrodes $\mathbf{24}_{24}$, $\mathbf{24}_{34}$, and $\mathbf{24}_{44}$. Further, a charge transfer control electrode 27C is disposed between an imaging device block and an imaging device block. Further, in these solid-state imaging apparatuses, the 16 charge storage electrodes 24 are controlled, so that the electric charges stored in the semiconductor material layer 23B can be read out from the first electrode 21.

[Step-10]

Specifically, the electric charges stored in the region of the semiconductor material layer 23B and the like facing the charge storage electrode $\mathbf{24}_{11}$ are first read out from the first electrode 21. The electric charges stored in the region of the semiconductor material layer 23B and the like facing the charge storage electrode $\mathbf{24}_{12}$ are then read from the first electrode 21 via the region of the semiconductor material layer 23B and the like facing the charge storage electrode $\mathbf{24}_{11}$. The electric charges stored in the region of the semiconductor material layer 23B and the like facing the charge storage electrode $\mathbf{24}_{13}$ are then read from the first electrode 21 via the regions of the semiconductor material layer 23B and the like facing the charge storage electrode $\mathbf{24}_{12}$ and the charge storage electrode $\mathbf{24}_{11}$.

[Step-20]

After that, the electric charges stored in the region of the semiconductor material layer 23B and the like facing the charge storage electrode $\mathbf{24}_{21}$ are moved to the region of the semiconductor material layer 23B and the like facing the charge storage electrode $\mathbf{24}_{11}$. The electric charges stored in the region of the semiconductor material layer 23B and the like facing the charge storage electrode $\mathbf{24}_{22}$ are moved to the region of the semiconductor material layer 23B and the like facing the charge storage electrode $\mathbf{24}_{12}$. The electric charges stored in the region of the semiconductor material layer 23B and the like facing the charge storage electrode $\mathbf{24}_{23}$ are moved to the region of the semiconductor material layer 23B and the like facing the charge storage electrode $\mathbf{24}_{13}$. The electric charges stored in the region of the semiconductor material layer 23B and the like facing the charge storage electrode $\mathbf{24}_{24}$ are moved to the region of the semiconductor material layer 23B and the like facing the charge storage electrode $\mathbf{24}_{14}$.

[Step-21]

The electric charges stored in the region of the semiconductor material layer 23B and the like facing the charge storage electrode $\mathbf{24}_{31}$ are moved to the region of the semiconductor material layer 23B and the like facing the charge storage electrode $\mathbf{24}_{21}$. The electric charges stored in the region of the semiconductor material layer 23B and the like facing the charge storage electrode $\mathbf{24}_{32}$ are moved to the region of the semiconductor material layer 23B and the like facing the charge storage electrode $\mathbf{24}_{22}$. The electric charges stored in the region of the semiconductor material layer 23B and the like facing the charge storage electrode $\mathbf{24}_{33}$ are moved to the region of the semiconductor material layer 23B and the like facing the charge storage electrode $\mathbf{24}_{23}$. The electric charges stored in the region of the semiconductor material layer 23B and the like facing the charge storage electrode $\mathbf{24}_{34}$ are moved to the region of the semiconductor material layer 23B and the like facing the charge storage electrode $\mathbf{24}_{24}$.

[Step-22]

The electric charges stored in the region of the semiconductor material layer 23B and the like facing the charge storage electrode $\mathbf{24}_{41}$ are moved to the region of the semiconductor material layer 23B and the like facing the charge storage electrode $\mathbf{24}_{31}$. The electric charges stored in the region of the semiconductor material layer 23B and the like facing the charge storage electrode $\mathbf{24}_{42}$ are moved to the region of the semiconductor material layer 23B and the like facing the charge storage electrode $\mathbf{24}_{32}$. The electric charges stored in the region of the semiconductor material layer 23B and the like facing the charge storage electrode $\mathbf{24}_{43}$ are moved to the region of the semiconductor material layer 23B and the like facing the charge storage electrode $\mathbf{24}_{33}$. The electric charges stored in the region of the semiconductor material layer 23B and the like facing the charge storage electrode $\mathbf{24}_{44}$ are moved to the region of the semiconductor material layer 23B and the like facing the charge storage electrode $\mathbf{24}_{34}$.

[Step-30]

[Step-10] is then carried out again, so that the electric charges stored in the region of the semiconductor material layer 23B and the like facing the charge storage electrode $\mathbf{24}_{21}$, the electric charges stored in the region of the semiconductor material layer 23B and the like facing the charge storage electrode $\mathbf{24}_{22}$, the electric charges stored in the region of the semiconductor material layer 23B and the like facing the charge storage electrode $\mathbf{24}_{23}$, and the electric charges stored in the region of the semiconductor material layer 23B and the like facing the charge storage electrode $\mathbf{24}_{24}$ can be read out via the first electrode 21.

[Step-40]

After that, the electric charges stored in the region of the semiconductor material layer 23B and the like facing the charge storage electrode $\mathbf{24}_{21}$ are moved to the region of the semiconductor material layer 23B and the like facing the charge storage electrode $\mathbf{24}_{11}$. The electric charges stored in the region of the semiconductor material layer 23B and the like facing the charge storage electrode $\mathbf{24}_{22}$ are moved to the region of the semiconductor material layer 23B and the like facing the charge storage electrode $\mathbf{24}_{12}$. The electric charges stored in the region of the semiconductor material layer 23B and the like facing the charge storage electrode $\mathbf{24}_{23}$ are moved to the region of the semiconductor material layer 23B and the like facing the charge storage electrode $\mathbf{24}_{13}$. The electric charges stored in the region of the semiconductor material layer 23B and the like facing the charge storage electrode $\mathbf{24}_{24}$ are moved to the region of the semiconductor material layer 23B and the like facing the charge storage electrode $\mathbf{24}_{14}$.

[Step-41]

The electric charges stored in the region of the semiconductor material layer 23B and the like facing the charge storage electrode $\mathbf{24}_{31}$ are moved to the region of the semiconductor material layer 23B and the like facing the charge storage electrode $\mathbf{24}_{21}$. The electric charges stored in the region of the semiconductor material layer 23B and the like facing the charge storage electrode $\mathbf{24}_{32}$ are moved to the region of the semiconductor material layer 23B and the like facing the charge storage electrode $\mathbf{24}_{22}$. The electric charges stored in the region of the semiconductor material layer 23B and the like facing the charge storage electrode $\mathbf{24}_{33}$ are moved to the region of the semiconductor material layer 23B and the like facing the charge storage electrode $\mathbf{24}_{23}$. The electric charges stored in the region of the semiconductor material layer 23B and the like facing the charge storage electrode $\mathbf{24}_{34}$ are moved to the region of the semiconductor material layer 23B and the like facing the charge storage electrode $\mathbf{24}_{24}$.

[Step-50]

[Step-10] is then carried out again, so that the electric charges stored in the region of the semiconductor material layer 23B and the like facing the charge storage electrode $\mathbf{24}_{31}$, the electric charges stored in the region of the semiconductor material layer 23B and the like facing the charge storage electrode $\mathbf{24}_{32}$, the electric charges stored in the region of the semiconductor material layer 23B and the like facing the charge storage electrode $\mathbf{24}_{33}$, and the electric charges stored in the region of the semiconductor material layer 23B and the like facing the charge storage electrode $\mathbf{24}_{34}$ can be read out via the first electrode 21.

[Step-60]

After that, the electric charges stored in the region of the semiconductor material layer 23B and the like facing the charge storage electrode $\mathbf{24}_{21}$ are moved to the region of the semiconductor material layer 23B and the like facing the charge storage electrode $\mathbf{24}_{11}$. The electric charges stored in the region of the semiconductor material layer 23B and the like facing the charge storage electrode $\mathbf{24}_{22}$ are moved to the region of the semiconductor material layer 23B and the like facing the charge storage electrode $\mathbf{24}_{12}$. The electric charges stored in the region of the semiconductor material layer 23B and the like facing the charge storage electrode $\mathbf{24}_{23}$ are moved to the region of the semiconductor material layer 23B and the like facing the charge storage electrode $\mathbf{24}_{13}$. The electric charges stored in the region of the semiconductor material layer 23B and the like facing the charge storage electrode $\mathbf{24}_{24}$ are moved to the region of the semiconductor material layer 23B and the like facing the charge storage electrode $\mathbf{24}_{14}$.

[Step-70]

[Step-10] is then carried out again, so that the electric charges stored in the region of the semiconductor material layer 23B and the like facing the charge storage electrode $\mathbf{24}_{41}$, the electric charges stored in the region of the semiconductor material layer 23B and the like facing the charge storage electrode $\mathbf{24}_{42}$, the electric charges stored in the region of the semiconductor material layer 23B and the like facing the charge storage electrode $\mathbf{24}_{43}$, and the electric charges stored in the region of the semiconductor material layer 23B and the like facing the charge storage electrode $\mathbf{24}_{44}$ can be read out via the first electrode 21.

In a solid-state imaging apparatus of Example 13, a plurality of imaging devices that constitutes an imaging device block shares a first electrode, and accordingly, the configuration and the structure in the pixel region in which the plurality of imaging devices is arranged can be simplified and miniaturized. Note that the plurality of imaging devices provided for one floating diffusion layer may be formed with a plurality of imaging devices of the first type, or may be formed with at least one imaging device of the first type and one or more imaging devices of the second type.

Example 14

Example 14 is a modification of Example 13. In solid-state imaging apparatuses of Example 14 shown in FIGS. 60, 61, 62, and 63 schematically showing the layouts of first electrodes 21 and charge storage electrodes 24, an imaging device block is formed with two imaging devices. One on-chip microlens 14 is then disposed above each imaging device block. Note that, in the examples shown in FIGS. 61 and 63, a charge transfer control electrode 27 is disposed between a plurality of imaging devices constituting the imaging device blocks.

For example, the photoelectric conversion layers corresponding to the charge storage electrodes $\mathbf{24}_{11}$, $\mathbf{24}_{21}$, $\mathbf{24}_{31}$, and $\mathbf{24}_{41}$ forming imaging device blocks have high sensitivity to incident light from the upper right in each drawing. Further, the photoelectric conversion layers corresponding to the charge storage electrodes $\mathbf{24}_{12}$, $\mathbf{24}_{22}$, $\mathbf{24}_{32}$, and $\mathbf{24}_{42}$ forming the imaging device blocks have high sensitivity to incident light from the upper left in each drawing. Accordingly, the imaging device including the charge storage electrode $\mathbf{24}_{11}$ and the imaging device including the charge storage electrode $\mathbf{24}_{12}$ are combined, for example, to enable acquisition of an image plane phase difference signal. Further, a signal from the imaging device including the charge storage electrode $\mathbf{24}_{11}$ and a signal from the imaging device including the charge storage electrode $\mathbf{24}_{12}$ are added to each other, so that one imaging device can be formed with the combination of these imaging devices. In the example shown in FIG. 60, the first electrode $\mathbf{21}_1$ is disposed between the charge storage electrode $\mathbf{24}_{11}$ and the charge storage electrode $\mathbf{24}_{12}$. However, as in the example shown in FIG. 62, the single first electrode $\mathbf{21}_1$ may be disposed to face the two charge storage electrodes $\mathbf{24}_{11}$ and $\mathbf{24}_{12}$, to further increase sensitivity.

Although the present disclosure has been described so far on the basis of preferred examples, the present disclosure is not limited to those examples. The structures, the configurations, the manufacturing conditions, the manufacturing methods, and the materials used for the stacked imaging devices, the imaging devices, and the solid-state imaging apparatus described in Examples are merely examples, and may be modified as appropriate. The imaging devices of the respective Examples may be combined as appropriate. The configuration and the structure of an imaging device of the present disclosure can be applied to a light emitting device, such as an organic EL device, for example, or can be applied to the channel formation region of a thin-film transistor. For example, it is possible to combine an imaging device of Example 7, an imaging device of Example 8, an imaging device of Example 9, an imaging device of Example 10, and an imaging device of Example 11 in a desired manner. It is also possible to combine an imaging device of Example 7, an imaging device of Example 8, an imaging device of Example 9, an imaging device of Example 10, and an imaging device of Example 12 in a desired manner.

In some cases, floating diffusion layers $FD_1$, $FD_2$, $FD_3$, 51C, 45C, and 46C can be shared.

Figure 64:
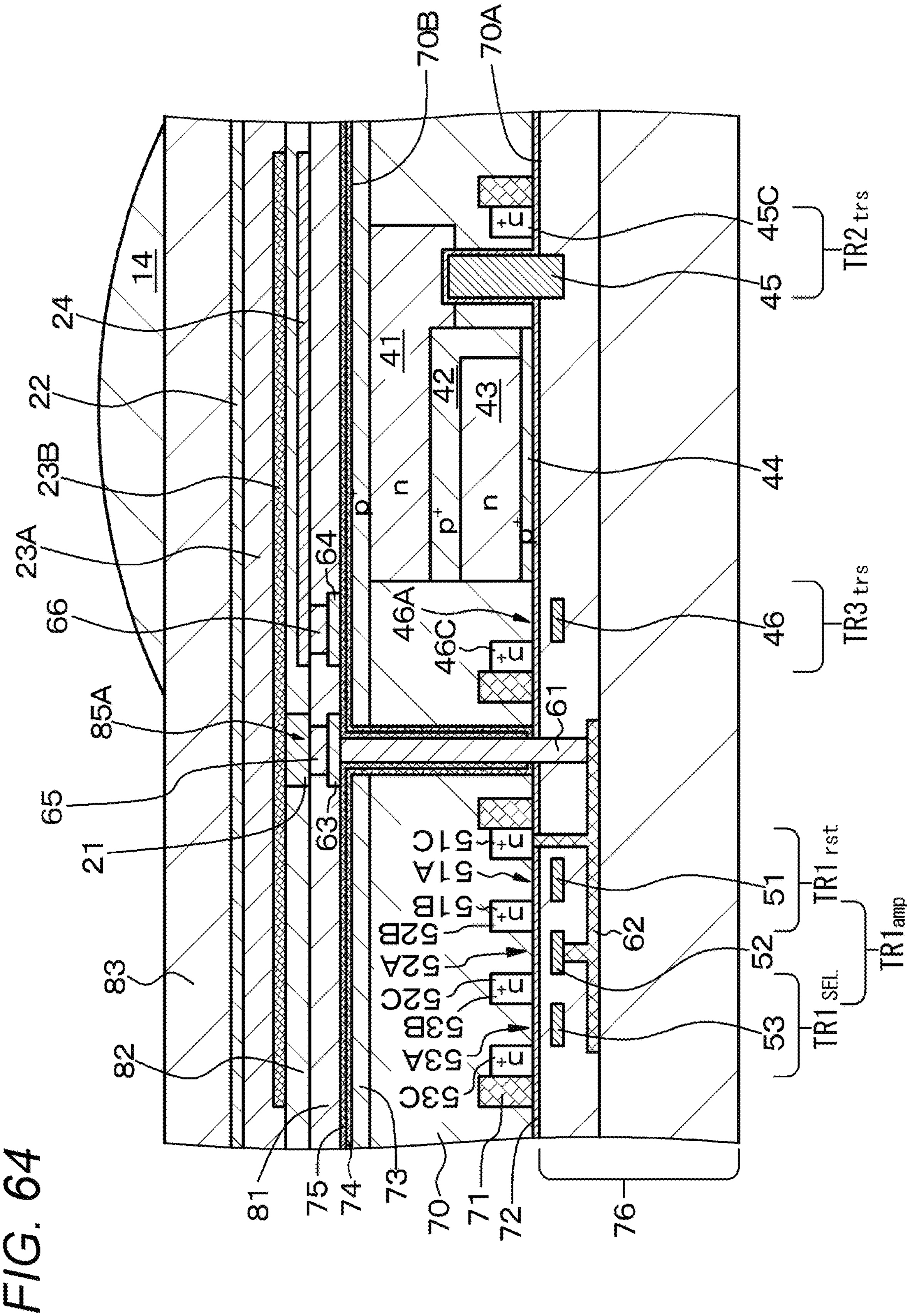
FIG. 64 is a schematic partial cross-sectional view of another modification of an imaging device of Example 1.

As shown in FIG. 64, which shows a modification of an imaging device described in Example 1, the first electrode 21 may extend in an opening 85A formed in the insulating layer 82, and be connected to the semiconductor material layer 23B, for example.

Figure 65:
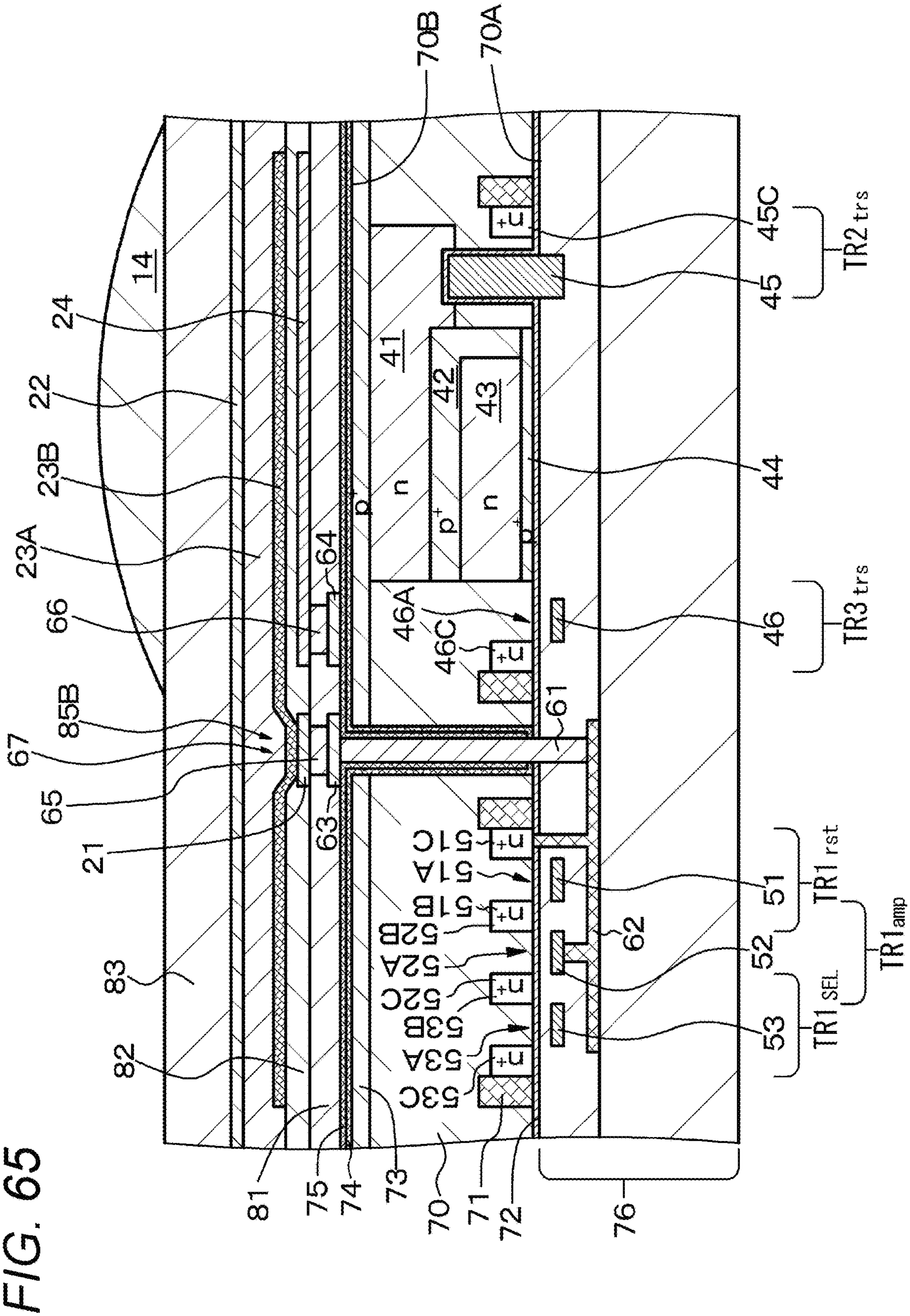
FIG. 65 is a schematic partial cross-sectional view of yet another modification of an imaging device of Example 1.
Figure 66A:
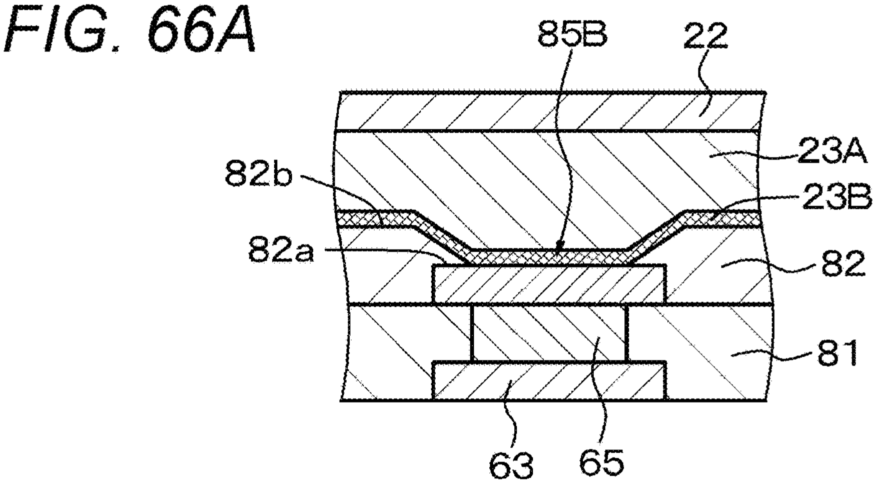
FIGS. 66A, 66B, and 66C are schematic partial cross-sectional views that are enlarged views of first electrode portions and the like in yet another modification of an imaging device of Example 1.
Figure 66B:
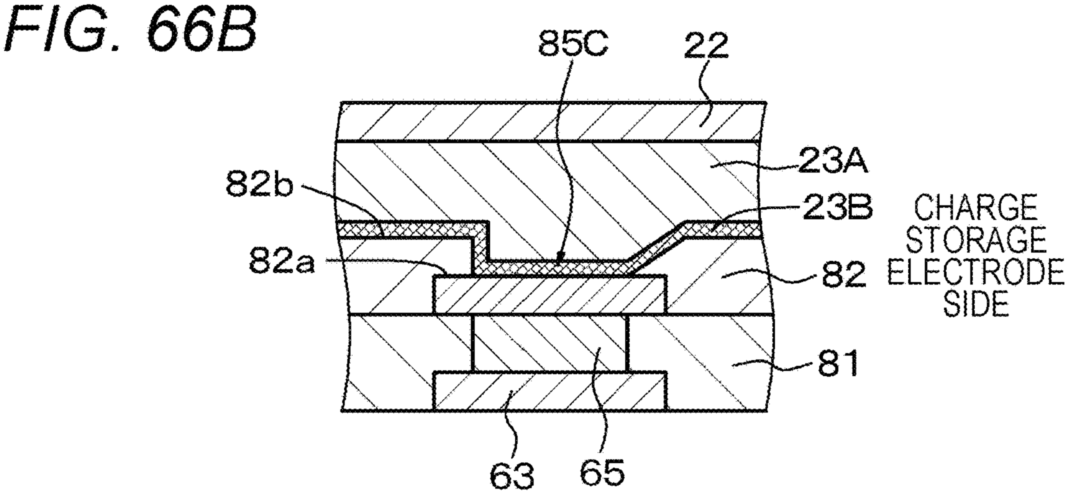
Figure 66C:
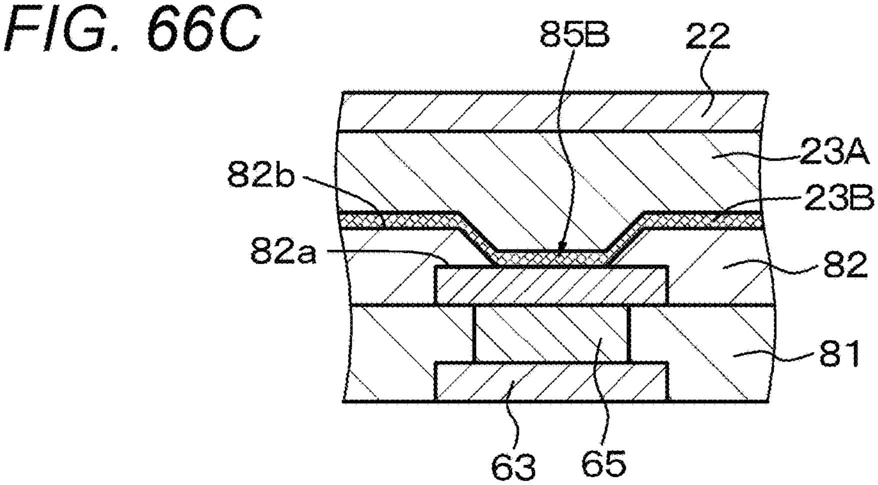

Alternatively, as shown in FIG. 65, which shows a modification of an imaging device described in Example 1, and in FIG. 66A showing a schematic partial cross-sectional view showing an enlarged view of the portion of the first electrode and the like, the edge portion of the top surface of the first electrode 21 is covered with the insulating layer 82, and the first electrode 21 is exposed through the bottom surface of an opening 85B. Where the surface of the insulating layer 82 in contact with the top surface of the first electrode 21 is a first surface 82*a*, and the surface of the insulating layer 82 in contact with the portion of the semiconductor material layer 23B facing the charge storage electrode 24 is a second surface 82*b*, the side surfaces of the opening 85B are slopes spreading from the first surface 82*a* toward the second surface 82*b*, for example. As the side surfaces of the opening 85B are sloped as above, electric charge transfer from the semiconductor material layer 23B to the first electrode 21 becomes smoother. Note that, in the example shown in FIG. 66A, the side surfaces of the opening 85B are rotationally symmetrical about the axis line of the opening 85B. However, as shown in FIG. 66B, an opening 85C may be designed so that a side surface of the opening 85C having a slope spreading from the first surface 82*a* toward the second surface 82*b* is located on the side of the charge storage electrode 24. This makes it difficult for electric charges to transfer from the portion of the semiconductor material layer 23B on the opposite side of the opening 85C from the charge storage electrode 24. While the side surface of the opening 85B has a slope which spreads from the first surface 82*a* to the second surface 82*b*, the edge portions of the side surfaces of the opening 85B in the second surface 82*b* may be located on the outer side of the edge portion of the first electrode 21 as shown in FIG. 66A, or may be located on the inner side of the edge portion of the first electrode 21 as shown in FIG. 66C. The former configuration is adopted to further facilitate electric charge transfer. The latter configuration is adopted to reduce the variation in the shape of the opening at the time of formation.

To form these openings 85B and 85C, an etching mask including the resist material formed when an opening is formed in an insulating layer by an etching method is reflowed, so that the side surface(s) of the opening of the etching mask is (are) sloped, and etching is performed on the insulating layer 82 with the etching mask.

Figure 67:
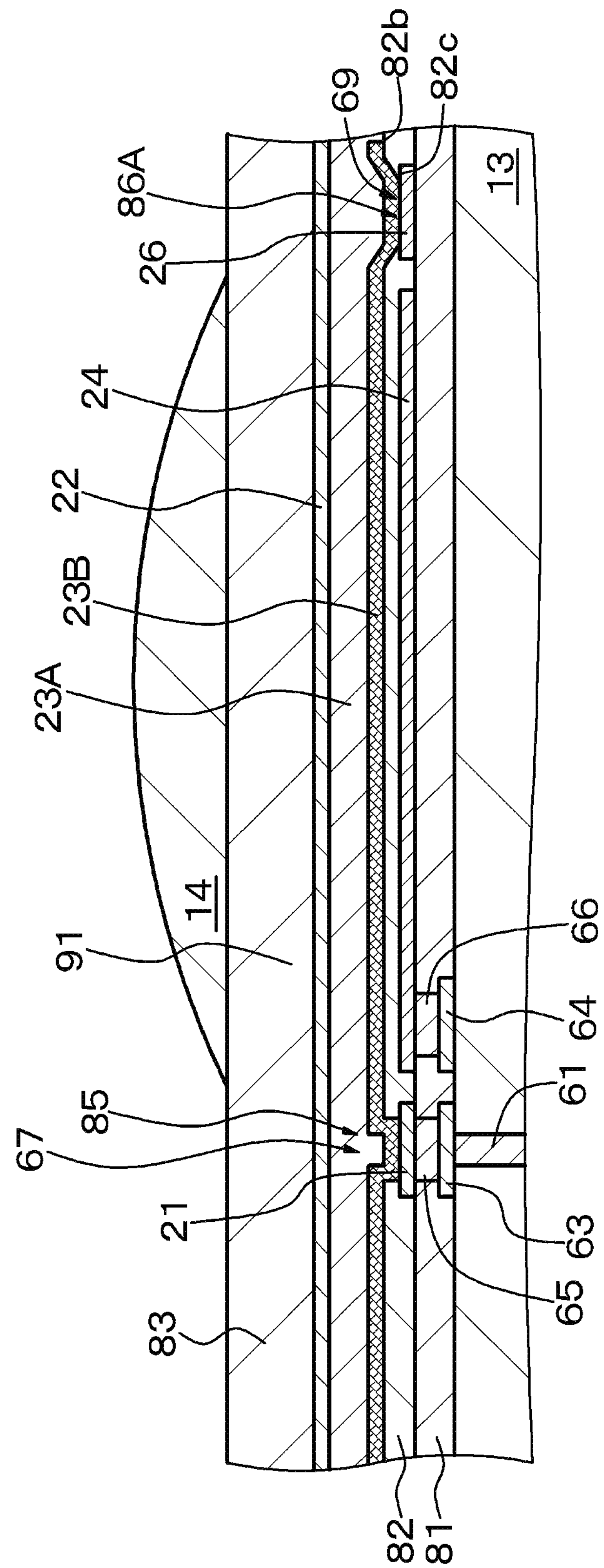
FIG. 67 is a schematic partial cross-sectional view that is an enlarged view of charge emission electrode portions and the like in another modification of an imaging device of Example 5.

Alternatively, regarding the charge emission electrode 26 described in Example 5, as shown in FIG. 67, the semiconductor material layer 23B may extend in a second opening 86A formed in the insulating layer 82 and be connected to the charge emission electrode 26, the edge portion of the top surface of the charge emission electrode 26 may be covered with the insulating layer 82, and the charge emission electrode 26 may be exposed through the bottom surface of the second opening 86A. Where the surface of the insulating layer 82 in contact with the top surface of the charge emission electrode 26 is a third surface 82*c*, and the surface of the insulating layer 82 in contact with the portion of the semiconductor material layer 23B facing the charge storage electrode 24 is the second surface 82*b*, the side surfaces of the second opening 86A may be slopes spreading from the third surface 82*c* to the second surface 82*b*.

Figure 68:
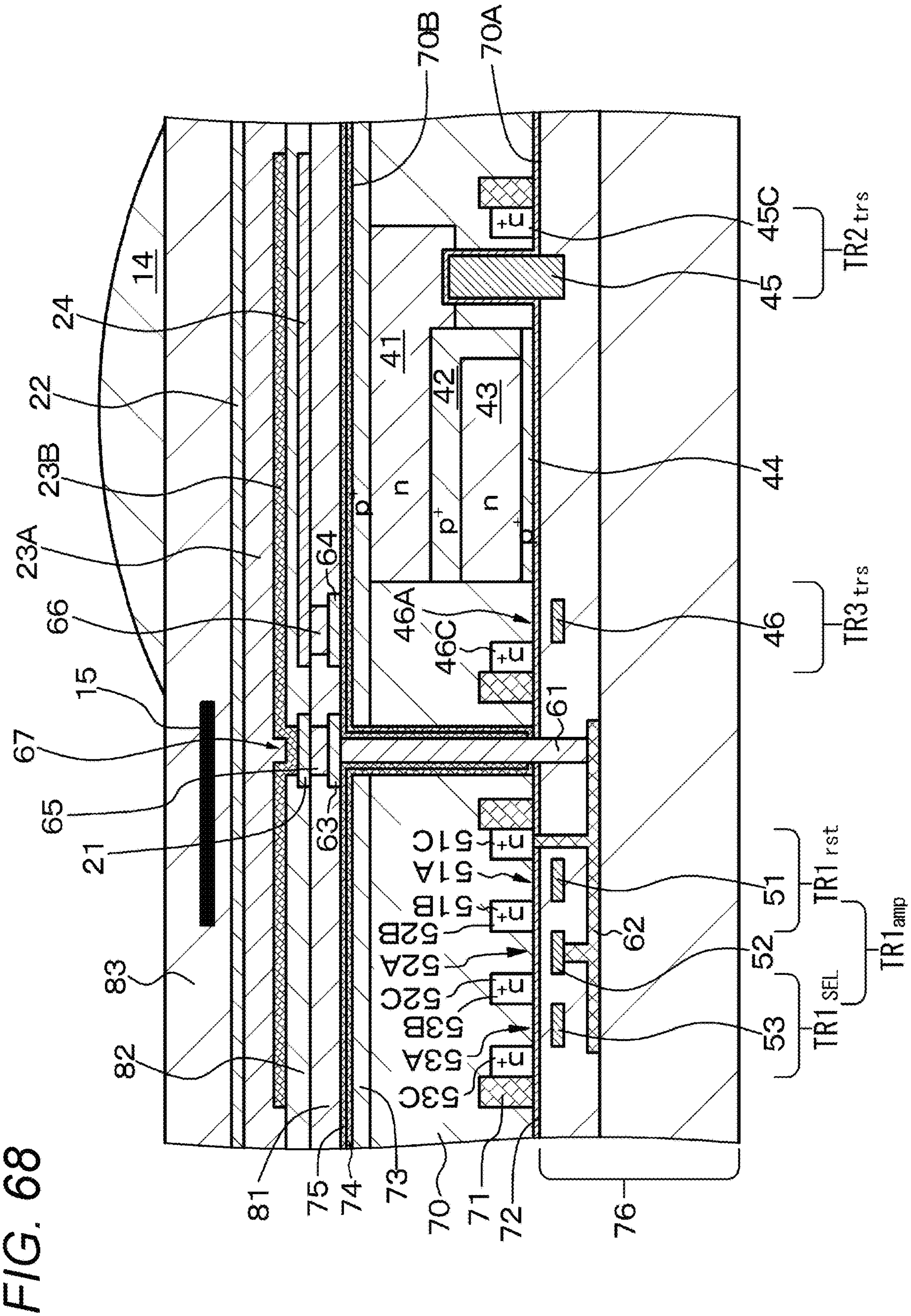
FIG. 68 is a schematic partial cross-sectional view of yet another modification of an imaging device of Example 1.

Further, as shown in FIG. 68, which shows a modification of an imaging device described in Example 1, light may enter from the side of the second electrode 22, and a light blocking layer 15 may be formed on the light incident side closer to the second electrode 22, for example. Note that the various wiring lines provided on the light incident side of the photoelectric conversion layer may also function as a light blocking layer.

Figure 69:
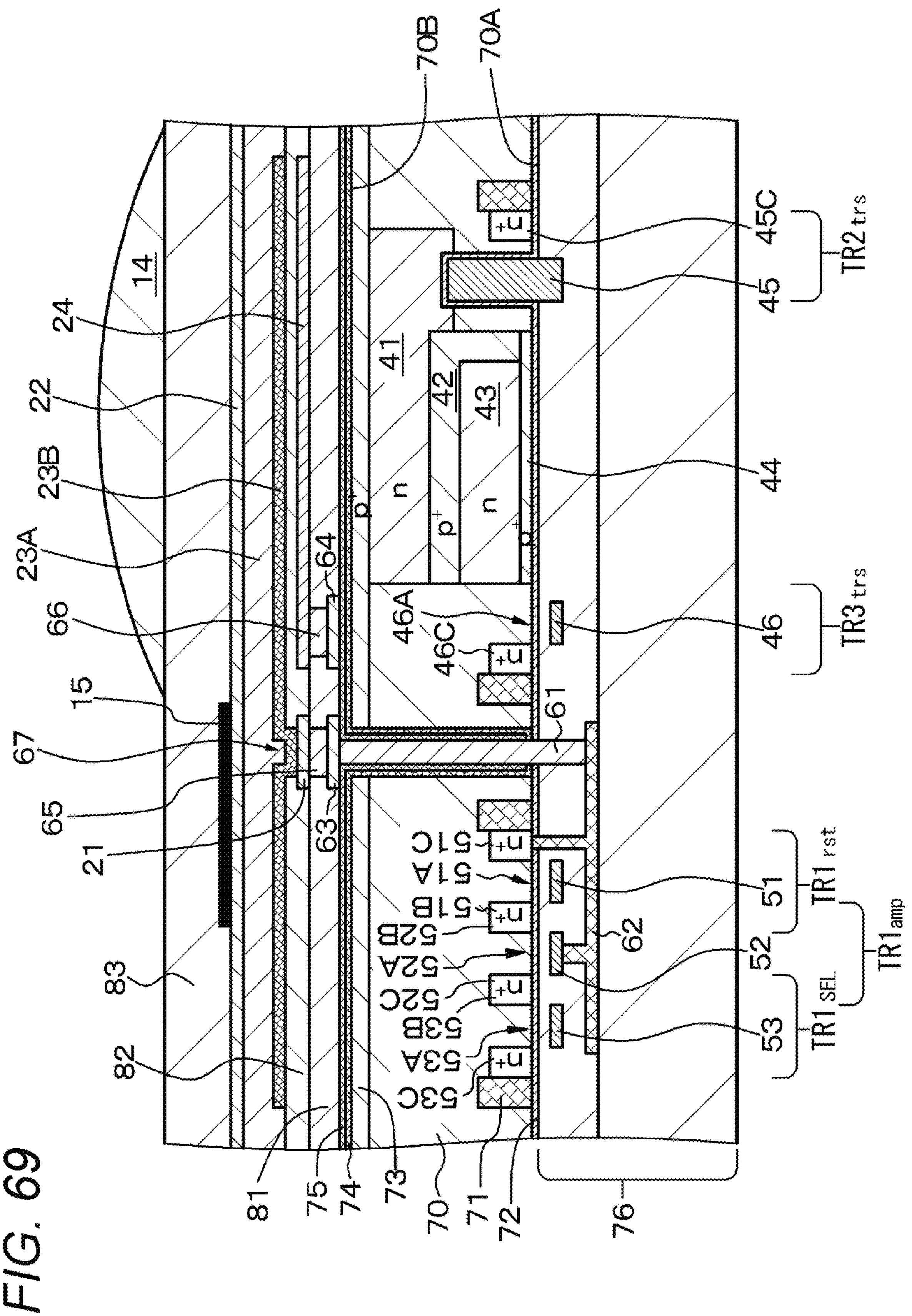
FIG. 69 is a schematic partial cross-sectional view of yet another modification of an imaging device of Example 1.
Figure 70:
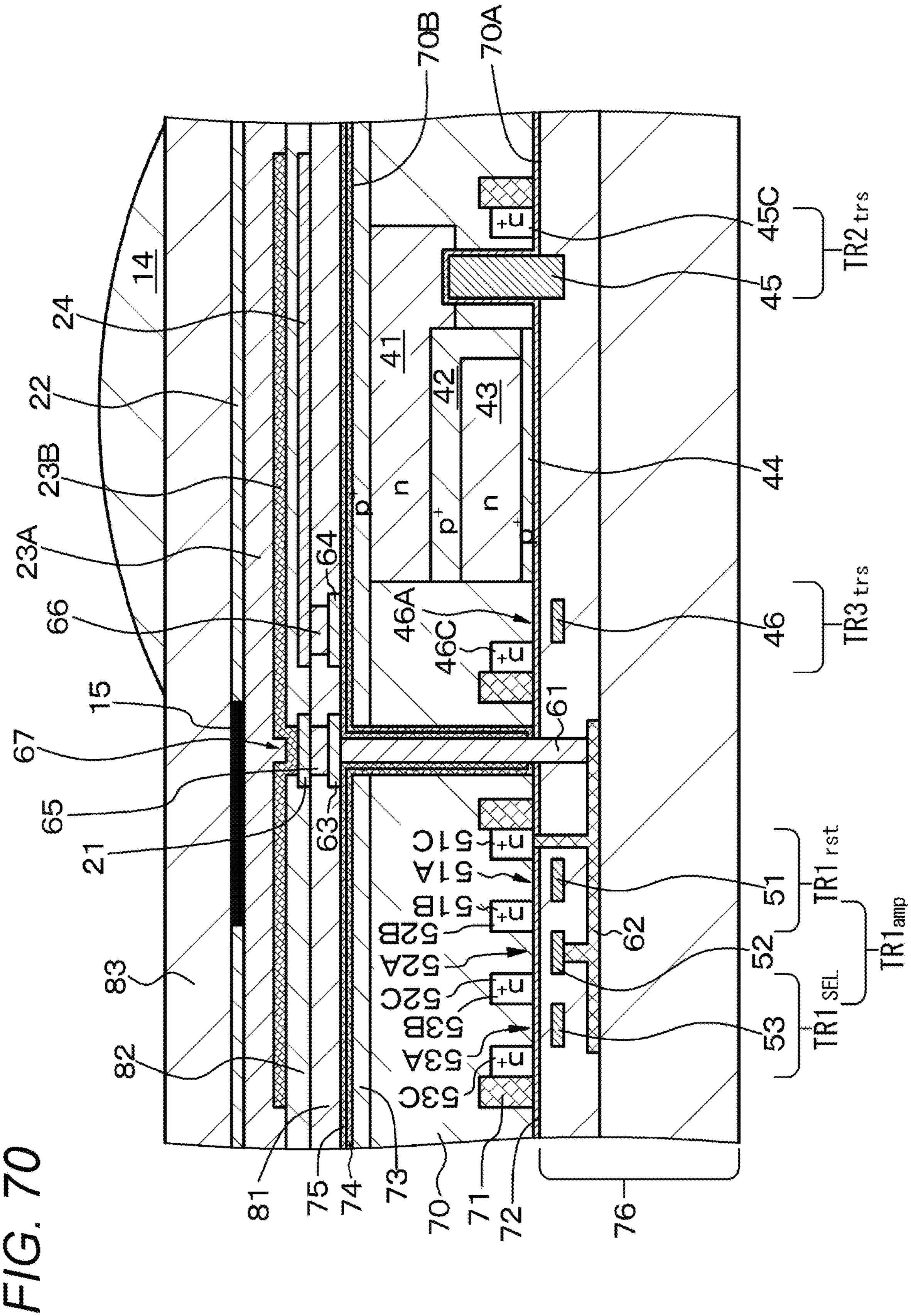
FIG. 70 is a schematic partial cross-sectional view of yet another modification of an imaging device of Example 1.

Note that, in the example shown in FIG. 68, the light blocking layer 15 is formed above the second electrode 22, or the light blocking layer 15 is formed on the light incident side closer to the second electrode 22 and above the first electrode 21. However, the light blocking layer 15 may be disposed on a surface on the light incident side of the second electrode 22, as shown in FIG. 69. Further, in some cases, the light blocking layer 15 may be formed in the second electrode 22, as shown in FIG. 70.

Figure 71:
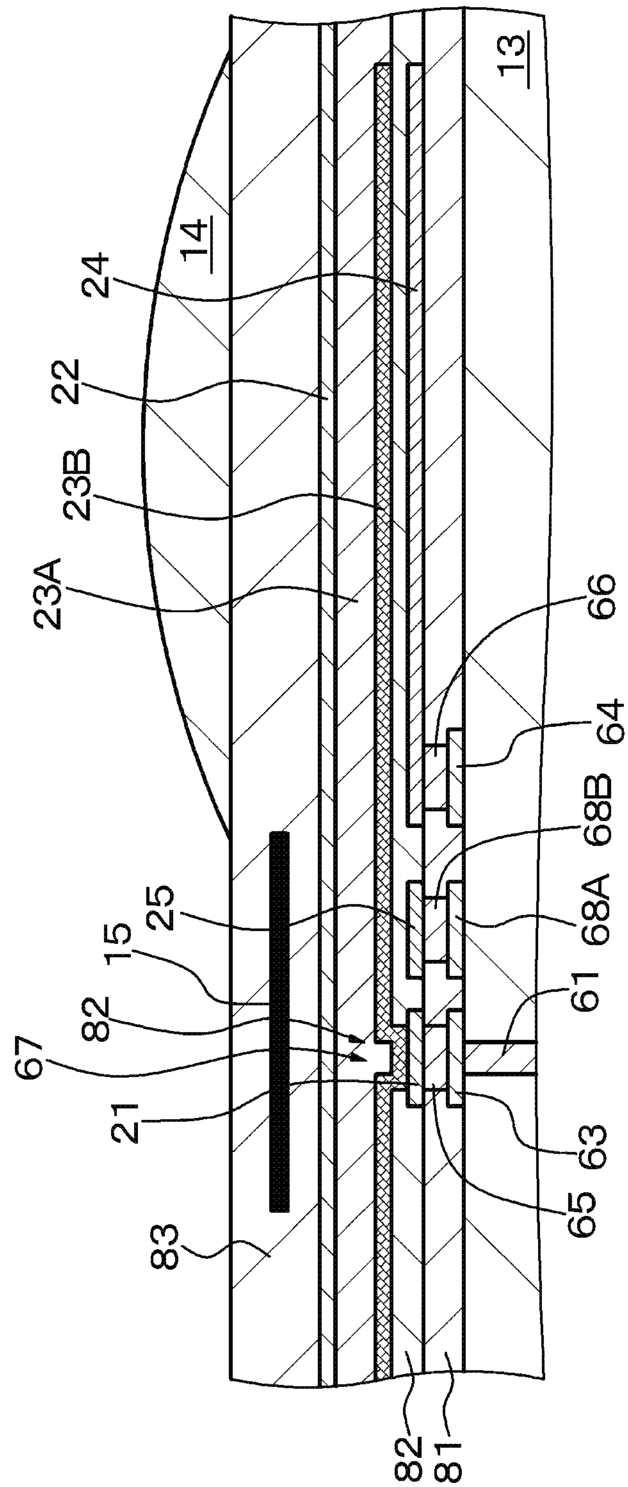
FIG. 71 is a schematic partial cross-sectional view of another modification of an imaging device of Example 4.
Figure 72:
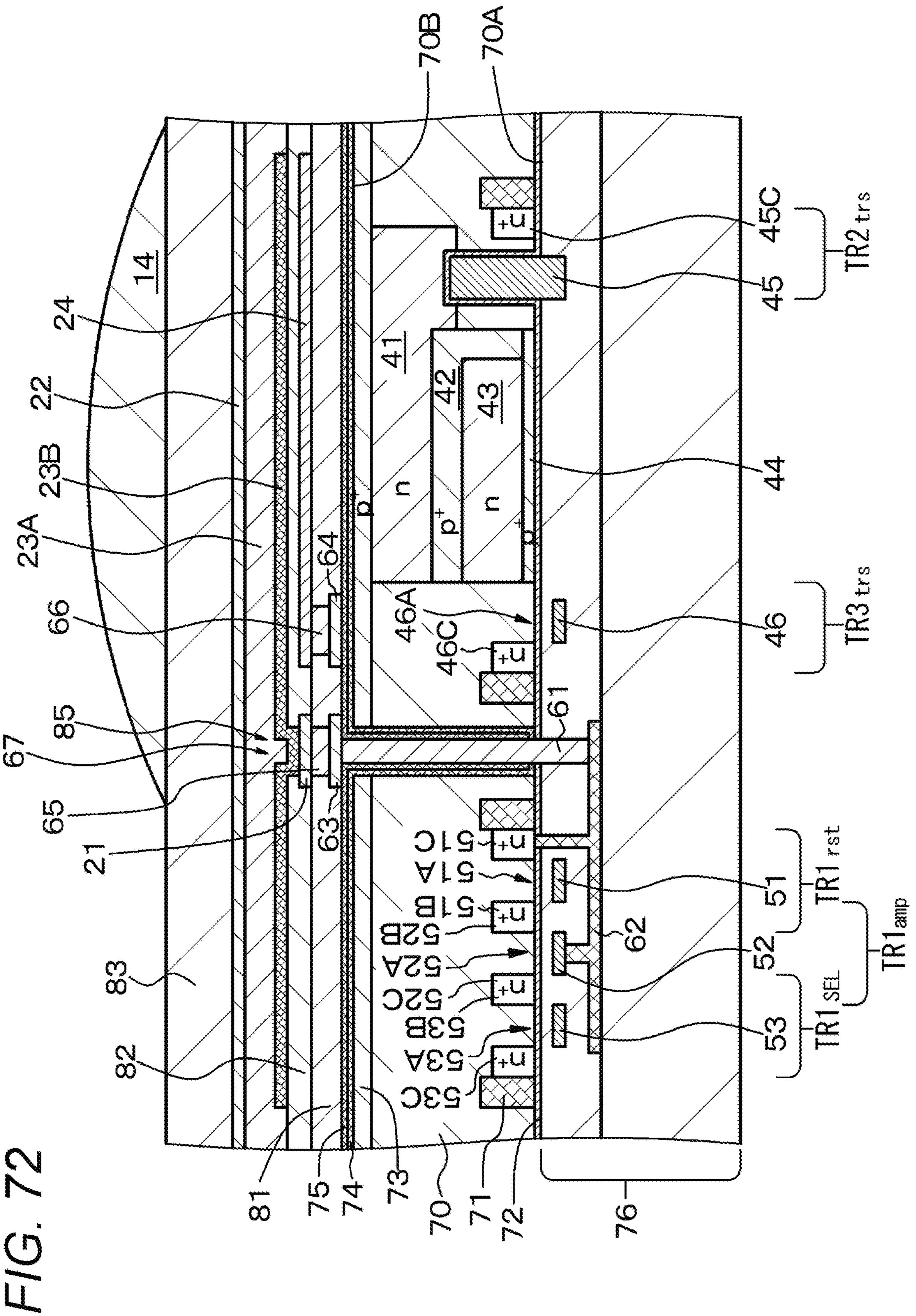
FIG. 72 is a schematic partial cross-sectional view of yet another modification of an imaging device of Example 1.

Alternatively, light may enter from the side of the second electrode 22 while light does not enter the first electrode 21. Specifically, as shown in FIG. 68, the light blocking layer 15 is formed on the light incident side closer to the second electrode 22 and above the first electrode 21. Alternatively, as shown in FIG. 72, the on-chip microlens 14 may be provided above the charge storage electrode 24 and the second electrode 22, so that light that enters the on-chip microlens 14 is gathered to the charge storage electrode 24 and does not reach the first electrode 21. Note that, in a case where the transfer control electrode 25 is provided, light can be prohibited from entering the first electrode 21 and the transfer control electrode 25, as described in Example 4. Specifically, as shown in FIG. 71, the light blocking layer 15 may be formed above the first electrode 21 and the transfer control electrode 25. Alternatively, light that enters the on-chip microlens 14 may not reach the first electrode 21, or the first electrode 21 and the transfer control electrode 25.

As the above configuration and structure are adopted, or as the light blocking layer 15 is provided or the on-chip microlens 14 is designed so that light enters only the portion of the photoelectric conversion layer 23A located above the charge storage electrode 24, the portion of the photoelectric conversion layer 23A located above the first electrode 21 (or above the first electrode 21 and the transfer control electrode 25) does not contribute to photoelectric conversion. Thus, all the pixels can be reset more reliably at the same time, and the global shutter function can be achieved more easily. In other words, in a method of driving a solid-state imaging apparatus including a plurality of imaging devices having the above configuration and structure, the following steps are repeated.

In all the imaging devices, the electric charges in the first electrodes 21 are simultaneously released out of the system, while electric charges are accumulated in the semiconductor material layers 23B and the like.

After that, in all the imaging devices, the electric charges accumulated in the semiconductor material layers 23B and the like are simultaneously transferred to the first electrodes 21, and after the transfer is completed, the electric charges transferred to the first electrode 21 are sequentially read out in each of the imaging devices.

In such a method of driving a solid-state imaging apparatus, each imaging device has a structure in which light that has entered from the second electrode side does not enter the first electrode, and the electric charges in the first electrode are released out of the system while electric charges are accumulated in the semiconductor material layer and the like in all the imaging devices. Thus, the first electrodes can be reliably reset at the same time in all the imaging devices. After that, the electric charges accumulated in the semiconductor material layers and the like are simultaneously transferred to the first electrodes in all the imaging devices, and, after the transfer is completed, the electric charges transferred to the first electrode are sequentially read out in each imaging device. Because of this, a so-called global shutter function can be easily achieved.

In a case where one semiconductor material layer 23B is formed and shared in a plurality of imaging devices, the edge portion of the semiconductor material layer 23B is preferably covered at least with the photoelectric conversion layer 23A, to protect the edge portion of the semiconductor material layer 23B. In such a case, the structure of each imaging device is only required to be like the structure shown at the right end of the semiconductor material layer 23B shown in FIG. 1, which shows a schematic cross-sectional view.

Figure 73:
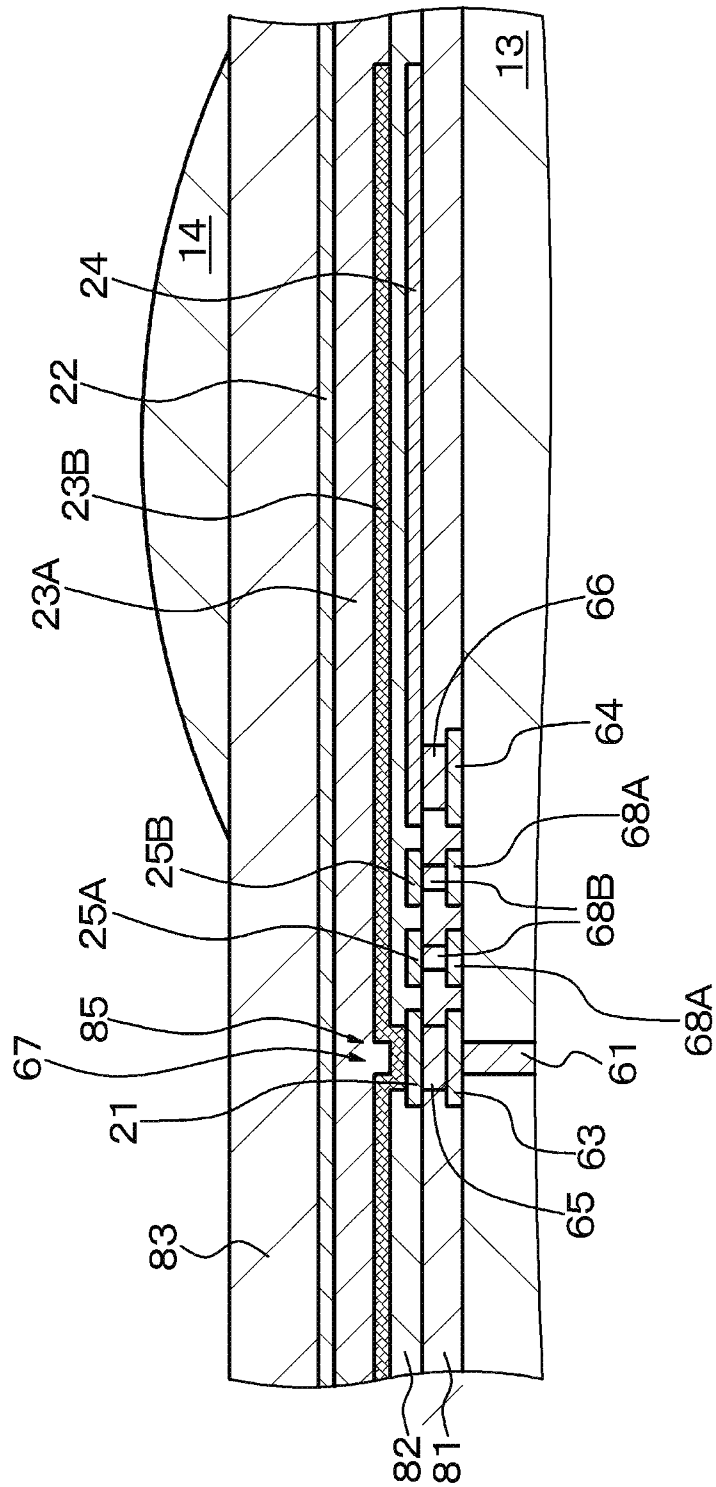
FIG. 73 is a schematic partial cross-sectional view of yet another modification of an imaging device of Example 4.

Further, in a modification of Example 4, a plurality of transfer control electrodes may be arranged from the position closest to the first electrode 21 toward the charge storage electrode 24, as shown in FIG. 73. Note that FIG. 73 shows an example in which two transfer control electrodes 25A and 25B are provided. Then, the on-chip microlens 14 may be provided above the charge storage electrode 24 and the second electrode 22, so that light that enters the on-chip microlens 14 is gathered to the charge storage electrode 24 and does not reach the first electrode 21 and the transfer control electrodes 25A and 25B.

Figure 74:
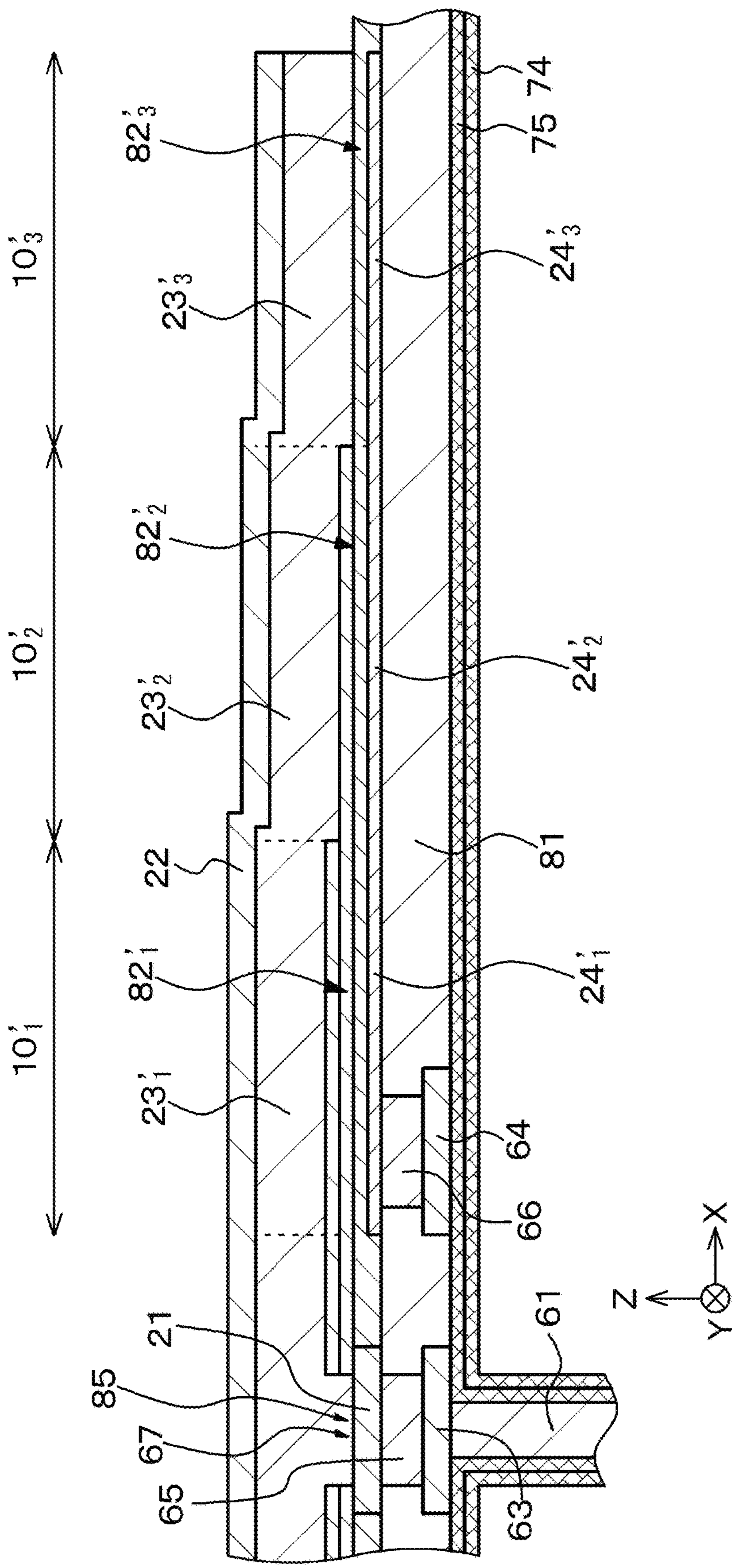
FIG. 74 is a schematic partial cross-sectional view showing an enlarged view of the portion in which a charge storage electrode, a photoelectric conversion layer, and a second electrode are stacked in a modification of an imaging device of Example 7.

In Example 7 shown in FIGS. 37 and 38, the thicknesses of the charge storage electrode segments $\mathbf{24'}_1$, $\mathbf{24'}_2$, and $\mathbf{24'}_3$ are made to become gradually smaller, so that the thicknesses of the insulating layer segments $\mathbf{82'}_2$, $\mathbf{82'}_2$, and $\mathbf{82'}_3$ become gradually greater. On the other hand, as shown in FIG. 74, which is a schematic partial cross-sectional view showing an enlarged view of the portion in which the charge storage electrode, the semiconductor material layer, the photoelectric conversion layer, and the second electrode are stacked in a modification of Example 7, the thicknesses of the charge storage electrode segments $\mathbf{24'}_1$, $\mathbf{24'}_2$, and $\mathbf{24'}_3$ may be made uniform, while the thicknesses of the insulating layer segments $\mathbf{82'}_1$, $\mathbf{82'}_2$, and $\mathbf{82'}_3$ are made to become gradually greater. Note that the thicknesses of the photoelectric conversion layer segments $\mathbf{23'}_1$, $\mathbf{23'}_2$, and $\mathbf{23'}_3$ are uniform.

Figure 75:
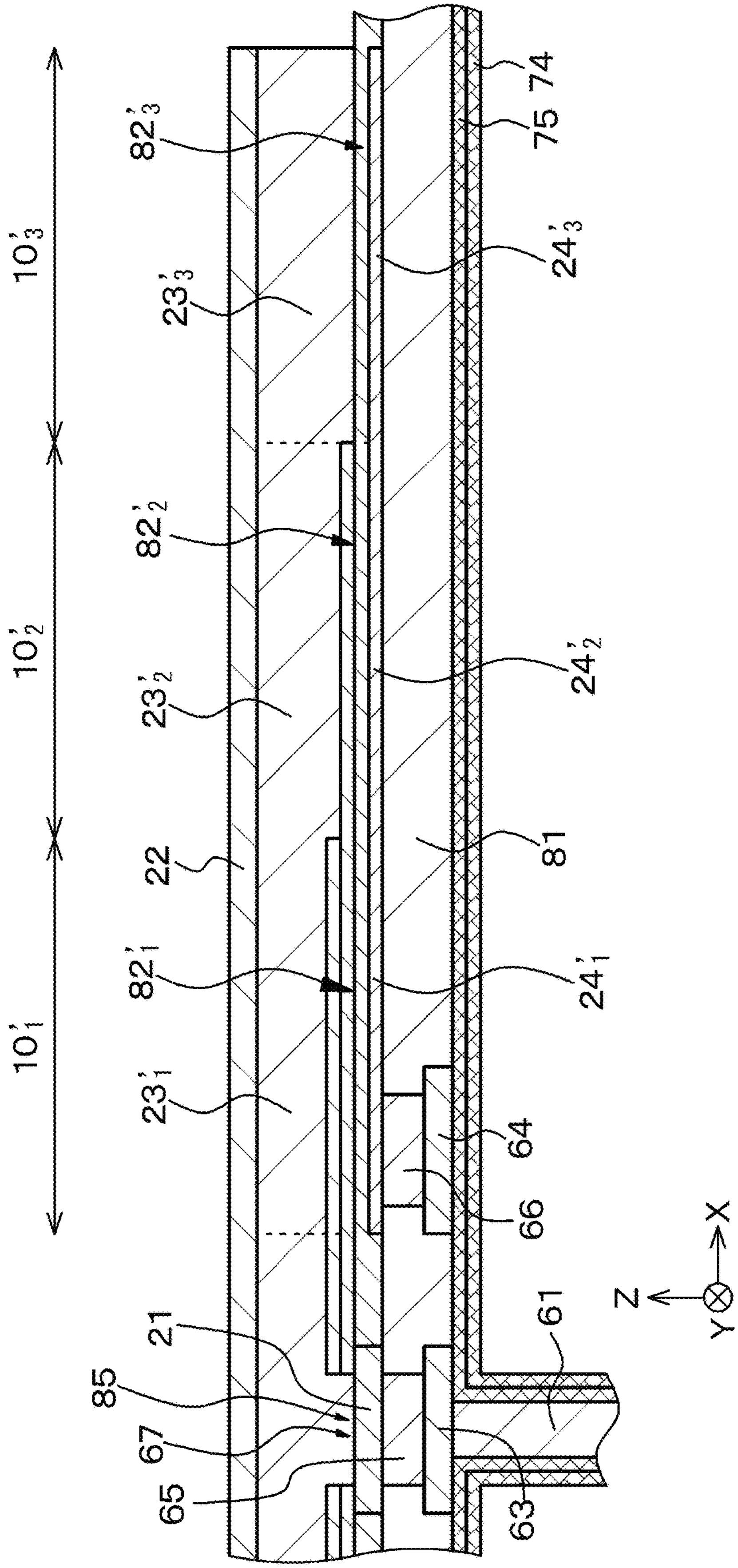
FIG. 75 is a schematic partial cross-sectional view showing an enlarged view of the portion in which a charge storage electrode, a photoelectric conversion layer, and a second electrode are stacked in a modification of an imaging device of Example 8.

Further, in Example 8 shown in FIG. 40, the thicknesses of the charge storage electrode segments $\mathbf{24'}_1$, $\mathbf{24'}_2$, and $\mathbf{24'}_3$ are made to become gradually smaller, so that the thicknesses of the photoelectric conversion layer segments $\mathbf{23'}_2$, $\mathbf{23'}_2$, and $\mathbf{23'}_3$ become gradually greater. On the other hand, as shown in FIG. 75, which is a schematic partial cross-sectional view showing an enlarged view of the portion in which the charge storage electrode, the photoelectric conversion layer, and the second electrode are stacked in a modification of Example 8, the thicknesses of the charge storage electrode segments $\mathbf{24'}_2$, $\mathbf{24'}_2$, and $\mathbf{24'}_3$ may be made uniform, and the thicknesses of the insulating layer segments $\mathbf{82'}_2$, $\mathbf{82'}_2$, and $\mathbf{82'}_3$ may be made to become gradually smaller, so that the thicknesses of the photoelectric conversion layer segments $\mathbf{23'}_2$, $\mathbf{23'}_2$, and $\mathbf{23'}_3$ become gradually greater.

It should go without saying that the various modifications described above may also be applied to Examples 2 through 14.

In the example cases described in Examples, the present disclosure is applied to CMOS solid-state imaging apparatuses in each of which unit pixels that detect signal charges corresponding to incident light quantities as physical quantities are arranged in a matrix. However, the present disclosure is not necessarily applied to such CMOS solid-state imaging apparatuses, and may also be applied to CCD solid-state imaging apparatuses. In the latter case, signal charges are transferred in a vertical direction by a vertical transfer register of a CCD structure, are transferred in a horizontal direction by a horizontal transfer register, and are amplified, so that pixel signals (image signals) are output. Further, the present disclosure is not necessarily applied to general solid-state imaging apparatuses of a column type in which pixels are arranged in a two-dimensional matrix, and a column signal processing circuit is provided for each pixel row. Furthermore, the selection transistor may also be omitted in some cases.

Further, imaging devices of the present disclosure are not necessarily used in a solid-state imaging apparatus that senses a distribution of visible incident light and captures the distribution as an image, but may also be used in a solid-state imaging apparatus that captures an incident amount distribution of infrared rays, X-rays, particles, or the like as an image. Also, in a broad sense, the present disclosure may be applied to any solid-state imaging apparatus (physical quantity distribution detection apparatus), such as a fingerprint detection sensor that detects a distribution of other physical quantities such as pressure and capacitance and captures such a distribution as an image.

Further, the present disclosure is not limited to solid-state imaging apparatuses that sequentially scan respective unit pixels in the imaging region by the row, and read pixel signals from the respective unit pixels. The present disclosure may also be applied to a solid-state imaging apparatus of an X-Y address type that selects desired pixels one by one, and reads pixel signals from the selected pixels one by one. A solid-state imaging apparatus may be in the form of a single chip, or may be in the form of a module that is formed by packaging an imaging region together with a drive circuit or an optical system, and has an imaging function.

Further, the present disclosure is not necessarily applied to solid-state imaging apparatuses, but may also be applied to imaging apparatuses. Here, an imaging apparatus is a camera system, such as a digital still camera or a video camera, or an electronic apparatus that has an imaging function, such as a portable telephone device. The form of a module mounted on an electronic apparatus, or a camera module, is an imaging apparatus in some cases.

Figure 77:
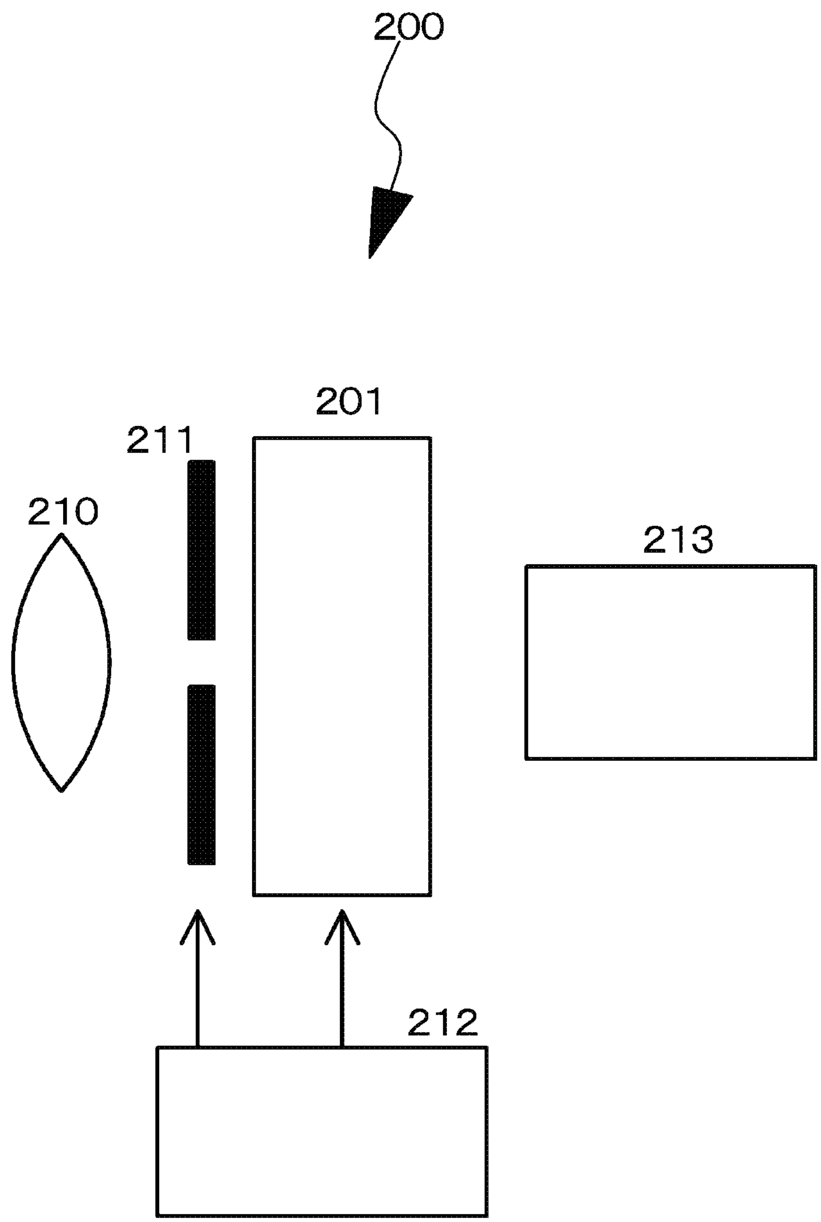
FIG. 77 is a conceptual diagram of an example using a solid-state imaging apparatus including imaging devices or the like of the present disclosure in an electronic apparatus (a camera).

FIG. 77 is a conceptual diagram showing an example in which a solid-state imaging apparatus 201 including imaging devices of the present disclosure is used for an electronic apparatus (a camera) 200. An electronic apparatus 200 includes the solid-state imaging apparatus 201, an optical lens 210, a shutter device $\mathbf{21}_1$, a drive circuit $\mathbf{21}_2$, and a signal processing circuit 213. The optical lens 210 gathers image light (incident light) from an object, and forms an image on the imaging surface of the solid-state imaging apparatus 201. With this, signal charges are stored in the solid-state imaging apparatus 201 for a certain period of time. The shutter device $\mathbf{21}_1$ controls the light exposure period and the light blocking period for the solid-state imaging apparatus 201. The drive circuit $\mathbf{21}_2$ supplies drive signals for controlling transfer operation and the like of the solid-state imaging apparatus 201, and shutter operation of the shutter device $\mathbf{21}_1$. In accordance with a drive signal (a timing signal) supplied from the drive circuit $\mathbf{21}_2$, the solid-state imaging apparatus 201 performs signal transfer. The signal processing circuit 213 performs various kinds of signal processing. Video signals subjected to the signal processing are stored into a storage medium such as a memory, or are output to a monitor. In such an electronic apparatus 200, it is possible to achieve miniaturization of the pixel size and improvement of the charge transfer efficiency in the solid-state imaging apparatus 201. Thus, the electronic apparatus 200 having its pixel characteristics improved can be obtained. The electronic apparatus 200 to which the solid-state imaging apparatus 201 can be applied is not necessarily a camera, but may be an imaging apparatus such as a camera module for mobile devices such as a digital still camera and a portable telephone device.

The technology (the present technology) according to the present disclosure can be applied to various products. For example, the technology according to the present disclosure may be embodied as a device mounted on any type of mobile object, such as an automobile, an electrical vehicle, a hybrid electrical vehicle, a motorcycle, a bicycle, a personal mobility device, an airplane, a drone, a vessel, or a robot.

Figure 84:
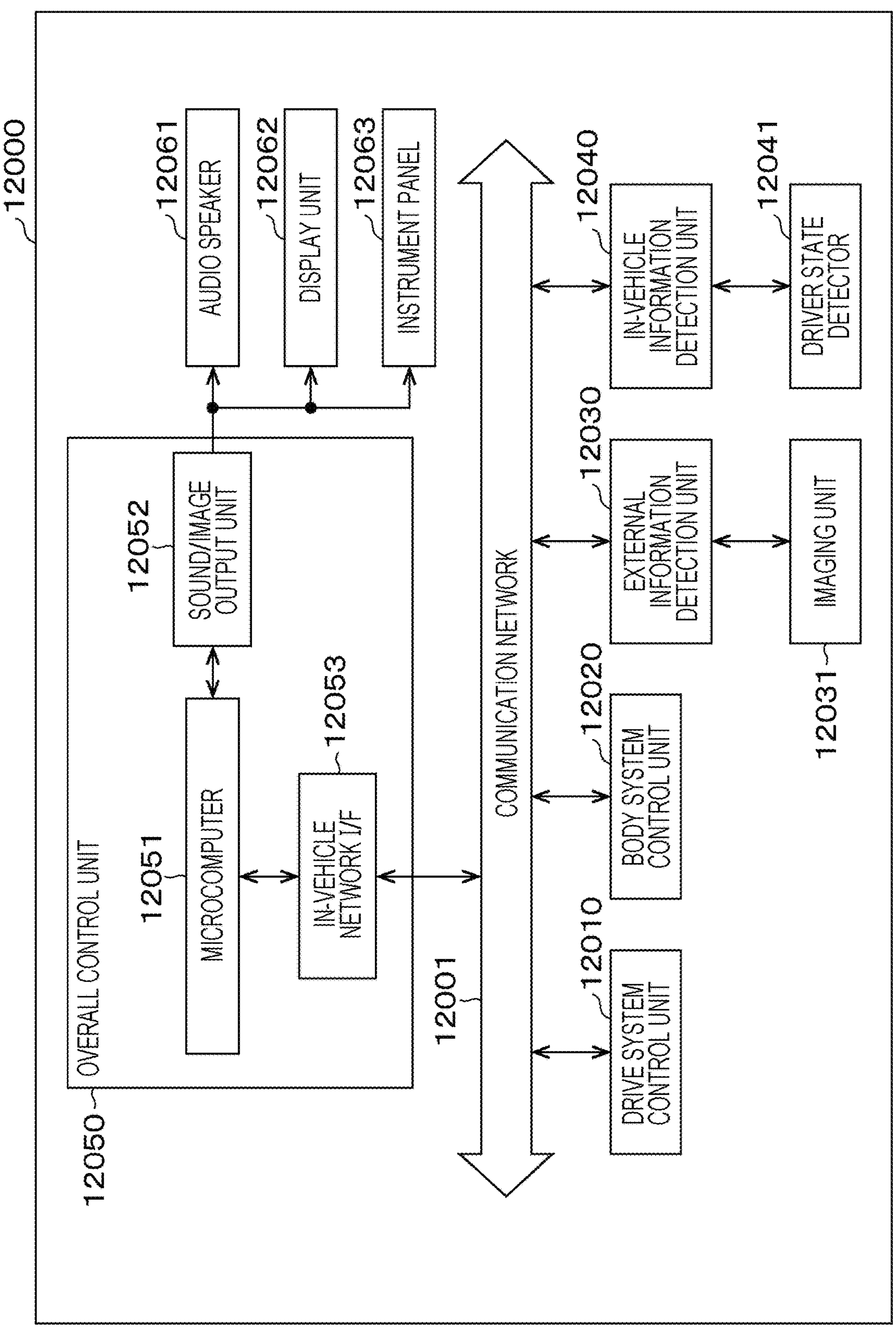
FIG. 84 is a block diagram schematically showing an example configuration of a vehicle control system.

FIG. 84 is a block diagram schematically showing an example configuration of a vehicle control system that is an example of a mobile object control system to which the technology according to the present disclosure may be applied.

A vehicle control system 12000 includes a plurality of electronic control units connected via a communication network 12001. In the example shown in FIG. 84, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether or not the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle velocity maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

The microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 84, an audio speaker 12061, a display unit 12062, and an instrument panel 12063 are shown as output devices. The display unit 12062 may include an on-board display and/or a head-up display, for example.

Figure 85:
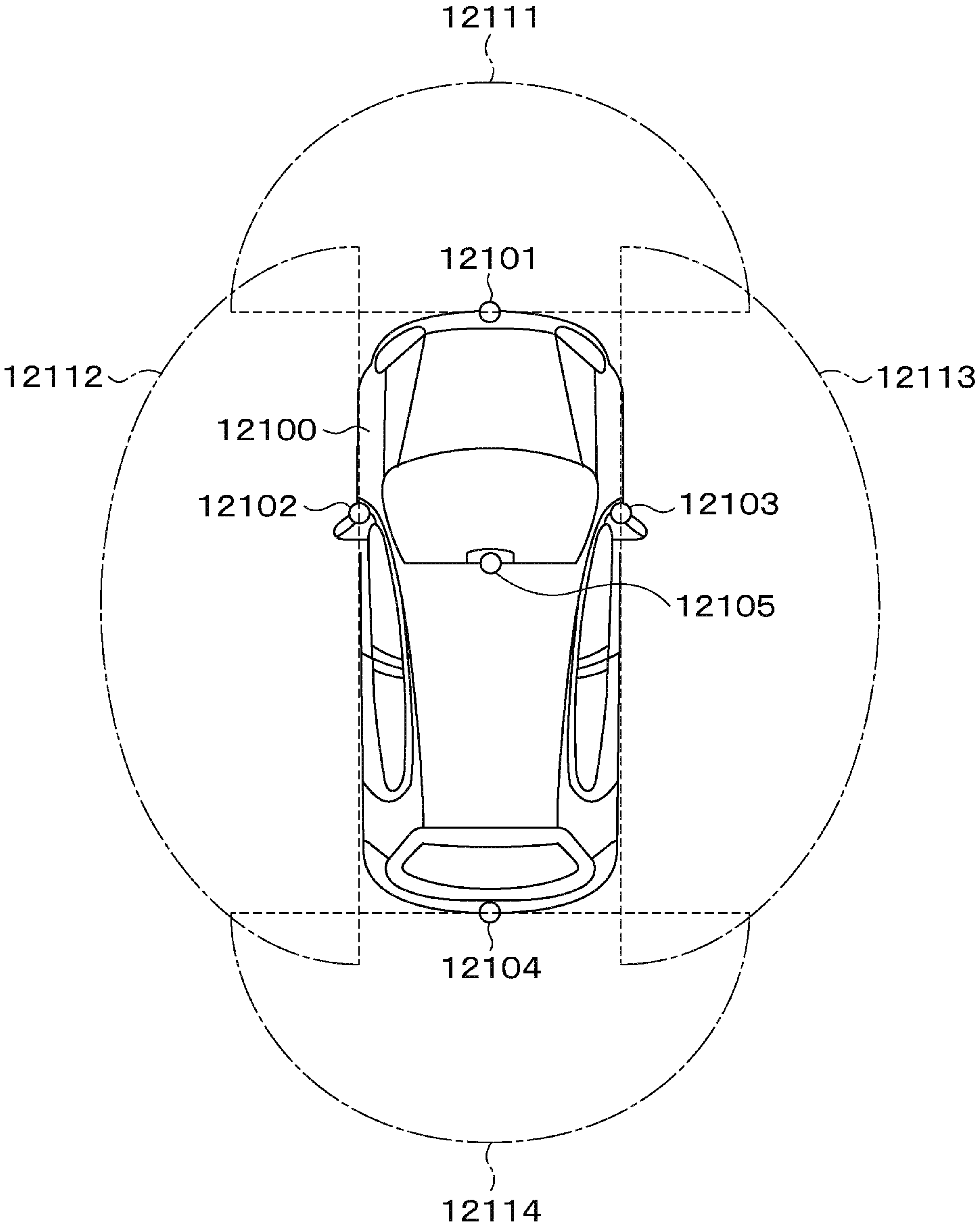
FIG. 85 is an explanatory diagram showing an example of installation positions of external information detectors and imaging units.

FIG. 85 is a diagram showing an example of installation positions of imaging units 12031.

In FIG. 85, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 85 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, on the basis of distance information obtained from the imaging units 12101 through 12104, the microcomputer 12051 calculates the distances to the respective three-dimensional objects within the imaging ranges 12111 through 12114, and temporal changes in the distances (the velocities relative to the vehicle 12100). In this manner, the three-dimensional object that is the closest three-dimensional object on the traveling path of the vehicle 12100 and is traveling at a predetermined velocity (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

The technology according to the present disclosure may also be applied to an endoscopic surgery system, for example.

Figure 86:
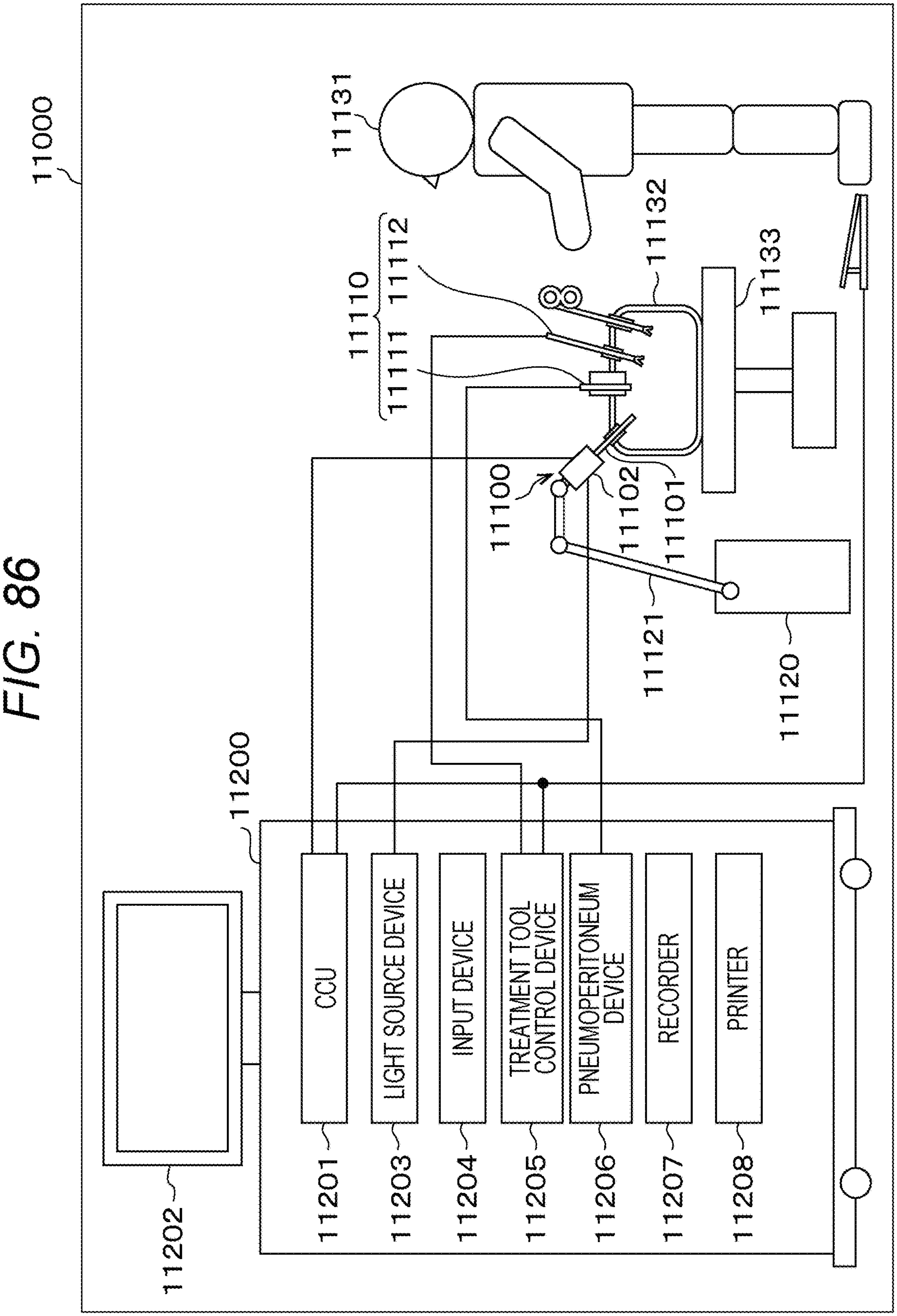
FIG. 86 is a diagram schematically showing an example configuration of an endoscopic surgery system.

FIG. 86 is a diagram schematically showing an example configuration of an endoscopic surgery system to which the technology (the present technology) according to the present disclosure may be applied.

FIG. 86 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is designed as a so-called rigid scope having a rigid lens barrel 11101. However, the endoscope 11100 may be designed as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (a demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrowband light observation (narrowband imaging) is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (auto-fluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

Figure 87:
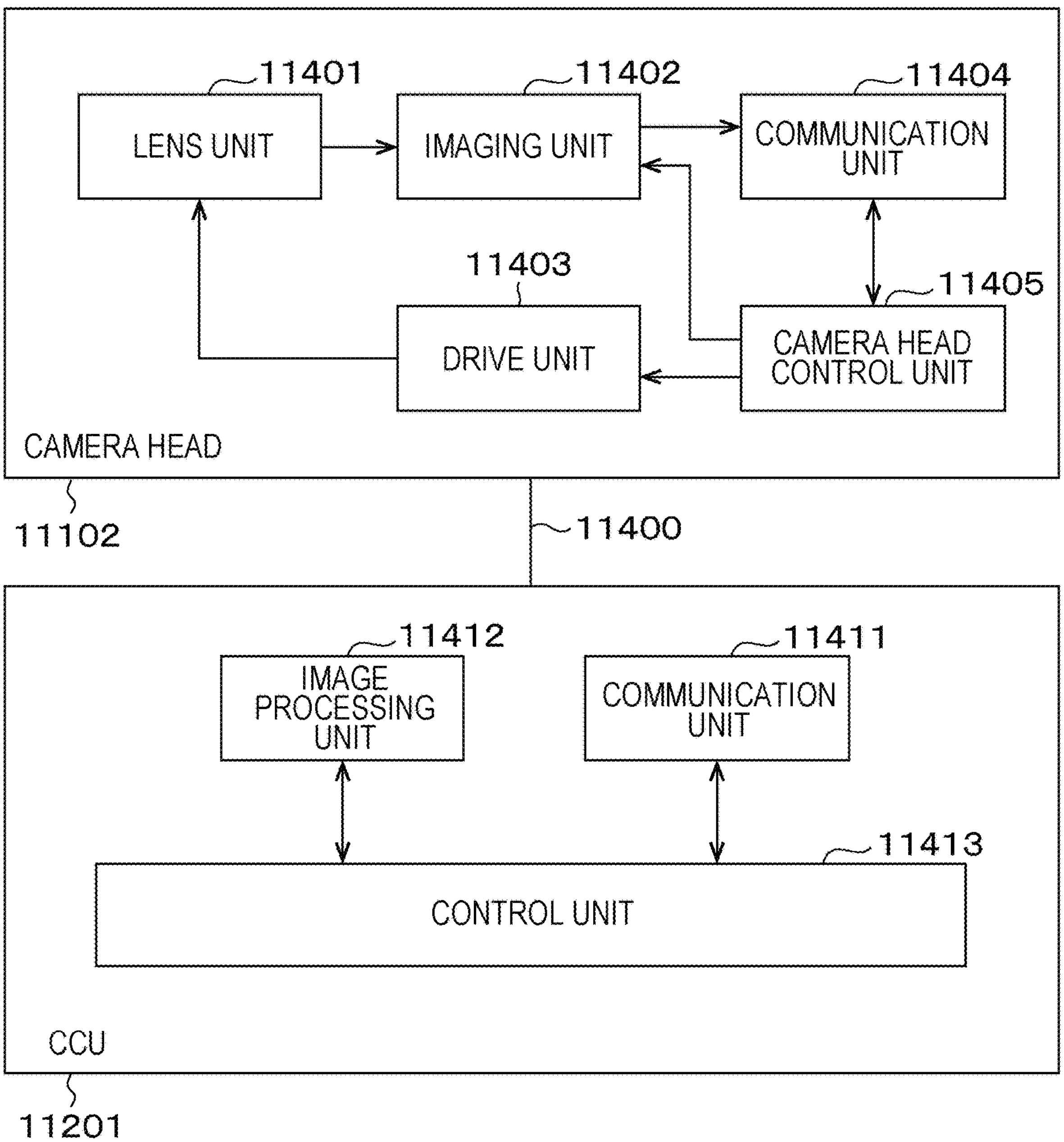
FIG. 87 is a block diagram showing an example of the functional configurations of a camera head and a CCU.

FIG. 87 is a block diagram showing an example of the functional configurations of the camera head 11102 and the CCU 11201 shown in FIG. 86.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 is provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be adjusted as appropriate.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

The communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit

11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

Note that the endoscopic surgery system has been described as an example herein, but the technology according to the present disclosure may be applied to a microscopic surgery system or the like, for example.

Note that the present disclosure may also be embodied in the configurations described below.

[A01] (Imaging Device: The First Embodiment)

An imaging device including:

a photoelectric conversion unit in which a first electrode, a photoelectric conversion layer, and a second electrode are stacked, in which a semiconductor material layer including an inorganic oxide semiconductor material having an amorphous structure at least in a portion is formed between the first electrode and the photoelectric conversion layer, and the formation energy of an inorganic oxide semiconductor material that has the same (or almost the same) composition as the inorganic oxide semiconductor material having an amorphous structure and has a crystalline structure (or the formation energy at a time when the inorganic oxide semiconductor material is supposedly to be generated) has a positive value.

[A02] The imaging device according to [A01], in which the formation energy is defined as the reaction energy at a time when the inorganic oxide semiconductor material having a crystalline structure is generated on the basis of a plurality of starting materials for forming the inorganic oxide semiconductor material having a crystalline structure.

[A03] The imaging device according to [A01] or [A02], in which each of the starting materials contains metallic atoms that constitute the inorganic oxide semiconductor material.

[A04] The imaging device according to [A03], in which the metallic element forming the inorganic oxide semiconductor material has a closed-shell d orbital.

[A05] The imaging device according to any one of [A02] to [A04], in which each of the starting materials is formed with an oxide formed with the metallic atoms constituting the inorganic oxide semiconductor material and oxygen atoms.

[A06] The imaging device according to any one of [A03] to [A05], in which the metallic atoms are metallic atoms selected from the group consisting of copper, silver, gold, zinc, gallium, germanium, indium, tin, and thallium.

[A07] The imaging device according to [A06], in which the metallic atoms are metallic atoms selected from the group consisting of copper, silver, zinc, gallium, germanium, and tin.

[A08] The imaging device according to any one of [A01] to [A05], in which the semiconductor material layer includes $Ga_{x1}Sn_{y1}O$, and satisfies $$0.28 \leq [y1/(x1+y1)] \leq 0.38$$

[A09] (Imaging Device: The Second Embodiment)

An imaging device including:

a photoelectric conversion unit in which a first electrode, a photoelectric conversion layer, and a second electrode are stacked, in which a semiconductor material layer including an inorganic oxide semiconductor material having an amorphous structure at least in a portion is formed between the first electrode and the photoelectric conversion layer, the composition of the inorganic oxide semiconductor material having an amorphous structure is formed with N kinds of metallic atoms $M_n$ (n=2, 3, . . . , N) and oxygen atoms, and the reaction energy at a time when an inorganic oxide semiconductor material having a crystalline structure is generated (or is supposedly to be generated) on the basis of a reaction of N kinds of metallic oxides formed with the metallic atoms $M_n$ and oxygen atoms has a positive value.

[A10] The imaging device according to [A09], in which the metallic atoms have a closed-shell d orbital.

[A11] The imaging device according to [A09] or [A10], in which the metallic atoms are metallic atoms selected from the group consisting of copper, silver, gold, zinc, gallium, germanium, indium, tin, and thallium.

[A12] The imaging device according to [A11], in which the metallic atoms are metallic atoms selected from the group consisting of copper, silver, zinc, gallium, germanium, and tin.

[A13] The imaging device according to [A09] or [A10], in which the semiconductor material layer includes $Ga_{x1}Sn_{y1}O$, and satisfies $$0.28 \leq [y1/(x1+y1)] \leq 0.38$$

[A14] The imaging device according to any one of [A01] to [A13], in which the photoelectric conversion unit further includes an insulating layer, and a charge storage electrode that is disposed at a distance from the first electrode and faces the semiconductor material layer via the insulating layer.

[A15] The imaging device according to any one of [A01] to [A14], in which the LUMO value $E_1$ of the material forming a portion of the photoelectric conversion layer located in the vicinity of the semiconductor material layer, and the LUMO value $E_2$ of the material forming the semiconductor material layer satisfy the following expression:

$$E_2 - E1 \geq 0.1 \text{ eV}$$

[A16] The imaging device according to [A15], which satisfies the following expression:

$$E_2 - E1 > 0.1 \text{ eV}$$

[A17] The imaging device according to any one of [A01] to [A16], in which the carrier mobility of the material forming the semiconductor material layer is not lower than 10 $cm^2/V \cdot s$.

[A18] The imaging device according to any one of [A01] to [A17], in which the semiconductor material layer has a thickness of $1 \times 10^{-8}$ m to $1.5 \times 10^{-7}$ m.

[A19] The imaging device according to any one of [A01] to [A18], in which light enters from the second electrode, and the surface roughness Ra of the semiconductor material layer at the interface between the photoelectric conversion layer and the semiconductor material layer is not greater than 1.5 nm, and the value of the root-mean-square roughness Rq of the semiconductor material layer is not greater than 2.5 nm.

[B01] The imaging device according to any one of [A01] to [A19], in which the photoelectric conversion unit further includes an insulating layer, and a charge storage electrode that is disposed at a distance from the first electrode and faces the semiconductor material layer via the insulating layer.

[B02] The imaging device according to [B01], further including a semiconductor substrate, in which the photoelectric conversion unit is disposed above the semiconductor substrate.

[B03] The imaging device according to [B01] or [B02], in which the first electrode extends in an opening formed in the insulating layer, and is connected to the semiconductor material layer.

[B04] The imaging device according to [B01] or [B02], in which the semiconductor material layer extends in an opening formed in the insulating layer, and is connected to the first electrode.

[B05] The imaging device according to [B04], in which the edge portion of the top surface of the first electrode is covered with the insulating layer, the first electrode is exposed through the bottom surface of the opening, and a side surface of the opening is a slope spreading from a first surface toward a second surface, the first surface being the surface of the insulating layer in contact with the top surface of the first electrode, the second surface being the surface of the insulating layer in contact with the portion of the semiconductor material layer facing the charge storage electrode.

[B06] The imaging device according to [B05], in which the side surface of the opening having the slope spreading from the first surface toward the second surface is located on the charge storage electrode side.

[B07] (Control of the Potentials of the First Electrode and the Charge Storage Electrode)

The imaging device according to any one of [B01] to [B06], further including a control unit that is disposed in the semiconductor substrate, and includes a drive circuit, in which the first electrode and the charge storage electrode are connected to the drive circuit, in a charge accumulation period, the drive circuit applies a potential $V_{11}$ to the first electrode, and a potential $V_{12}$ to the charge storage electrode, to accumulate electric charges in the semiconductor material layer (or the semiconductor material layer and the photoelectric conversion layer), and, in a charge transfer period, the drive circuit applies a potential $V_{21}$ to the first electrode, and a potential $V_{22}$ to the charge storage electrode, to read the electric charges accumulated in the semiconductor material layer (or the semiconductor material layer and the photoelectric conversion layer) into the control unit via the first electrode.

Here, the potential of the first electrode is higher than the potential of the second electrode, to satisfy the following:

$$V_{12}>V_{11}, \text{ and } V_{22}<V_{21}$$

[B08] (Transfer Control Electrode)

The imaging device according to any one of [B01] to [B07], further including a transfer control electrode that is disposed between the first electrode and the charge storage electrode, is located at a distance from the first electrode and the charge storage electrode, and is positioned to face the semiconductor material layer via the insulating layer.

[B09] (Control of the Potentials of the First Electrode, the Charge Storage Electrode, and the Transfer Control Electrode)

The imaging device according to [B08], further including a control unit that is disposed in the semiconductor substrate, and includes a drive circuit, in which the first electrode, the charge storage electrode, and the transfer control electrode are connected to the drive circuit, in a charge accumulation period, the drive circuit applies a potential $V_{11}$ to the first electrode, a potential $V_{12}$ to the charge storage electrode, and a potential $V_{13}$ to the transfer control electrode, to accumulate electric charges in the semiconductor material layer (or the semiconductor material layer and the photoelectric conversion layer), and, in a charge transfer period, the drive circuit applies a potential $V_{21}$ to the first electrode, a potential $V_{22}$ to the charge storage electrode, and a potential $V_{23}$ to the transfer control electrode, to read the electric charges accumulated in the semiconductor material layer (or the semiconductor material layer and the photoelectric conversion layer) into the control unit via the first electrode.

Here, the potential of the first electrode is higher than the potential of the second electrode, to satisfy the following:

$$V_{12}>V_{13}, \text{ and } V_{22}<V_{23}<V_{21}$$

[B10] (Charge Emission Electrode)

The imaging device according to any one of [B01] to [B09], further including a charge emission electrode that is connected to the semiconductor material layer, and is disposed at a distance from the first electrode and the charge storage electrode.

[B11] The imaging device according to [B10], in which the charge emission electrode is disposed to surround the first electrode and the charge storage electrode.

[B12] The imaging device according to [B10] or [B11], in which the semiconductor material layer extends in a second opening formed in the insulating layer, and is connected to the charge emission electrode, the edge portion of the top surface of the charge emission electrode is covered with the insulating layer, the charge emission electrode is exposed through the bottom surface of the second opening, and a side surface of the second opening is a slope spreading from a third surface to a second surface, the third surface being the surface of the insulating layer in contact with the top surface of the charge emission electrode, the second surface being the surface of the insulating layer in contact with the portion of the semiconductor material layer facing the charge storage electrode.

[B13] (Control of the Potentials of the First Electrode, the Charge Storage Electrode, and the Charge Emission Electrode)

The imaging device according to any one of [B10] to [B12], further including a control unit that is disposed in the semiconductor substrate, and includes a drive circuit, in which the first electrode, the charge storage electrode, and the charge emission electrode are connected to the drive circuit, in a charge accumulation period, the drive circuit applies a potential $V_{11}$ to the first electrode, a potential $V_{12}$ to the charge storage electrode, and a potential $V_{14}$ to the charge emission electrode, to accumulate electric charges in the semiconductor material layer (or the semiconductor material layer and the photoelectric conversion layer), and, in a charge transfer period, the drive circuit applies a potential $V_{21}$ to the first electrode, a potential $V_{22}$ to the charge storage electrode, and a potential $V_{24}$ to the charge emission electrode, to read the electric charges accumulated in the semiconductor material layer (or the semiconductor material layer and the photoelectric conversion layer) into the control unit via the first electrode.

Here, the potential of the first electrode is higher than the potential of the second electrode, to satisfy the following:

$$V_{14}>V_{11}, \text{ and } V_{24}<V_{21}$$

[B14] (Charge Storage Electrode Segments)

The imaging device according to any one of [B01] to [B13], in which the charge storage electrode is formed with a plurality of charge storage electrode segments.

[B15] The imaging device according to [B14], in which, when the potential of the first electrode is higher than the potential of the second electrode, the potential to be applied to the charge storage electrode segment located closest to the first electrode is higher than the potential to be applied to the charge storage electrode segment located farthest from the first electrode in a charge transfer period, and, when the potential of the first electrode is lower than the potential of the second electrode, the potential to be applied to the charge storage electrode segment located closest to the first electrode is lower than the potential to be applied to the charge storage electrode segment located farthest from the first electrode in a charge transfer period.

[B16] The imaging device according to any one of [B01] to [B15], in which at least a floating diffusion layer and an amplification transistor that constitute the control unit are disposed in the semiconductor substrate, and the first electrode is connected to the floating diffusion layer and the gate portion of the amplification transistor.

[B17] The imaging device according to [B16], in which a reset transistor and a selection transistor that constitute the control unit are further disposed in the semiconductor substrate, the floating diffusion layer is connected to one source/drain region of the reset transistor, and one source/drain region of the amplification transistor is connected to one source/drain region of the selection transistor, and the other source/drain region of the selection transistor is connected to a signal line.

[B18] The imaging device according to any one of [B01] to [B17], in which the size of the charge storage electrode is larger than that of the first electrode.

[B19] The imaging device according to any one of [B01] to [B18], in which light enters from the second electrode side, and a light blocking layer is formed on a light incident side closer to the second electrode.

[B20] The imaging device according to any one of [B01] to [B18], in which light enters from the second electrode side, and light does not enter the first electrode.

[B21] The imaging device according to [B20], in which a light blocking layer is formed on a light incident side closer to the second electrode and above the first electrode.

[B22] The imaging device according to [B20], in which an on-chip microlens is provided above the charge storage electrode and the second electrode, and light that enters the on-chip microlens is gathered to the charge storage electrode.

[B23] (Imaging Device: The First Configuration)

The imaging device according to any one of [B01] to [B22], in which the photoelectric conversion unit is formed with N (N≥2) photoelectric conversion unit segments, the semiconductor material layer and the photoelectric conversion layer are formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the insulating layer segments gradually vary from the first photoelectric conversion unit segment to the Nth photoelectric conversion unit segment.

[B24] (Imaging Device: The Second Configuration)

The imaging device according to any one of [B01] to [B22], in which the photoelectric conversion unit is formed with N (N≥2) photoelectric conversion unit segments, the semiconductor material layer and the photoelectric conversion layer are formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the photoelectric conversion layer segments gradually vary from the first photoelectric conversion unit segment to the Nth photoelectric conversion unit segment.

[B25] (Imaging Device: The Third Configuration)

The imaging device according to any one of [B01] to [B22], in which the photoelectric conversion unit is formed with N (N≥2) photoelectric conversion unit segments, the semiconductor material layer and the photoelectric conversion layer are formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the insulating layer segment differs between adjacent photoelectric conversion unit segments.

[B26] (Imaging Device: The Fourth Configuration)

The imaging device according to any one of [B01] to [B22], in which the photoelectric conversion unit is formed with N (N≥2) photoelectric conversion unit segments, the semiconductor material layer and the photoelectric conversion layer are formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the charge storage electrode segment differs between adjacent photoelectric conversion unit segments.

[B27] (Imaging Device: The Fifth Configuration)

The imaging device according to any one of [B01] to [B22], in which the photoelectric conversion unit is formed with N (N≥2) photoelectric conversion unit segments, the semiconductor material layer and the photoelectric conversion layer are formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the areas of the charge storage electrode segments become gradually smaller from the first photoelectric conversion unit segment to the Nth photoelectric conversion unit segment.

[B28] (Imaging Device: The Sixth Configuration)

The imaging device according to any one of [B01] to [B22], in which, when the stacking direction of the charge storage electrode, the insulating layer, the semiconductor material layer, and the photoelectric conversion layer is the Z direction, and the direction away from the first electrode is the X direction, the cross-sectional area of a stacked portion of the charge storage electrode, the insulating layer, the semiconductor material layer, and the photoelectric conversion layer taken along a Y-Z virtual plane varies depending on the distance from the first electrode.

[C01] (Stacked Imaging Device)

A stacked imaging device including at least one imaging device according to any one of [A01] to [A19].

[C02] (Stacked Imaging Device)

A stacked imaging device including at least one imaging device according to any one of [A01] to [B28].

[D01] (Solid-State Imaging Apparatus: The First Embodiment)

A solid-state imaging apparatus including a plurality of imaging devices according to any one of [A01] to [A19].

[D02] (Solid-State Imaging Apparatus: The First Embodiment)

A solid-state imaging apparatus including a plurality of imaging devices according to any one of [A01] to [B28].

[D03] (Solid-State Imaging Apparatus: The Second Embodiment)

A solid-state imaging apparatus including a plurality of stacked imaging devices according to [C01].

[D04] (Solid-State Imaging Apparatus: The Second Embodiment)

A solid-state imaging apparatus including a plurality of stacked imaging devices according to [C02].

[E01] (Solid-State Imaging Apparatus: The First Configuration)

A solid-state imaging apparatus including a photoelectric conversion unit in which a first electrode, a photoelectric conversion layer, and a second electrode are stacked, in which the photoelectric conversion unit includes a plurality of imaging devices according to any one of [A01] to [B28], an imaging device block is formed with a plurality of imaging devices, and a first electrode is shared among the plurality of imaging devices constituting the imaging device block.

[E02] (Solid-State Imaging Apparatus: The Second Configuration)

A solid-state imaging apparatus including a plurality of imaging devices according to any one of [A01] to [B28], in which an imaging device block is formed with a plurality of imaging devices, and a first electrode is shared among the plurality of imaging devices constituting the imaging device block.

[E03] The solid-state imaging apparatus according to [E01] or [E02], in which one on-chip microlens is disposed above one imaging device.

[E04] The solid-state imaging apparatus according to [E01] or [E02], in which an imaging device block is formed with two imaging devices, and one on-chip microlens is disposed above the imaging device block.

[E05] The solid-state imaging apparatus according to any one of [E01] to [E04], in which one floating diffusion layer is provided for a plurality of imaging devices.

[E06] The solid-state imaging apparatus according to any one of [E01] to [E05], in which a first electrode is disposed adjacent to the charge storage electrode of each imaging device.

[E07] The solid-state imaging apparatus according to any one of [E01] to [E06], in which a first electrode is disposed adjacent to the charge storage electrode of one or some imaging devices of a plurality of imaging devices, and is not adjacent to the remaining charge storage electrodes of the plurality of imaging devices.

[E08] The solid-state imaging apparatus according to [E07], in which the distance between the charge storage electrode forming an imaging device and the charge storage electrode forming another imaging device is longer than the distance between the first electrode and the charge storage electrode in the imaging device adjacent to the first electrode.

[F01] (Method of Driving a Solid-State Imaging Apparatus)

A method of driving a solid-state imaging apparatus including: a photoelectric conversion unit in which a first electrode, a photoelectric conversion layer, and a second electrode are stacked, the photoelectric conversion unit further including a charge storage electrode that is disposed at a distance from the first electrode and is positioned to face the photoelectric conversion layer via an insulating layer; and a plurality of imaging devices each having a structure in which light enters from the second electrode side, and light does not enter the first electrode, the method including the steps of:

releasing electric charges in the first electrode from the system while accumulating electric charges in a semiconductor material layer simultaneously in all the imaging devices, and transferring the electric charges accumulated in the semiconductor material layer to the first electrode simultaneously in all the imaging devices, and then sequentially reading the electric charges transferred to the first electrode in each imaging device, the steps being repeatedly carried out.

REFERENCE SIGNS LIST

10'$_1$, 10'$_2$, 10'$_3$ Photoelectric conversion unit segment
13 Various imaging device components located below interlayer insulating layer
14 On-chip microlens (OCL)
15 Light blocking layer
21 First electrode
22 Second electrode
23A Photoelectric conversion layer
23B Semiconductor material layer
23'$_1$, 23'$_2$, 23'$_3$ Photoelectric conversion layer segment
24, 24"$_1$, 24"$_2$, 24"$_3$ Charge storage electrode
24A, 24B, 24C, 24'$_1$, 24'$_2$, 24'$_3$ Charge storage electrode segment
25, 25A, 25B Transfer control electrode (charge transfer electrode)
26 Charge emission electrode
27, 27A$_1$, 27A$_2$, 27A$_3$, 27B$_1$, 27B$_2$, 27B$_3$, 27C Charge transfer control electrode
41, 43 n-type semiconductor region
42, 44, 73 p$^+$-layer
45, 46 Gate portion of transfer transistor Semiconductor substrate region
51 Gate portion of reset transistor $\mathbf{TR1}_{rst}$
51A Channel formation region of reset transistor $\mathbf{TR1}_{rst}$
51B, 51C Source/drain region of reset transistor $\mathbf{TR1}_{rst}$
52 Gate portion of amplification transistor $\mathbf{TR1}_{amp}$
52 A Channel formation region of amplification transistor $\mathbf{TR1}_{amp}$
52B, 52C Source/drain region of amplification transistor $\mathbf{TR1}_{amp}$
53 Gate portion of selection transistor $\mathbf{TR1}_{sel}$
53A Channel formation region of selection transistor $\mathbf{TR1}_{sel}$
53B, 53C Source/drain region of selection transistor $\mathbf{TR1}_{sel}$
61 Contact hole portion
62 Wiring layer
63, 64, 68A Pad portion
65, 68B Connecting hole
66, 67, 69 Connecting portion
70 Semiconductor substrate
70A First surface (front surface) of semiconductor substrate
70B Second surface (back surface) of semiconductor substrate
71 Device separation region
72 Oxide film
74 $HfO_2$ film
85 Insulating material film
76, 81 Interlayer insulating layer
82 Insulating layer
82'$_1$, 82'$_2$, 82'$_3$ Insulating layer segment
82*a* First surface of insulating layer
82*b* Second surface of insulating layer
82*c* Third surface of insulating layer
83 Insulating layer
85, 85A, 85B, 85C Opening
86, 86A Second opening
100 Solid-state imaging apparatus
101 Stacked imaging device
111 Imaging region
112 Vertical drive circuit
113 Column signal processing circuit
114 Horizontal drive circuit
115 Output circuit
116 Drive control circuit
117 Signal line (data output line)
118 Horizontal signal line
200 Electronic apparatus (camera)
201 Solid-state imaging apparatus
210 Optical lens
211 Shutter device
212 Drive circuit
213 Signal processing circuit
$FD_1$, $FD_2$, $FD_3$, 45C, 46C Floating diffusion layer
$\mathbf{TR1}_{trs}$, $\mathbf{TR2}_{trs}$, $\mathbf{TR3}_{trs}$ Transfer transistor
$\mathbf{TR1}_{rst}$, $\mathbf{TR2}_{rst}$, $\mathbf{TR3}_{rst}$ Reset transistor
$\mathbf{TR1}_{amp}$, $\mathbf{TR2}_{amp}$, $\mathbf{TR3}_{amp}$ Amplification transistor
$\mathbf{TR1}_{sel}$, $\mathbf{TR3}_{sel}$, $\mathbf{TR3}_{sel}$ Selection transistor
$V_{DD}$ Power supply
$TG_1$, $TG_2$, $TG_3$ Transfer gate line
$RST_1$, $RST_2$, $RST_3$ Reset line
$SEL_1$, $SEL_2$, $SEL_3$ Selection line
VSL, $VSL_1$, $VSL_2$, $VSL_3$ Signal line (data output line)
$V_{OA}$, $V_{OT}$, $V_{OU}$ Wiring line

The invention claimed is:

1. An imaging device comprising:

a photoelectric conversion unit in which a first electrode, a photoelectric conversion layer, and a second electrode are stacked; and a semiconductor material layer including an inorganic oxide semiconductor material between the first electrode and the photoelectric conversion layer, wherein at least a portion of the inorganic oxide semiconductor material has a crystalline structure with a formation energy having a positive value in units of eV/atom, wherein the inorganic oxide semiconductor material includes $Ga_{x1}Sn_{y1}O$, and satisfies $0.28 \le [y1/(x1+y1)] \le 0.38$, and wherein the inorganic oxide semiconductor material has an amorphous structure in at least one portion.

2. The imaging device according to claim 1, wherein the formation energy is defined as a reaction energy at a time when the inorganic oxide semiconductor material having the crystalline structure is generated on a basis of a plurality of starting materials.

3. The imaging device according to claim 2, wherein each of the starting materials contains metallic atoms that constitute the inorganic oxide semiconductor material.

4. The imaging device according to claim 3, wherein the metallic atoms forming the inorganic oxide semiconductor material have a closed-shell d orbital.

5. The imaging device according to claim 3, wherein each of the starting materials is formed with the metallic atoms and oxygen atoms.

6. The imaging device according to claim 3, wherein the metallic atoms are selected from the group consisting of copper, silver, gold, zinc, gallium, germanium, indium, tin, and thallium.

7. The imaging device according to claim 3, wherein the metallic atoms are selected from the group consisting of copper, silver, zinc, gallium, germanium, and tin.

8. A stacked imaging device comprising at least one imaging device according to claim 1.

9. A solid-state imaging apparatus comprising a plurality of imaging devices according to claim 1.

10. A solid-state imaging apparatus comprising a plurality of stacked imaging devices according to claim 8.

11. An imaging device comprising:

a photoelectric conversion unit in which a first electrode, a photoelectric conversion layer, and a second electrode are stacked; and a semiconductor material layer including an inorganic oxide semiconductor material between the first electrode and the photoelectric conversion layer, wherein at least a portion of the inorganic oxide semiconductor material has a crystalline structure with a reaction energy having a positive value in units of eV/atom at a time when the portion of the inorganic oxide semiconductor material is generated on a basis of a reaction of oxygen atoms and N kinds of metallic atoms $M_n$ (n=2, 3, . . . , N), wherein the inorganic oxide semiconductor material includes $Ga_{x1}Sn_{y1}O$, and satisfies $0.28 \leq [y1/(x1+y1)] \leq 0.38$, and wherein the inorganic oxide semiconductor material has an amorphous structure in at least one portion.

12. The imaging device according to claim 11, wherein the metallic atoms have a closed-shell d orbital.

13. The imaging device according to claim 11, wherein the metallic atoms are selected from the group consisting of copper, silver, gold, zinc, gallium, germanium, indium, tin, and thallium.

14. The imaging device according to claim 11, wherein the metallic atoms are selected from the group consisting of copper, silver, zinc, gallium, germanium, and tin.

* * * * *